US012735637B2

(12) United States Patent
Kim et al.

(10) Patent No.: US 12,735,637 B2
(45) Date of Patent: Sep. 15, 2026

(54) POLYMER AND ORGANIC LIGHT-EMITTING DEVICE USING SAME

(71) Applicant: LG Chem, Ltd., Seoul (KR)

(72) Inventors: Ji Hoon Kim, Daejeon (KR); Sungkyoung Kang, Daejeon (KR); Dongyoon Khim, Daejeon (KR); Yu Jin Woo, Daejeon (KR); Jaechol Lee, Daejeon (KR); Jiyoung Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 356 days.

(21) Appl. No.: 18/294,287

(22) PCT Filed: Dec. 14, 2022

(86) PCT No.: PCT/KR2022/020384
§ 371 (c)(1),
(2) Date: Feb. 1, 2024

(87) PCT Pub. No.: WO2023/113475
PCT Pub. Date: Jun. 22, 2023

(65) Prior Publication Data
US 2024/0368463 A1 Nov. 7, 2024

(30) Foreign Application Priority Data
Dec. 16, 2021 (KR) ........................ 10-2021-0180872

(51) Int. Cl.

| | |
|---|---|
| ***C09K 11/06*** | (2006.01) |
| ***H10K 50/15*** | (2023.01) |
| ***H10K 85/10*** | (2023.01) |

(52) U.S. Cl.
CPC .............. *C09K 11/06* (2013.01); *H10K 50/15* (2023.02); *H10K 85/114* (2023.02); *C09K 2211/1425* (2013.01)

(58) Field of Classification Search
CPC C09K 11/06; C09K 2211/1425; H10K 50/15; H10K 50/16; H10K 50/171;
(Continued)

(56) References Cited

U.S. PATENT DOCUMENTS

| | | | |
|---|---|---|---|
| 7,351,358 | B2 | 4/2008 | Hsu et al. |
| 8,465,848 | B2 | 6/2013 | Smith |

(Continued)

FOREIGN PATENT DOCUMENTS

| | | | |
|---|---|---|---|
| CN | 106117522 | A | 11/2016 |
| CN | 110691806 | A | 1/2020 |

(Continued)

OTHER PUBLICATIONS

International Search Report for PCT/KR2022/020384 mailed Apr. 4, 2023. 3 pages.

(Continued)

*Primary Examiner* — Marcos D. Pizarro
(74) *Attorney, Agent, or Firm* — Lerner David LLP

(57) ABSTRACT

A polymer represented by the following Chemical Formula 1
and an organic light emitting device formed by using the same are described here:

$$E1\text{-}[A1]_a\text{-}[B1]_b\text{-}[C1]_c\text{-}E2 \quad \text{[Chemical Formula 1]}$$

wherein all the variables are described herein.

17 Claims, 1 Drawing Sheet

(58) Field of Classification Search
CPC .. H10K 85/111; H10K 85/114; H10K 85/151; H10K 71/12; C08G 2261/122; C08G 2261/132; C08G 2261/1412; C08G 2261/148; C08G 2261/164; C08G 2261/3162; C08G 2261/334; C08G 2261/95; C08G 61/02; C08G 61/12; C08L 65/00; C09D 165/00
See application file for complete search history.

(56) References Cited

U.S. PATENT DOCUMENTS

| | | | |
|---|---|---|---|
| 2004/0067387 | A1 | 4/2004 | Kim et al. |
| 2013/0082251 | A1 | 4/2013 | Park et al. |
| 2015/0011795 | A1 | 1/2015 | Zoellner et al. |
| 2016/0329497 | A1 | 11/2016 | Radu et al. |
| 2020/0185611 | A1 | 6/2020 | Yi et al. |
| 2020/0227641 | A1 | 7/2020 | Kang et al. |
| 2023/0087796 | A1 | 3/2023 | Kim et al. |
| 2023/0140039 | A1 | 5/2023 | Kim et al. |

FOREIGN PATENT DOCUMENTS

| | | | |
|---|---|---|---|
| CN | 111164113 | A | 5/2020 |
| JP | 2020105469 | A | 7/2020 |
| JP | 2020107869 | A | 7/2020 |
| KR | 20040028954 | A | 4/2004 |
| KR | 20140136503 | A | 11/2014 |
| KR | 20160131947 | A | 11/2016 |
| KR | 20180080686 | A | 7/2018 |
| KR | 20210091061 | A | 7/2021 |
| KR | 20210091062 | A | 7/2021 |
| KR | 20210120844 | A | 10/2021 |
| KR | 20220018219 | A | 2/2022 |
| WO | 2011028216 | A1 | 3/2011 |

OTHER PUBLICATIONS

Search Report dated Mar. 28, 26 from the Office Action for Chinese Application No. 202280052488.5 issued Apr. 1, 2026, 3 pages.

[FIG. 1]
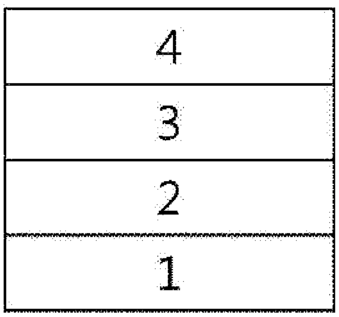
[FIG. 2]
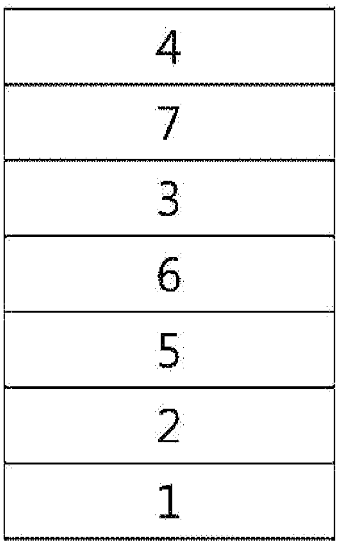

POLYMER AND ORGANIC LIGHT-EMITTING DEVICE USING SAME

CROSS-REFERENCE TO RELATED APPLICATIONS

This application is a national stage entry under 35 U.S.C. § 371 of International Application No. PCT/KR2022/020384 filed on Dec. 14, 2022, which claims priority from Korean Patent Application No. 10-2021-0180872 filed on Dec. 16, 2021, all the disclosures of which are incorporated by reference herein.

TECHNICAL FIELD

The present specification relates to a polymer and an organic light emitting device formed by using the same.

BACKGROUND ART

An organic light emission phenomenon is one of the examples of converting an electric current into visible rays through an internal process of a specific organic molecule. The principle of the organic light emission phenomenon is as follows. When an organic material layer is disposed between a positive electrode and a negative electrode, if electric current is applied between the two electrodes, electrons and holes are injected from the negative electrode and the positive electrode, respectively, into the organic material layer. The electrons and the holes which are injected into the organic material layer are recombined to form an exciton, and the exciton falls down again to the ground state to emit light. An organic electroluminescent device using this principle may be generally composed of a negative electrode, a positive electrode, and an organic material layer disposed therebetween, for example, an organic material layer including a hole injection layer, a hole transport layer, a light emitting layer, an electron transport layer, and an electron injection layer.

A material used in the organic light emitting device is mostly a pure organic material or a complex compound where an organic material and metal form a complex, and may be classified into a hole injection material, a hole transport material, a light emitting material, an electron transport material, an electron injection material, and the like according to the use thereof. Herein, an organic material having a p-type property, that is, an organic material, which is easily oxidized and has an electrochemically stable state during oxidation, is usually used as the hole injection material or the hole transport material. Meanwhile, an organic material having an n-type property, that is, an organic material, which is easily reduced and has an electrochemically stable state during reduction, is usually used as the electron injection material or the electron transport material. As the light emitting material, a material having both p-type and n-type properties, that is, a material having a stable form in both oxidation and reduction states is preferred, and a material having high light emitting efficiency for converting an exciton into light when the exciton is formed is preferred.

In addition to those mentioned above, it is preferred that the material used in the organic light emitting device additionally has the following properties.

First, it is preferred that the material used in the organic light emitting device has excellent thermal stability. This is because joule heating occurs due to the movement of electric charges in the organic light emitting device. Currently, since N, N'-di(1-naphthyl)-N, N'-diphenyl-(1,1'-biphenyl)-4,4'-diamine (NPB) typically used as a hole transport layer material has a glass transition temperature value of 100° C. or less, there is a problem in that it is difficult to use the material in an organic light emitting device requiring a high electric current.

Second, in order to obtain a high-efficiency organic light emitting device which is capable of being driven at low voltage, holes or electrons injected into the organic light emitting device need to be smoothly transferred to a light emitting layer, and simultaneously, the injected holes and electrons need to be prevented from being released out of the light emitting layer. For this purpose, a material used in the organic light emitting device needs to have an appropriate band gap and an appropriate highest occupied molecular orbital (HOMO) or lowest unoccupied molecular orbital (LUMO) energy level. Since poly(3,4-ethylenedioxythiophene) doped:poly(styrenesulfonic acid) (PEDOT:PSS) currently used as a hole transport material in an organic light emitting device to be manufactured by a solution application method has a lower LUMO energy level than the LUMO energy level of an organic material used as a light emitting layer material, it is difficult to manufacture an organic light emitting device having high efficiency and a long service life.

In addition, the material used in the organic light emitting device needs to have excellent chemical stability, excellent charge mobility, excellent interface characteristics with electrodes or adjacent layers, and the like. That is, the material used in the organic light emitting device needs to be minimally deformed by moisture or oxygen. Further, the material used in the organic light emitting device needs to have appropriate hole or electron mobility so as to make a balance between densities of holes and electrons in a light emitting layer of the organic light emitting device, thereby maximally forming excitons. Moreover, the material used in the organic light emitting device needs to be able to improve the interface with an electrode including a metal or a metal oxide for the stability of the device.

In addition to those mentioned above, a material used in an organic light emitting device for a solution process needs to additionally have the following properties.

First, the material used in the organic light emitting device needs to form a storable homogenous solution. Since a commercialized material for a deposition process has good crystallinity so that the material is not dissolved well in a solution or the crystals thereof are easily formed even though the material forms a solution, it is highly likely that according to the storage period, the concentration gradient of the solution varies or a defective device is formed.

Second, layers where the solution process is performed need to have solvent and material resistance to other layers. For this purpose, a material capable of forming a polymer self-cross-linked on a substrate through a heat treatment or ultraviolet (UV) irradiation after a curing group is introduced and a solution is applied, like N4,N4'-di(naphthalen-1-yl)-N4,N4'-bis(4-vinylphenyl) biphenyl-4,4'-diamine (VNPB), or capable of forming a polymer having sufficient resistance in the next process is preferred, and a material capable of having solvent resistance itself, like hexaazatriphenylenehexacarbonitrile (HATCN), is also preferred.

Therefore, there is a need for developing an organic material having the aforementioned requirements in the art.

Technical Problem

The present specification has been made in an effort to provide a polymer and an organic light emitting device formed by using the same.

Technical Solution

An exemplary embodiment of the present specification provides a polymer represented by the following Chemical Formula 1.

E1-$[A1]_a$-$[B1]_b$-$[C1]_c$-E2 [Chemical Formula 1]

In Chemical Formula 1,

A1 is represented by the following Chemical Formula 2,

B1 is represented by the following Chemical Formula 3,

C1 is a substituted or unsubstituted arylene group; or a substituted or unsubstituted divalent heterocyclic group, E1 and E2 are the same as or different from each other, and are each independently hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a crosslinkable group; or a combination thereof, a, b, and c are each a mole fraction, a is a real number of $0<a\leq 1$, b is a real number of $0\leq b<1$, c is a real number of $0\leq c<1$, $a+b+c=1$,

[Chemical Formula 2]

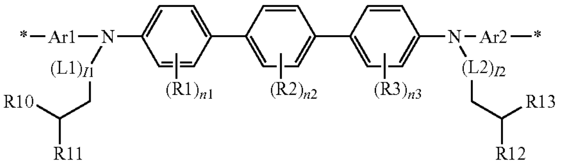

in Chemical Formula 2,

Ar1, Ar2, L1 and L2 are the same as or different from each other, and are each independently a substituted or unsubstituted arylene group, R1 to R3 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, R10 to R13 are the same as or different from each other, and are each independently a substituted or unsubstituted alkyl group, n1 to n3 are each independently an integer from 1 to 4, when n1 to n3 are each independently 2 or higher, the substituents in each parenthesis are the same as or different from each other, l1 and l2 are each independently an integer from 1 to 5, when l1 and l2 are each independently 2 or higher, the structures in each parenthesis are the same as or different from each other,

* is an attachment point in the polymer,

[Chemical Formula 3]

$Z{-}[Y{-}*]_m$ in Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; deuterium; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

Another exemplary embodiment of the present specification provides a polymer including a unit represented by the following Chemical Formula 2; and an end group represented by the following Chemical Formula 5.

[Chemical Formula 2]

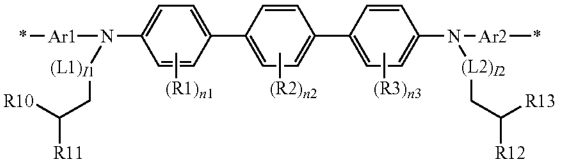

*-[E] [Chemical Formula 5]

In Chemical Formulae 2 and 5,

Ar1, Ar2, L1 and L2 are the same as or different from each other, and are each independently a substituted or unsubstituted arylene group, R1 to R3 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, R10 to R13 are the same as or different from each other, and are each independently a substituted or unsubstituted alkyl group, n1 to n3 are each independently an integer from 1 to 4, when n1 to n3 are each independently 2 or higher, the substituents in each parenthesis are the same as or different from each other, l1 and l2 are each independently an integer from 1 to 5, when l1 and l2 are each independently 2 or higher, the structures in each parenthesis are the same as or different from each other, E is hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, and

* is an attachment point in the polymer.

Still another exemplary embodiment of the present specification provides an organic light emitting device including: a first electrode; a second electrode; and an organic material layer having one or more layers provided between the first electrode and the second electrode, in which one or more layers of the organic material layer include the polymer.

Advantageous Effects

A polymer according to an exemplary embodiment of the present specification includes a unit of Chemical Formula 2 substituted with a branched alkyl group. Accordingly, an effect in which the solubility of a polymer to be prepared is improved is exhibited.

Further, the polymer according to an exemplary embodiment of the present specification can be applied to an organic light emitting device to improve the performance and/or stability of the device.

BRIEF DESCRIPTION OF DRAWINGS

FIGS. 1 and 2 are views exemplifying the structure of an organic light emitting device according to some exemplary embodiments of the present specification.

1: Substrate

2: Anode

3: Light emitting layer

4: Cathode

5: Hole injection layer

6: Hole transport layer

7: Electron injection and transport layer

DETAILED DESCRIPTION

Hereinafter, the present specification will be described in more detail.

The present specification provides a polymer represented by the following Chemical Formula 1.

$$E1\text{-}[A1]_a\text{-}[B1]_b\text{-}[C1]_c\text{-}E2 \quad \text{[Chemical Formula 1]}$$

In Chemical Formula 1,

A1 is represented by the following Chemical Formula 2,

B1 is represented by the following Chemical Formula 3,

C1 is a substituted or unsubstituted arylene group; or a substituted or unsubstituted divalent heterocyclic group, E1 and E2 are the same as or different from each other, and are each independently hydrogen; deuterium; a substituted or unsubstituted alkyl group; a substituted or unsubstituted silyl group; a substituted or unsubstituted aryl group; a substituted or unsubstituted arylamine group;

a substituted or unsubstituted siloxane group; a crosslinkable group; or a combination thereof, a, b, and c are each a mole fraction, a is a real number of $0<a\leq1$, b is a real number of $0\leq b<1$, c is a real number of $0\leq c<1$, $a+b+c=1$,

[Chemical Formula 2]

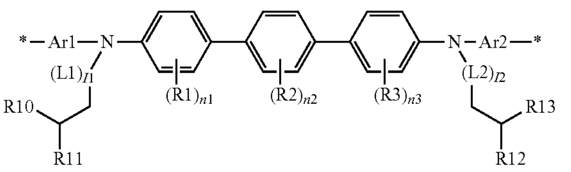

in Chemical Formula 2,

Ar1, Ar2, L1 and L2 are the same as or different from each other, and are each independently a substituted or unsubstituted arylene group, R1 to R3 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, R10 to R13 are the same as or different from each other, and are each independently a substituted or unsubstituted alkyl group, n1 to n3 are each independently an integer from 1 to 4, when n1 to n3 are each independently 2 or higher, the substituents in each parenthesis are the same as or different from each other, l1 and l2 are each independently an integer from 1 to 5, when l1 and l2 are each independently 2 or higher, the substituents in each parenthesis are the same as or different from each other,

* is an attachment point in the polymer, $$Z\text{-}[Y\text{—}*]_m \quad \text{[Chemical Formula 3]}$$

in Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; deuterium; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

In an exemplary embodiment of the present specification, Chemical Formula 2 included in the polymer includes a branched alkyl group. Accordingly, an effect in which the solubility of a polymer to be prepared is improved compared to the polymer including a straight-chained alkyl group is exhibited. An increase in solubility forms an excellent thin film when a device is manufactured through a solution process, thereby exhibiting an effect in which the performance of the manufactured device is improved. Specifically, the polymer may include a branched alkyl group to exhibit stable driving voltage, improved efficiency and/or long service life characteristics when applied to devices.

In an exemplary embodiment of the present specification, the polymer has a polydispersity index (PDI) of 1 to 10.

Preferably, the polymer has a molecular weight distribution of 1 to 5. More preferably, the polymer has a molecular weight distribution of 1 to 4.

In the present specification, the polydispersity index (PDI) is calculated through the following Equation (1).

$$PDI = \text{Weight average molecular weight } (Mw) / \text{Number average molecular weight } (Mn) \quad \text{Equation (1)}$$

A wide molecular weight distribution of a polymer means that molecules with various molecular weights are distributed, which means that it is difficult to synthesize a polymer with reproducibility. Therefore, the wider the molecular weight distribution, the lower the uniformity of the polymer. That is, the closer the molecular weight distribution to 1, the more homogeneous the polymer is prepared.

In an exemplary embodiment of the present specification, the molecular weight of the polymer is measured by a gel permeation chromatography (GPC) method.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; an alkyl group; a cycloalkyl group; an alkoxy group; an aryloxy group; an amine group; an aryl group; and a heterocyclic group, being substituted with a substituent to which two or more substituents among the exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

Examples of the substituents will be described below, but are not limited thereto.

In the present specification, examples of a halogen group include fluorine (F), chlorine (Cl), bromine (Br) or iodine (I).

In the present specification, an alkyl group may be straight-chained or branched, and the number of carbon atoms thereof is not particularly limited, but is preferably 1 to 60. According to an exemplary embodiment, the number of carbon atoms of the alkyl group is 1 to 30. Specific examples of the alkyl group include a methyl group, an ethyl group, a propyl group, an isopropyl group, a butyl group, an isobutyl group, a tert-butyl group, a pentyl group, a hexyl group, a heptyl group, an octyl group, and the like, but are not limited thereto.

In the present specification, the number of carbon atoms of the cycloalkyl group is not particularly limited, but is preferably 3 to 60. According to an exemplary embodiment, the number of carbon atoms of the cycloalkyl group is 3 to 30. Specific examples of the cycloalkyl group include a cyclopropyl group, a cyclobutyl group, a cyclopentyl group, a cyclohexyl group, a cycloheptyl group, a cyclooctyl group, and the like, but are not limited thereto.

In the present specification, an alkoxy group may be straight-chained, branched, or cyclic. The number of carbon atoms of the alkoxy group is not particularly limited, but is preferably 1 to 30. Specific examples of the alkoxy group include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, and the like, but are not limited thereto.

In the present specification, a fluoroalkoxy group means an alkoxy group substituted with F.

In the present specification, an amine group may be selected from the group consisting of $-NH_2$; an alkylamine group; an arylalkylamine group; an arylamine group; an arylheteroarylamine group; an alkylheteroarylamine group; and a heteroarylamine group, and is not limited thereto. The number of carbon atoms of the amine group is not particularly limited, but is preferably 1 to 60.

In the present specification, the number of carbon atoms of the aryl group is not particularly limited, but is preferably 6 to 60. According to an exemplary embodiment, the number of carbon atoms of the aryl group is 6 to 30. In an exemplary embodiment of the present specification, the aryl group may be a monocyclic aryl group or a polycyclic aryl group. Specific examples of the monocyclic aryl group include a phenyl group, a biphenyl group, a terphenyl group, and the like, but are not limited thereto. Examples of the polycyclic aryl group include a naphthyl group, an anthracenyl group, a phenanthrenyl group, a pyrenyl group, a perylenyl group, a triphenylenyl group, a chrysenyl group, a fluorenyl group, and the like, but are not limited thereto.

In the present specification, an arylene group means a group having two bonding positions in an aryl group, that is, a divalent group. The above-described description on the aryl group may be applied to the arylene group, except for a divalent arylene group.

In the present specification, examples of an arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include a monocyclic aryl group, a polycyclic aryl group, or both a monocyclic aryl group and a polycyclic aryl group. For example, the aryl group in the arylamine group may be selected from the above-described examples of the aryl group.

In the present specification, a heterocyclic group includes one or more atoms other than carbon, that is, one or more heteroatoms, and specifically, the heteroatom may include one or more of O, N, Se, S, or the like. The number of carbon atoms of the heterocyclic group is not particularly limited, but is preferably 2 to 30. In an exemplary embodiment of the present specification, the heterocyclic group may be monocyclic or polycyclic. Examples of the heterocyclic group include a thiophene group, a furan group, a pyrrole group, an imidazole group, a thiazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthridine group, a phenanthroline group, an isoxazole group, a thiadiazole group, a phenothiazine group, a dibenzofuran group, and the like, but are not limited thereto.

In the present specification, the divalent heterocycle may be monocyclic or polycyclic, and means that there are two bonding positions in the heterocyclic group. For example, examples of the divalent heterocycle group may be a divalent thiophene group; a divalent carbazole group; a divalent dibenzofuran group; a divalent dibenzothiophene group, and the like, but are not limited thereto.

In the present specification, the aryloxy group is a group represented by —$OR_{200}$, and $R_{200}$ is an aryl group. The aryl group in the aryloxy group is the same as the above-described examples of the aryl group. Specific examples of the aryloxy group include a phenoxy group, benzyloxy, p-methylbenzyloxy, a p-tolyloxy group, an m-tolyloxy group, a 3,5-dimethyl phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, but are not limited thereto.

In the present specification, a silyl group is a group represented by —$SiR_{201}R_{202}R_{203}$, and $R_{201}$, $R_{202}$ and $R_{203}$ are the same as or different from each other, and are each independently hydrogen; deuterium; a substituted or unsubstituted alkyl group; or a substituted or unsubstituted aryl group. Examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a siloxane group is a group represented by —$Si(R_{204})_2OSi(R_{205})_3$ or —$OSi(R_{204})_3Si(R_{205})_3$, and $R_{204}$ and $R_{205}$ are the same as or different from each other, and are each independently hydrogen; deuterium; a substituted or unsubstituted alkyl group; or a substituted or unsubstituted aryl group.

In the present specification, a cross-linkable group may mean a reactive substituent which cross-links compounds by being exposed to heat, light, and/or radiation. A cross-linkage may be produced while radicals produced by decomposing carbon-carbon multiple bonds and cyclic structures by means of a heat treatment, light irradiation, and/or radiation irradiation are linked to each other.

In an exemplary embodiment of the present specification, the cross-linkable group is any one of the following structures.

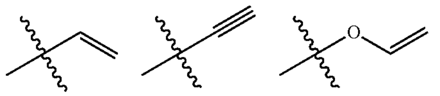

-continued

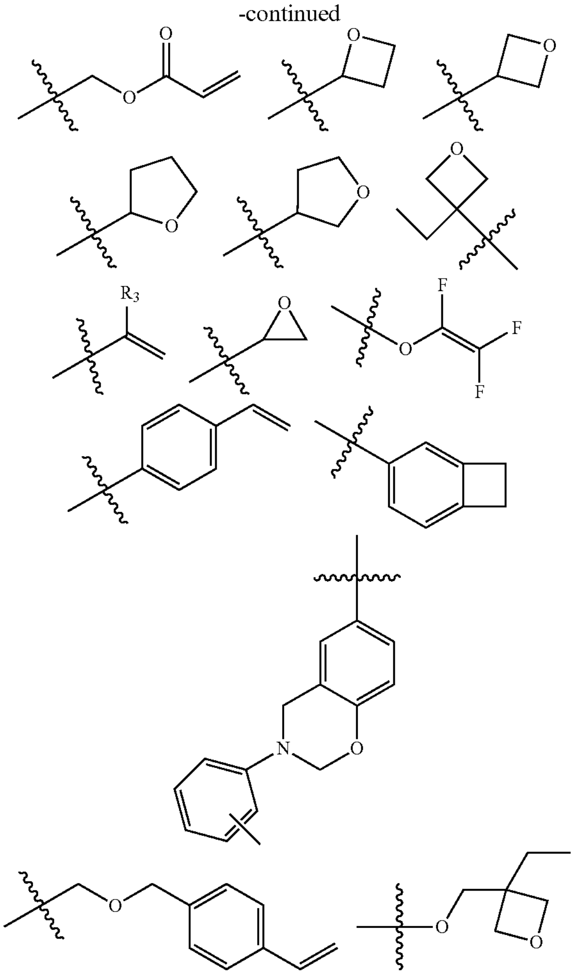

In the structure,  means a moiety bonded to another substituent or a bonding portion.

In the present specification, the "adjacent" group may mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

In the present specification, in a ring formed by bonding adjacent groups, the "ring" means a substituted or unsubstituted hydrocarbon ring; or a substituted or unsubstituted hetero ring.

In the present specification, the "mole fraction" means a ratio of the mole number of a given component to the total mole number of all the components.

In the present specification, a combination of substituents means a substituent in which two or more substituents of the exemplified substituents are linked. For example, in hydrogen; deuterium; a substituted or unsubstituted alkyl group; a substituted or unsubstituted aryl group; a cross-linkable group; or a combination thereof, the 'combination' means a substituent in which two or more substituents of the exemplified substituents are linked. As an example, the combination may have a structure in which an alkyl group and a cross-linkable group are linked or a structure in which an alkyl group and an aryl group are linked, but is not limited thereto.

In an exemplary embodiment of the present specification, L1 and L2 are the same as or different from each other, and are each independently a substituted or unsubstituted arylene group having 6 to 30 carbon atoms.

In an exemplary embodiment of the present specification, L1 and L2 are the same as or different from each other, and are each independently a substituted or unsubstituted phenylene group; a substituted or unsubstituted biphenylene group; or a substituted or unsubstituted naphthylene group.

In an exemplary embodiment of the present specification, L1 and L2 are the same as or different from each other, and are each independently a phenylene group; a biphenylene group; or a naphthylene group.

In an exemplary embodiment of the present specification, Chemical Formula 2 is represented by the following Chemical Formula 2-1.

[Chemical Formula 2-1]

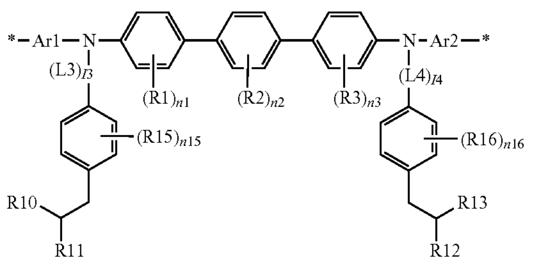

In Chemical Formula 2-1,

R1 to R3, R10 to R13, Ar1, Ar2, and n1 to n3 are the same as those defined in Chemical Formula 2, L3 and L4 are the same as or different from each other, and are each independently a direct bond; or a substituted or unsubstituted arylene group, R15 and R16 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, n15 and n16 are each independently an integer from 1 to 4, when n15 and n16 are each independently 2 or higher, the substituents in each parenthesis are the same as or different from each other, l3 and l4 are each independently an integer from 1 to 4, when l3 and l4 are each independently 2 or higher, the structures in each parenthesis are the same as or different from each other, and

* is an attachment point in the polymer.

In an exemplary embodiment of the present specification, Ar1 and Ar2 are the same as or different from each other, and are each independently a substituted or unsubstituted arylene group having 6 to 30 carbon atoms.

In an exemplary embodiment of the present specification, Ar1 and Ar2 are the same as or different from each other, and are each independently a substituted or unsubstituted phenylene group; a substituted or unsubstituted biphenylene group; or a substituted or unsubstituted terphenylene group.

In an exemplary embodiment of the present specification, Ar1 and Ar2 are the same as or different from each other, and are each independently a phenylene group; a biphenylene group; or a terphenylene group.

In an exemplary embodiment of the present specification, Chemical Formula 2 is represented by the following Chemical Formula 2-2.

[Chemical Formula 2-2]

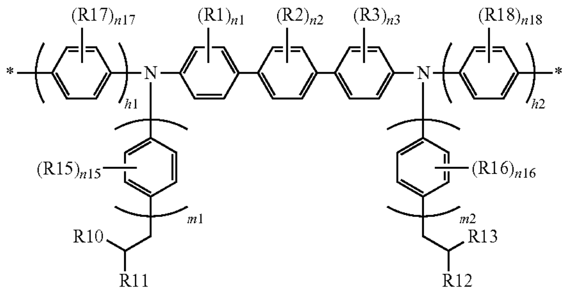

In Chemical Formula 2-2,

R1 to R3, R10 to R13 and n1 to n3 are the same as those defined in Chemical Formula 2, R15 to R18 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, m1, m2, h1 and h2 are each independently an integer from 1 to 3, when m1, m2, h1 and h2 are each independently 2 or higher, the structures in each parenthesis are the same as or different from each other, n15 to n18 are each independently an integer from 1 to 4, when n15 to n18 are each independently 2 or higher, the substituents in each parenthesis are the same as or different from each other, and

* is an attachment point in the polymer.

In an exemplary embodiment of the present specification, Chemical Formula 2 is represented by the following Chemical Formula 2-3.

[Chemical Formula 2-3]

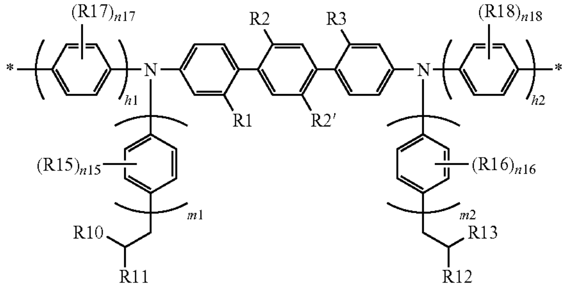

In Chemical Formula 2-3,

R10 to R13 are the same as those defined in Chemical Formula 2,

R1 to R3, R2' and R15 to R18 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, m1, m2, h1 and h2 are each independently an integer from 1 to 3, when m1, m2, h1 and h2 are each independently 2 or higher, the structures in each parenthesis are the same as or different from each other, n15 to n18 are each independently an integer from 1 to 4, when n15 to n18 are each independently 2 or higher, the substituents in each parenthesis are the same as or different from each other, and

* is an attachment point in the polymer.

In an exemplary embodiment of the present specification, Chemical Formula 2 is represented by the following Chemical Formula 2-4 or 2-5.

[Chemical Formula 2-4]

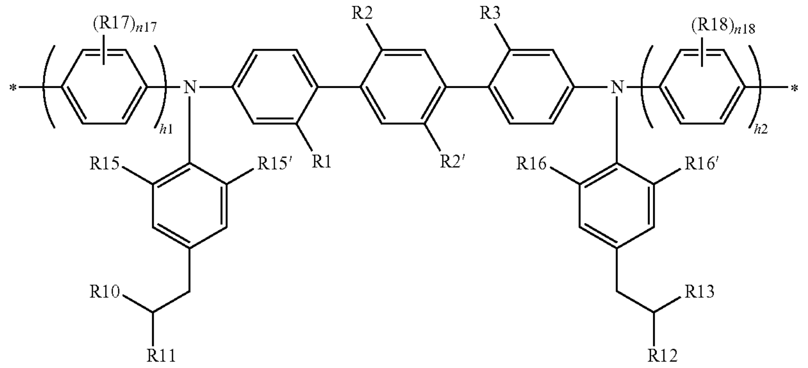

[Chemical Formula 2-5]

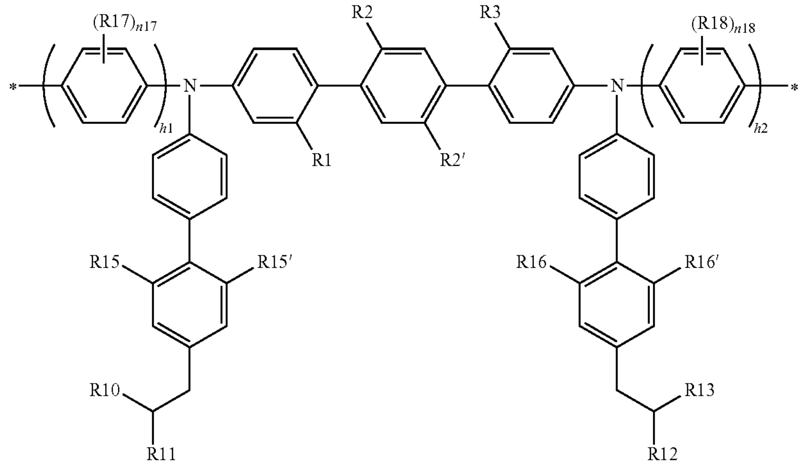

In Chemical Formulae 2-4 and 2-5,

R10 to R13 are the same as those defined in Chemical Formula 2,

R1 to R3, R2', R15 to R18, R15' and R16' are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, h1 and h2 are each independently an integer from 1 to 3, when h1 and h2 are each independently 2 or higher, the structures in each parenthesis are the same as or different from each other, n17 to n18 are each independently an integer from 1 to 4, when n17 to n18 are each independently 2 or higher, the substituents in each parenthesis are the same as or different from each other, and

* is an attachment point in the polymer.

In an exemplary embodiment of the present specification, R1 to R3 are each hydrogen; deuterium; or a substituted or unsubstituted alkyl group.

In an exemplary embodiment of the present specification, one or more of R1, R2 or R3 are a substituted or unsubstituted alkyl group.

In an exemplary embodiment of the present specification, any one of R1, R2 or R3 is a substituted or unsubstituted alkyl group.

In an exemplary embodiment of the present specification, two of R1, R2 or R3 are a substituted or unsubstituted alkyl group.

In an exemplary embodiment of the present specification, all of R1 to R3 are a substituted or unsubstituted alkyl group.

In an exemplary embodiment of the present specification, R1 to R3 are the same as or different from each other, and are each independently hydrogen; deuterium; or a substituted or unsubstituted alkyl group having 1 to 10 carbon atoms, and one or more of R1, R2 or R3 are a substituted or unsubstituted alkyl group having 1 to 10 carbon atoms.

In an exemplary embodiment of the present specification, R1 to R3 are the same as or different from each other, and are each independently hydrogen; deuterium; or an alkyl group, and one or more of R1, R2 or R3 are an alkyl group.

In an exemplary embodiment of the present specification, R1 to R3 are the same as or different from each other, and are each independently hydrogen; deuterium; a methyl group; or a hexyl group, and one or more of R1, R2 or R3 are a methyl group; or a hexyl group.

In an exemplary embodiment of the present specification, R1 and R3 are each a methyl group.

In an exemplary embodiment of the present specification, R2 is a hexyl group.

In an exemplary embodiment of the present specification, R2' is a hexyl group.

In an exemplary embodiment of the present specification, m1 and m2 are each independently 1 or 2.

In an exemplary embodiment of the present specification, h1 and h2 are each 2.

In an exemplary embodiment of the present specification, R15 to R18 are the same as or different from each other, and are each independently hydrogen; or a substituted or unsubstituted alkyl group.

In an exemplary embodiment of the present specification, R15 to R18 are the same as or different from each other, and are each independently hydrogen; or an alkyl group.

In an exemplary embodiment of the present specification, R15 to R18 are the same as or different from each other, and are each independently hydrogen; or an alkyl group having 1 to 30 carbon atoms.

In an exemplary embodiment of the present specification, R15 to R18 are the same as or different from each other, and are each independently hydrogen; or an alkyl group having 1 to 10 carbon atoms.

In an exemplary embodiment of the present specification, R15 to R18 are the same as or different from each other, and are each independently hydrogen; or an alkyl group having 1 to 5 carbon atoms.

In an exemplary embodiment of the present specification, R15 to R18 are the same as or different from each other, and are each independently hydrogen; or a methyl group.

In an exemplary embodiment of the present specification, R15 to R18 are the same as or different from each other, and are each independently hydrogen; or a substituted or unsubstituted alkyl group.

In an exemplary embodiment of the present specification, R15' and R16' are the same as or different from each other, and are each independently hydrogen; or an alkyl group.

In an exemplary embodiment of the present specification, R15' and R16' are the same as or different from each other, and are each independently hydrogen; or an alkyl group having 1 to 30 carbon atoms.

In an exemplary embodiment of the present specification, R15' and R16' are the same as or different from each other, and are each independently hydrogen; or an alkyl group having 1 to 10 carbon atoms.

In an exemplary embodiment of the present specification, R15' and R16' are the same as or different from each other, and are each independently hydrogen; or an alkyl group having 1 to 5 carbon atoms.

In an exemplary embodiment of the present specification, R15' and R16' are the same as or different from each other, and are each independently hydrogen; or a methyl group.

In an exemplary embodiment of the present specification, R10 to R13 are each independently an alkyl group.

In an exemplary embodiment of the present specification, R10 to R13 are each independently an alkyl group having 1 to 10 carbon atoms.

In an exemplary embodiment of the present specification, R10 to R13 are each independently a methyl group; an ethyl group; a propyl group; a butyl group; a pentyl group; or a hexyl group.

In an exemplary embodiment of the present specification, Chemical Formula 2 has the following structure.

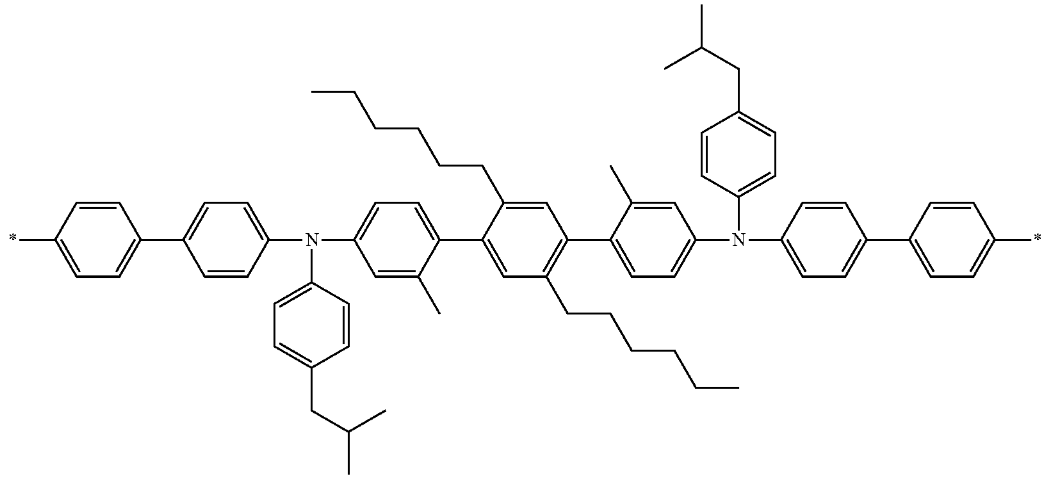

-continued
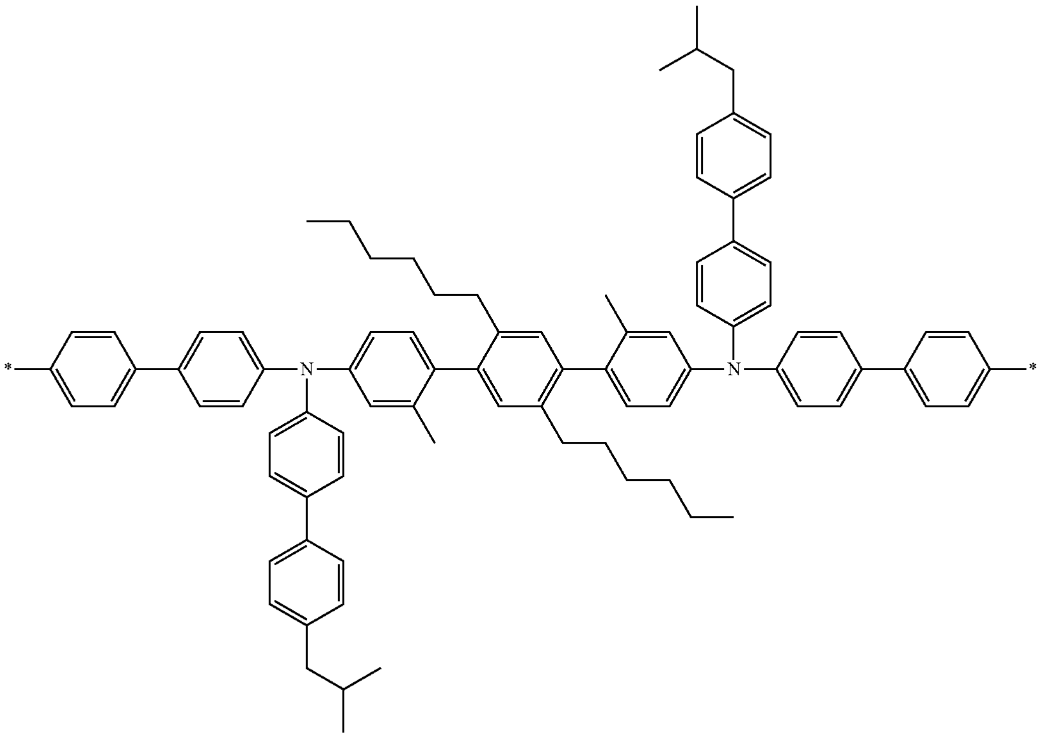 [SMILES: *c1ccc(-c2ccc(N(c3ccc(-c4ccc(CC(C)C)cc4)cc3)c3ccc(-c4cc(CCCCCC)c(-c5ccc(N(c6ccc(-c7ccc(*)cc7)cc6)c6ccc(-c7c(C)cc(CC(C)C)cc7C)cc6)cc5C)cc4CCCCCC)c(C)c3)cc2)cc1]
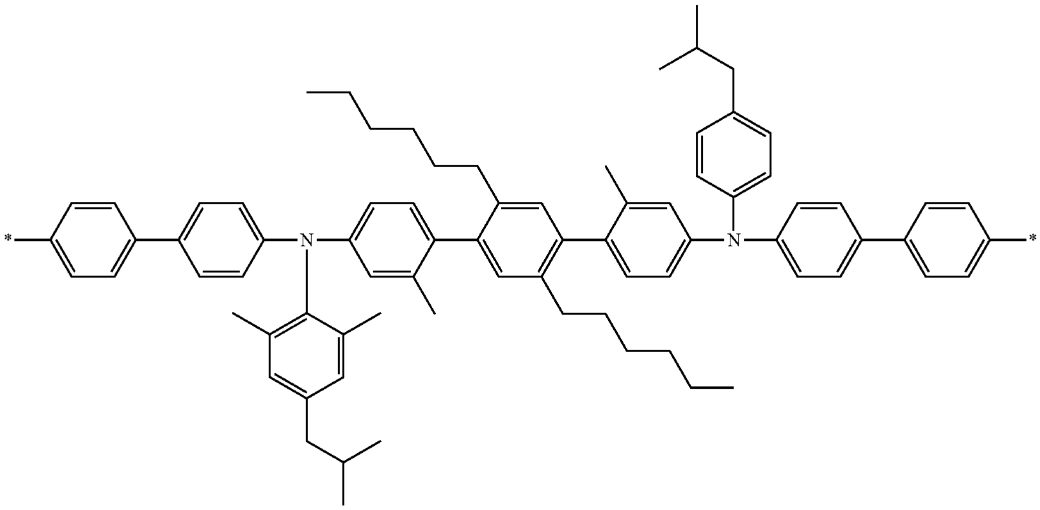

-continued

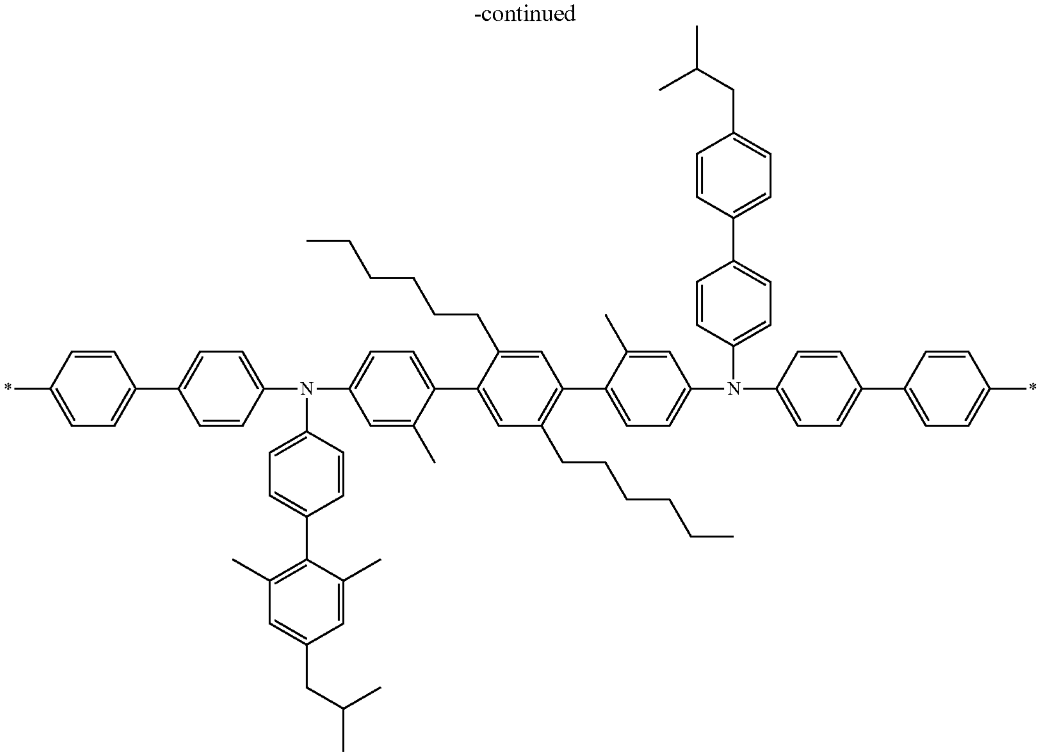

In the structure, * is an attachment point in the polymer.

In an exemplary embodiment of the present specification, a unit represented by Chemical Formula 2 included in the polymer includes a branched alkyl group. Accordingly, an effect in which the uniformity of a polymer to be prepared is improved is exhibited.

In an exemplary embodiment of the present specification, hydrogen can be replaced with deuterium. For example, hydrogen included in the structure can be replaced with deuterium.

In an exemplary embodiment of the present specification, a is a mole fraction, and a real number of $0<a\leq1$. That is, the polymer needs to include A1.

In an exemplary embodiment of the present specification, b is a mole fraction, and a real number of $0\leq b<1$. That is, the polymer selectively includes B1.

In an exemplary embodiment of the present specification, b is a real number of $0<b<1$.

In an exemplary embodiment of the present specification, B1 of Chemical Formula 1 is a unit represented by Chemical Formula 3.

In an exemplary embodiment of the present specification, B1 is a unit having 3 or 4 attachment points. In an exemplary embodiment of the present specification, Y is a direct bond; or a substituted or unsubstituted arylene group.

In an exemplary embodiment of the present specification, Y is a direct bond; or a substituted or unsubstituted phenylene group.

In an exemplary embodiment of the present specification, Chemical Formula 3 is represented by any one of the following Chemical Formulae 3-1 to 3-4.

[Chemical Formula 3-1]

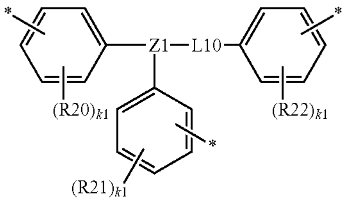

[Chemical Formula 3-2]

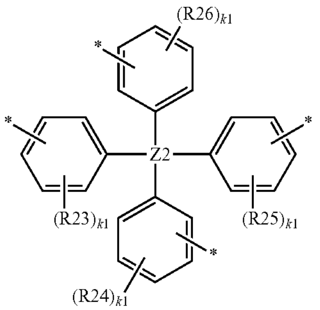

[Chemical Formula 3-3]

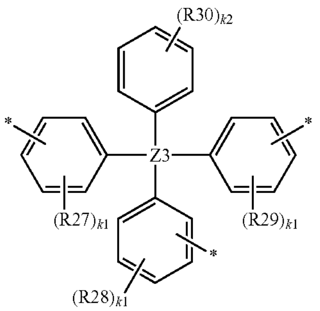

-continued

[Chemical Formula 3-4]

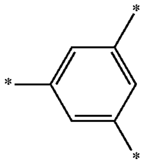

In Chemical Formulae 3-1 to 3-4,

Z1 is CRa; SiRa; N; or a substituted or unsubstituted trivalent aryl group,

Z2 and Z3 are the same as or different from each other, and are each independently C; Si; or a substituted or unsubstituted tetravalent aryl group, L10 is a direct bond; or a substituted or unsubstituted arylene group, Ra is hydrogen; deuterium; a substituted or unsubstituted alkyl group; or a substituted or unsubstituted aryl group, R20 to R30 are the same as or different from each other, and are each independently hydrogen; deuterium; a halogen group; a cyano group; an alkoxy group; an aryloxy group; a fluoroalkoxy group; a siloxane group; a substituted or unsubstituted amine group; a substituted or unsubstituted alkyl group; a substituted or unsubstituted aryl group; a substituted or unsubstituted heterocyclic group; or a cross-linkable group, and adjacent groups may be bonded to each other to form a ring, Each k1 is independently an integer from 1 to 4, k2 is an integer from 1 to 5, when each k1 is independently 2 or higher, substituents in the parenthesis are the same as or different from each other, when k2 is 2 or higher, substituents in the parenthesis are the same as or different from each other, and

* is an attachment point in the polymer.

In an exemplary embodiment of the present specification, Chemical Formula 3 is represented by Chemical Formula 3-1.

In an exemplary embodiment of the present specification, Z1 is CRa or SiRa, and when Ra is a substituted or unsubstituted aryl group, L10 is a substituted or unsubstituted arylene group.

In an exemplary embodiment of the present specification, Z1 is CH; SiH; N; or a substituted or unsubstituted trivalent aryl group.

In an exemplary embodiment of the present specification, Z1 is CH; SiH; N; or a substituted or unsubstituted trivalent phenyl group.

In an exemplary embodiment of the present specification, Z1 is N; or a trivalent phenyl group.

In an exemplary embodiment of the present specification, L10 is a direct bond; or a substituted or unsubstituted arylene group having 6 to 30 carbon atoms.

In an exemplary embodiment of the present specification, L10 is a direct bond; or an arylene group having 6 to 30 carbon atoms.

In an exemplary embodiment of the present specification, L10 is a direct bond; or a phenylene group.

In an exemplary embodiment of the present specification, L10 is a direct bond.

In an exemplary embodiment of the present specification, Chemical Formula 3 is represented by Chemical Formula 3-2.

In an exemplary embodiment of the present specification, Z2 is C; or Si.

In an exemplary embodiment of the present specification, Chemical Formula 3 is represented by Chemical Formula 3-3.

In an exemplary embodiment of the present specification, Z3 is C; or Si.

In an exemplary embodiment of the present specification, Chemical Formula 3 is represented by Chemical Formula 3-4.

In an exemplary embodiment of the present specification, Chemical Formula 3 is one of the following structures.

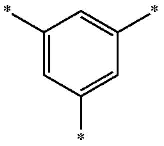

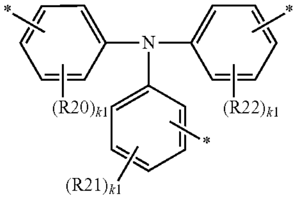

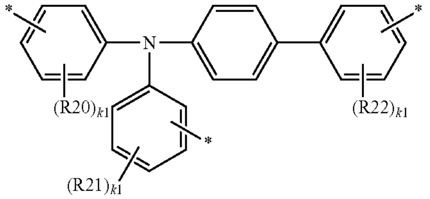

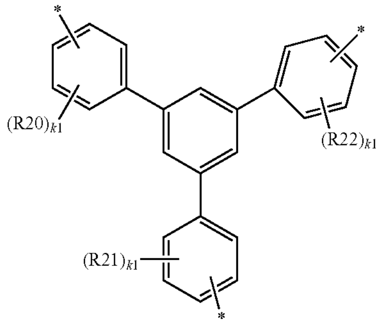

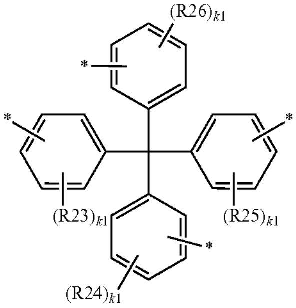

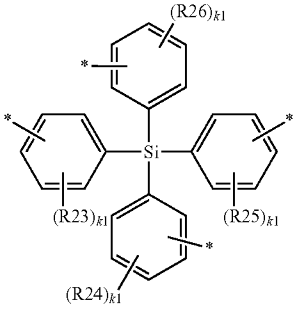

-continued

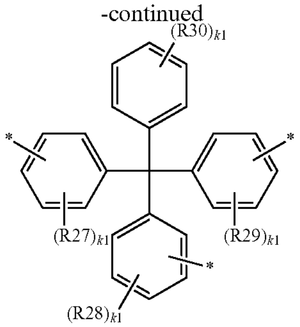

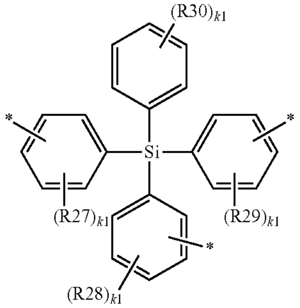

In the structures,

R20 to R30 are the same as or different from each other, and are each independently hydrogen; deuterium; a halogen group; a cyano group; an alkoxy group; an aryloxy group; a fluoroalkoxy group; a siloxane group; a substituted or unsubstituted amine group; a substituted or unsubstituted alkyl group; a substituted or unsubstituted aryl group; a substituted or unsubstituted heterocyclic group; or a cross-linkable group, and adjacent groups may be bonded to each other to form a ring, Each k1 is independently an integer from 1 to 4, k2 is an integer from 1 to 5, when each k1 is independently 2 or higher, substituents in the parenthesis are the same as or different from each other, when k2 is 2 or higher, substituents in the parenthesis are the same as or different from each other, and

* is an attachment point in the polymer.

In an exemplary embodiment of the present specification, R20 to R30 are each a hydrogen.

Specifically, Chemical Formula 3 is any one of the following structures.

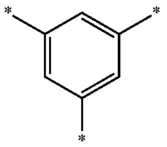

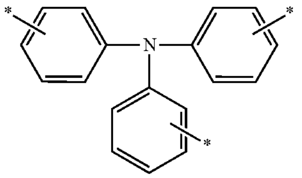

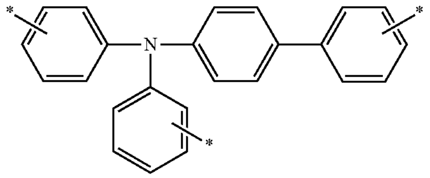

-continued

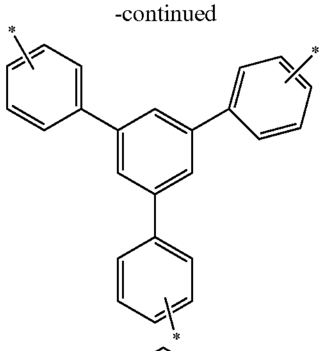

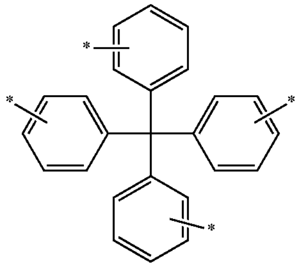

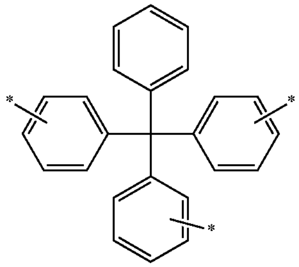

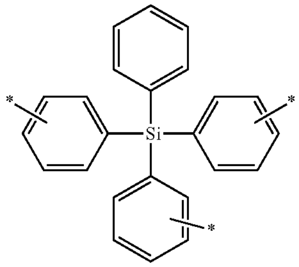

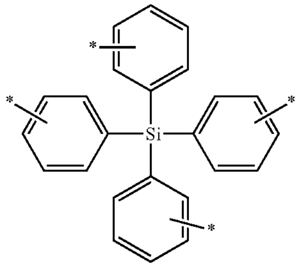

In the structure, * is an attachment point in the polymer.

More specifically, Chemical Formula 3 is any one of the following structures.

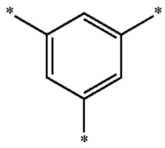
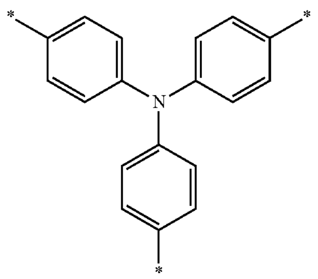
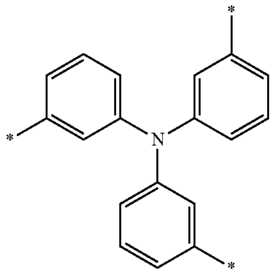
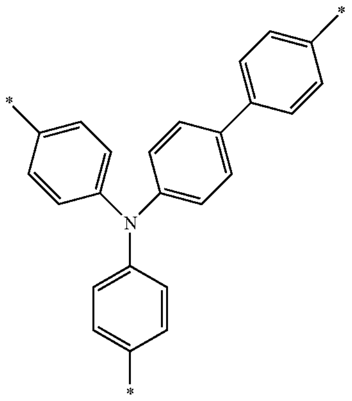
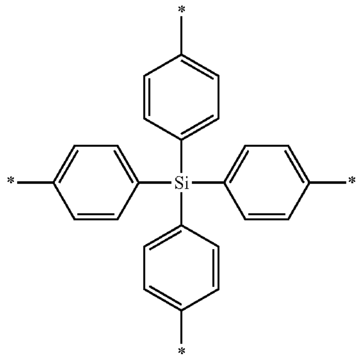
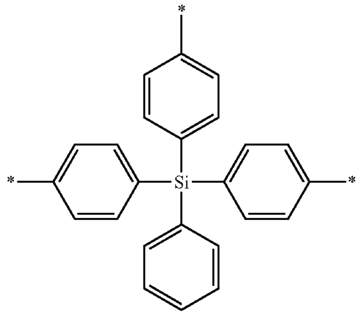
-continued
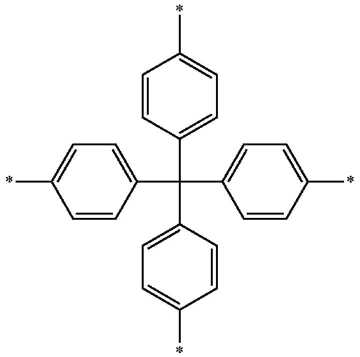
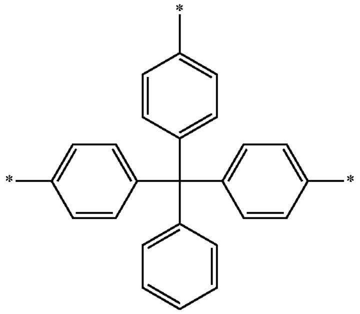
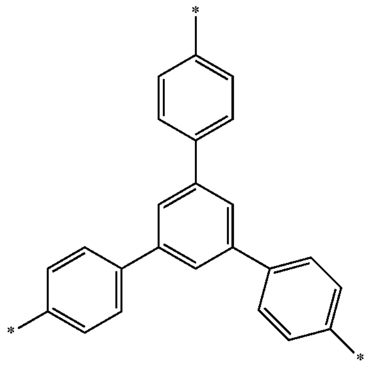
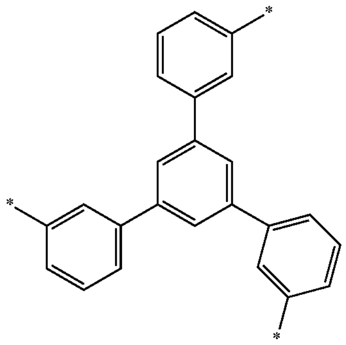
In the structure, * is an attachment point in the polymer.
More specifically, Chemical Formula 3 is any one of the following structures.

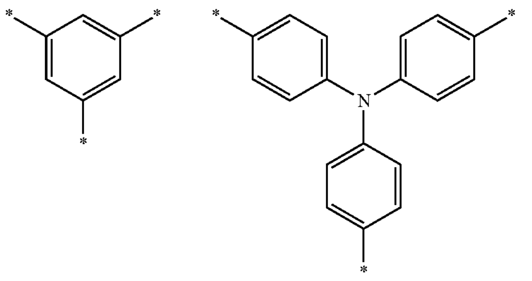
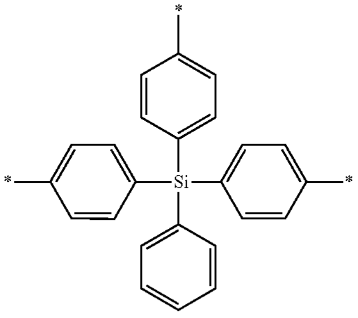
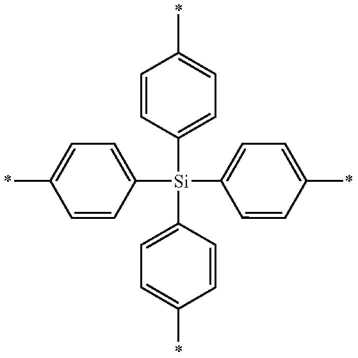
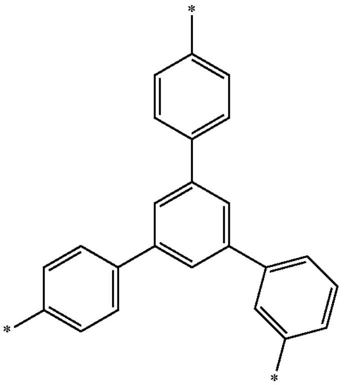
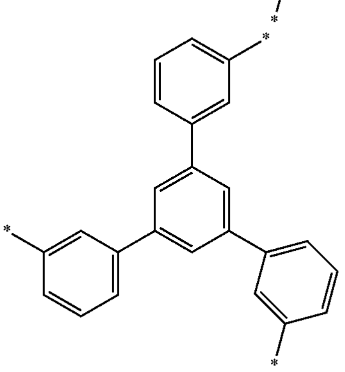
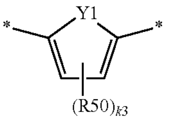

In the structure, * is an attachment point in the polymer.

In an exemplary embodiment of the present specification, c is a mole fraction, and a real number of $0 \leq c < 1$. That is, the polymer selectively includes C1.

In an exemplary embodiment of the present specification, C1 of Chemical Formula 1 is a unit having 2 attachment points.

In an exemplary embodiment of the present specification, C1 of Chemical Formula 1 is a substituted or unsubstituted arylene group; or a substituted or unsubstituted divalent heterocyclic group.

In an exemplary embodiment of the present specification, C1 of Chemical Formula 1 is an arylene group which is unsubstituted or substituted with deuterium or a cross-linkable group; or a divalent heterocyclic group which is unsubstituted or substituted with deuterium or a cross-linkable group.

In an exemplary embodiment of the present specification, C1 is any one of the following structures.

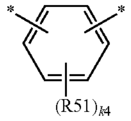
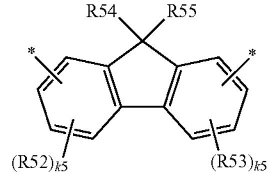
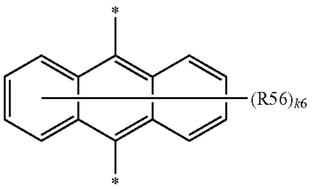
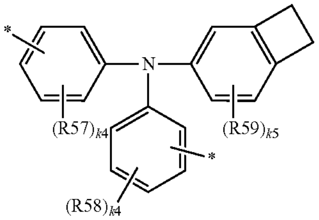
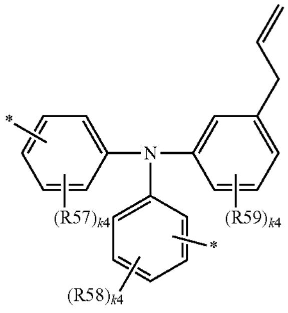
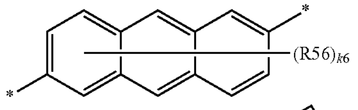

In the structures,

Y1 is S, O, or NR100,

R50 to R59 and R100 are the same as or different from each other, and are each independently hydrogen; deuterium; a substituted or unsubstituted alkyl group; a substituted or unsubstituted aryl group; or a cross-linkable group, k3 is an integer of 1 or 2, Each k4 is independently an integer from 1 to 4, Each k5 is independently an integer from 1 to 3, Each k6 is independently an integer from 1 to 8, when k3 to k6 are each independently 2 or higher, the substituents in each parenthesis are the same as or different from each other, and

* is an attachment point in the polymer.

Specifically, C1 is any one of the following structures.

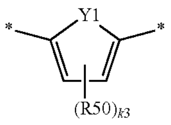

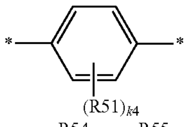

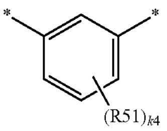

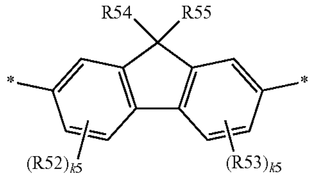

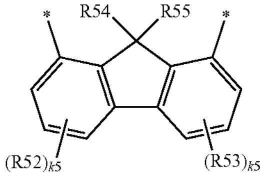

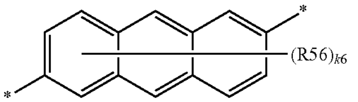

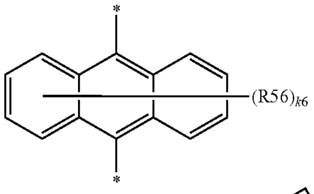

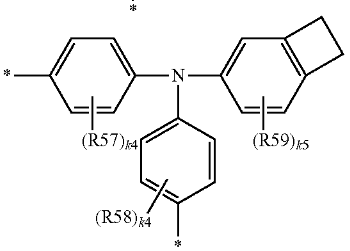

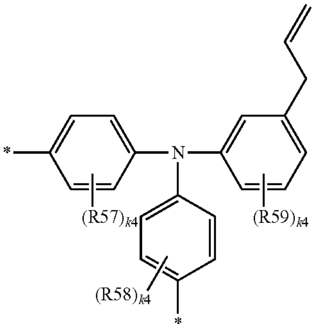

In the structures,

Y1 is s, O, or NR100,

R50 to R59 and R100 are the same as or different from each other, and are each independently hydrogen; deuterium; a substituted or unsubstituted alkyl group; a substituted or unsubstituted aryl group; or a cross-linkable group, k3 is an integer of 1 or 2, Each k4 is independently an integer from 1 to 4, Each k5 is independently an integer from 1 to 3, Each k6 is independently an integer from 1 to 8, when k3 to k6 are each independently 2 or higher, the substituents in each parenthesis are the same as or different from each other, and

* is an attachment point in the polymer.

More specifically, C1 is any one of the following structures.

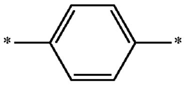

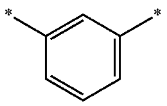

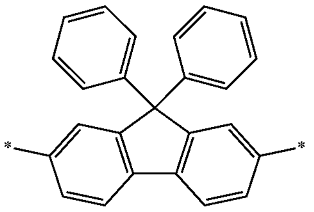

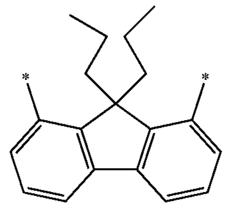

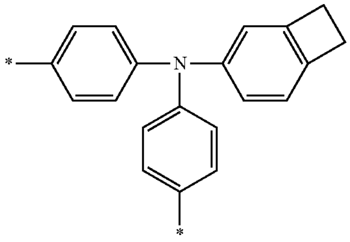

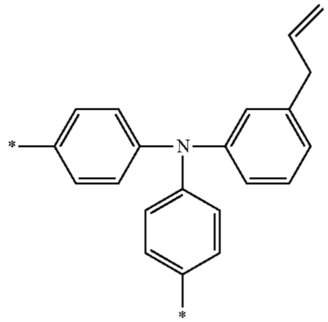

In the structure, * is an attachment point in the polymer.

In an exemplary embodiment of the present specification, E1 and E2 are end-capping units of the polymer.

In an exemplary embodiment of the present specification, E1 and E2 are units having only one attachment point.

In an exemplary embodiment of the present specification, E1 and E2 are the same as or different from each other, and are each independently a substituted or unsubstituted alkyl group; a substituted or unsubstituted aryl group; a cross-linkable group; or a combination thereof.

In an exemplary embodiment of the present specification, E1 and E2 are the same as or different from each other, and are each independently a substituted or unsubstituted alkyl group having 1 to 30 carbon atoms; a substituted or unsubstituted aryl group having 6 to 30 carbon atoms; a cross-linkable group; or a combination thereof.

In an exemplary embodiment of the present specification, E1 and E2 are the same as or different from each other, and are each independently a substituted or unsubstituted alkyl group having 1 to 10 carbon atoms; a substituted or unsubstituted phenyl group; a substituted or unsubstituted biphenyl group; a cross-linkable group; or a combination thereof.

In an exemplary embodiment of the present specification, E1 and E2 are the same as or different from each other, and are each independently a cross-linkable group; or any one of the following structures.

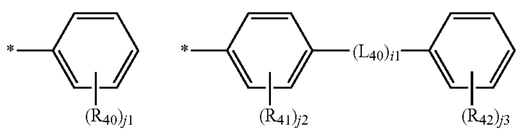

In the structures,

R40 to R42 are the same as or different from each other, and are each independently hydrogen; deuterium; a substituted or unsubstituted alkyl group; a substituted or unsubstituted aryl group; a substituted or unsubstituted heterocyclic group; or a cross-linkable group, L40 is a direct bond; a substituted or unsubstituted alkylene group; or a substituted or unsubstituted arylene group, i1 is an integer from 1 to 10, j1 and j3 are each independently an integer from 1 to 5, j2 is an integer from 1 to 4, when i1 is 2 or higher, two or more L40's are the same as or different from each other, when j1 to j3 are each independently 2 or higher, the substituents in each parenthesis are the same as or different from each other, and

* is an attachment point in the polymer.

In an exemplary embodiment of the present specification, E1 and E2 are the same as or different from each other, and are each independently any one of the following structures.

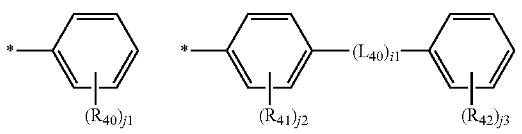

In the structures,

R40 to R42, L40, i1, j1 to j3 and * are as described above.

In an exemplary embodiment of the present specification, R40 to R42 are the same as or different from each other, and are each independently hydrogen; deuterium; an alkyl group having 1 to 10 carbon atoms; or a cross-linkable group.

In an exemplary embodiment of the present specification, L40 is a direct bond; an alkylene group having 1 to 10 carbon atoms; or an arylene group having 6 to 30 carbon atoms.

In an exemplary embodiment of the present specification, E1 and E2 are the same as or different from each other, and are each independently any one of the following structures.

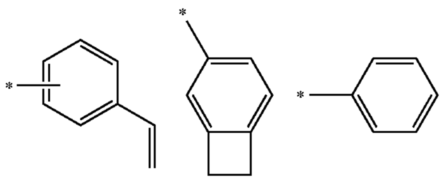

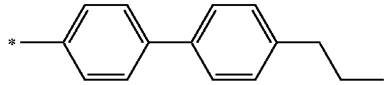

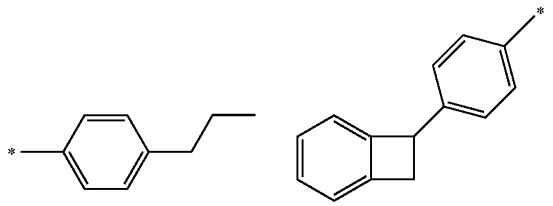

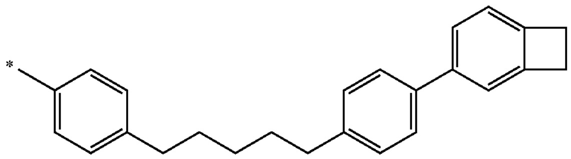

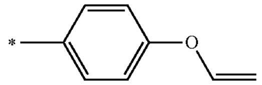

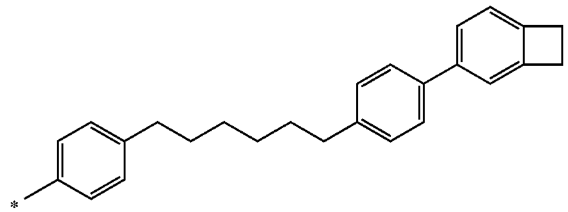

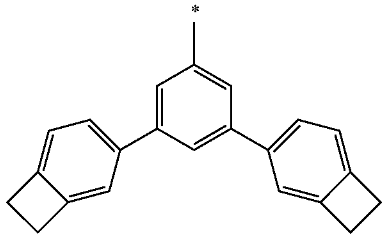

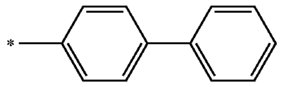

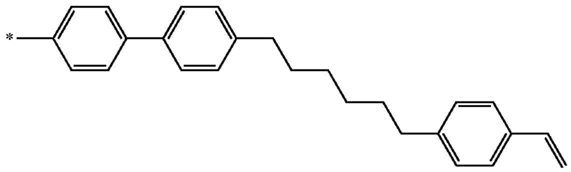

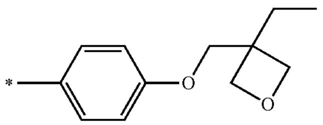

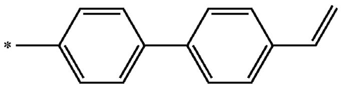

In the structure, * is an attachment point in the polymer.

More specifically, E1 and E2 are the same as or different from each other, and are each independently any one of the following structures.

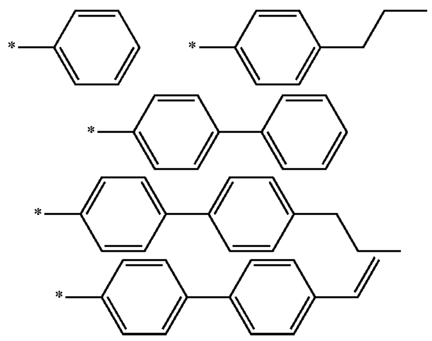

In the structure, * is an attachment point in the polymer.

In an exemplary embodiment of the present specification, a, b, and c are determined by the equivalent ratio of the monomers used in the preparation of the polymer.

In an exemplary embodiment of the present specification, a is a real number of 0.2 or higher.

In an exemplary embodiment of the present specification, a is a real number from 0.2 to 1.

In an exemplary embodiment of the present specification, a is a real number from 0.2 to 0.9.

In an exemplary embodiment of the present specification, b is a real number of 0 or higher.

In an exemplary embodiment of the present specification, b is a real number from 0 to 0.5.

In an exemplary embodiment of the present specification, b is a real number of more than 0 and 0.5 or lower.

In an exemplary embodiment of the present specification, b is a real number from 0.1 to 0.4.

In an exemplary embodiment of the present specification, c is a real number from 0 to 0.2.

In an exemplary embodiment of the present specification, c is a real number from 0 to 0.1.

In an exemplary embodiment of the present specification, c is 0.

In an exemplary embodiment of the present specification, a is a real number from 0.3 to 1, b is a real number from 0 to 0.5, and c is a real number from 0 to 0.2.

In an exemplary embodiment of the present specification, a is a real number from 0.3 to 1, b is a real number of more than 0 and 0.5 or lower, and c is a real number from 0 to 0.2.

In an exemplary embodiment of the present specification, a is a real number from 0.3 to 0.9, b is a real number from 0.1 to 0.4, and c is a real number from 0 to 0.2.

In the present specification, a, b, and c are not based on the mole fraction of the entire polymer represented by Chemical Formula 1 including E1 and E2, but are a mole fraction based on the sum of A1, B1 and C1.

In an exemplary embodiment of the present specification, the molar ratio of (A1+B1):(E1+E2) is 40:60 to 98:2.

An exemplary embodiment of the present specification provides a polymer including a unit represented by the following Chemical Formula 2; and an end group represented by the following Chemical Formula 5.

[Chemical Formula 2]

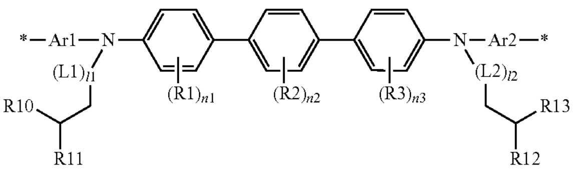

*-[E] [Chemical Formula 5]

In Chemical Formulae 2 and 5,

Ar1, Ar2, L1 and L2 are the same as or different from each other, and are each independently a substituted or unsubstituted arylene group, R1 to R3 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, R10 to R13 are the same as or different from each other, and are each independently a substituted or unsubstituted alkyl group, n1 to n3 are each independently an integer from 1 to 4, when n1 to n3 are each independently 2 or higher, the substituents in each parenthesis are the same as or different from each other, l1 and l2 are each independently an integer from 1 to 5, when l1 and l2 are each independently 2 or higher, the substituents in each parenthesis are the same as or different from each other, E is hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, and

* is an attachment point in the polymer.

In an exemplary embodiment of the present specification, the polymer represented by Chemical Formula 1 may be represented by a polymer including the unit represented by Chemical Formula 2; and the end group represented by Chemical Formula 5. Specifically, when b and c of Chemical Formula 1 are 0, the polymer represented by Chemical Formula 1 may be represented by a polymer including the unit represented by Chemical Formula 2; and the end group represented by Chemical Formula 5.

In an exemplary embodiment of the present specification, the polymer including the unit represented by Chemical Formula 2; and the end group represented by Chemical Formula 5 further includes a unit represented by the following Chemical Formula 3.

$Z\text{-}[Y\text{—}*]_m$ [Chemical Formula 3]

In Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; deuterium; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

That is, an exemplary embodiment of the present specification provides a polymer including the unit represented by Chemical Formula 2; the unit represented by Chemical Formula 3; and the end group represented by Chemical Formula 5.

In this case, the polymer represented by Chemical Formula 1 may be represented by a polymer including the unit represented by Chemical Formula 2; the unit represented by Chemical Formula 3; and the end group represented by Chemical Formula 5.

Specifically, when b of Chemical Formula 1 is a real number of more than 0 and less than 1 and c is 0, the polymer represented by Chemical Formula 1 may be represented by a polymer including the unit represented by Chemical Formula 2; the unit represented by Chemical Formula 3; and the end group represented by Chemical Formula 5.

In an exemplary embodiment of the present specification, the polymer including the unit represented by Chemical Formula 2; and the end group represented by Chemical Formula 5 further includes a unit represented by the following Chemical Formula 4.

*—[C1]-* [Chemical Formula 4]

In Chemical Formula 4,

C1 is a substituted or unsubstituted arylene group; or a substituted or unsubstituted divalent heterocyclic group, and

* is an attachment point in the polymer.

That is, an exemplary embodiment of the present specification provides a polymer including the unit represented by Chemical Formula 2; the unit represented by Chemical Formula 4; and the end group represented by Chemical Formula 5.

In this case, the polymer represented by Chemical Formula 1 may be represented by a polymer including the unit represented by Chemical Formula 2; the unit represented by Chemical Formula 4; and the end group represented by Chemical Formula 5.

Specifically, when b of Chemical Formula 1 is 0 and c is a real number of more than 0 and less than 1, the polymer represented by Chemical Formula 1 may be represented by a polymer including the unit represented by Chemical Formula 2; the unit represented by Chemical Formula 4; and the end group represented by Chemical Formula 5.

Further, an exemplary embodiment of the present specification provides a polymer including the unit represented by Chemical Formula 2; the unit represented by Chemical Formula 3; the unit represented by Chemical Formula 4; and the end group represented by Chemical Formula 5.

In this case, the polymer represented by Chemical Formula 1 may be represented by a polymer including the unit represented by Chemical Formula 2; the unit represented by Chemical Formula 3; the unit represented by Chemical Formula 4; and the end group represented by Chemical Formula 5.

Specifically, when b and c of Chemical Formula 1 are each a real number of more than 0 and less than 1, the polymer represented by Chemical Formula 1 may be represented by a polymer including the unit represented by Chemical Formula 2; the unit represented by Chemical Formula 3; the unit represented by Chemical Formula 4; and the end group represented by Chemical Formula 5.

In an exemplary embodiment of the present specification, the above-described description on Chemical Formula 2 in Chemical Formula 1 is equally applied to the description on Chemical Formula 2 of the polymer including the unit represented by Chemical Formula 2; and the end group represented by Chemical Formula 5. For example, in the polymer including the unit represented by Chemical Formula 2; and the end group represented by Chemical Formula 5, Chemical Formula 2 may be represented by Chemical Formula 2-1 or Chemical Formula 2-2.

In an exemplary embodiment of the present specification, when the polymer including the unit represented by Chemical Formula 2; and the end group represented by Chemical Formula 5 further includes a unit represented by Chemical Formula 3, the above-described description on Chemical Formula 3 in Chemical Formula 1 is equally applied to the description on Chemical Formula 3. For example, in the polymer including the unit represented by Chemical Formula 2; the unit represented by Chemical Formula 3; and the end group represented by Chemical Formula 5, Chemical Formula 3 may be represented by any one of Chemical Formulae 3-1 to 3-4.

The description on Chemical Formulae 2 and 3 is equally applied even to a polymer including the unit represented by Chemical Formula 2; the unit represented by Chemical Formula 3; the unit represented by Chemical Formula 4; and the end group represented by Chemical Formula 5.

In an exemplary embodiment of the present specification, when the polymer including the unit represented by Chemical Formula 2; and the end group represented by Chemical Formula 5 further includes Chemical Formula 4, the definition of C1 defined in Chemical Formula 1 is equally applied to the description on C1 of Chemical Formula 4. For example, in the polymer including the unit represented by Chemical Formula 2; the unit represented by Chemical Formula 4; and the end group represented by Chemical Formula 5, C1 of Chemical Formula 4 is any one of the following structures.

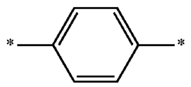
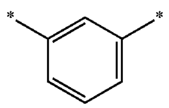
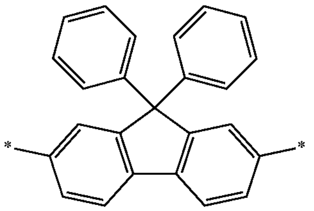
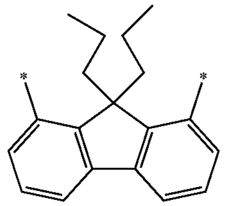
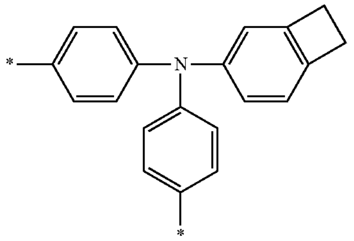

-continued

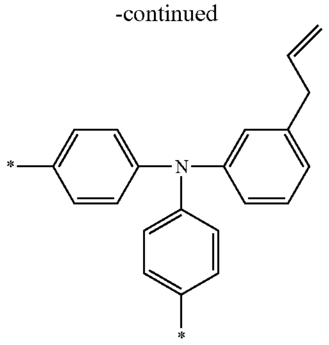

The description on C1 is equally applied even to a polymer including the unit represented by Chemical Formula 2; the unit represented by Chemical Formula 3; the unit represented by Chemical Formula 4; and the end group represented by Chemical Formula 5.

In an exemplary embodiment of the present specification, in the polymer including the unit represented by Chemical Formula 2; and the end group represented by Chemical Formula 5, the description on E1 of Chemical Formula 1 is equally applied to E of Chemical Formula 5. For example, in the polymer including the unit represented by Chemical Formula 2; and the end group represented by Chemical Formula 5, E is an end-capping unit of the polymer.

In an exemplary embodiment of the present specification, E is a cross-linkable group; or any one of the following structures.

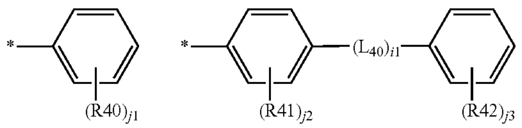

In the structures,

R40 to R42 are the same as or different from each other, and are each independently hydrogen; deuterium; a substituted or unsubstituted alkyl group; a substituted or unsubstituted aryl group; a substituted or unsubstituted heterocyclic group; or a cross-linkable group, L40 is a direct bond; a substituted or unsubstituted alkylene group; or a substituted or unsubstituted arylene group, i1 is an integer from 1 to 10, j1 and j3 are each independently an integer from 1 to 5, j2 is an integer from 1 to 4, when i1 is 2 or higher, two or more L40's are the same as or different from each other, when j1 to j3 are each independently 2 or higher, the substituents in each parenthesis are the same as or different from each other, and

* is an attachment point in the polymer.

The description on E is equally applied even to a polymer including the unit represented by Chemical Formula 2; the unit represented by Chemical Formula 3; and the end group represented by Chemical Formula 5. Further, the description on E is equally applied even to a polymer including the unit represented by Chemical Formula 2; the unit represented by Chemical Formula 3; the unit represented by Chemical Formula 4; and the end group represented by Chemical Formula 5.

In an exemplary embodiment of the present specification, the polymer is an alternating polymer, a block polymer, or a random polymer.

In an exemplary embodiment of the present specification, Chemical Formula 1 does not mean that A1, B1 and C1 are only in this order in the polymer. Specifically, A1, B1 and C1 may be in various orders in the polymer. For example, the polymer may be in the order of E1-A1-B1-C1-E2, E1-A1-C1-B1-E2, E1-B1-A1-C1-E2, E1-B1-C1-A1-E2, E1-C1-A1-B1-E2 or E1-C1-B1-A1-E2.

In addition, Chemical Formula 1 does not have a structure in which only each one of A1, B1 and C1 is linked in the polymer. For example, the polymer may be linked in various content ranges in the polymer, such as E1-A1-B1-A1-C1-E2, E1-A1-C1-B1-C1-E2, and E1-A1-B1-C1-A1-E2. In this case, the content range of A1, B1 and C1 is determined by the equivalent ratio of the monomers used during the preparation of the polymer.

In an exemplary embodiment of the present specification, the polymer has a weight average molecular weight (Mw) of 25,000 g/mol to 1,000,000 g/mol. Specifically, the polymer has a weight average molecular weight (Mw) of 50,000 g/mol to 500,000 g/mol. More specifically, the polymer has a weight average molecular weight (Mw) of 50,000 g/mol to 140,000 g/mol.

When the weight average molecular weight of the polymer satisfies the above range, the viscosity is appropriate to show an effect of facilitating the manufacture of an inkjet device and the manufacture of an organic light emitting device using fine pixels.

In an exemplary embodiment of the present specification, the unit represented by Chemical Formula 2, the unit represented by Chemical Formula 3, the unit represented by Chemical Formula 4, and the end group represented by Chemical Formula 5 may be distributed so as to optimize the characteristics of the polymer.

In an exemplary embodiment of the present specification, when the mole fraction of the unit represented by Chemical Formula 2, the mole fraction of the unit represented by Chemical Formula 3, the mole fraction of the unit represented by Chemical Formula 4, and the mole fraction of the unit represented by Chemical Formula 5 in the polymer are defined as al, b1, c1, and e1, respectively, al, b1, c1, and e1 are each a real number, $0<a1<1$, $0\leq b1<1$, $0\leq c1<1$, $0<e1<1$, and $a1+b1+c1+e1=1$.

In an exemplary embodiment of the present specification, al is a real number of 0.2 or higher.

In an exemplary embodiment of the present specification, al is a real number of 0.2 or higher and less than 1.

In an exemplary embodiment of the present specification, al is a real number from 0.2 to 0.9.

In an exemplary embodiment of the present specification, al is a real number from 0.25 to 0.85.

In an exemplary embodiment of the present specification, b1 is a real number of 0 or higher.

In an exemplary embodiment of the present specification, b1 is a real number from 0 to 0.5.

In an exemplary embodiment of the present specification, b1 is a real number of more than 0 and 0.5 or lower.

In an exemplary embodiment of the present specification, b1 is a real number from 0.1 to 0.4.

In an exemplary embodiment of the present specification, c1 is a real number from 0 to 0.2.

In an exemplary embodiment of the present specification, c1 is a real number from 0 to 0.1.

In an exemplary embodiment of the present specification, c1 is 0.

In an exemplary embodiment of the present specification, e1 is a real number from 0.1 to 0.5.

In an exemplary embodiment of the present specification, e1 is a real number from 0.1 to 0.4.

In an exemplary embodiment of the present specification, al is a real number of 0.2 or higher and less than 1, b1 is a real number from 0 to 0.5, c1 is a real number from 0 to 0.2, e1 is a real number from 0.1 to 0.5, and a1+b1+c1+e1=1.

In an exemplary embodiment of the present specification, al is a real number of 0.2 or higher and less than 1, b1 is a real number of more than 0 and 0.5 or lower, c1 is a real number from 0 to 0.2, e1 is a real number from 0.1 to 0.5, and a1+b1+c1+e1=1.

In an exemplary embodiment of the present specification, al is a real number from 0.2 to 0.9, b1 is a real number from 0.1 to 0.4, c1 is a real number from 0 to 0.2, e1 is a real number from 0.1 to 0.5, and a1+b1+c1+e1=1.

In an exemplary embodiment of the present specification, al is a real number from 0.25 to 0.85, b1 is a real number from 0.1 to 0.4, c1 is a real number from 0 to 0.1, e1 is a real number from 0.1 to 0.4, and a1+b1+c1+e1=1.

In an exemplary embodiment of the present specification, the polymer is any one of the following structures.

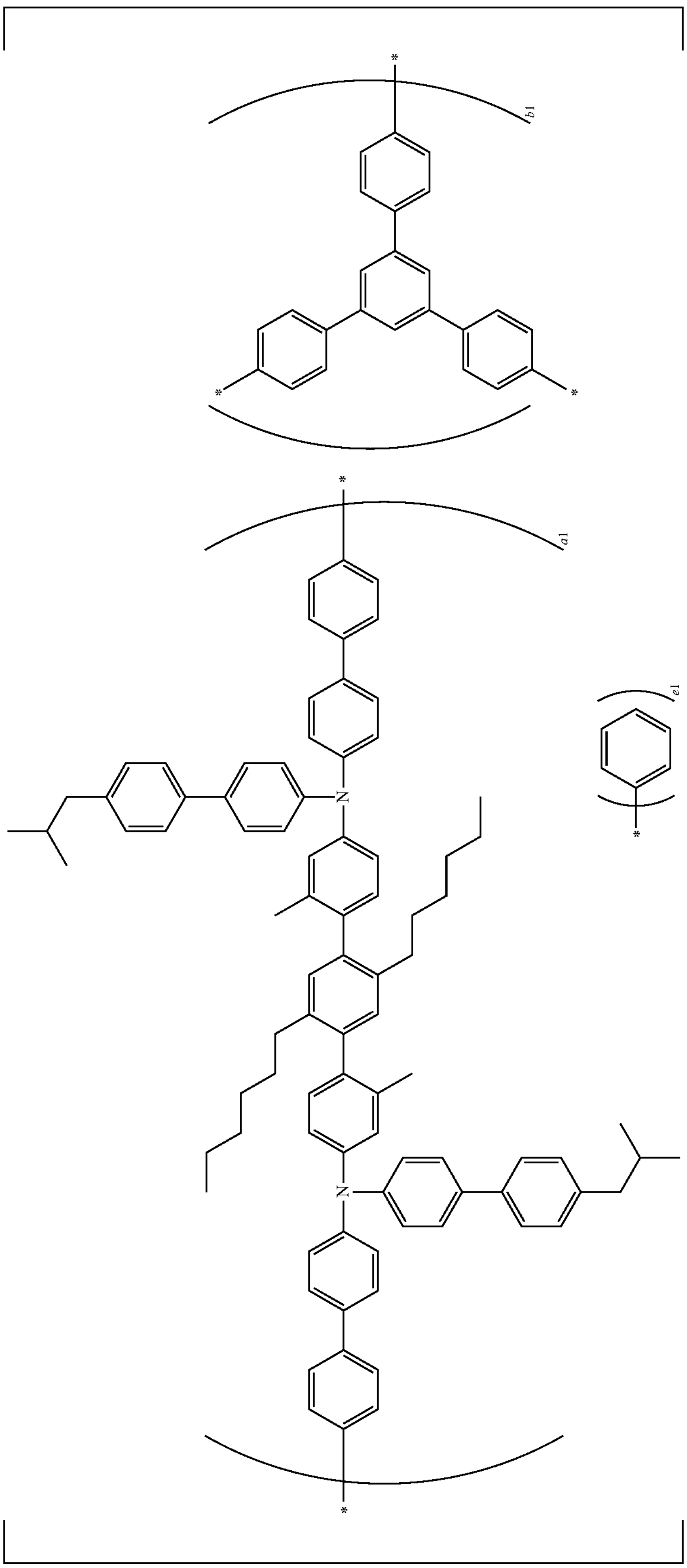
b1
a1
e1

-continued
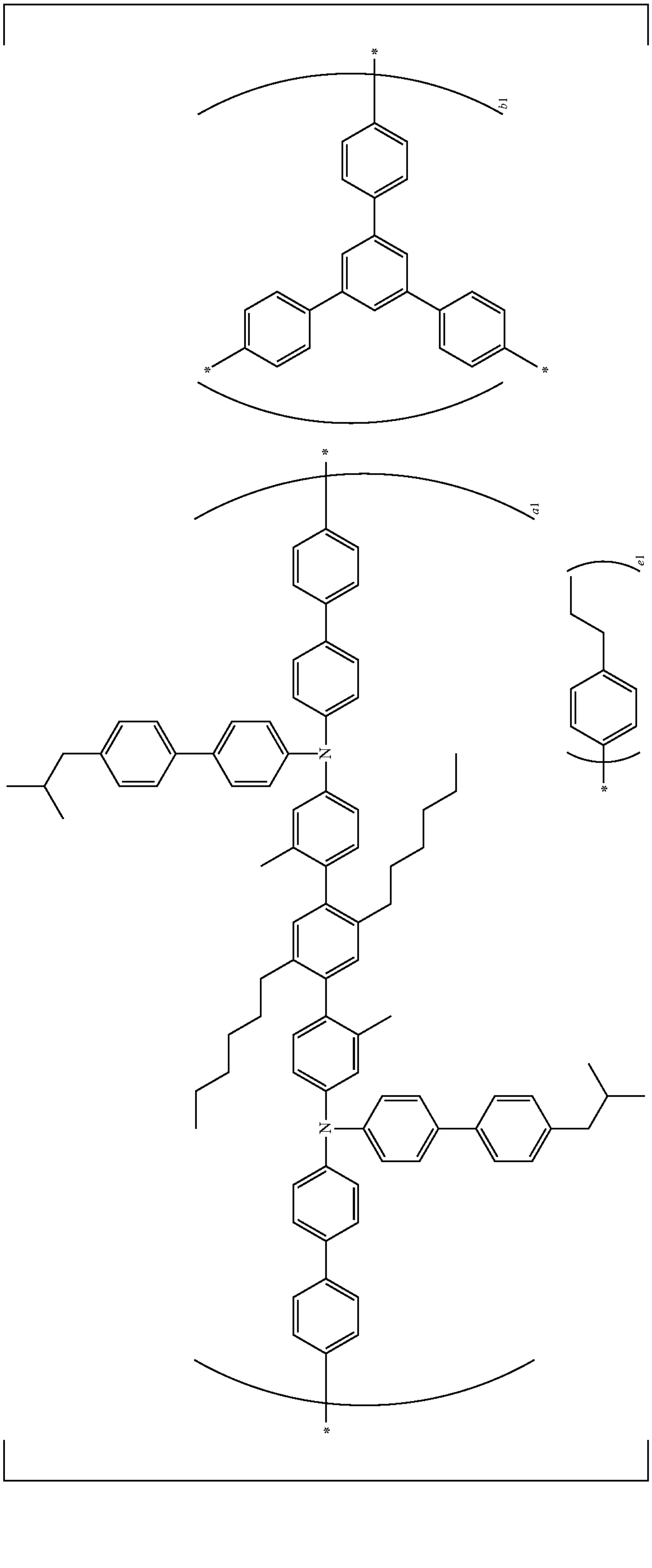

-continued
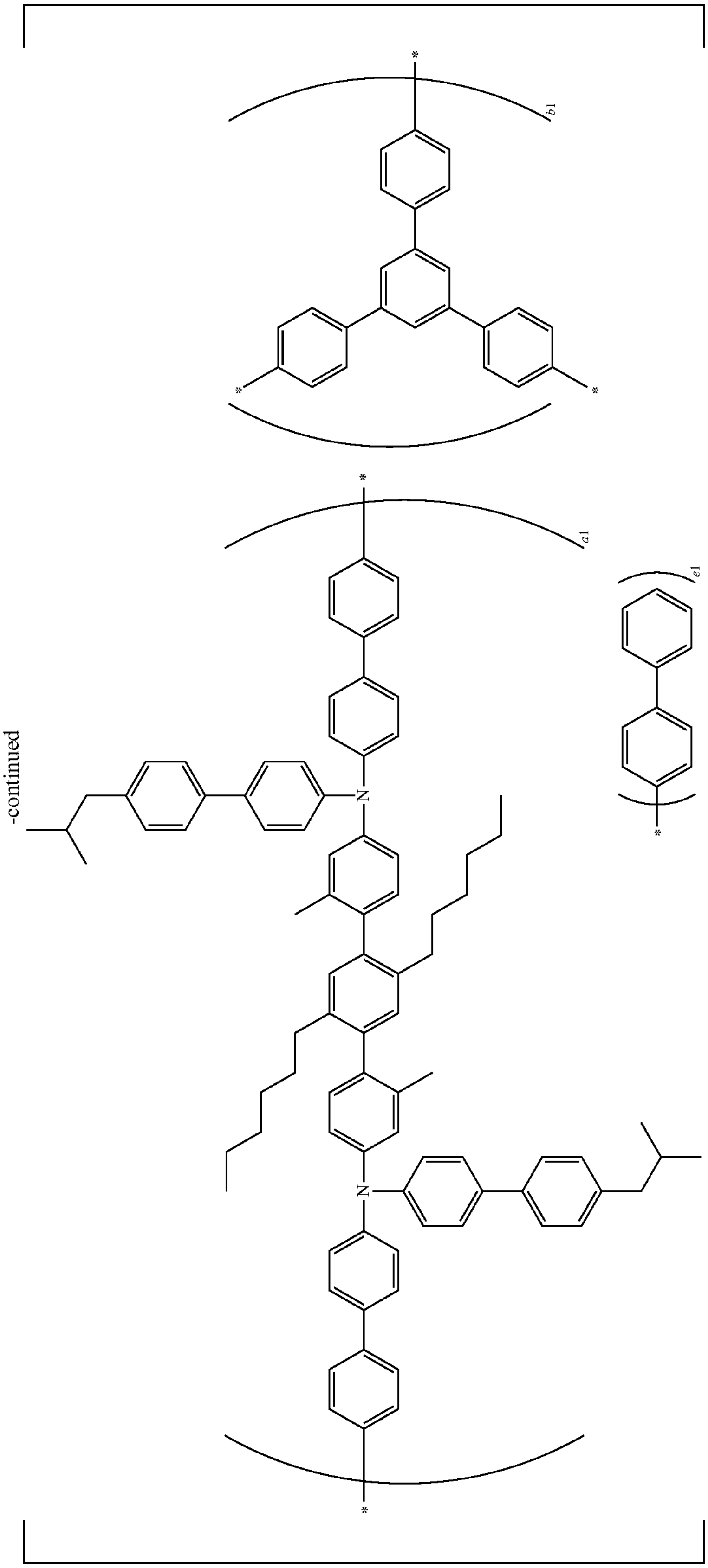

-continued
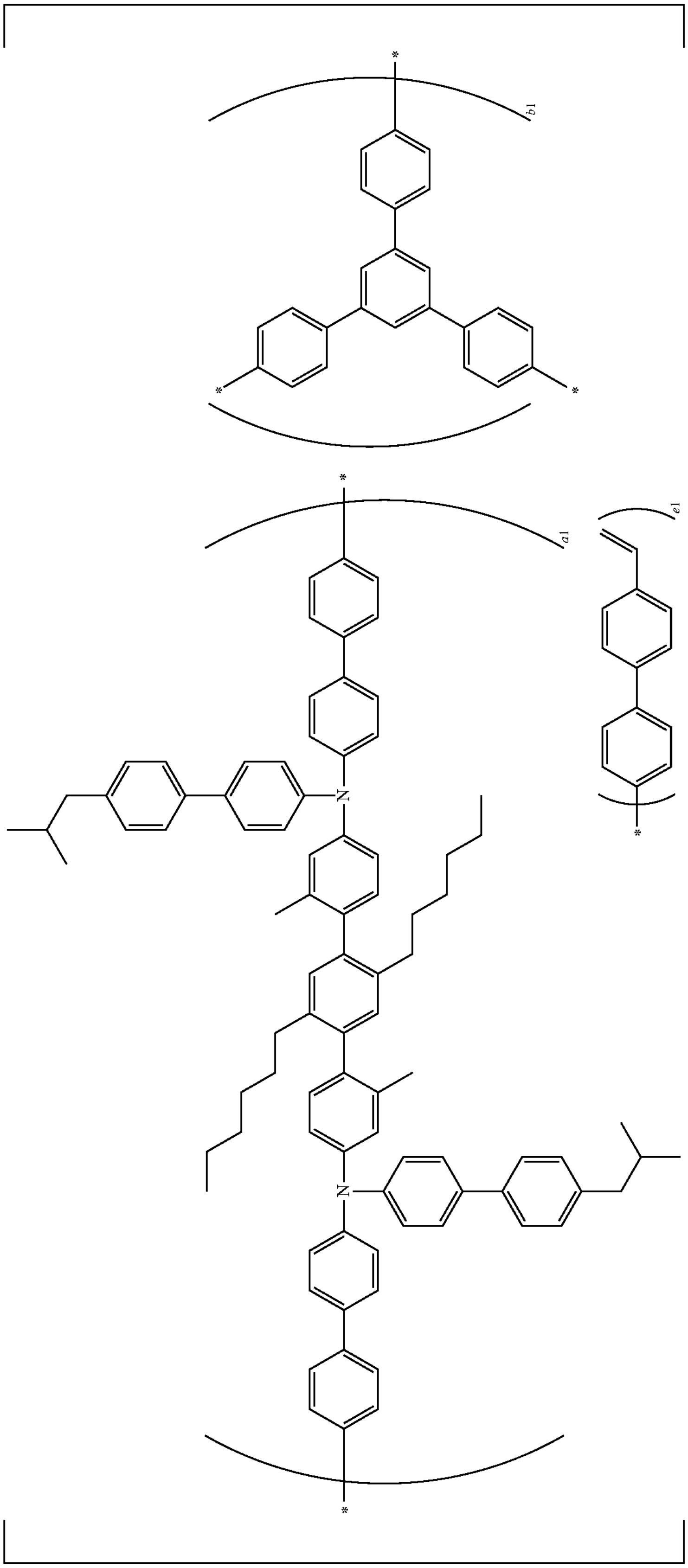

-continued
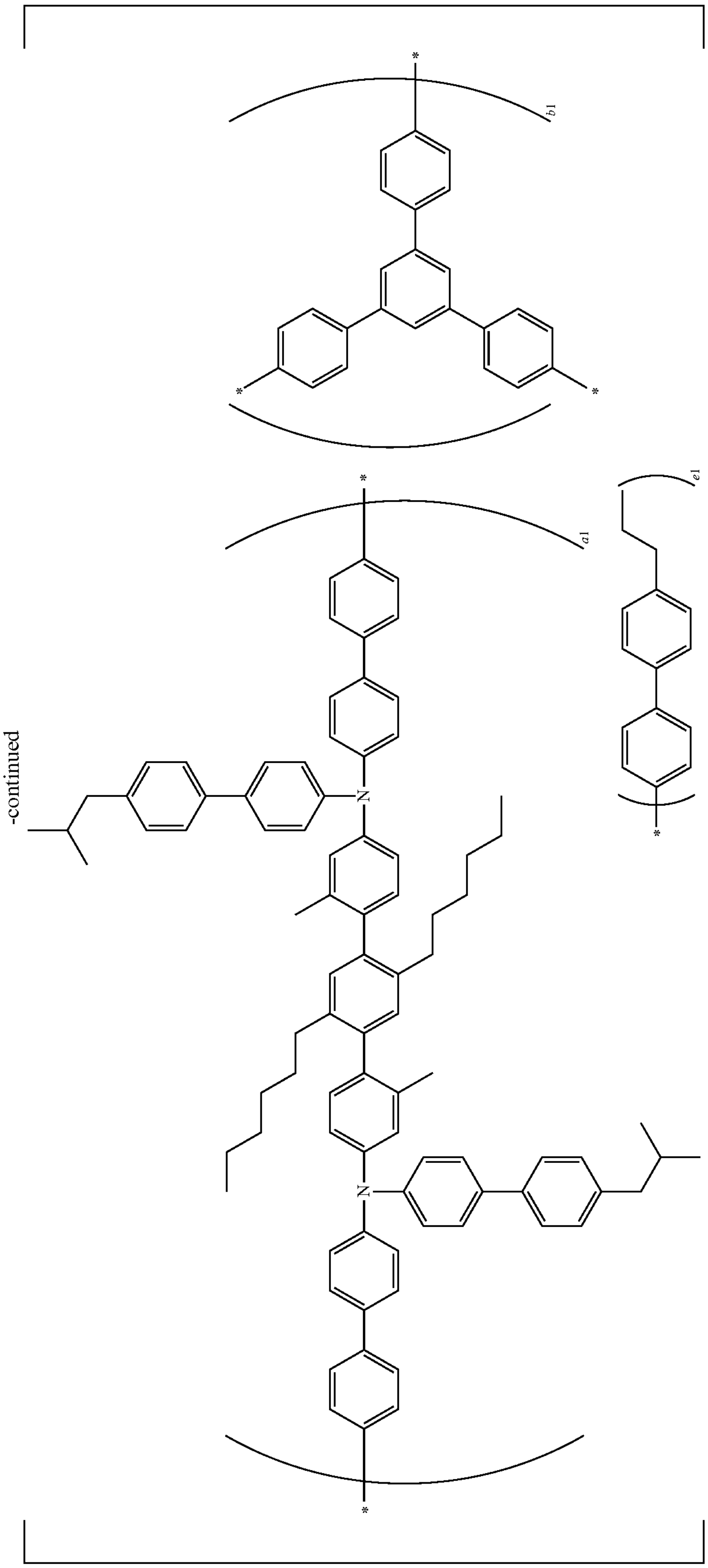

-continued
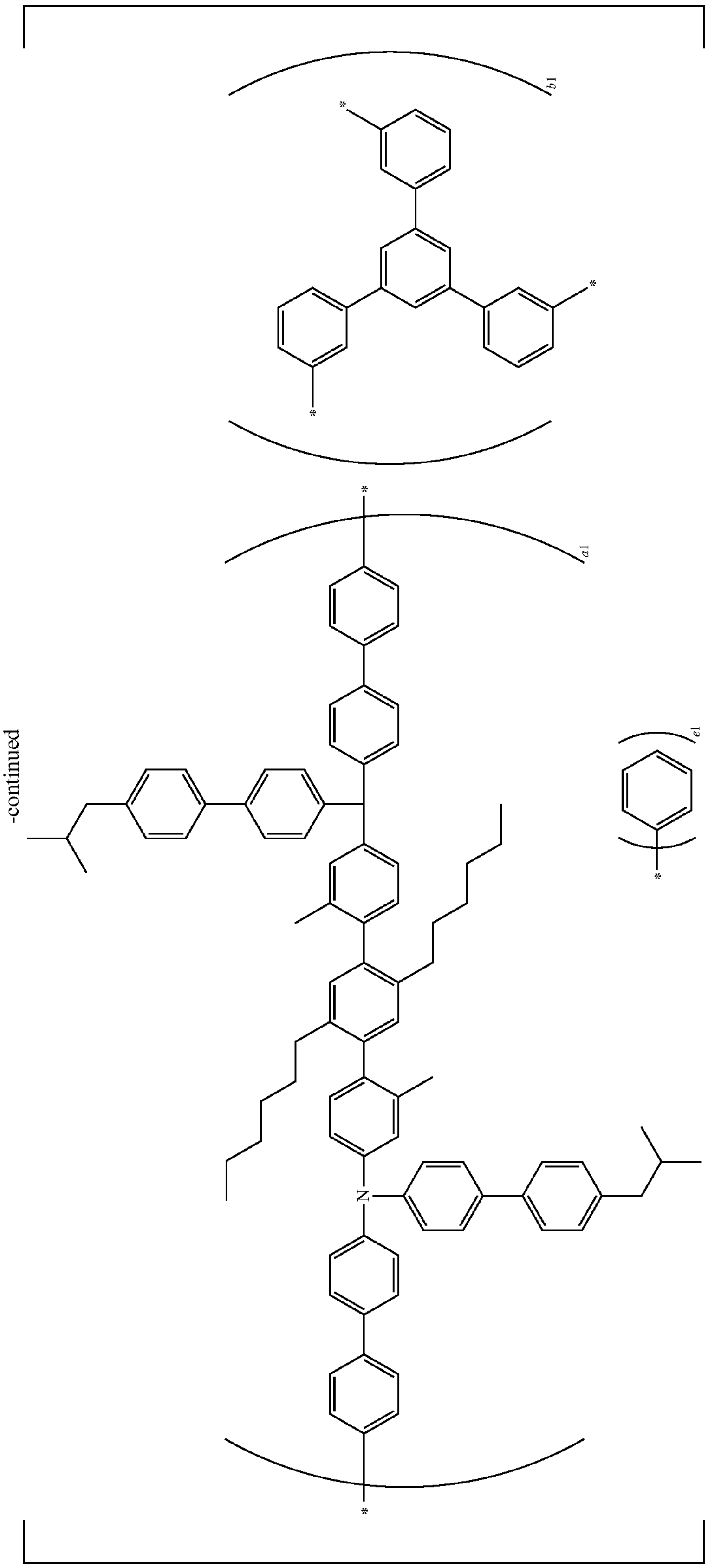

-continued
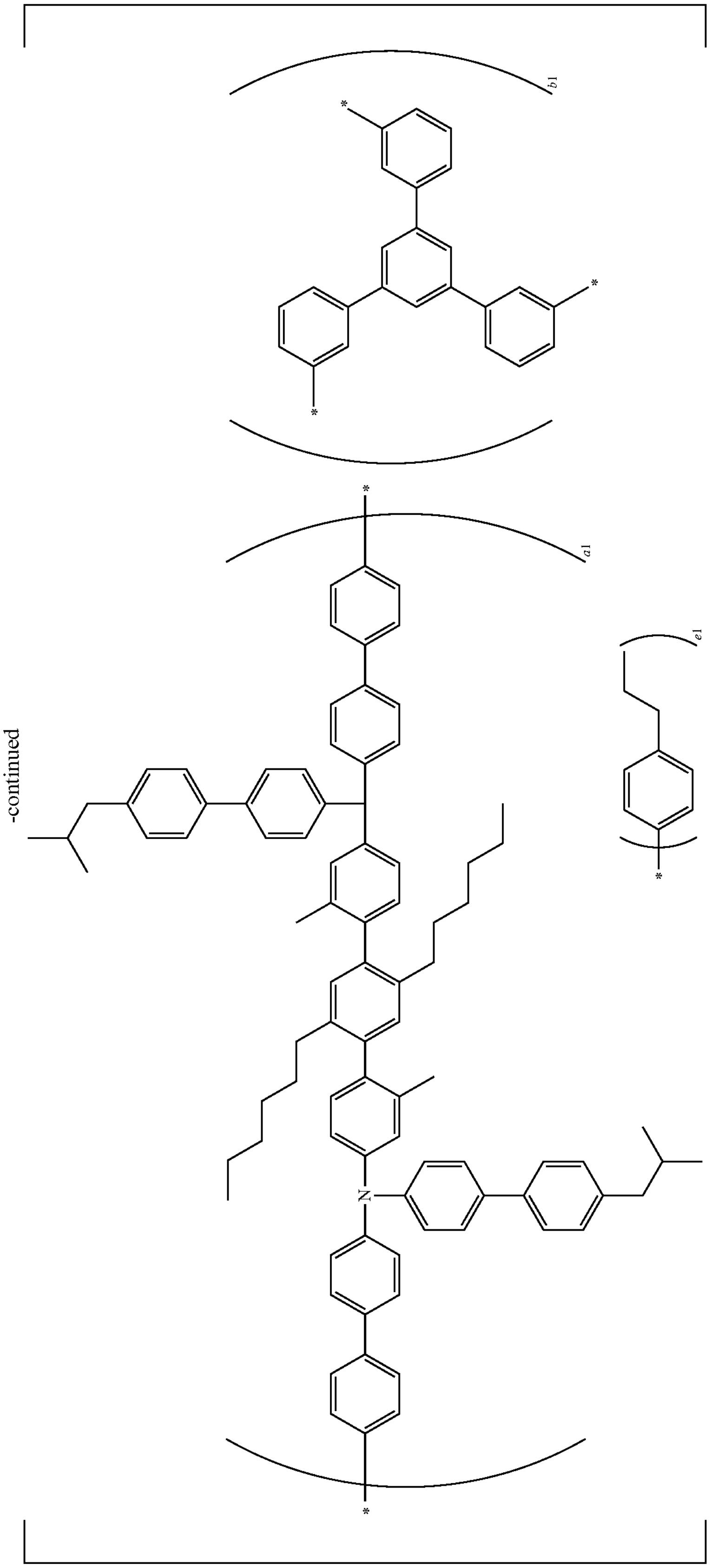

-continued
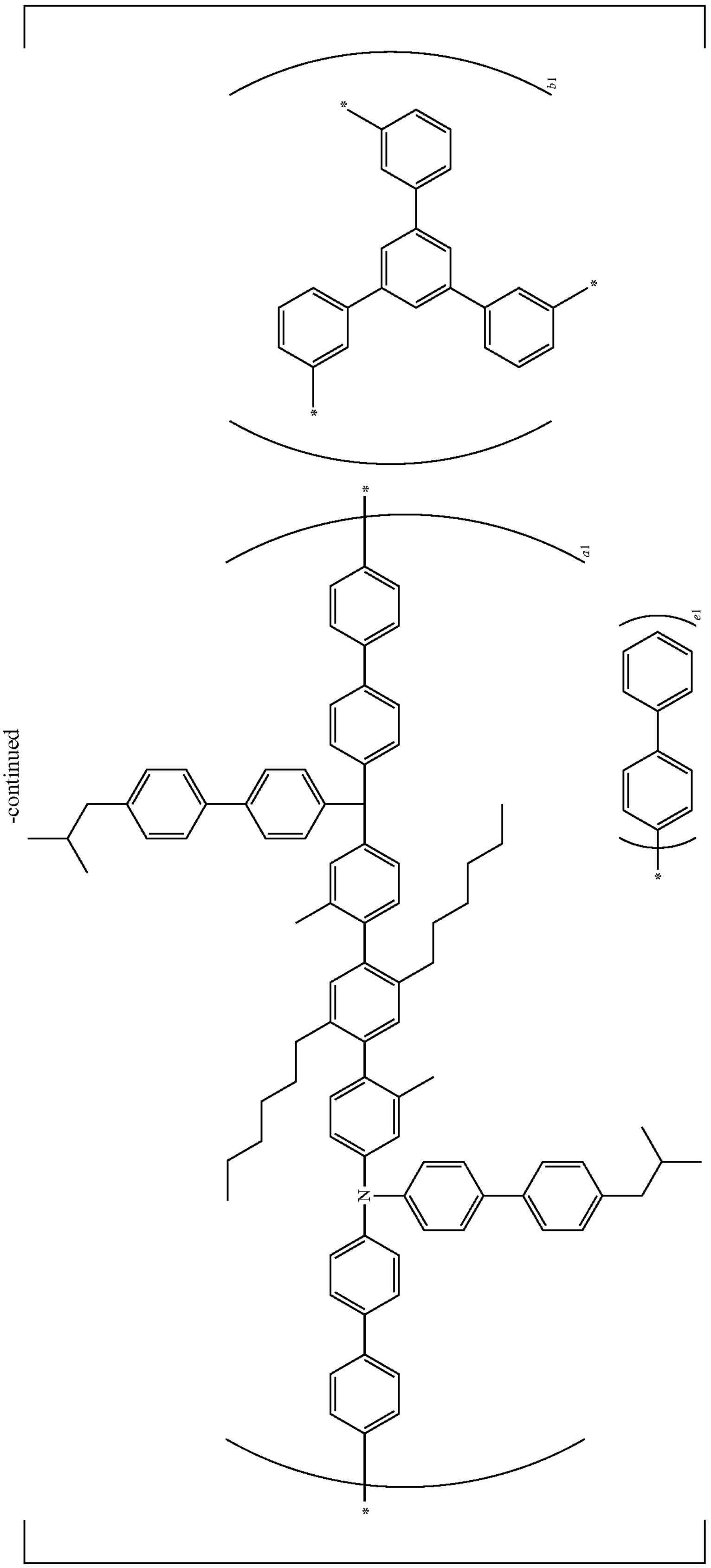

-continued
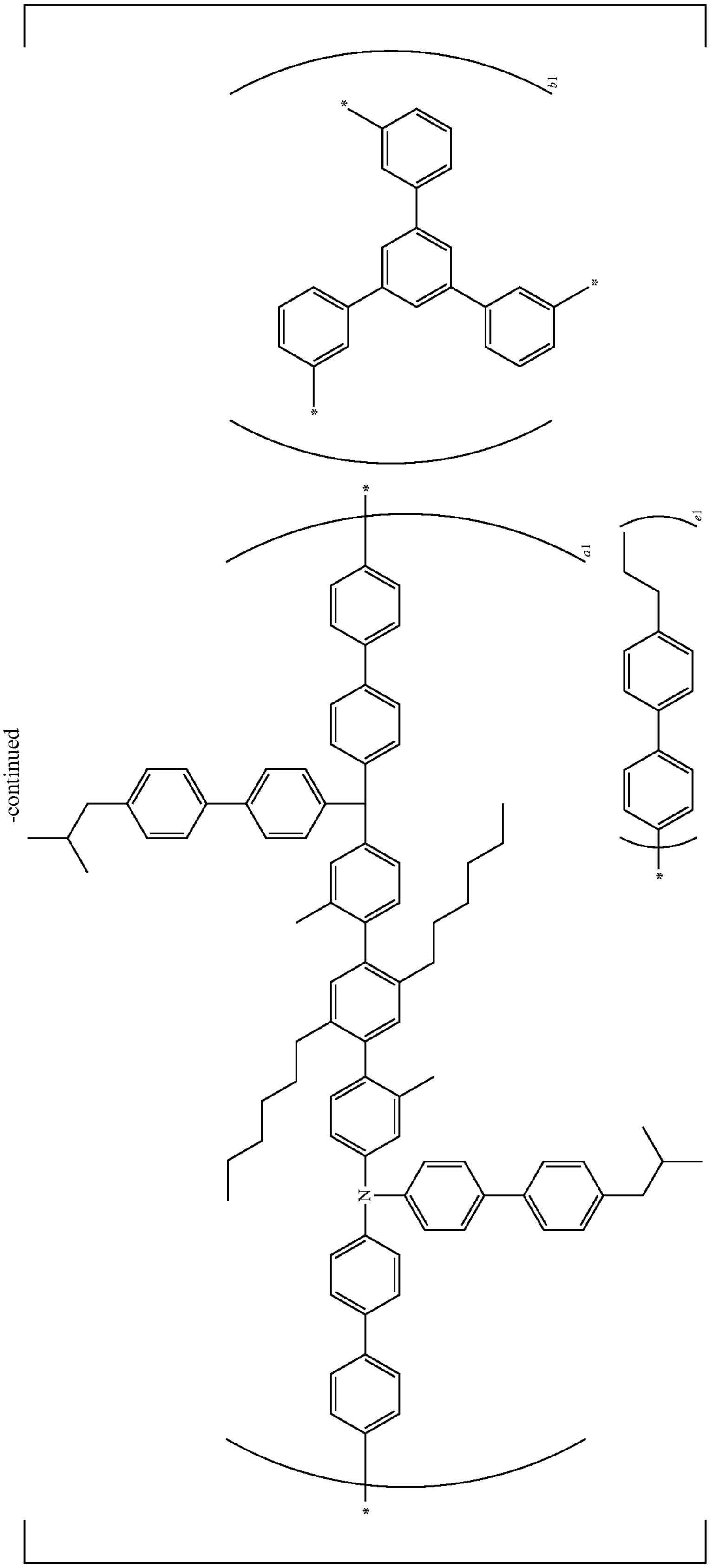

-continued
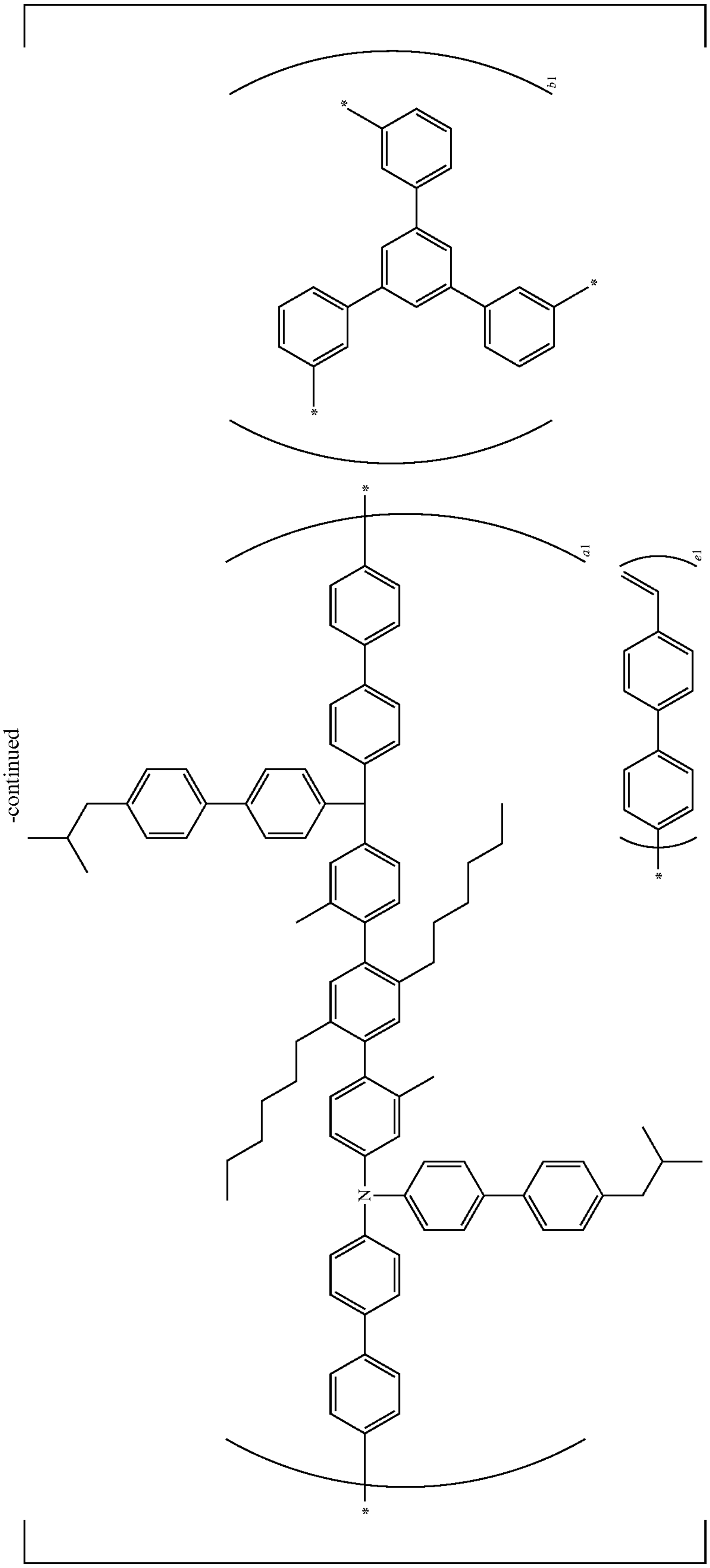

-continued
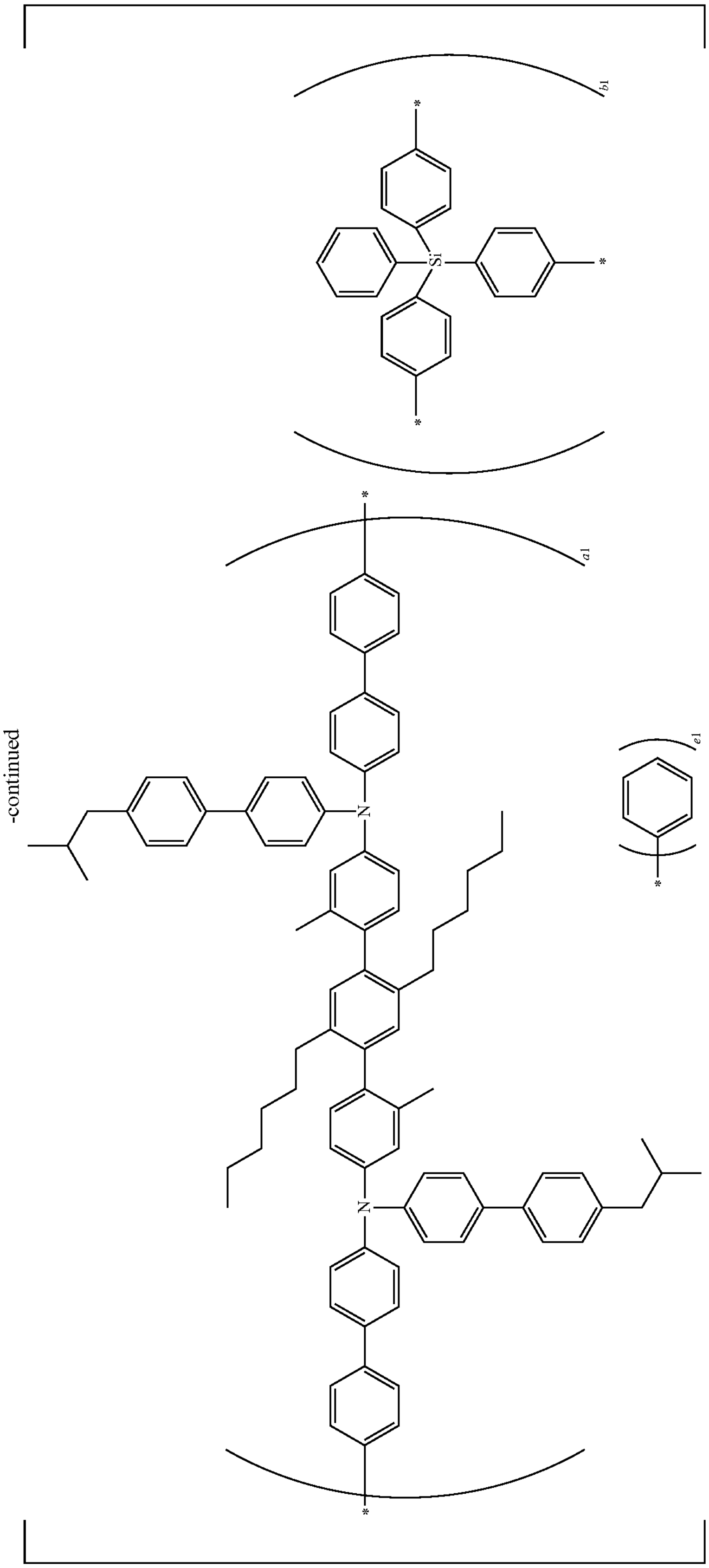

-continued
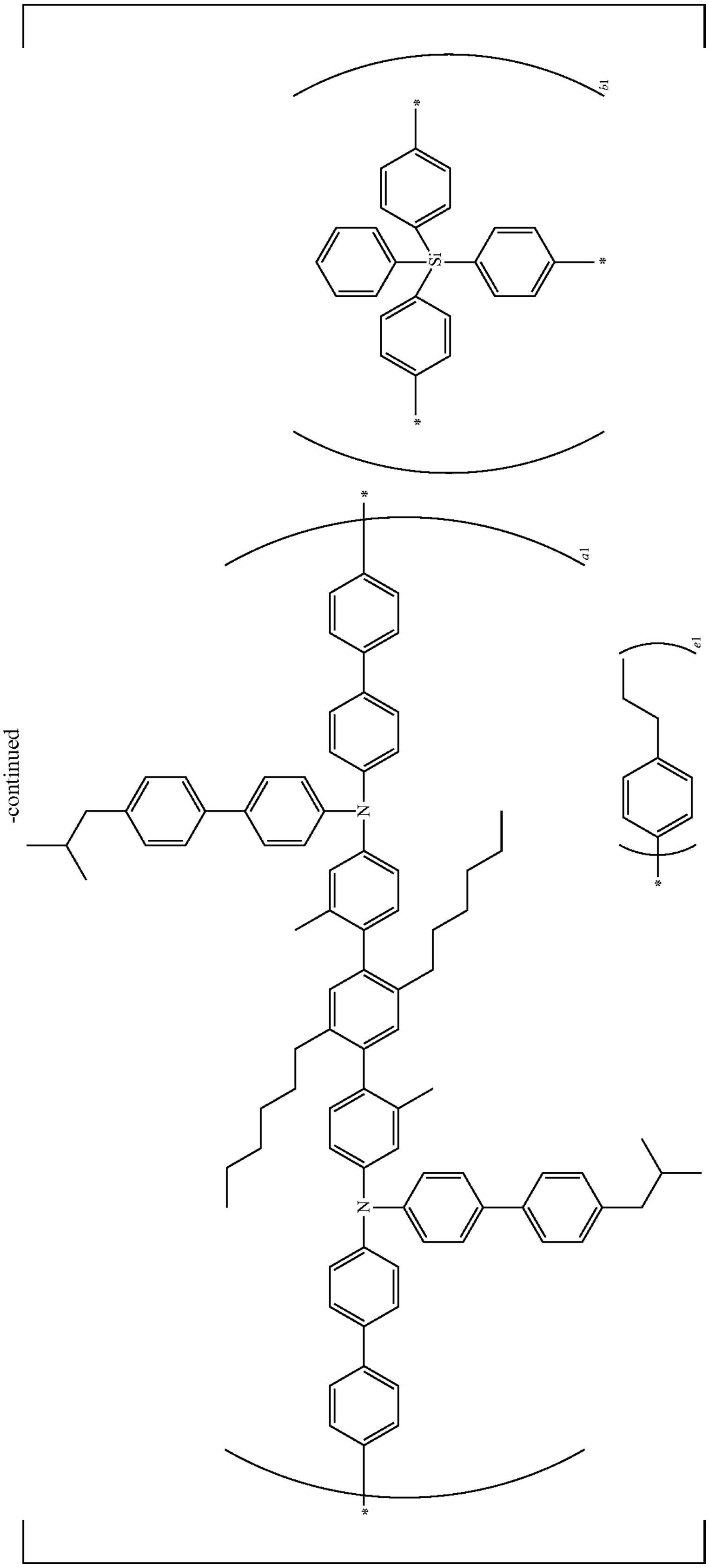

-continued
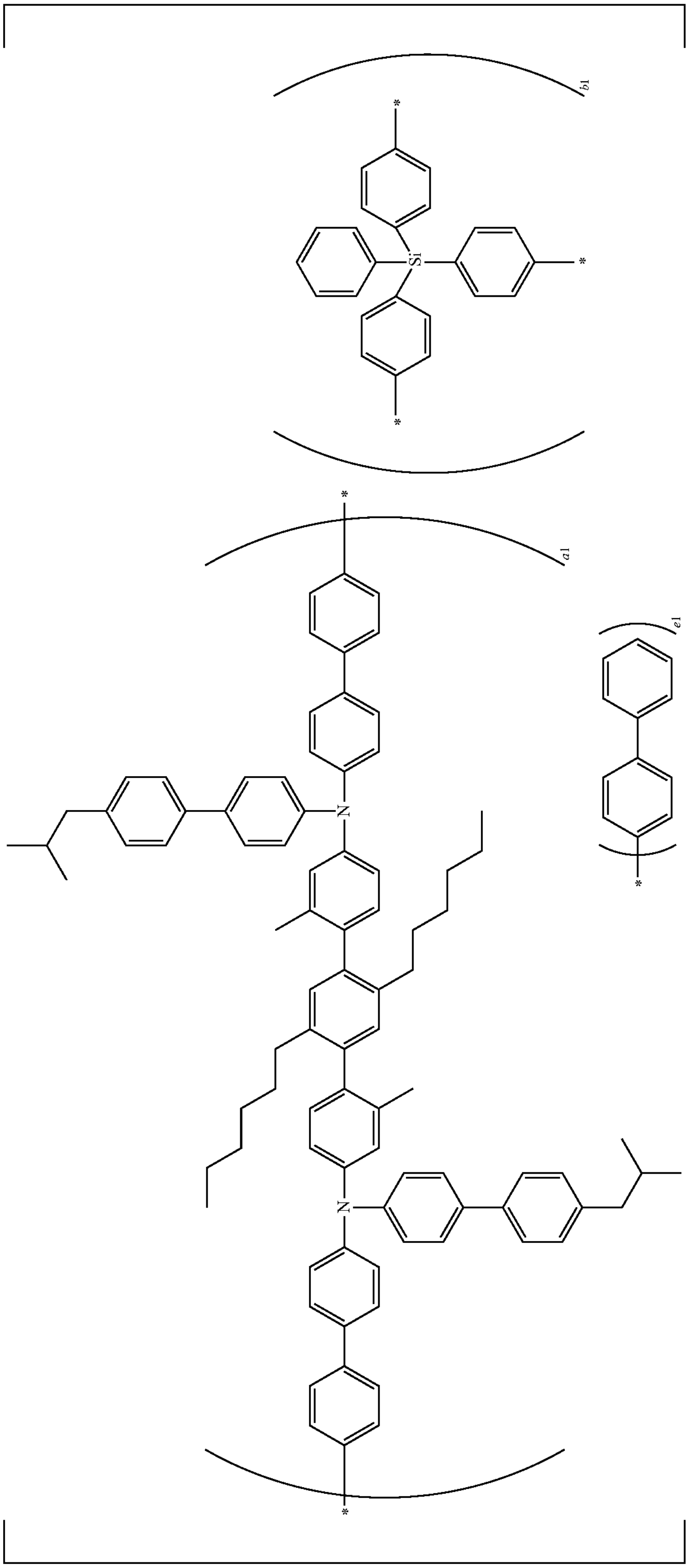

-continued
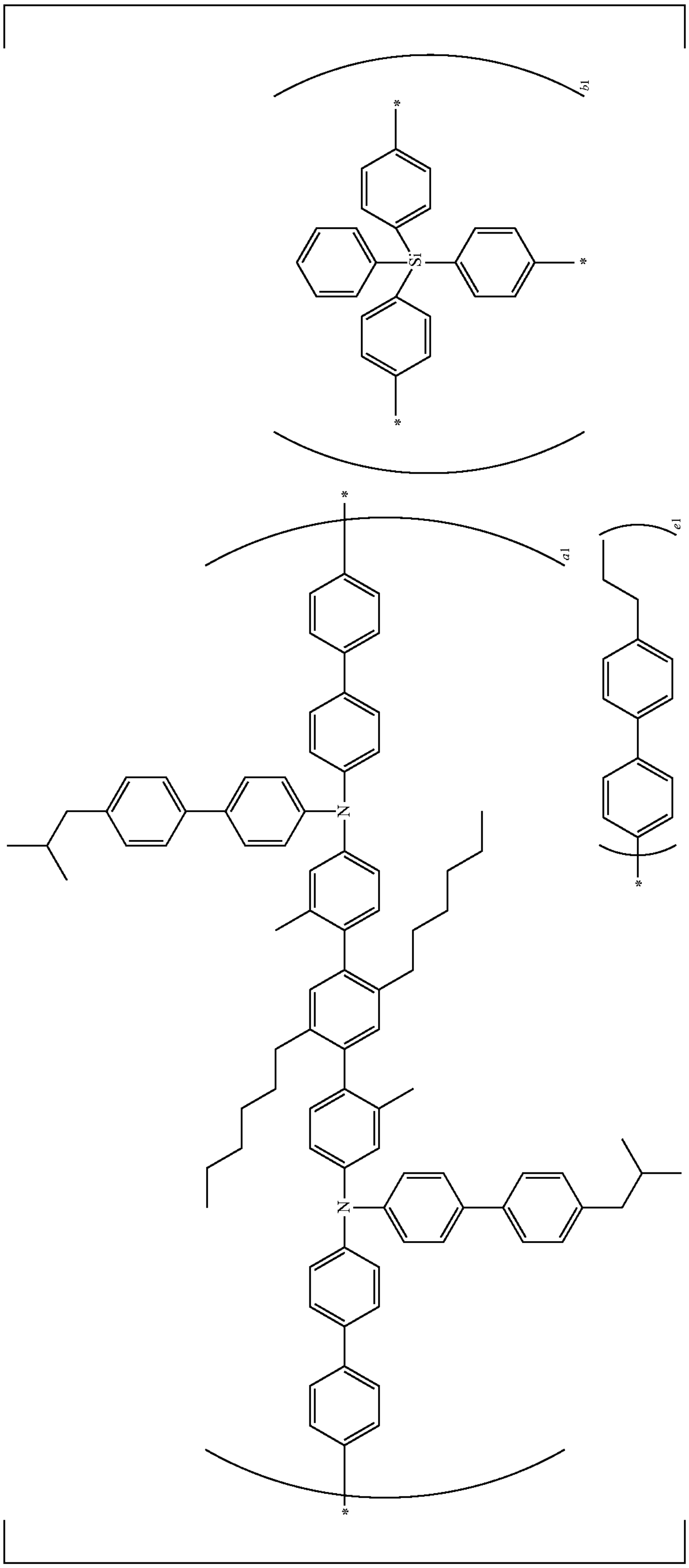

-continued
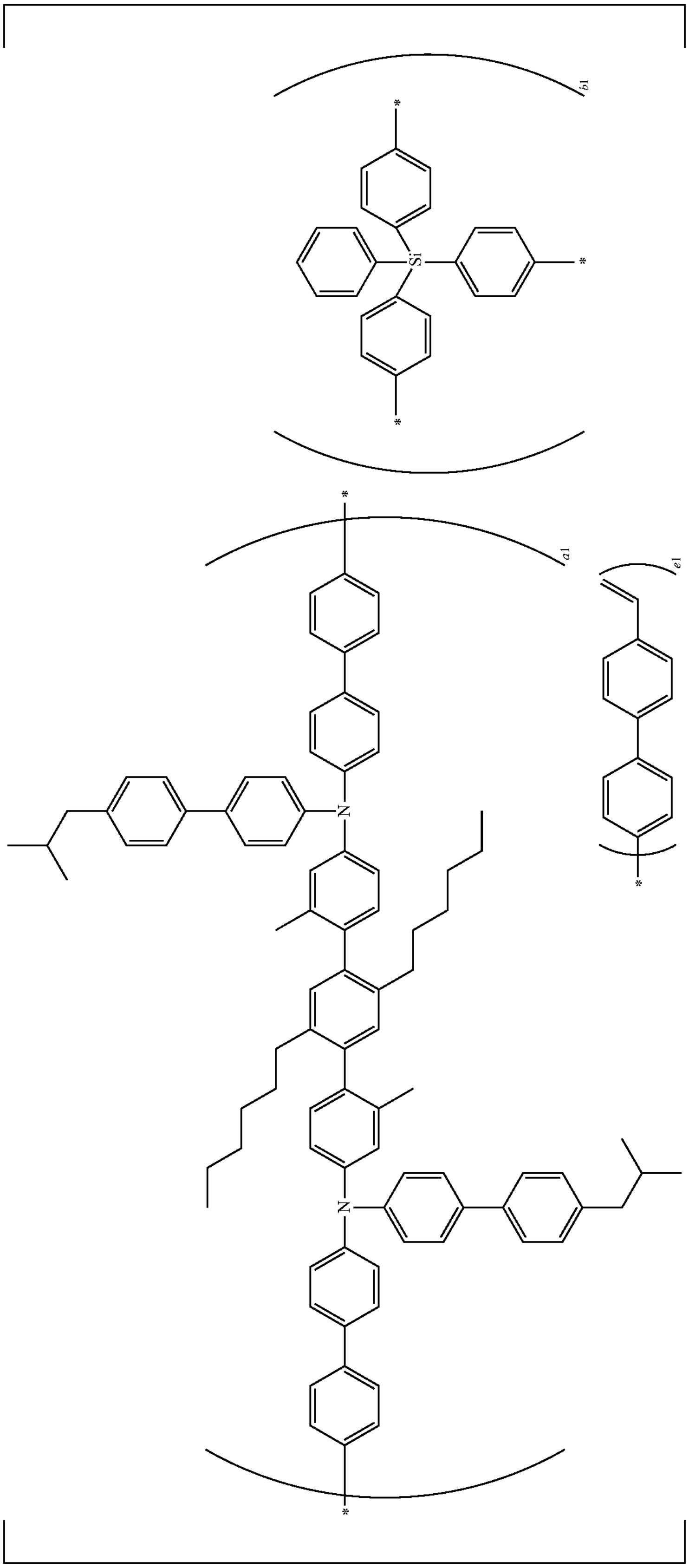

-continued
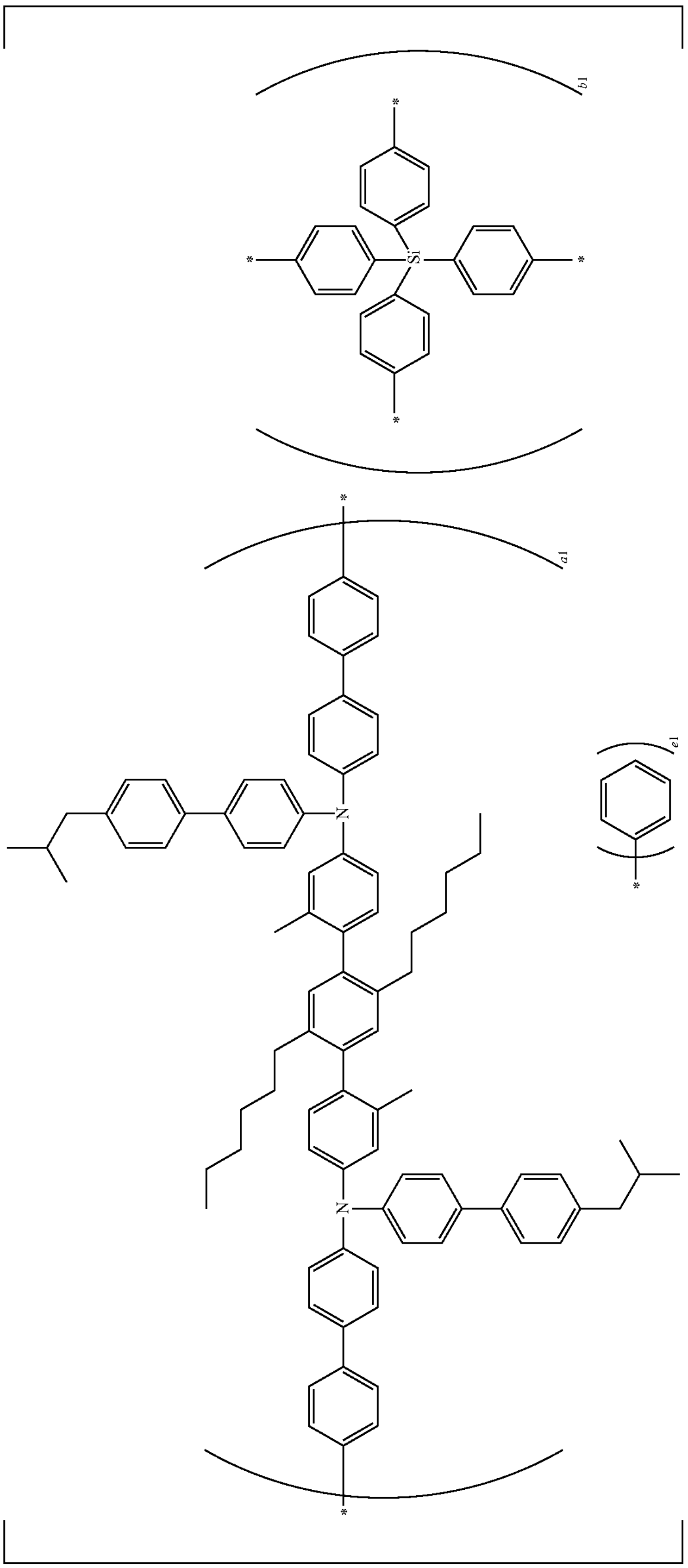

-continued
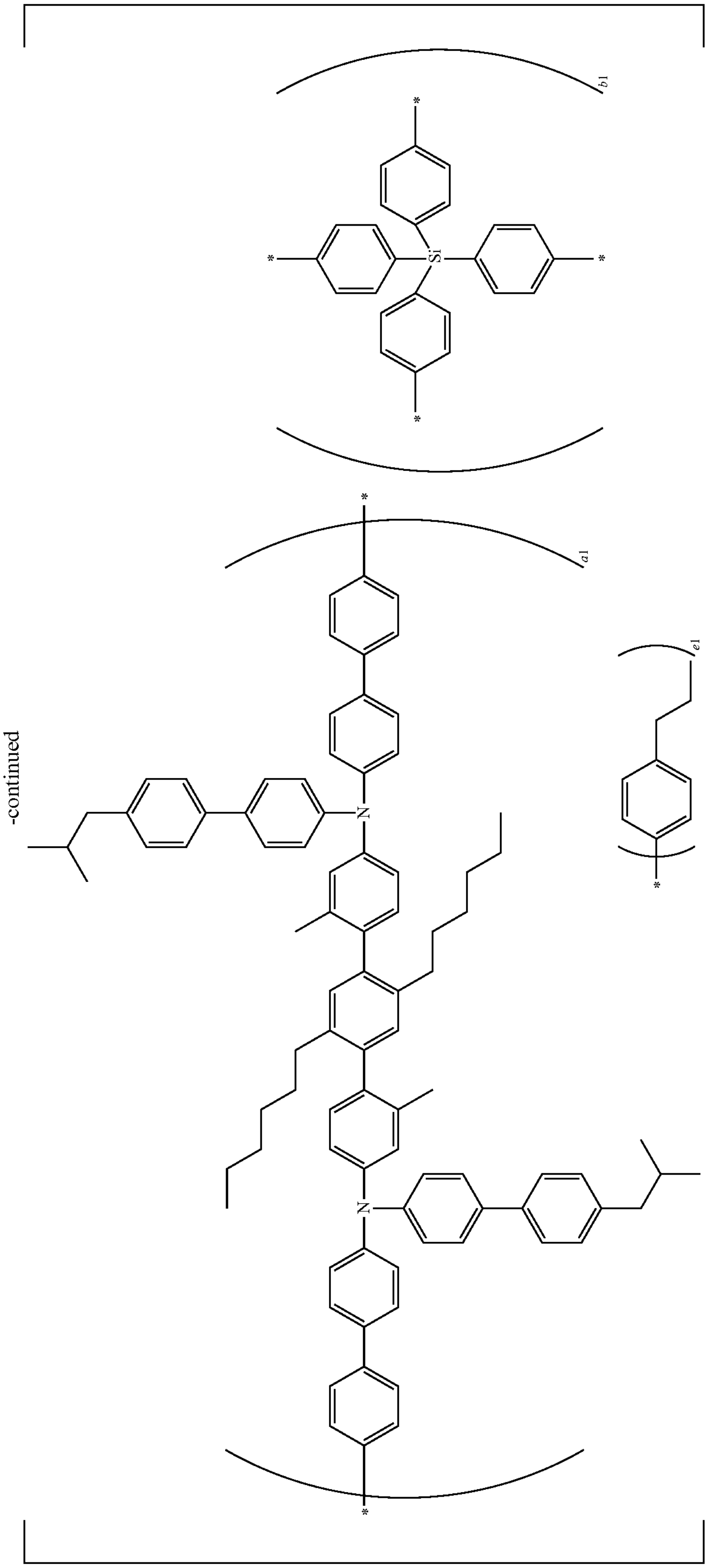

-continued
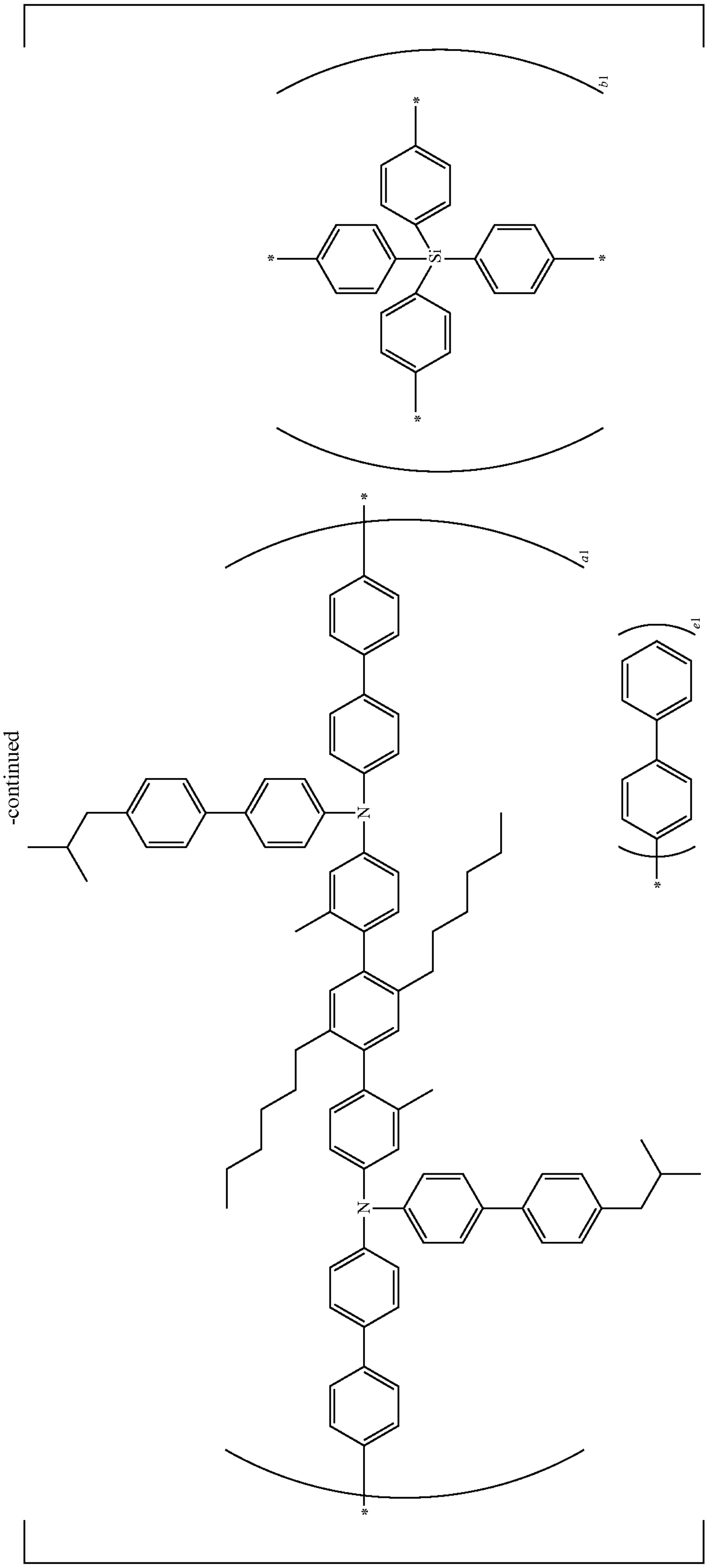

-continued
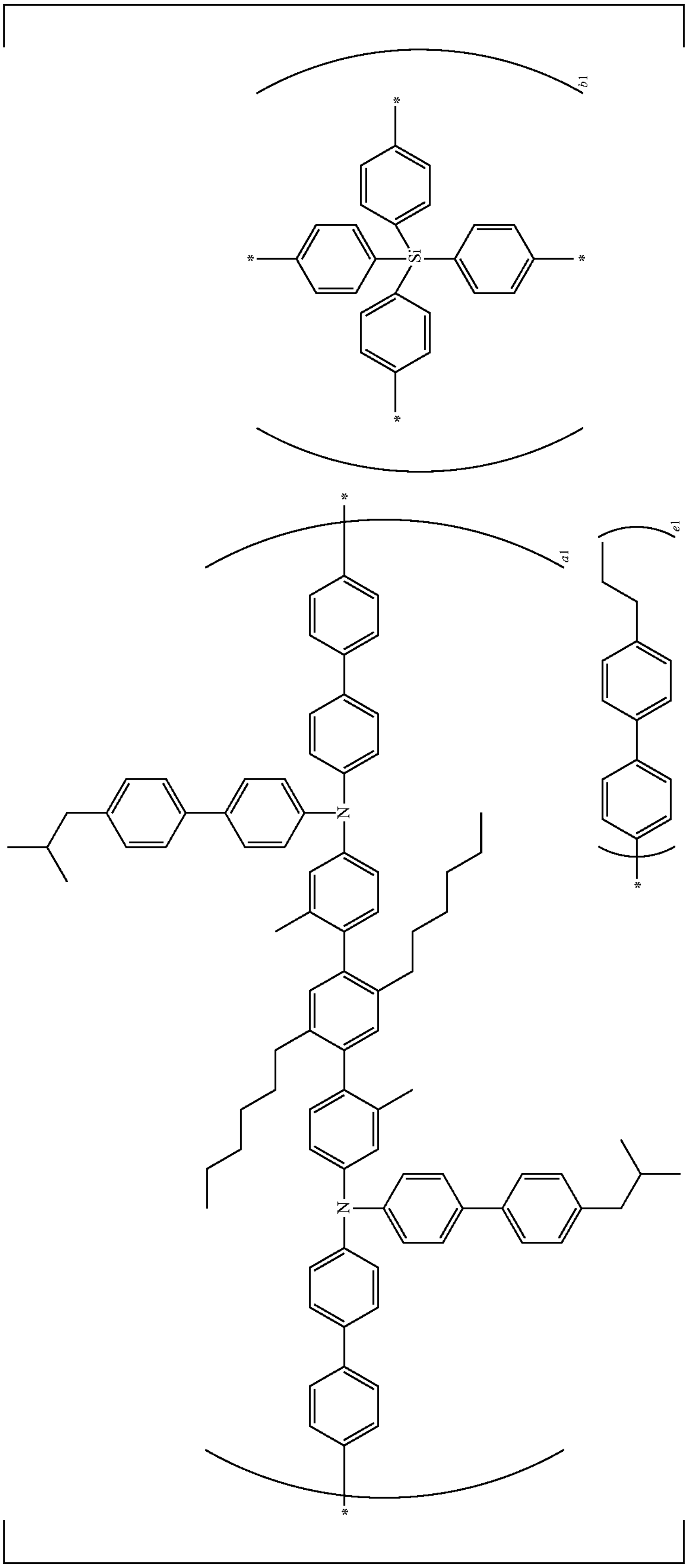

-continued
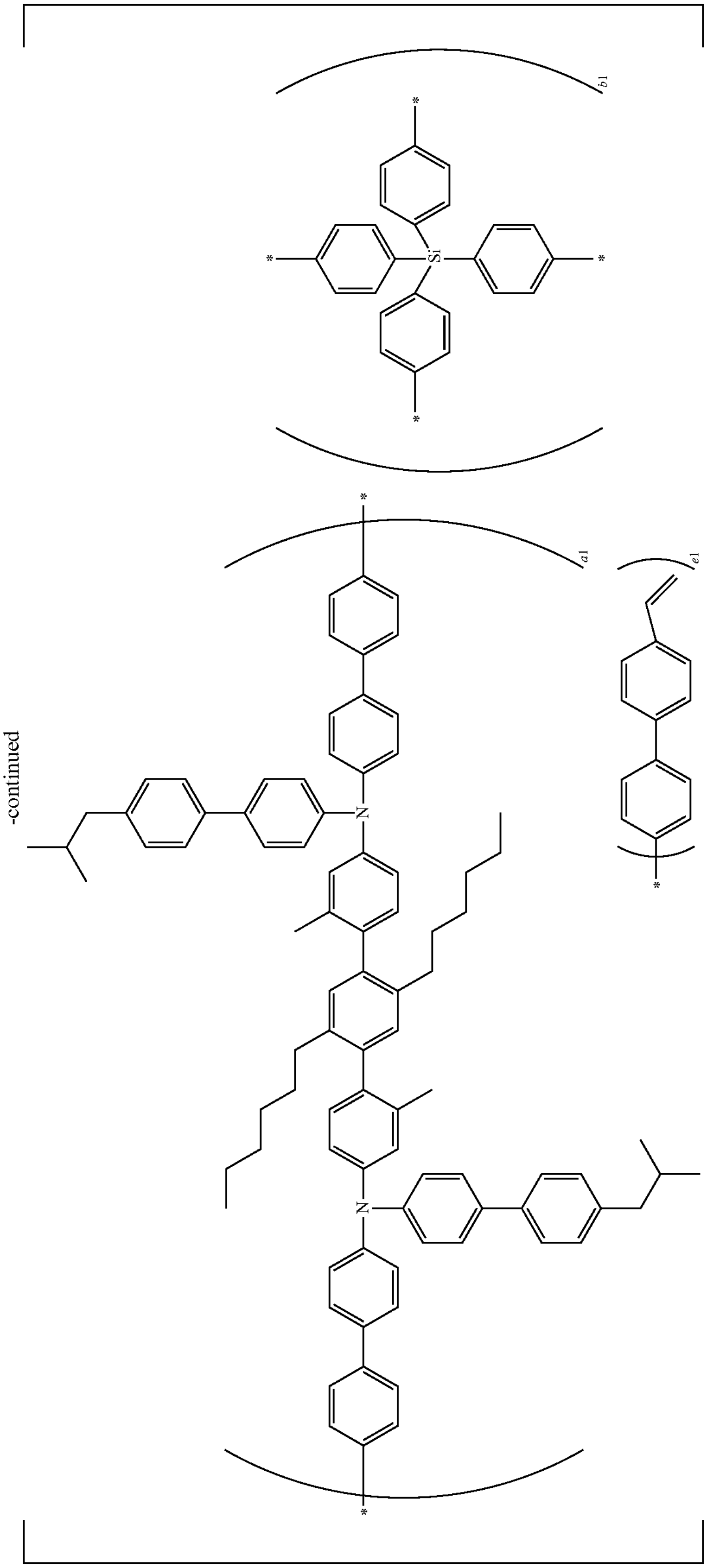

-continued
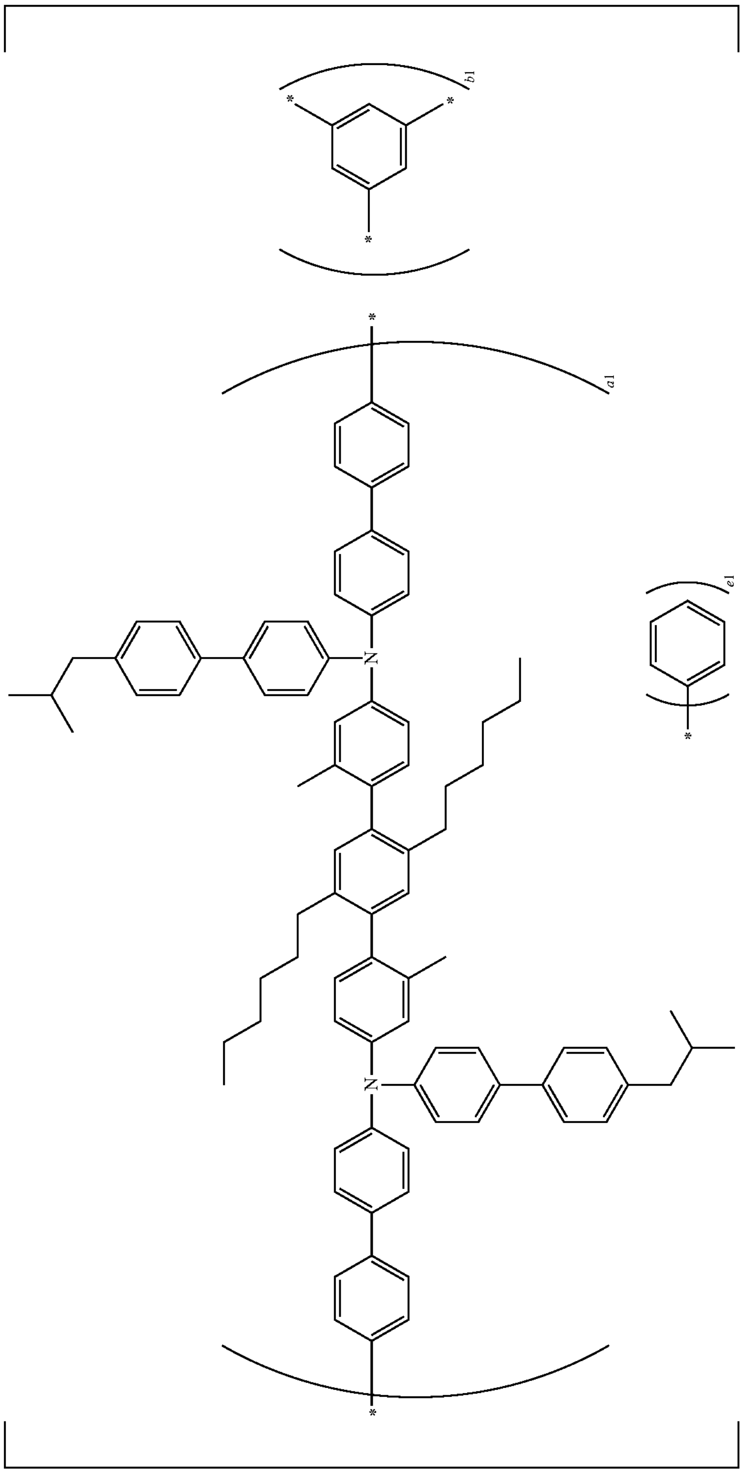

-continued
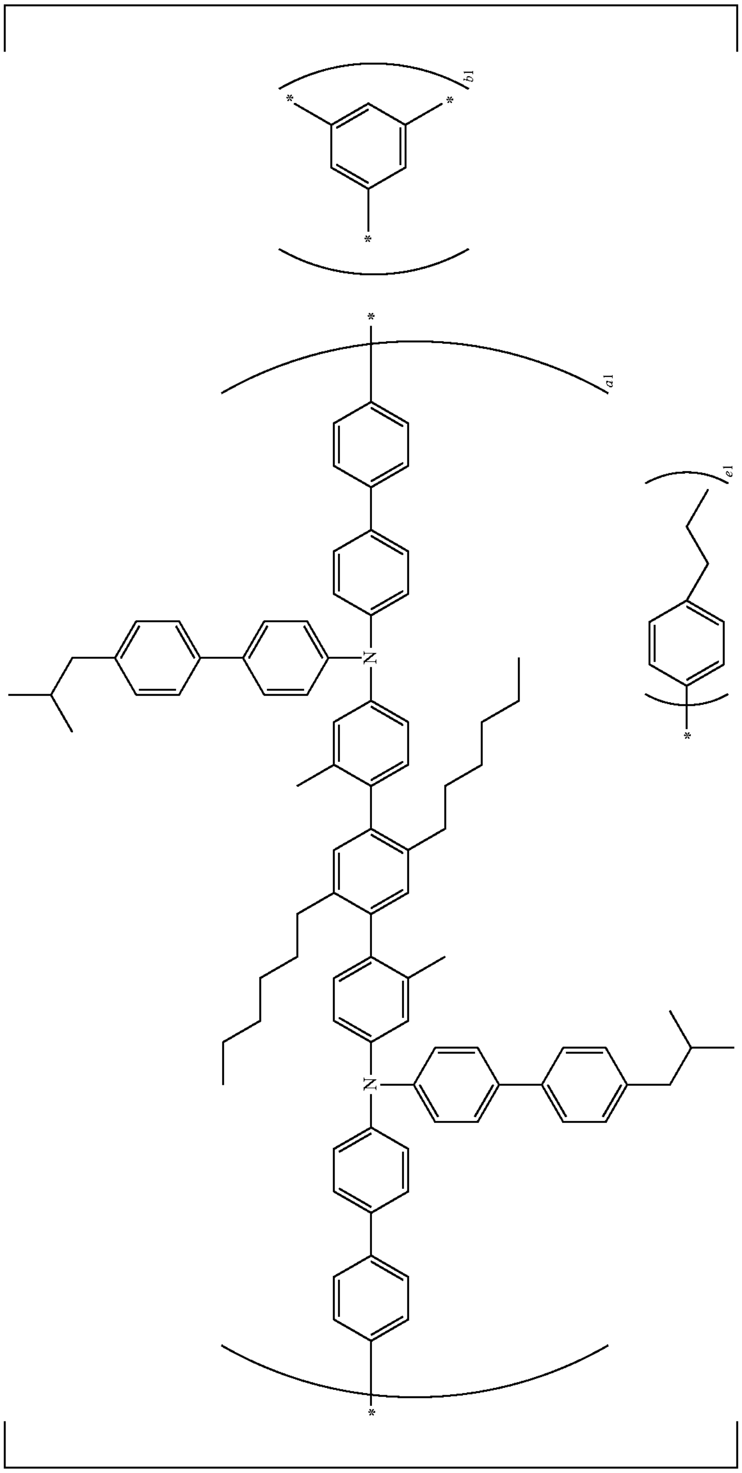

-continued
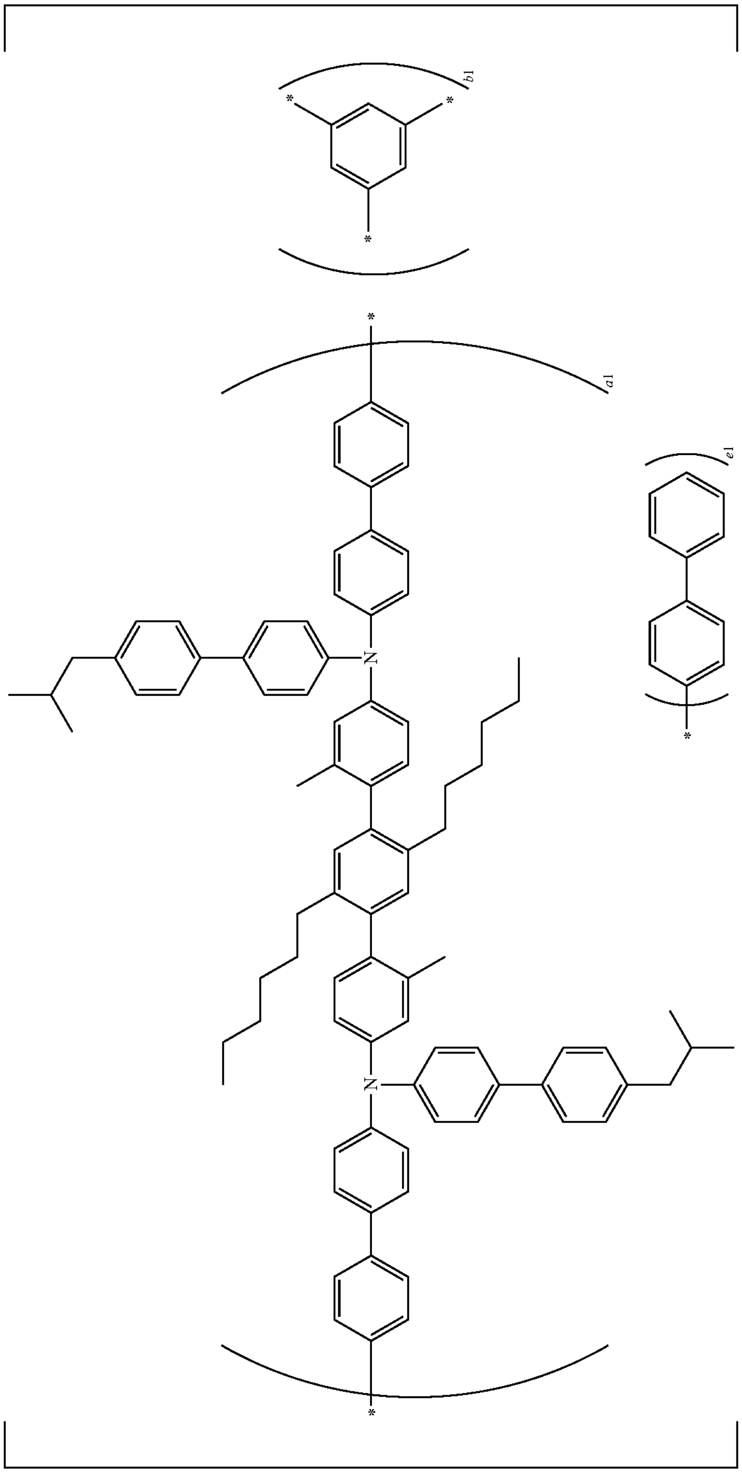

-continued
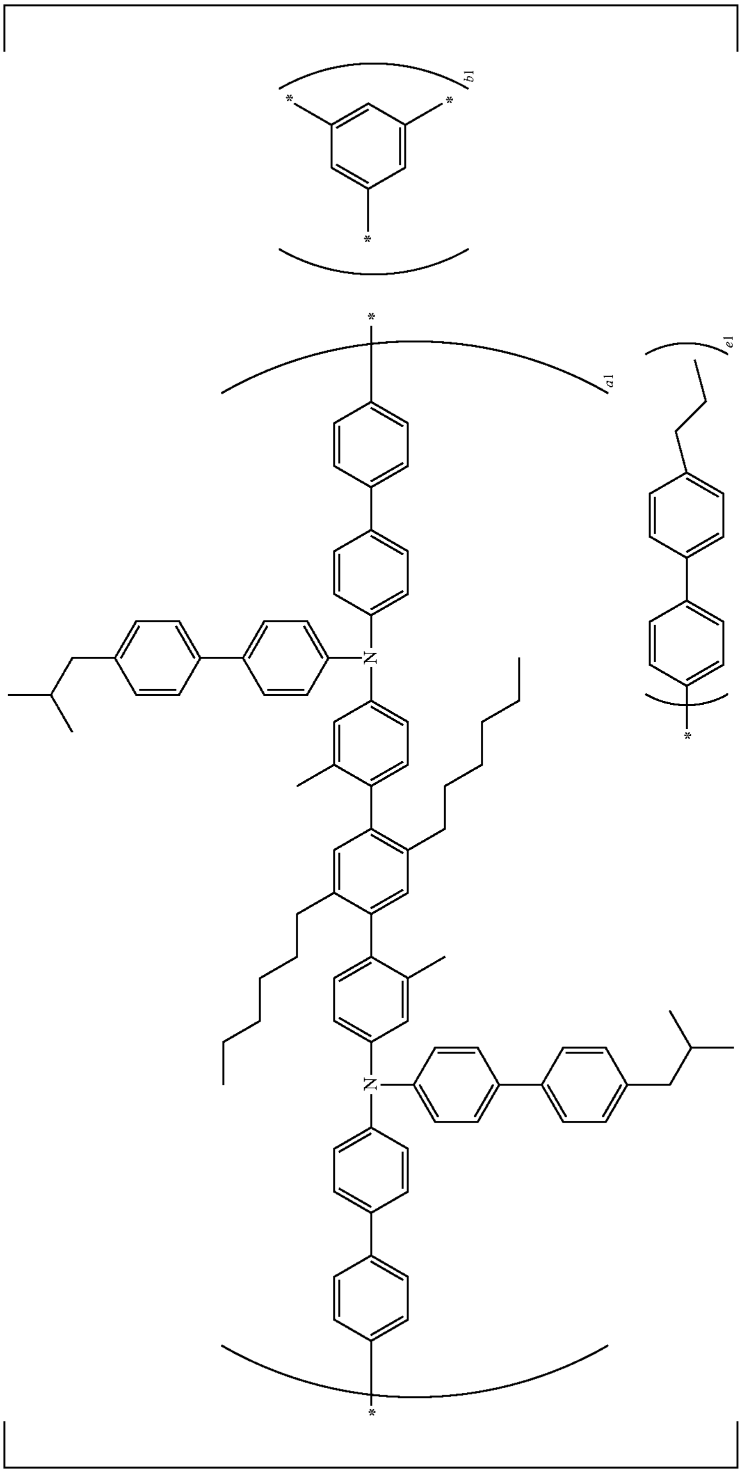

-continued
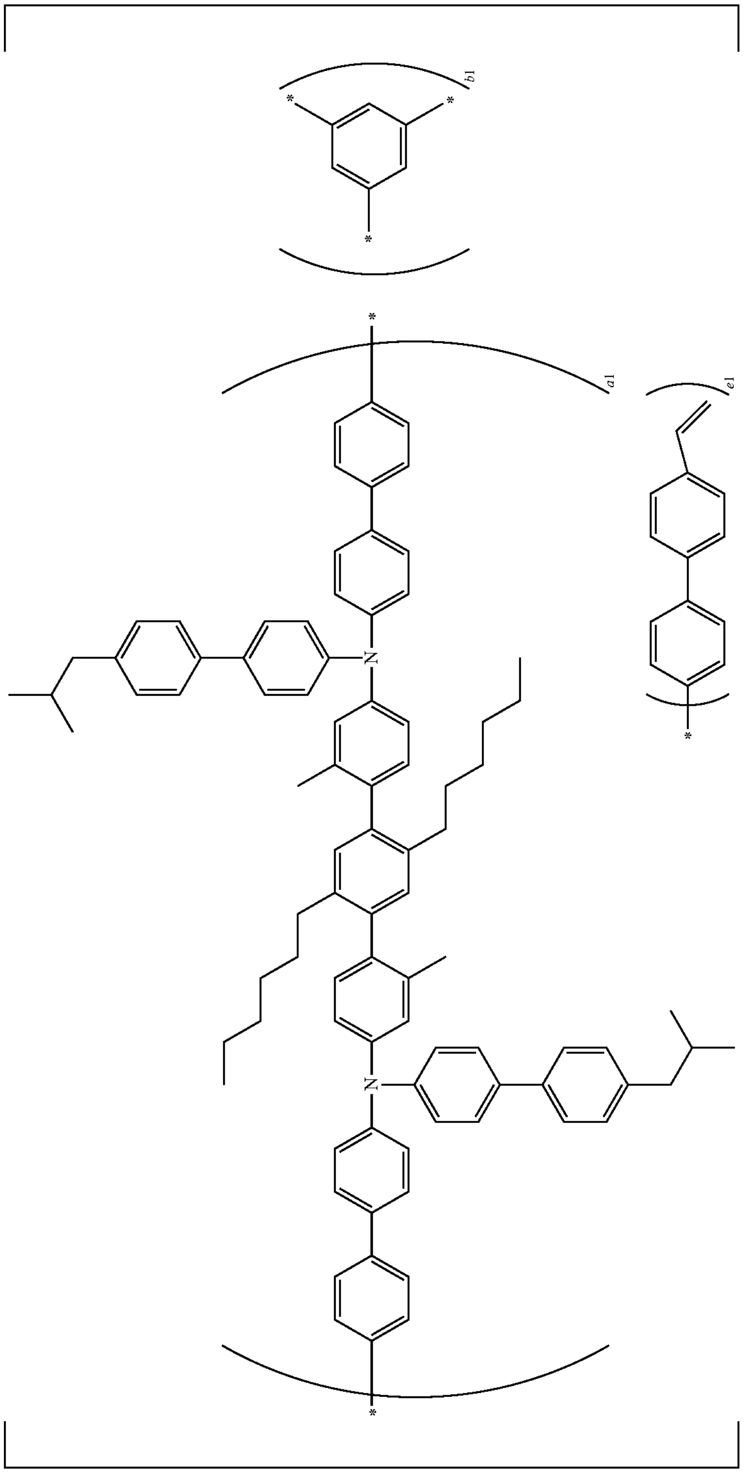

-continued
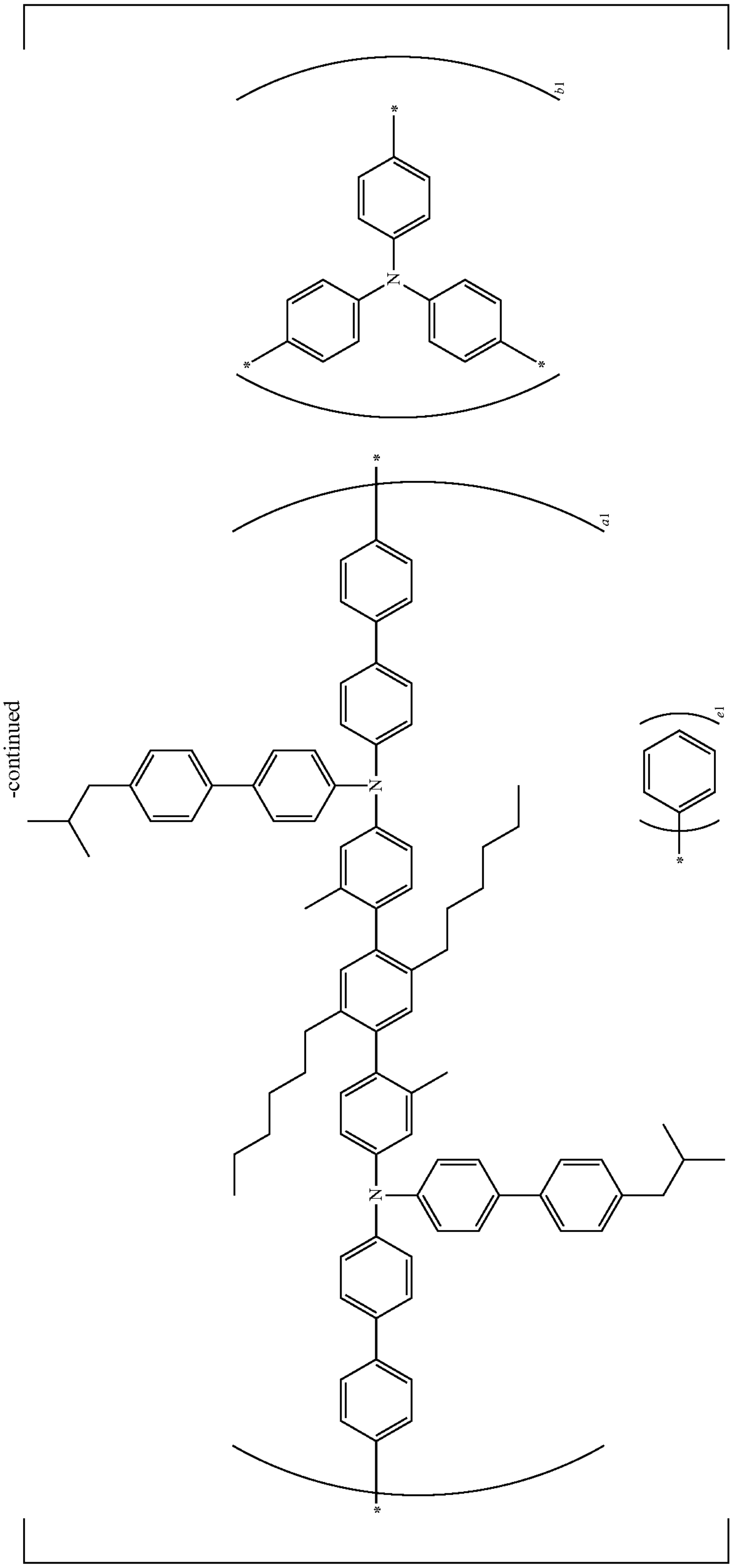

-continued
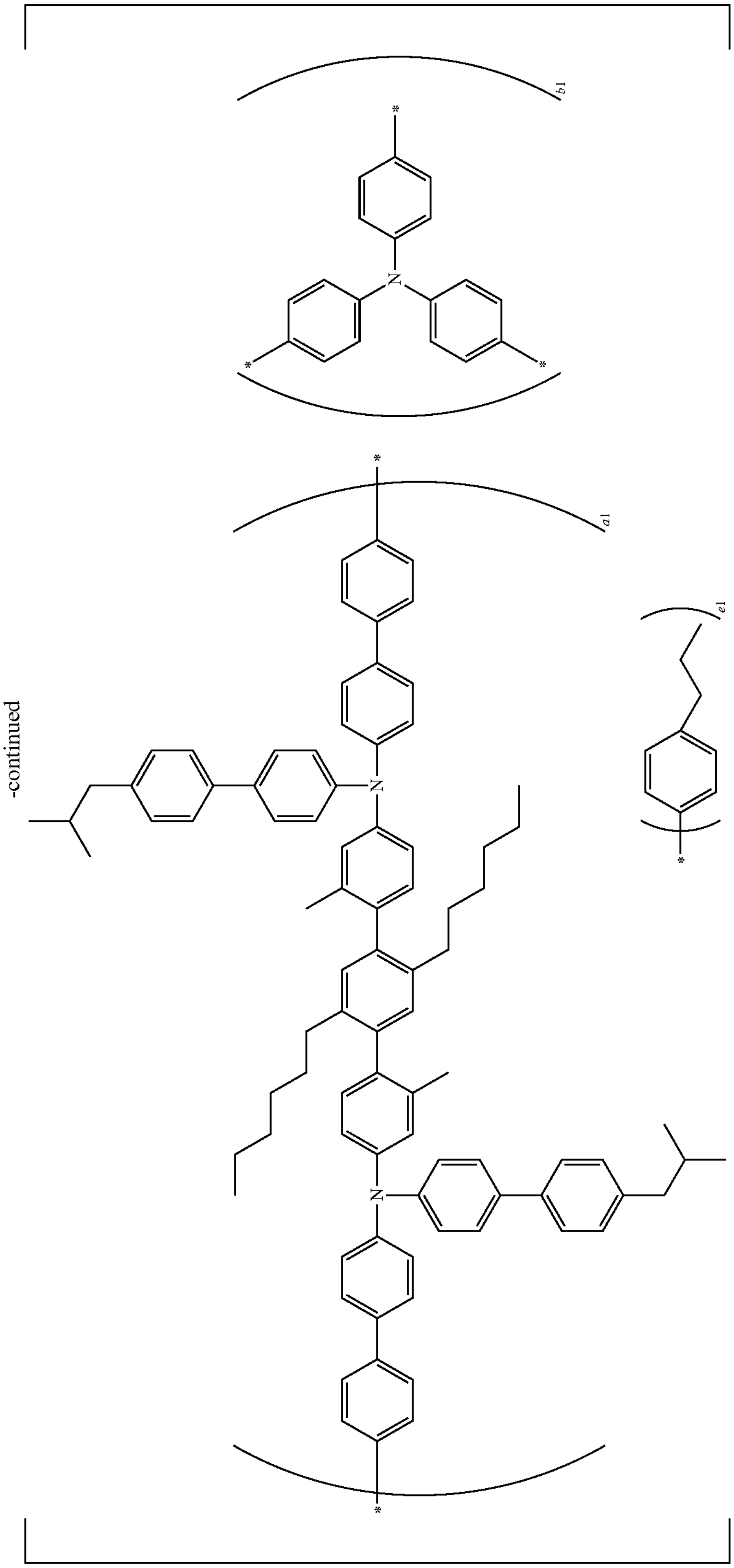

-continued
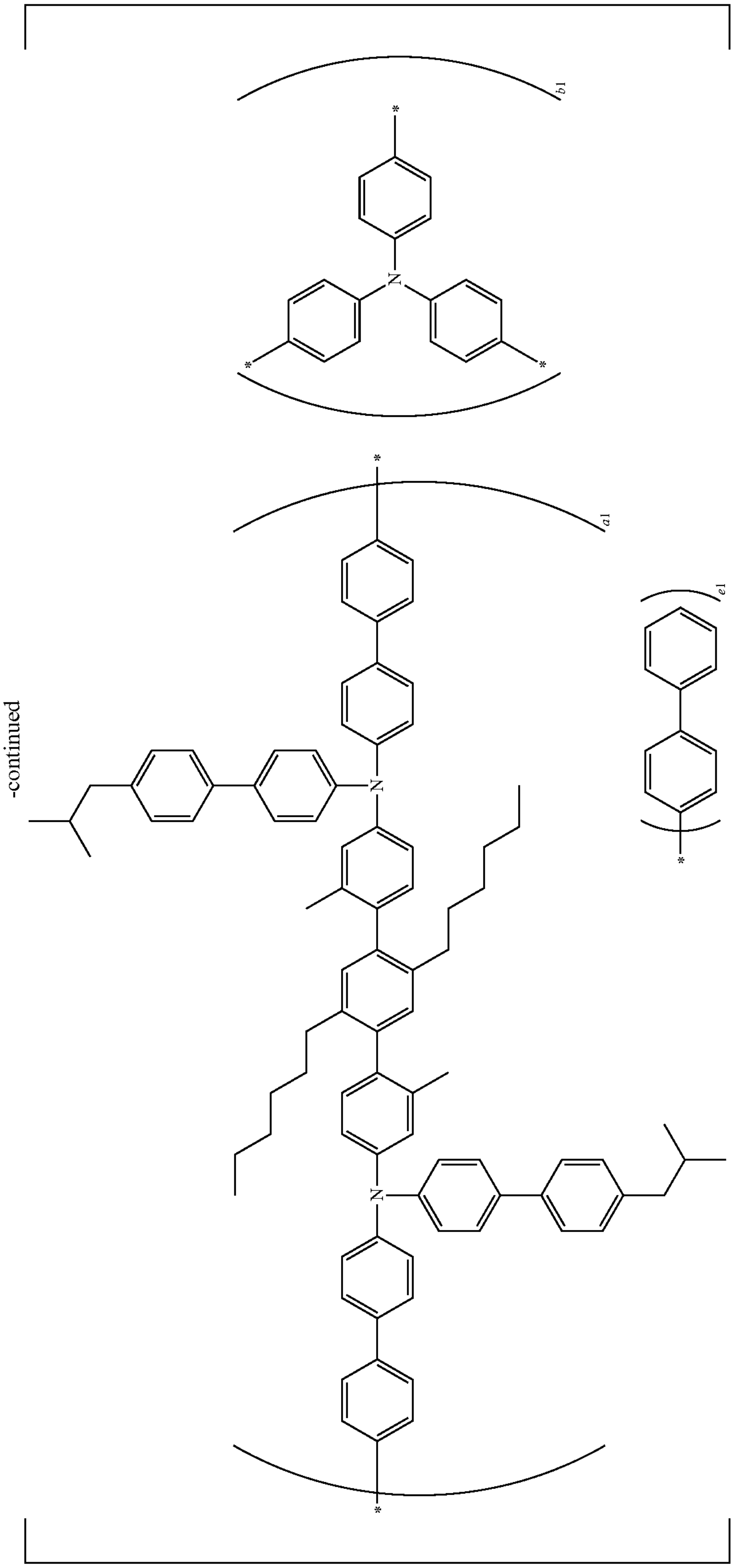

-continued
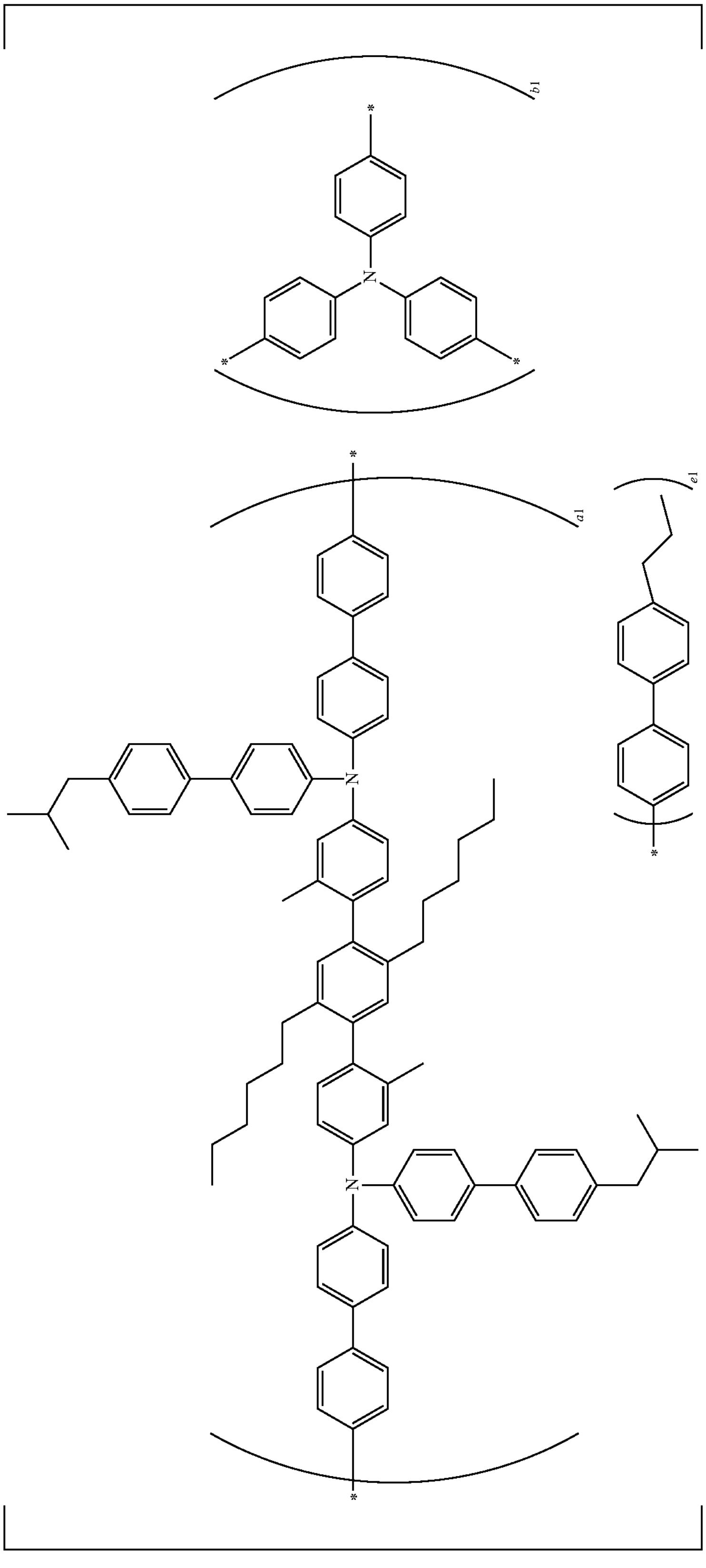

-continued
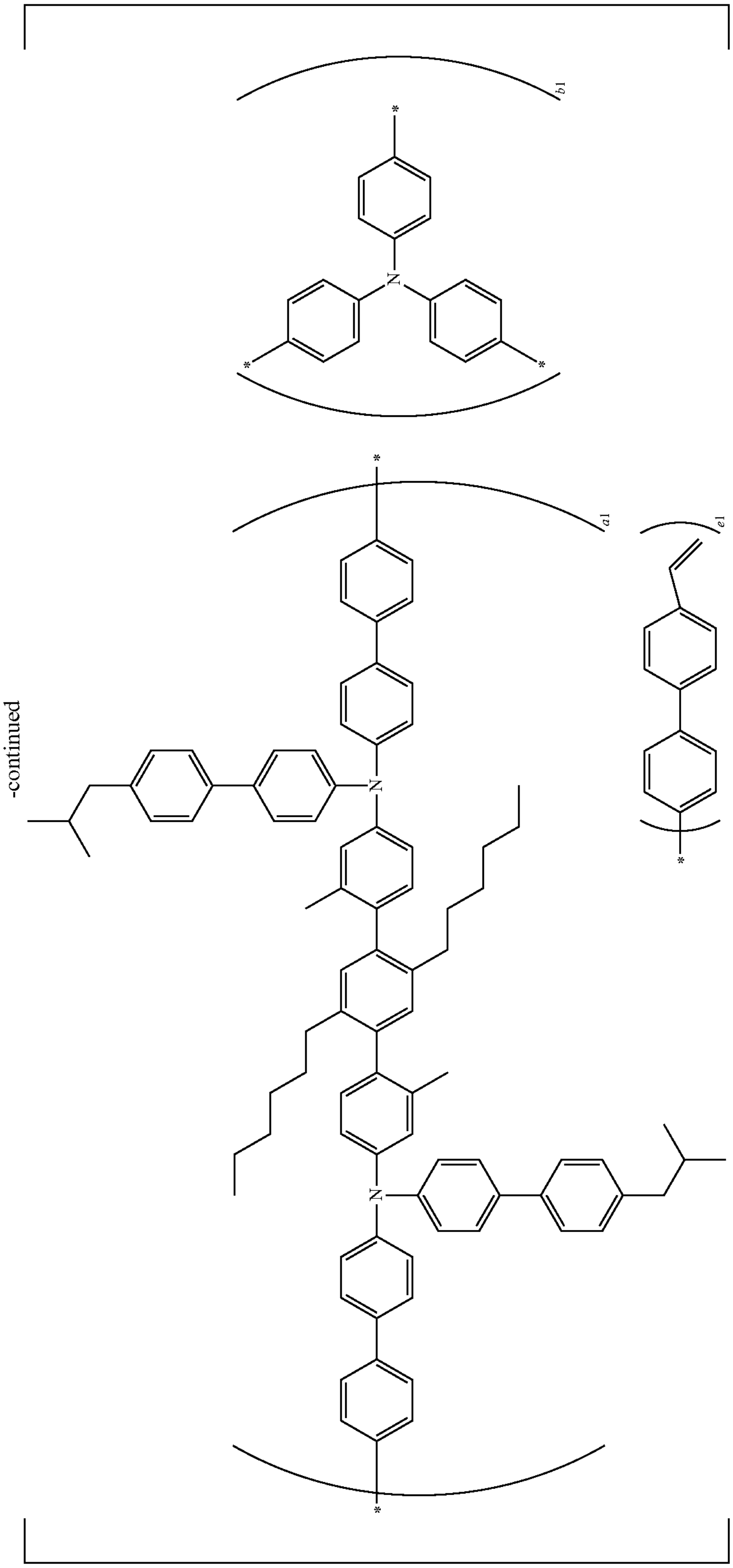

-continued
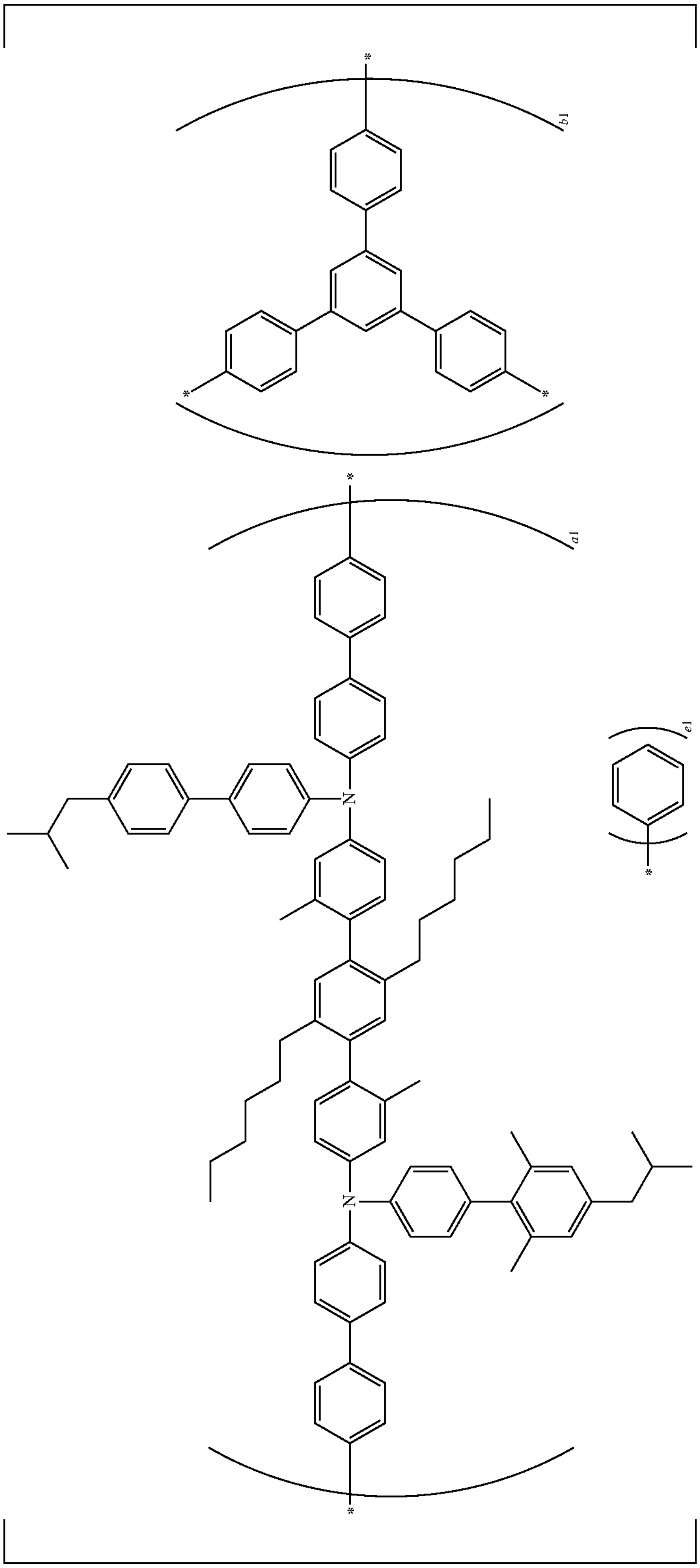

-continued
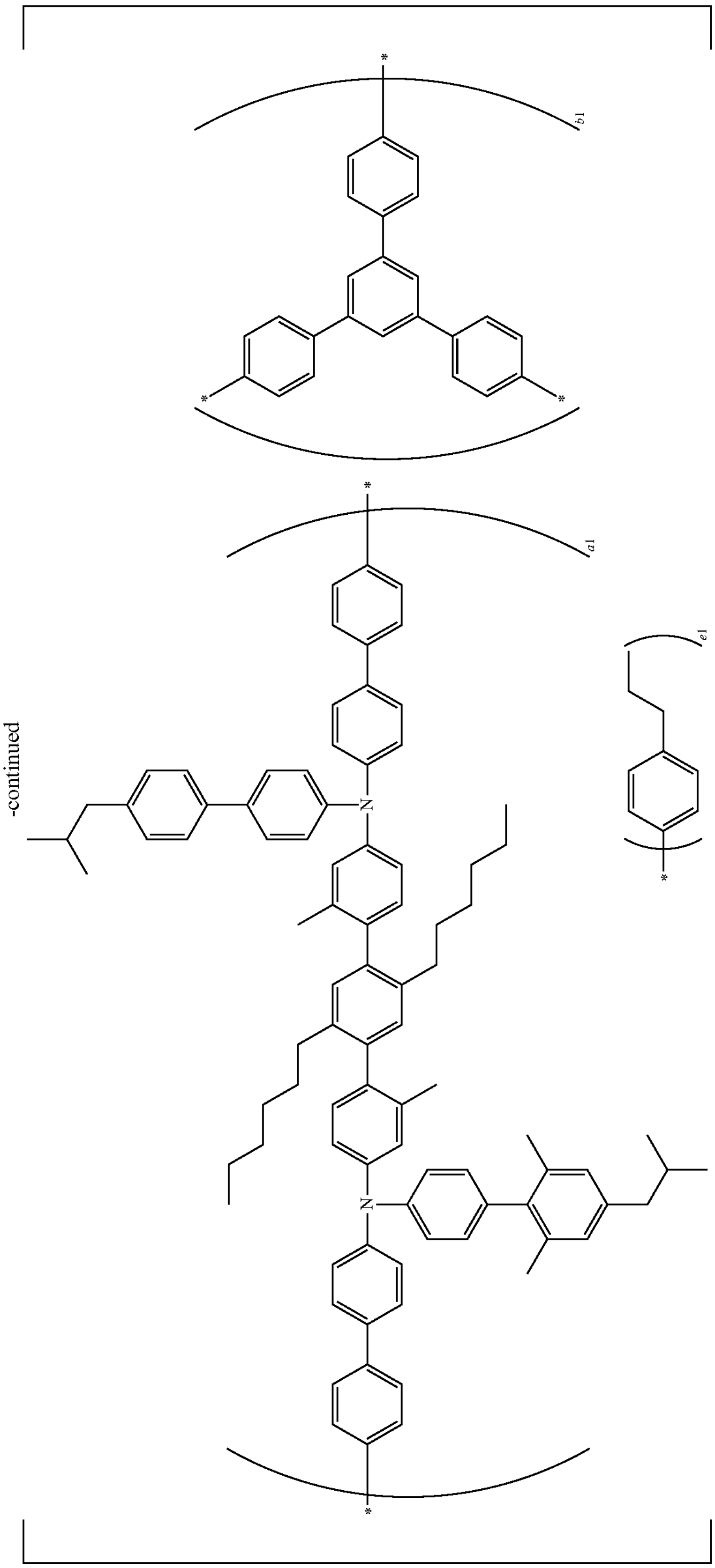

-continued
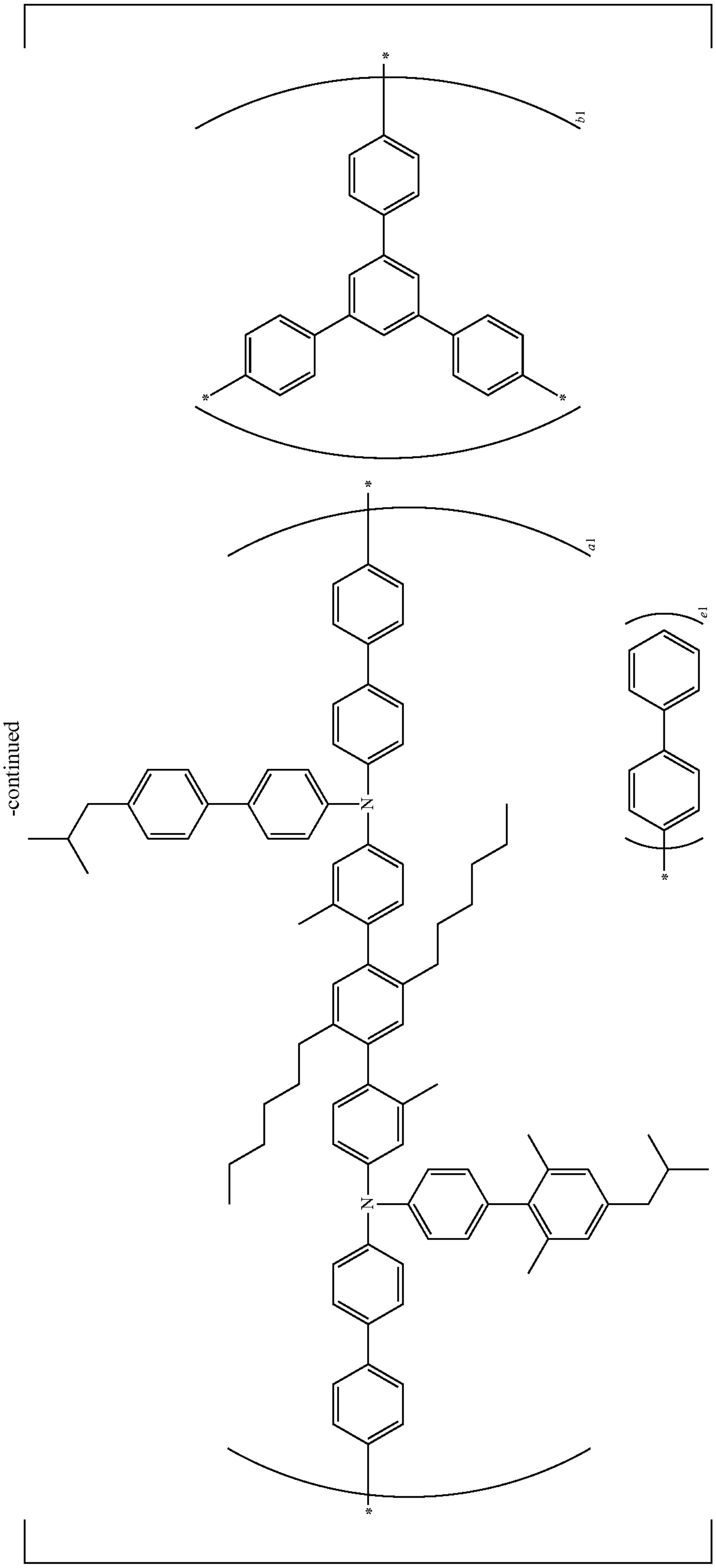

-continued
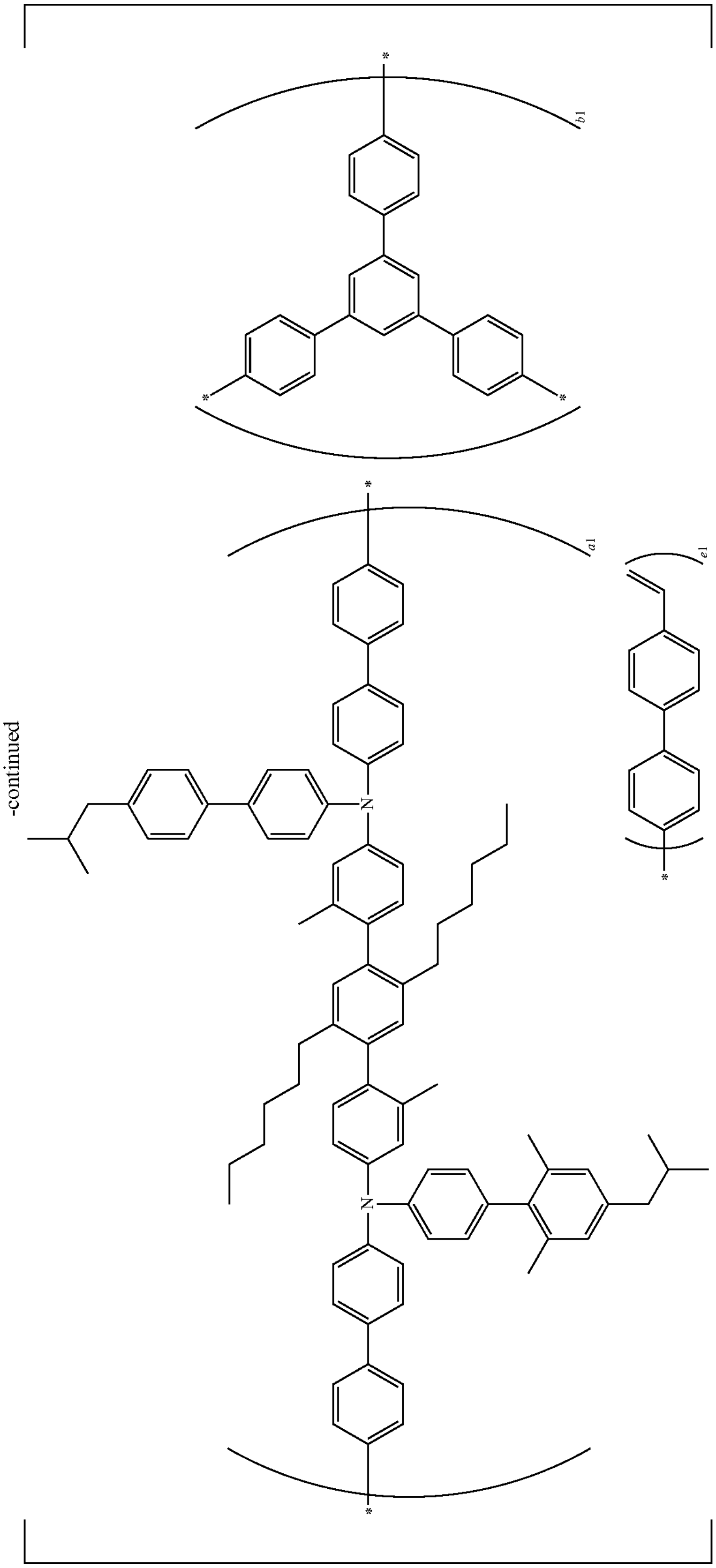

-continued
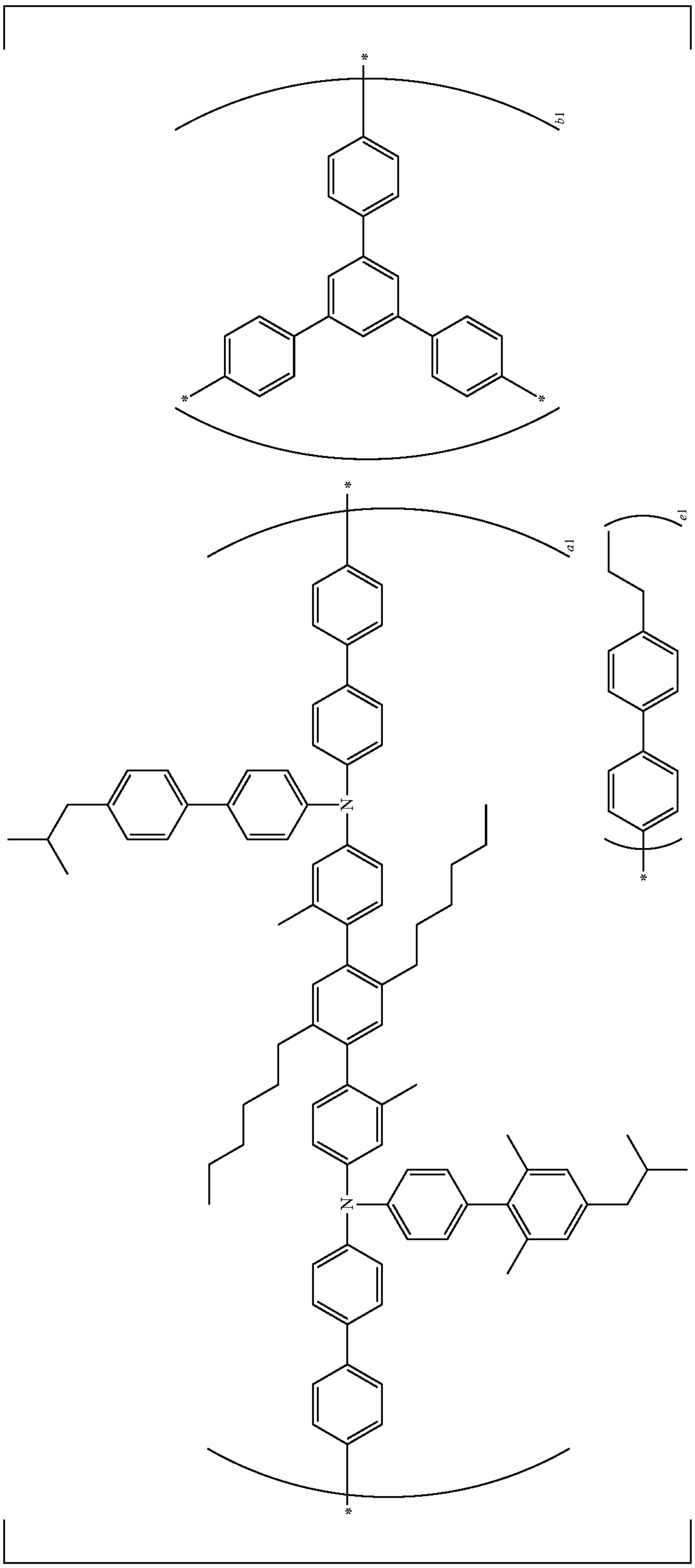

-continued
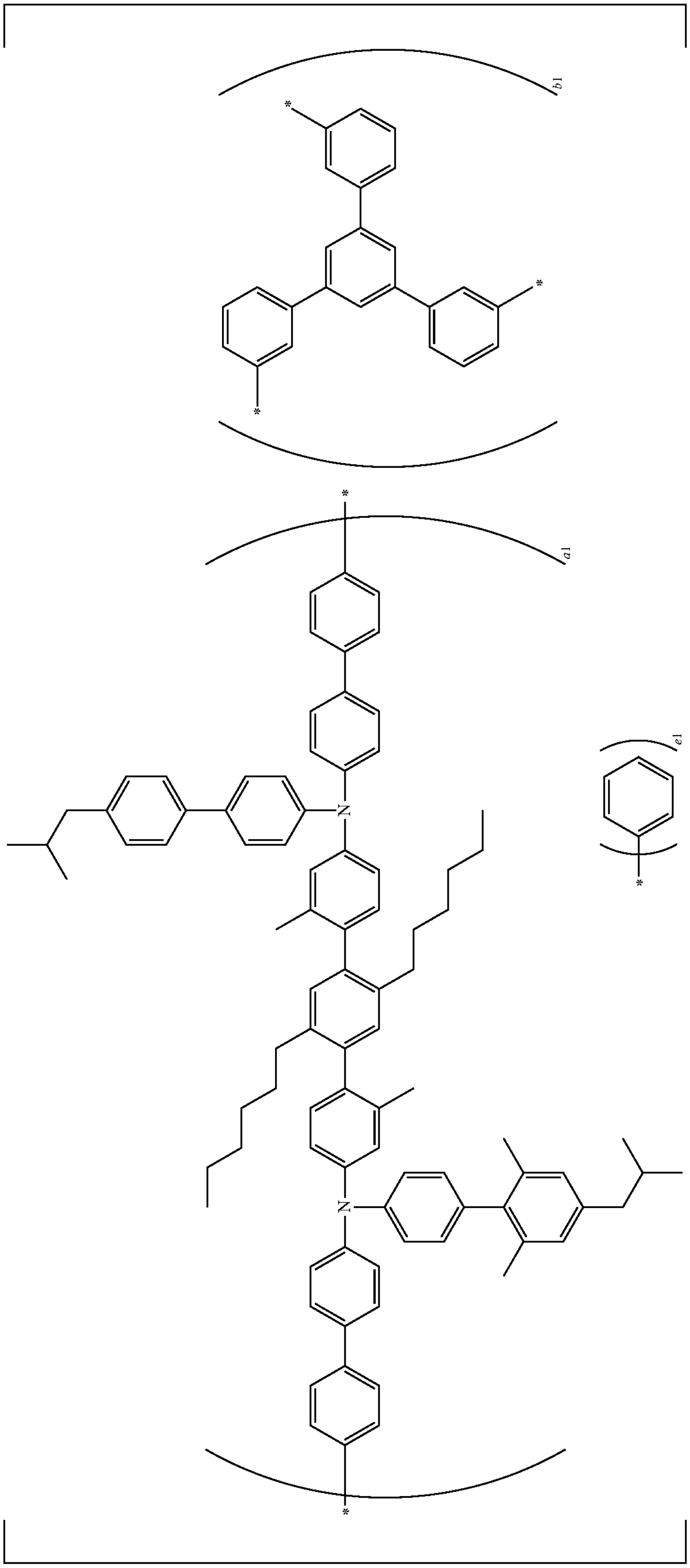

-continued
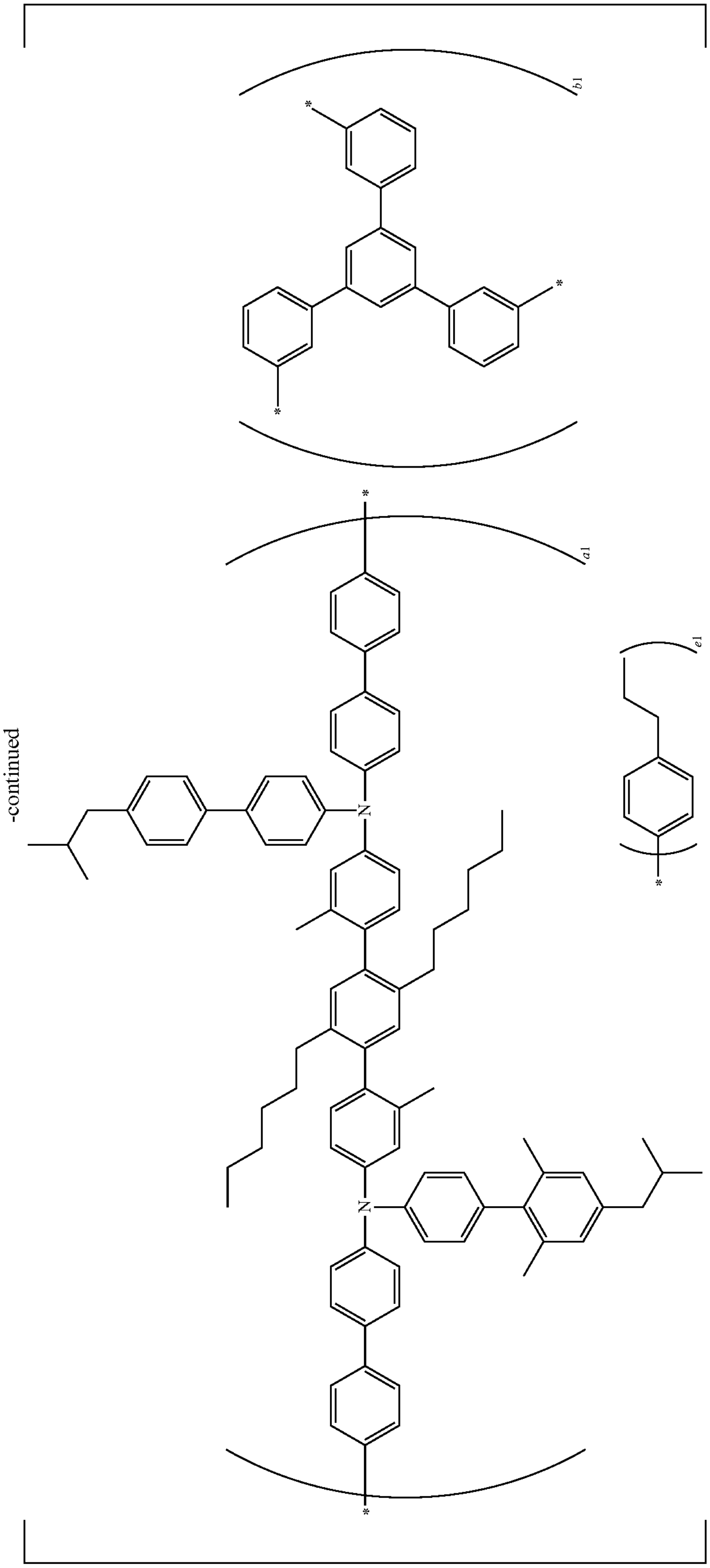

-continued
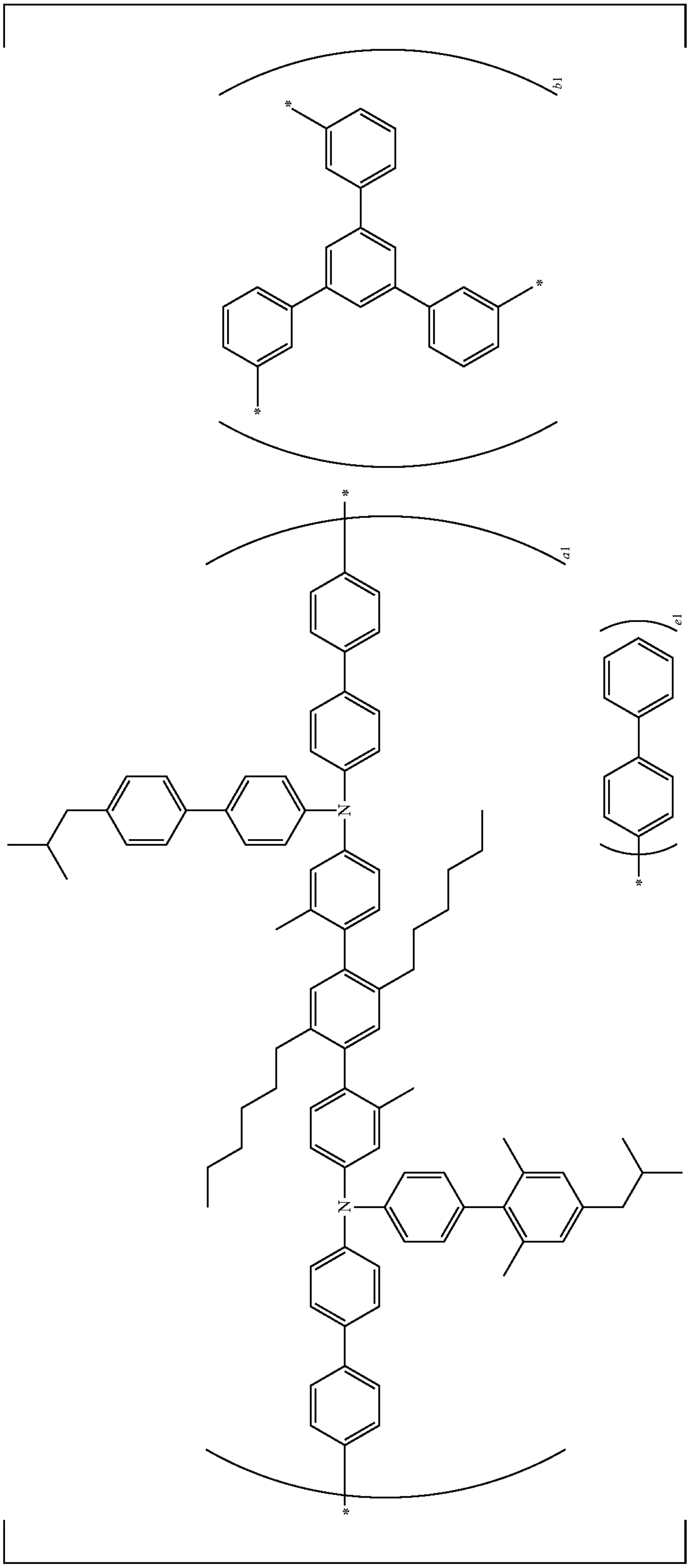

-continued
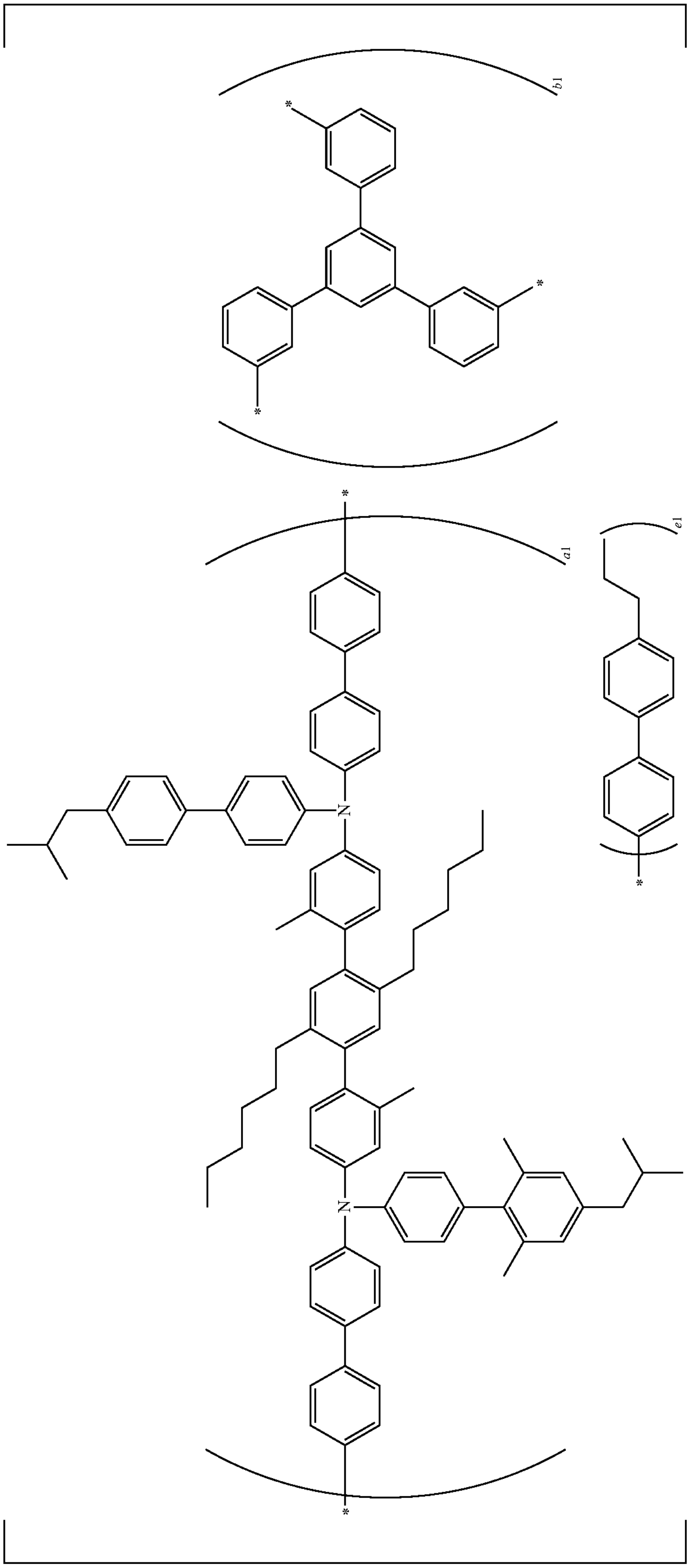

-continued
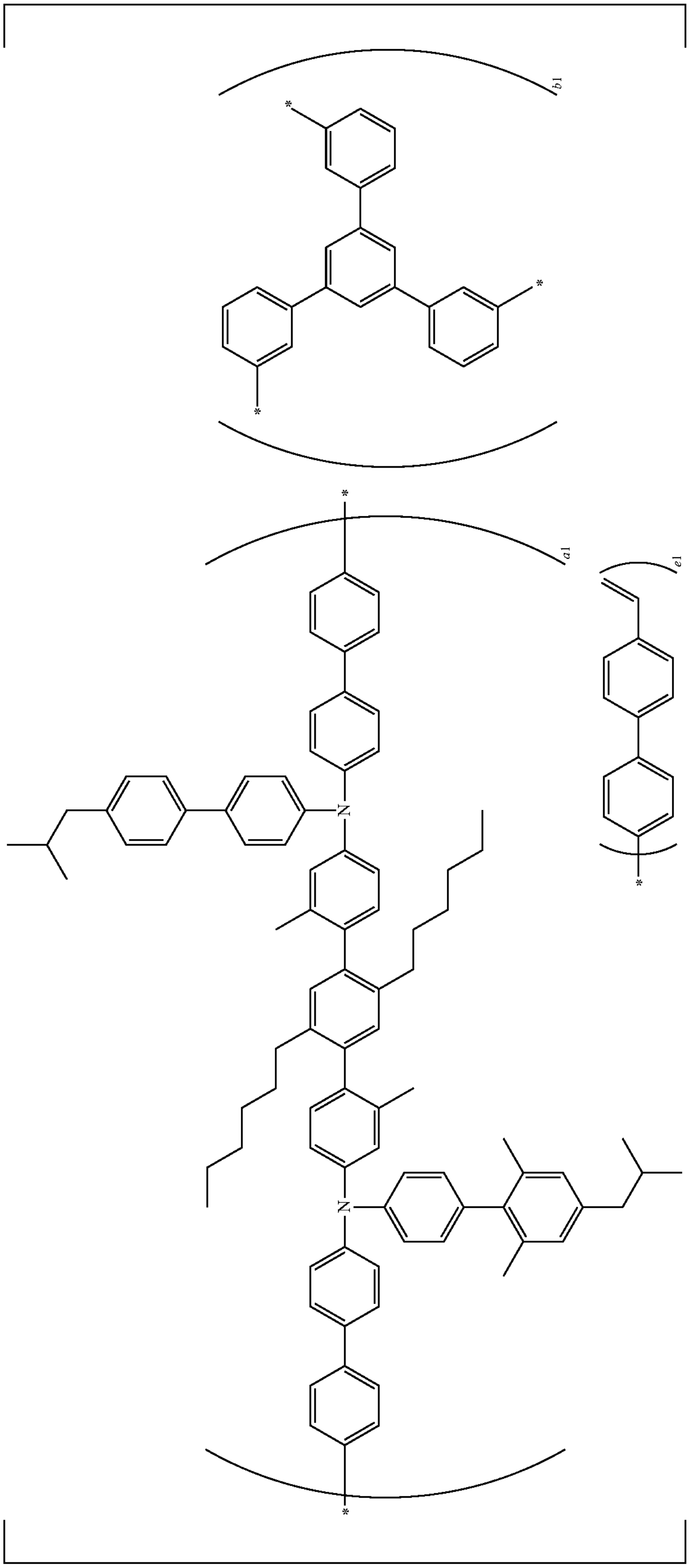

-continued
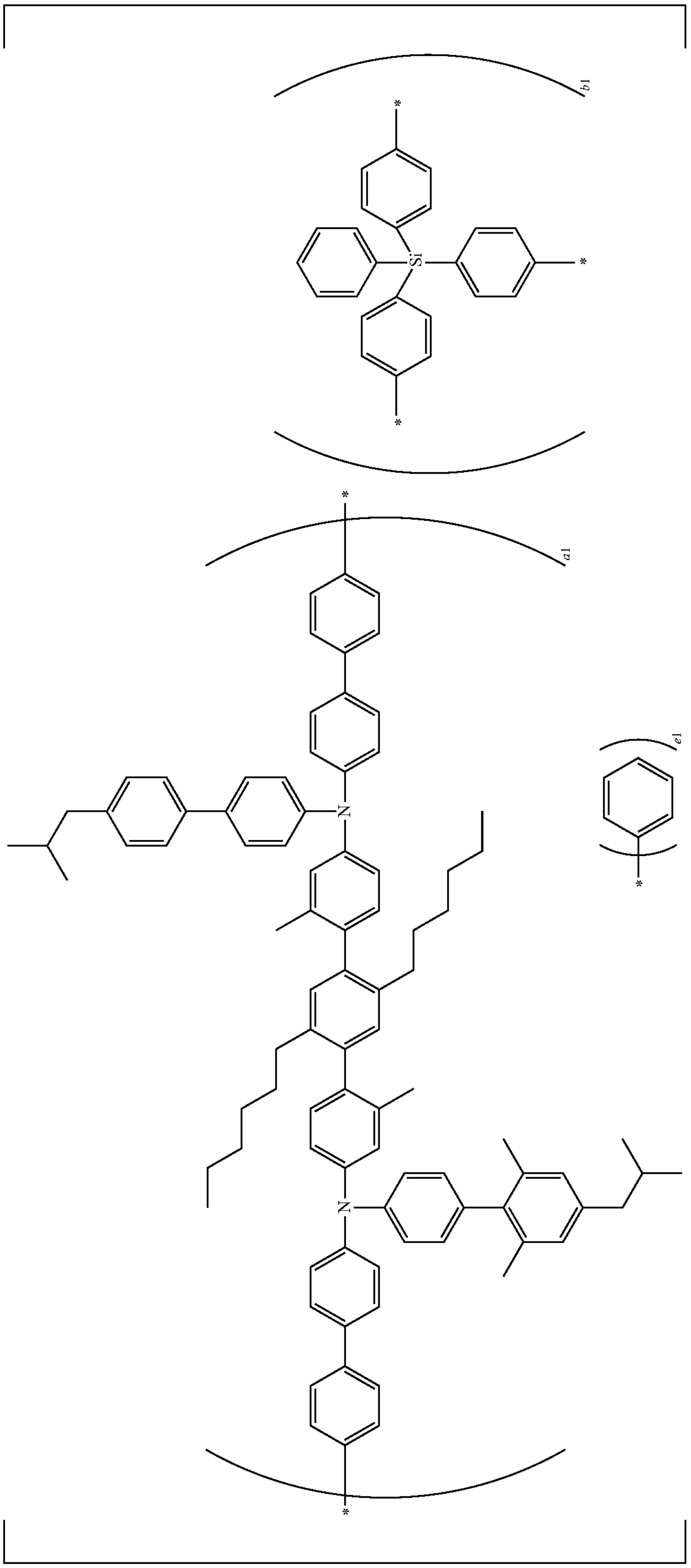

-continued
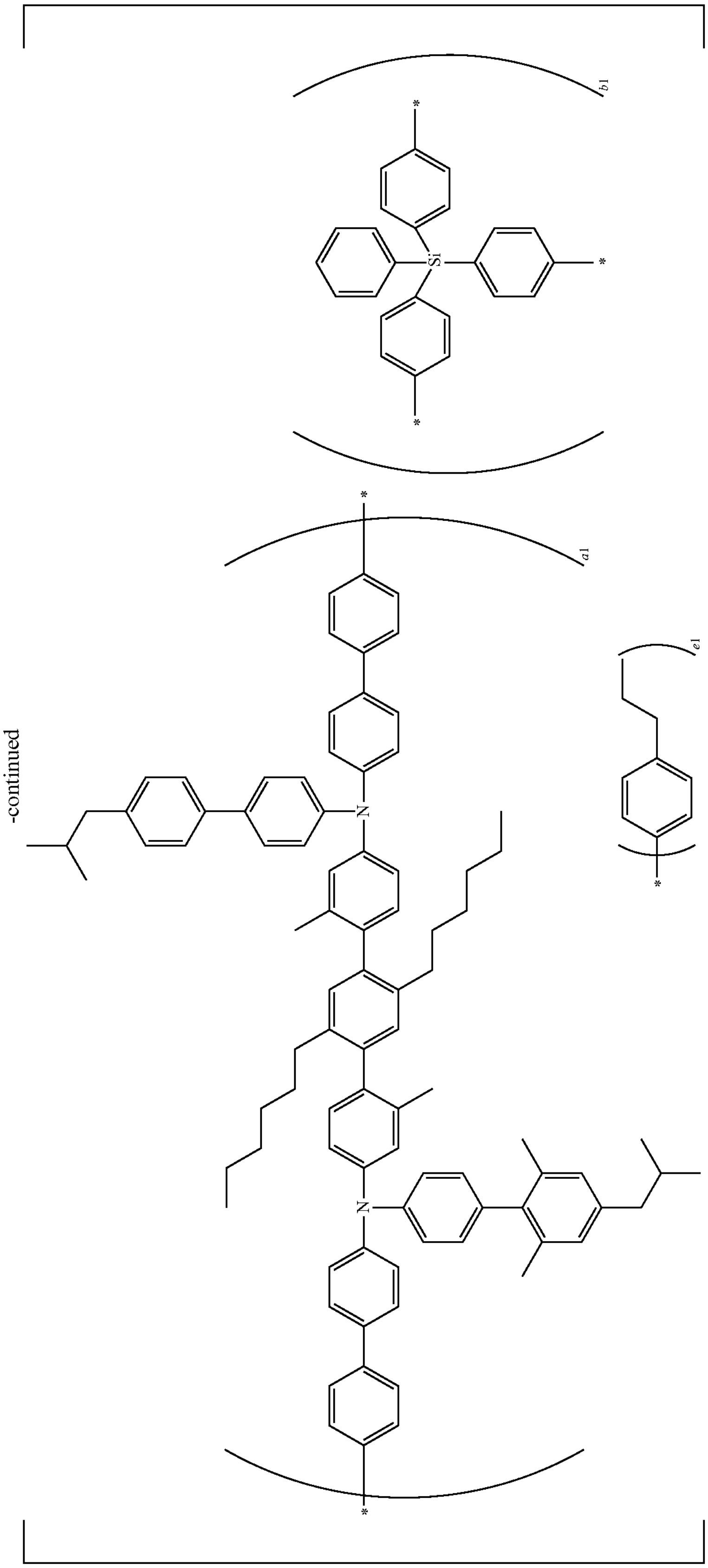

-continued
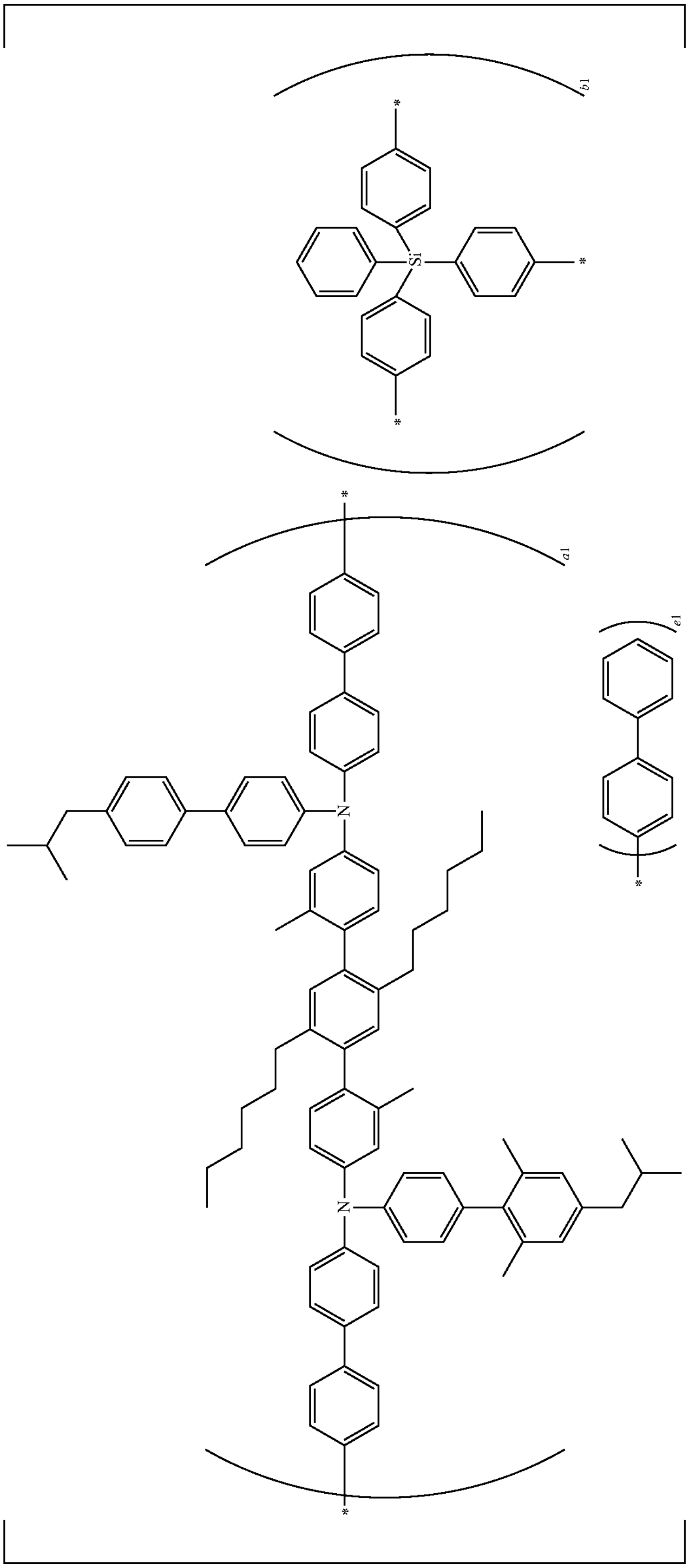

-continued
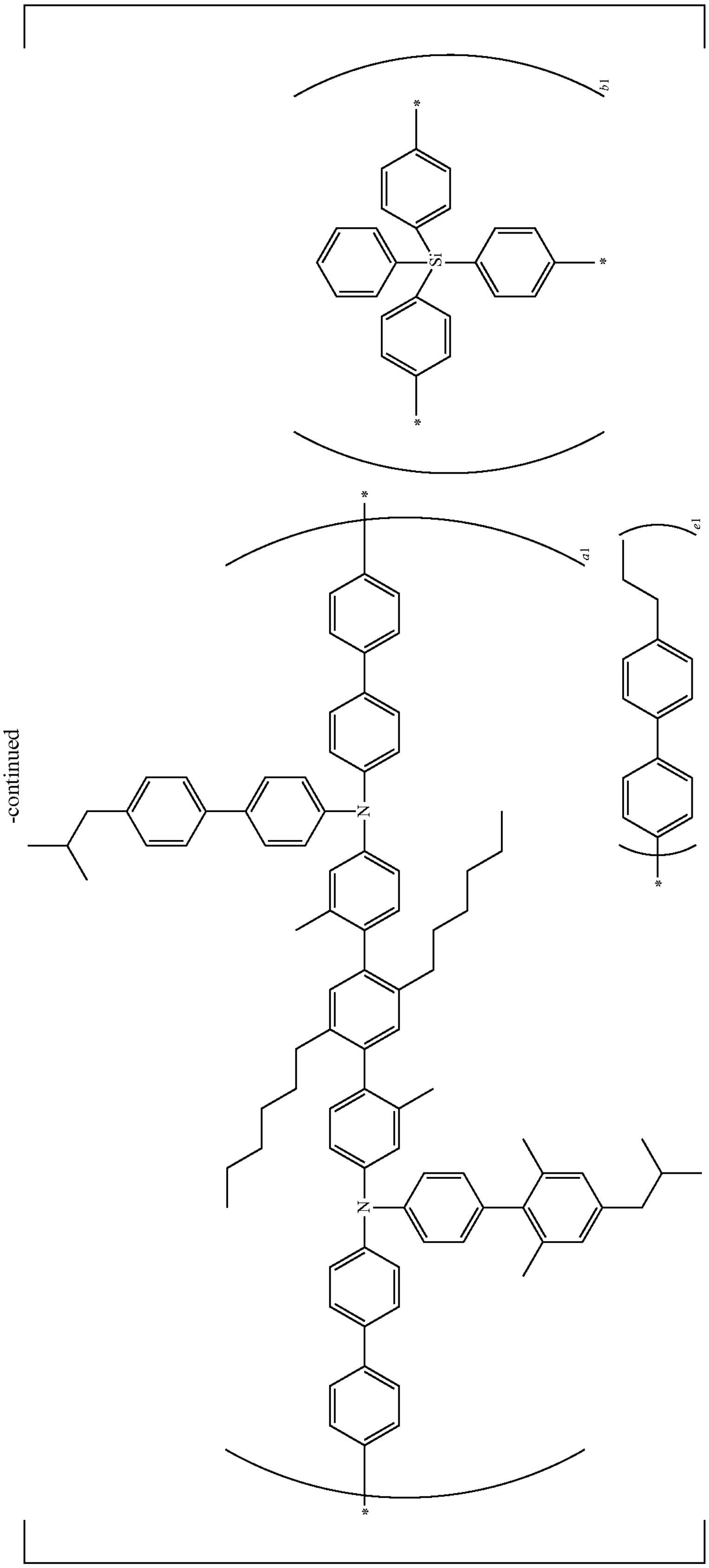

-continued
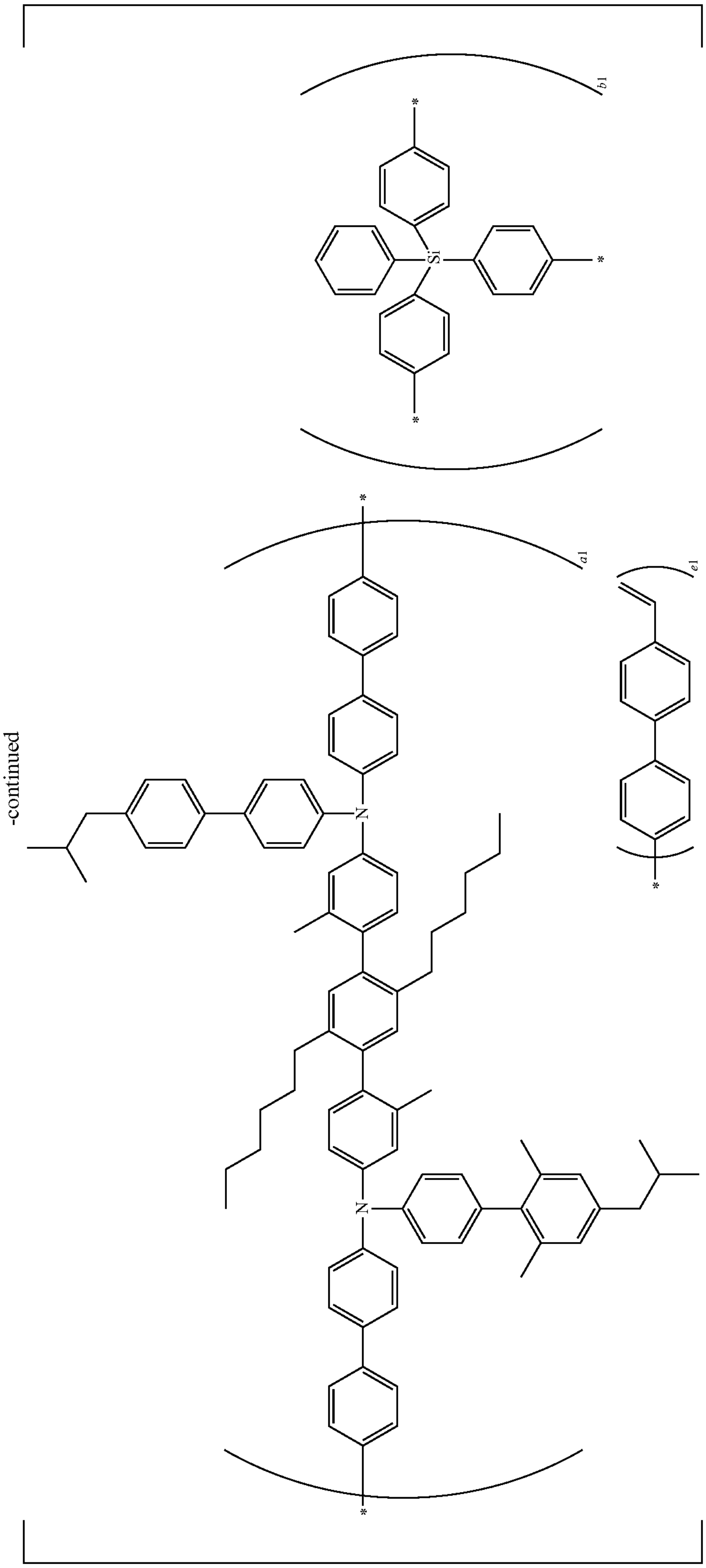

-continued
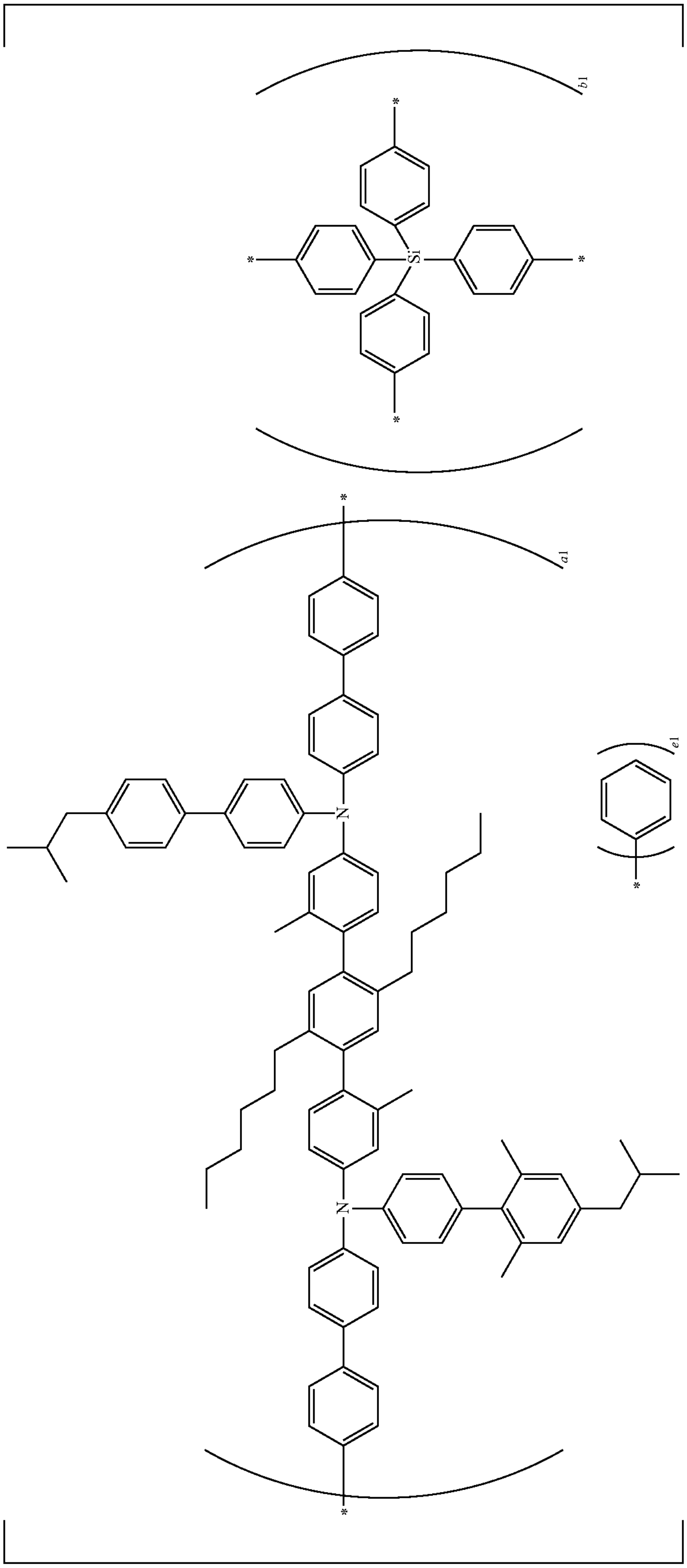

-continued
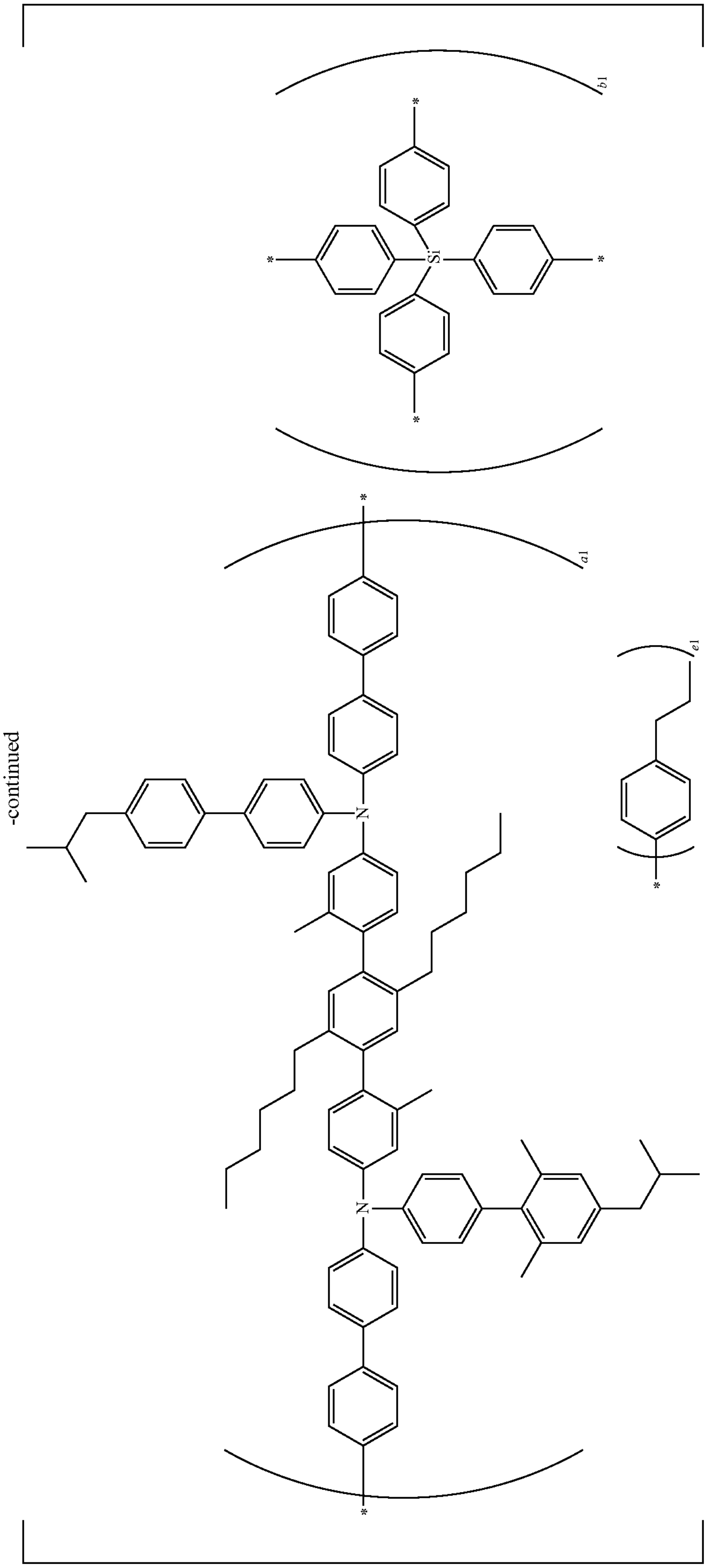

-continued
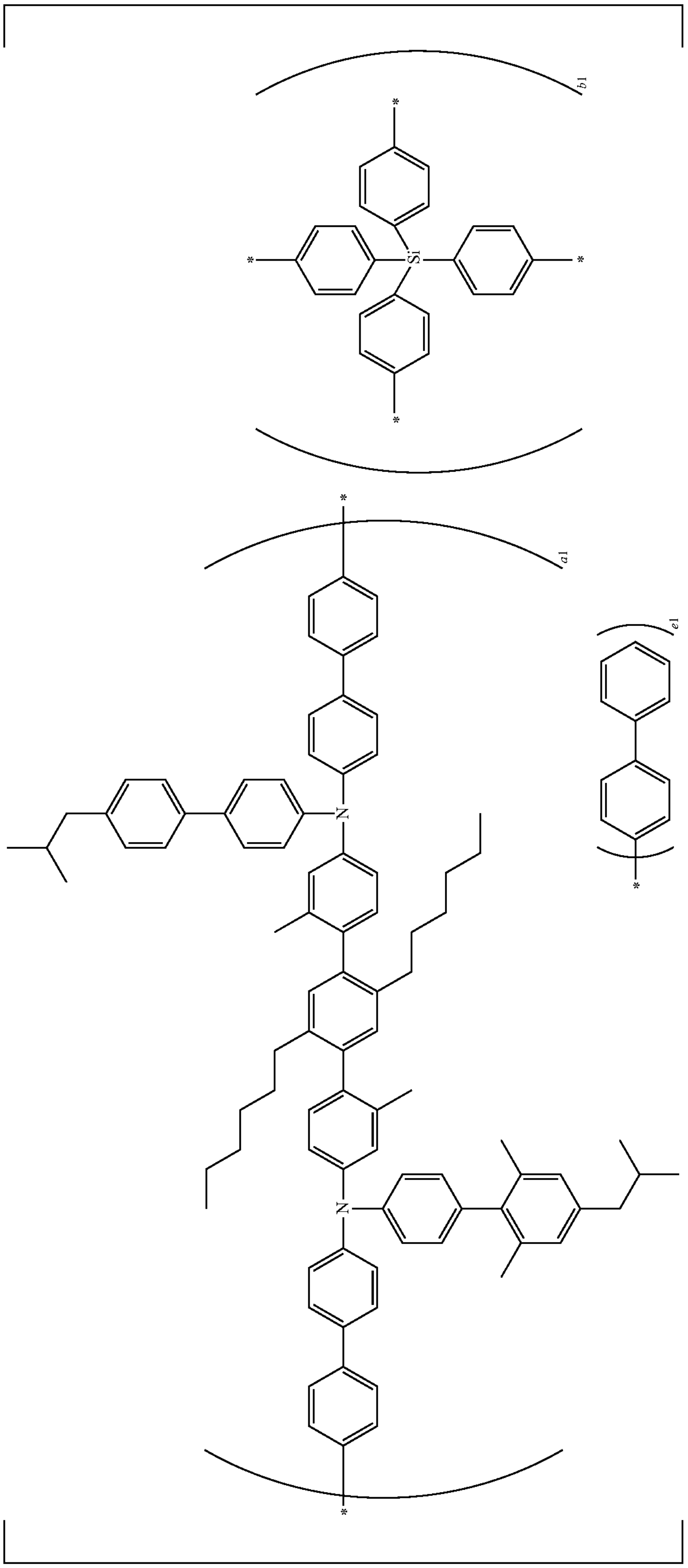

-continued
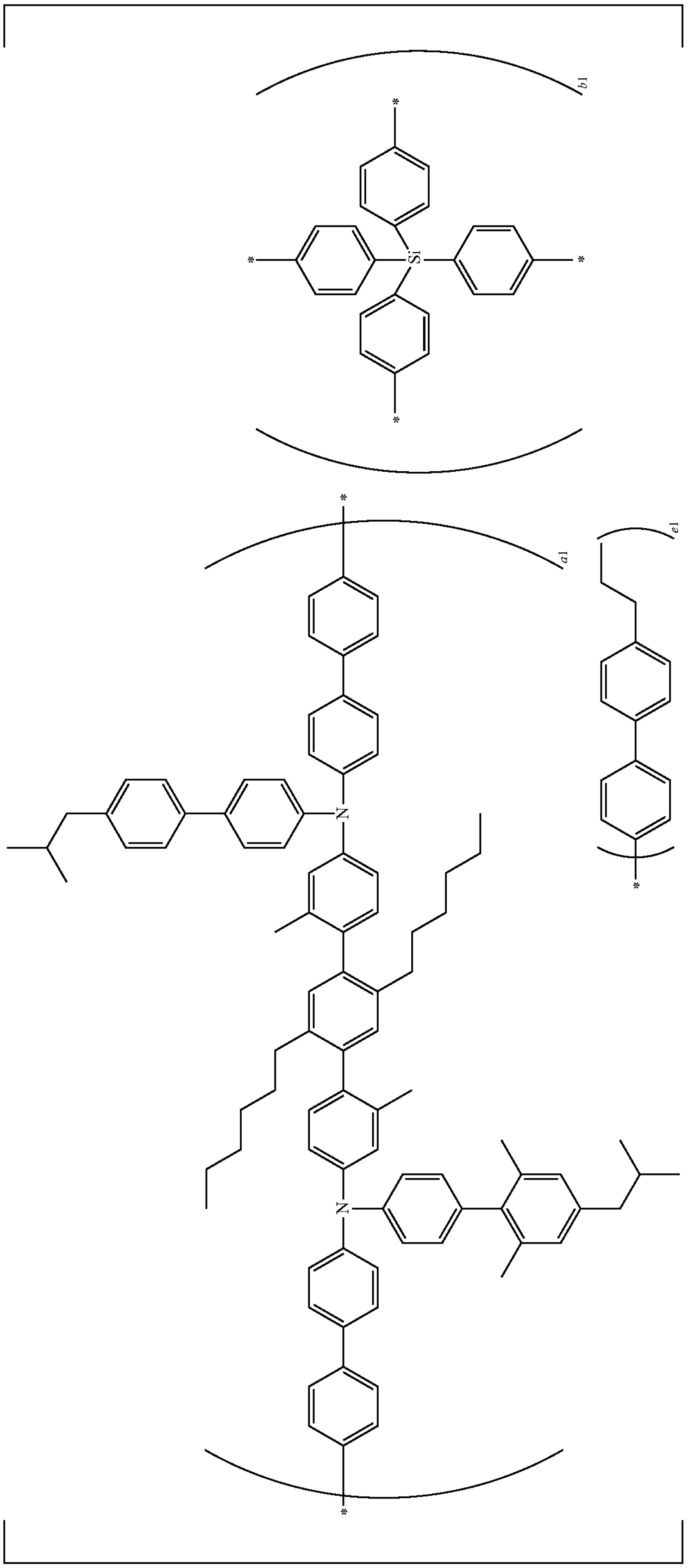

-continued
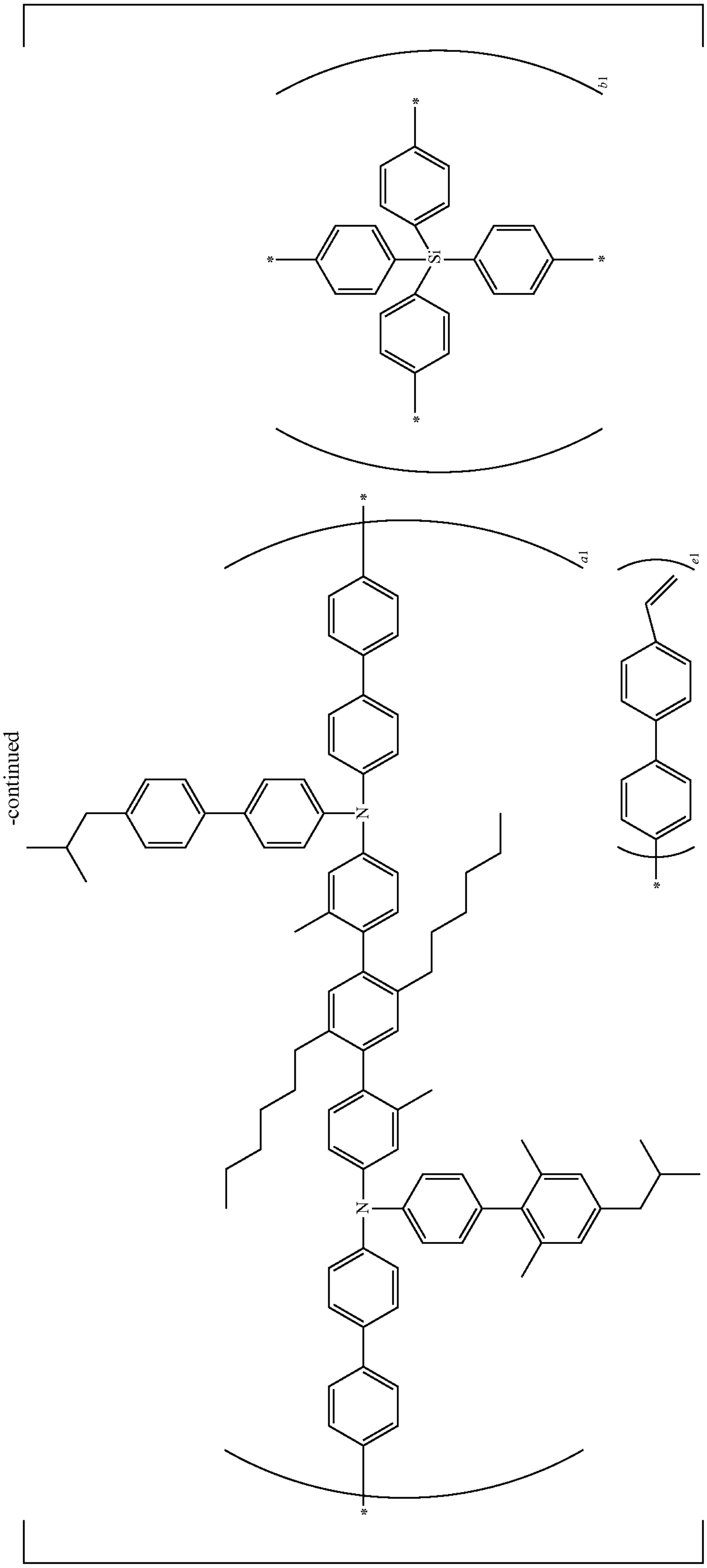

-continued
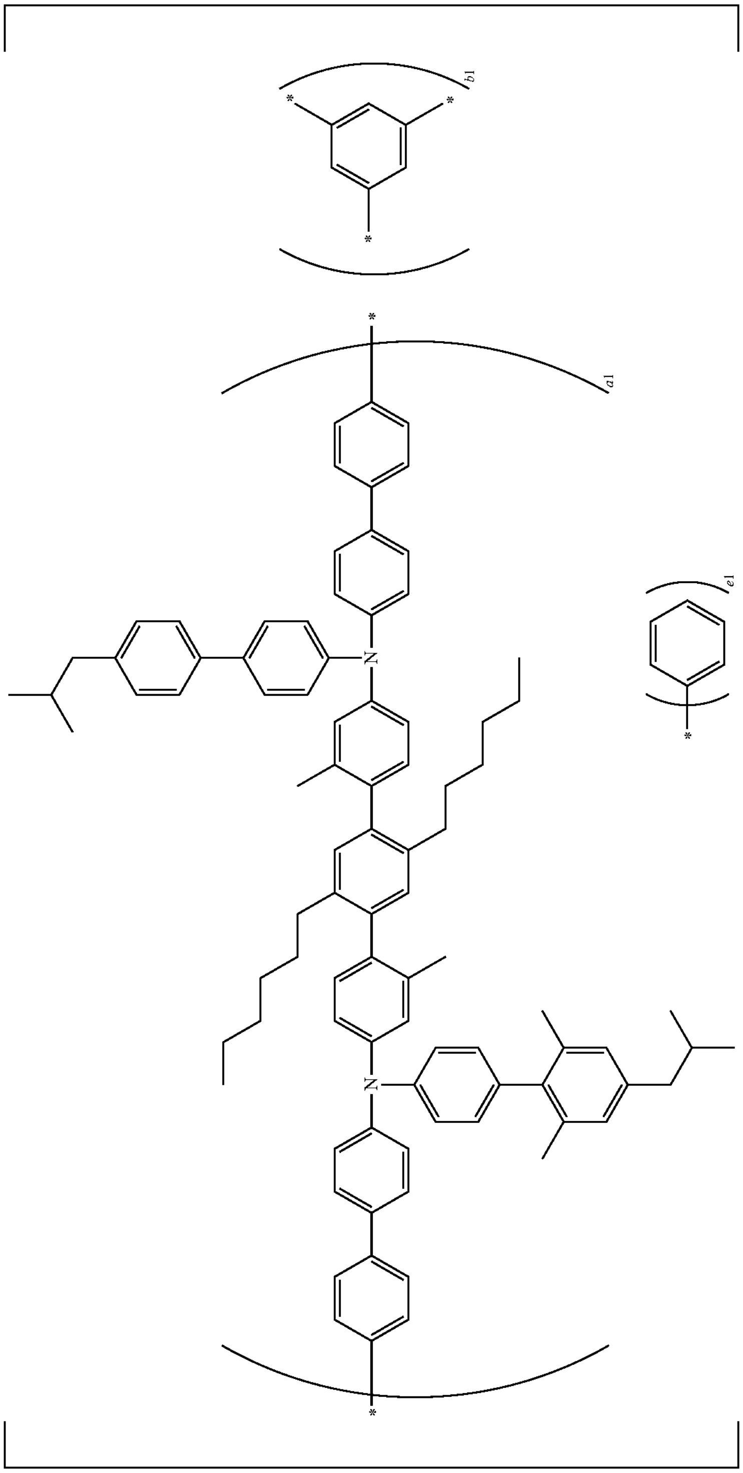

-continued
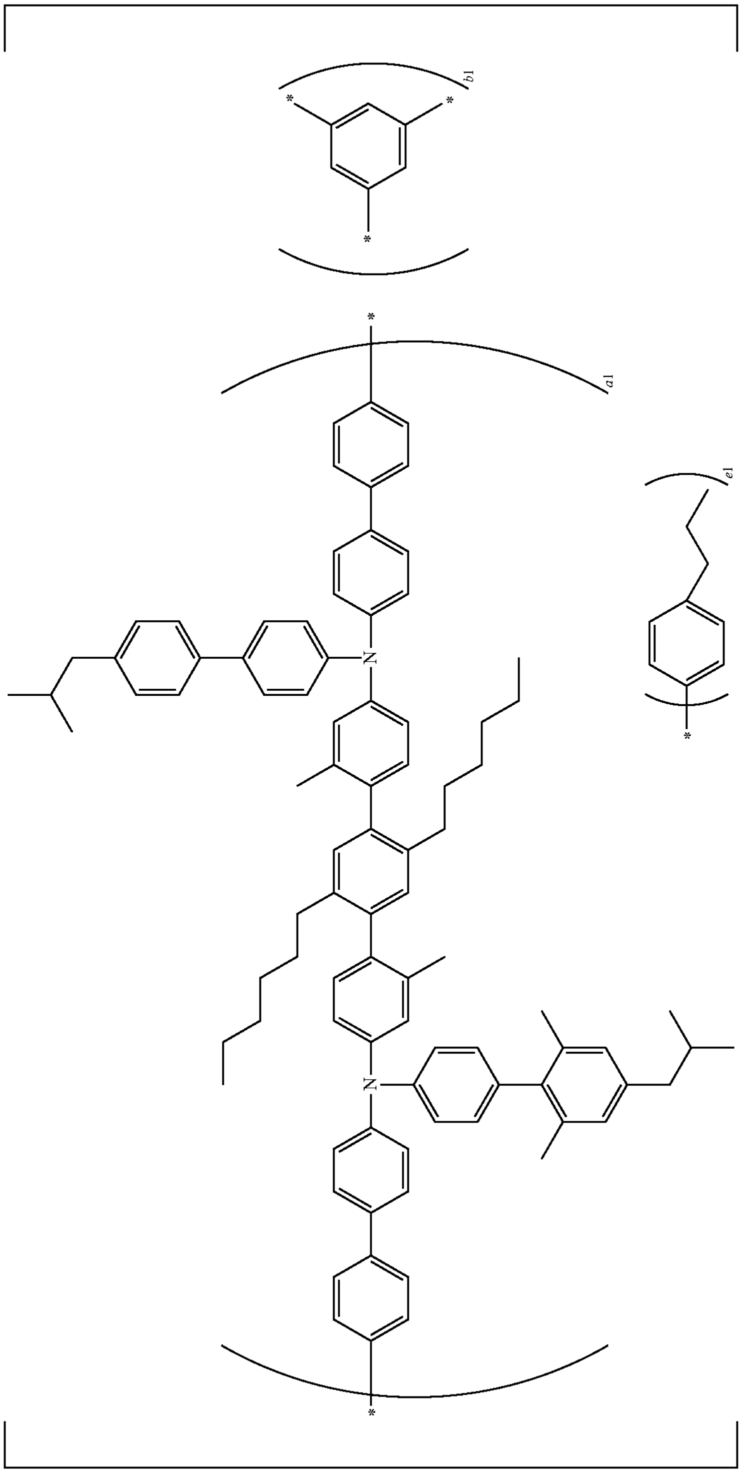

-continued
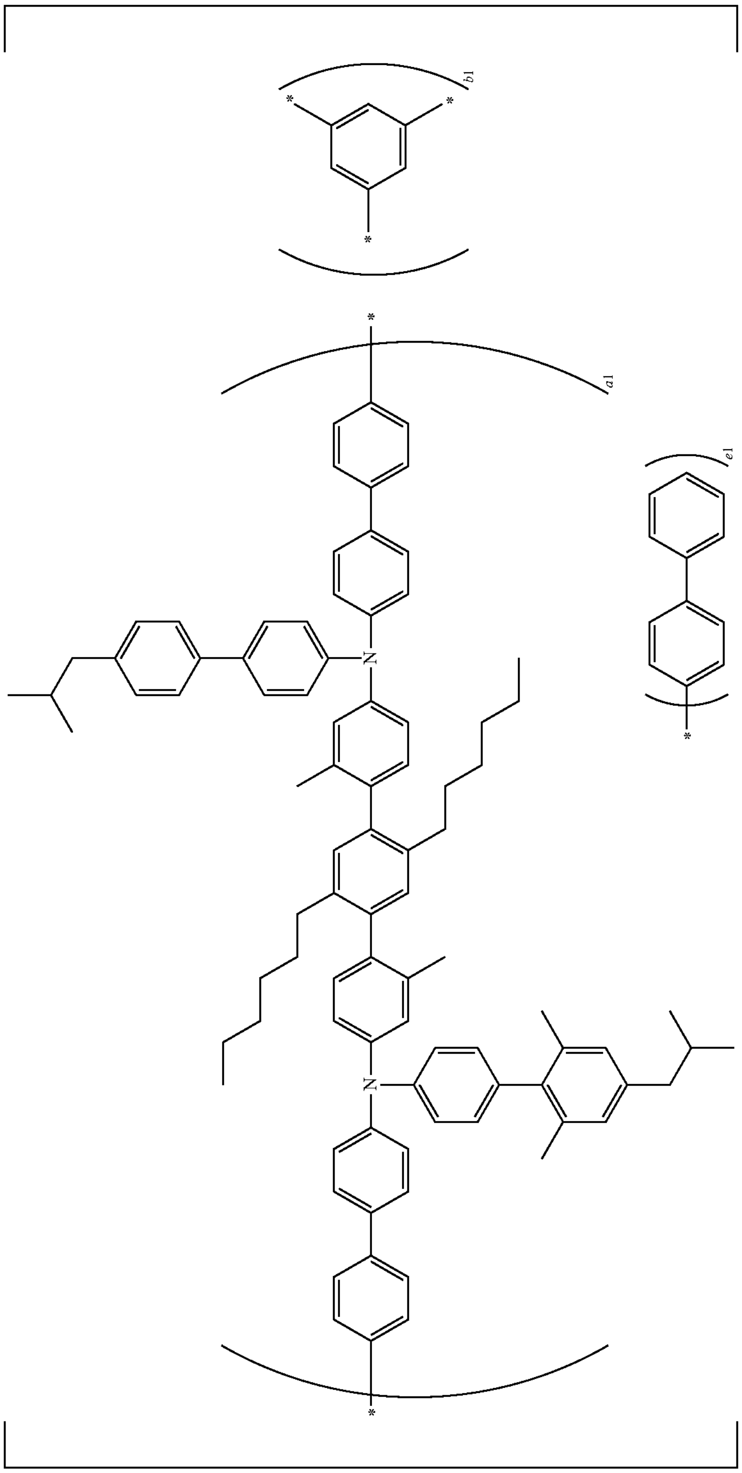

-continued
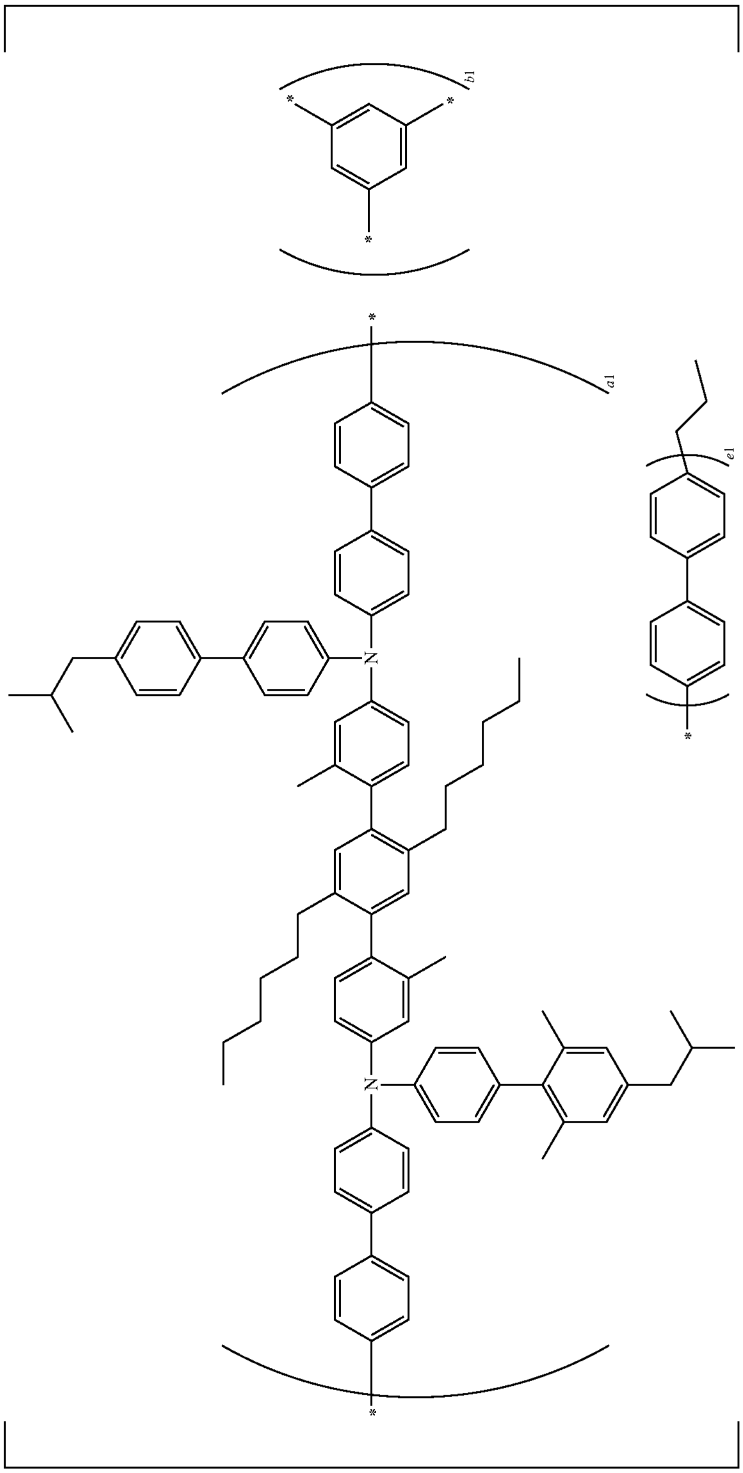

-continued
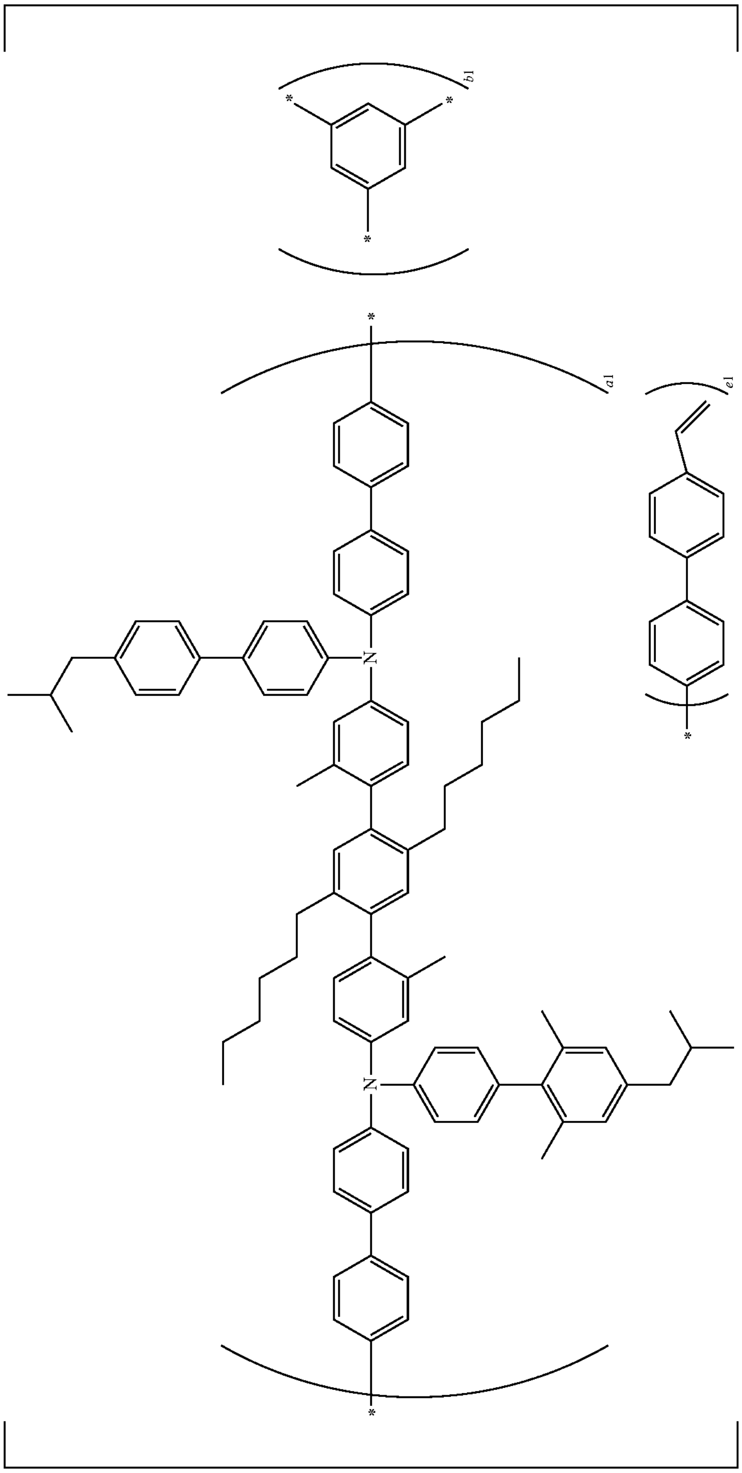

-continued
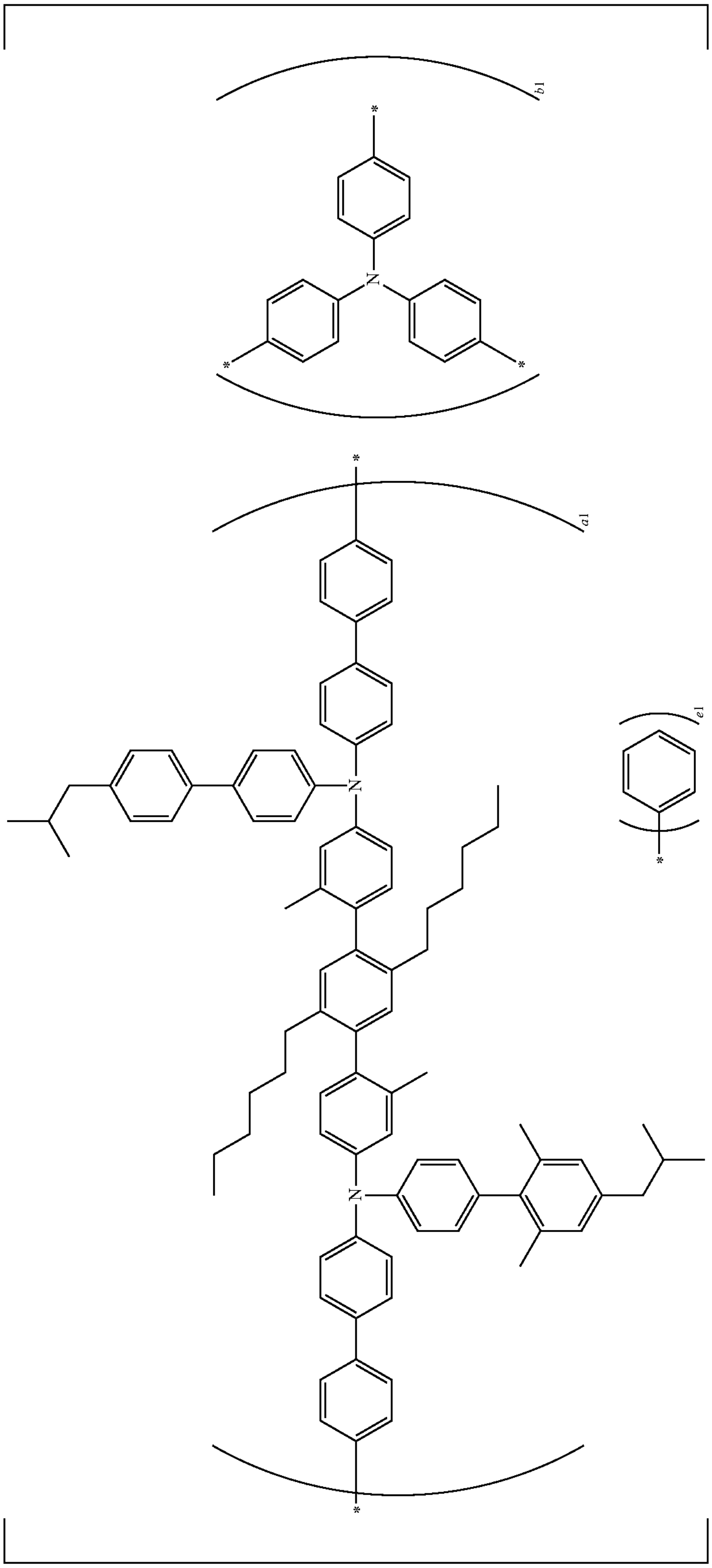

-continued
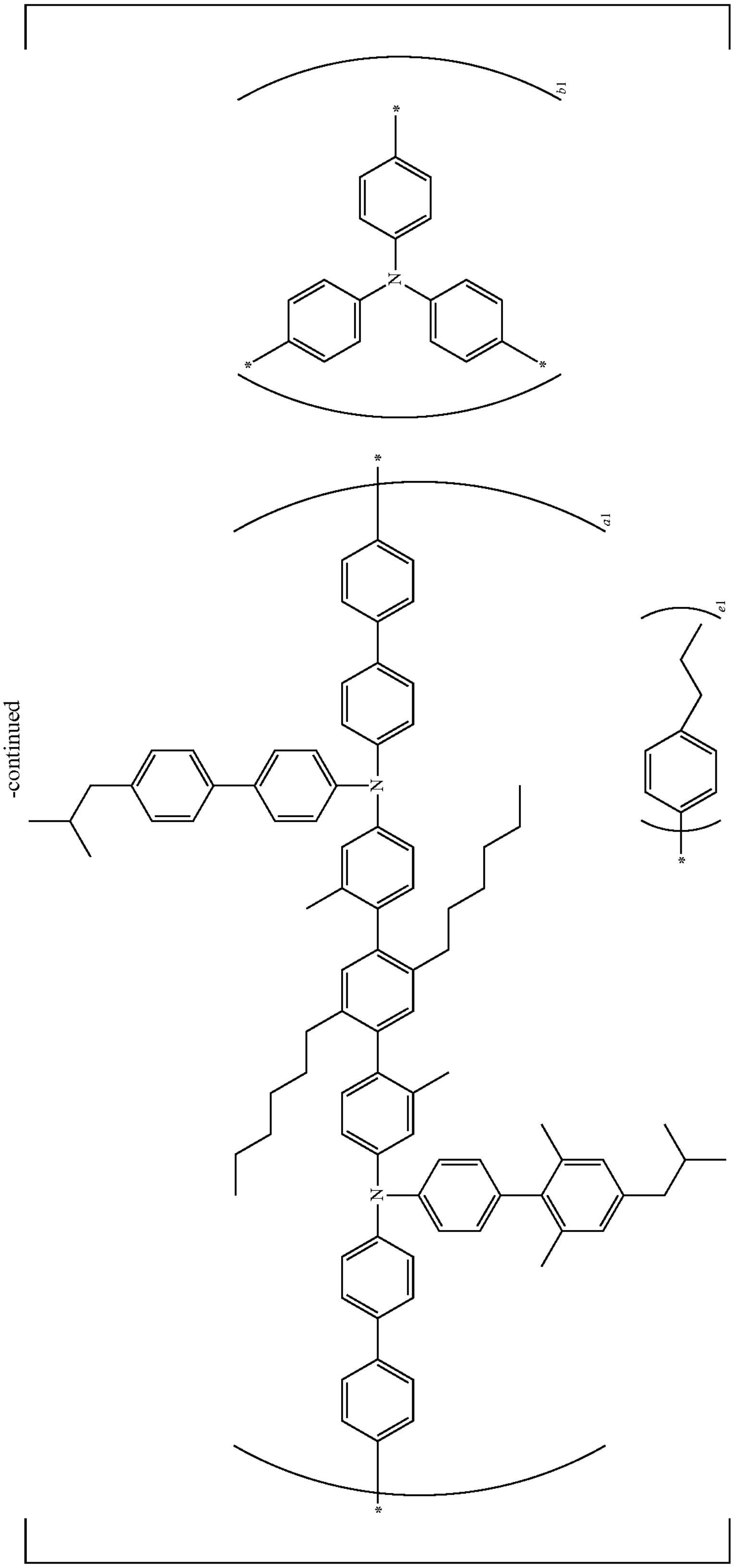

-continued
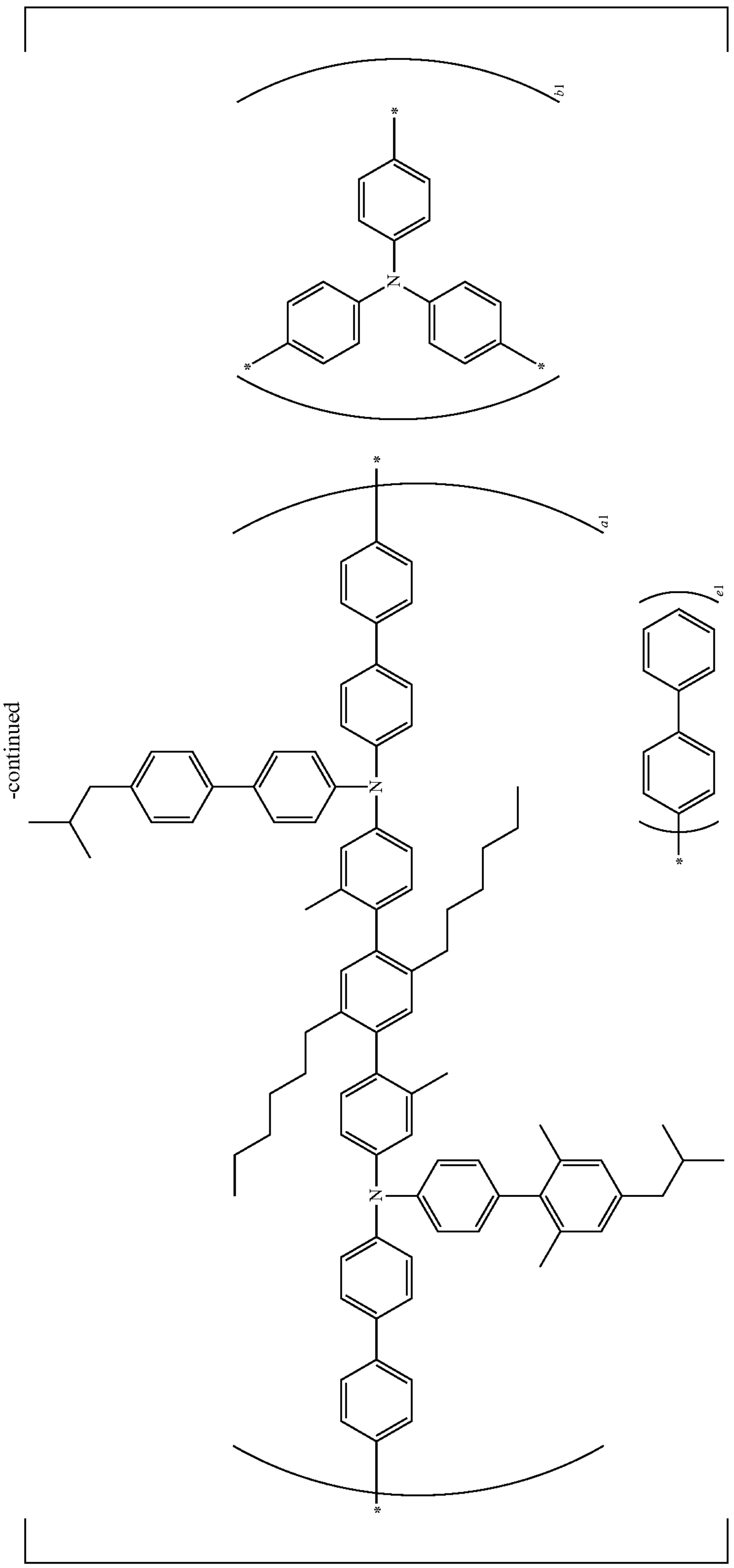

-continued
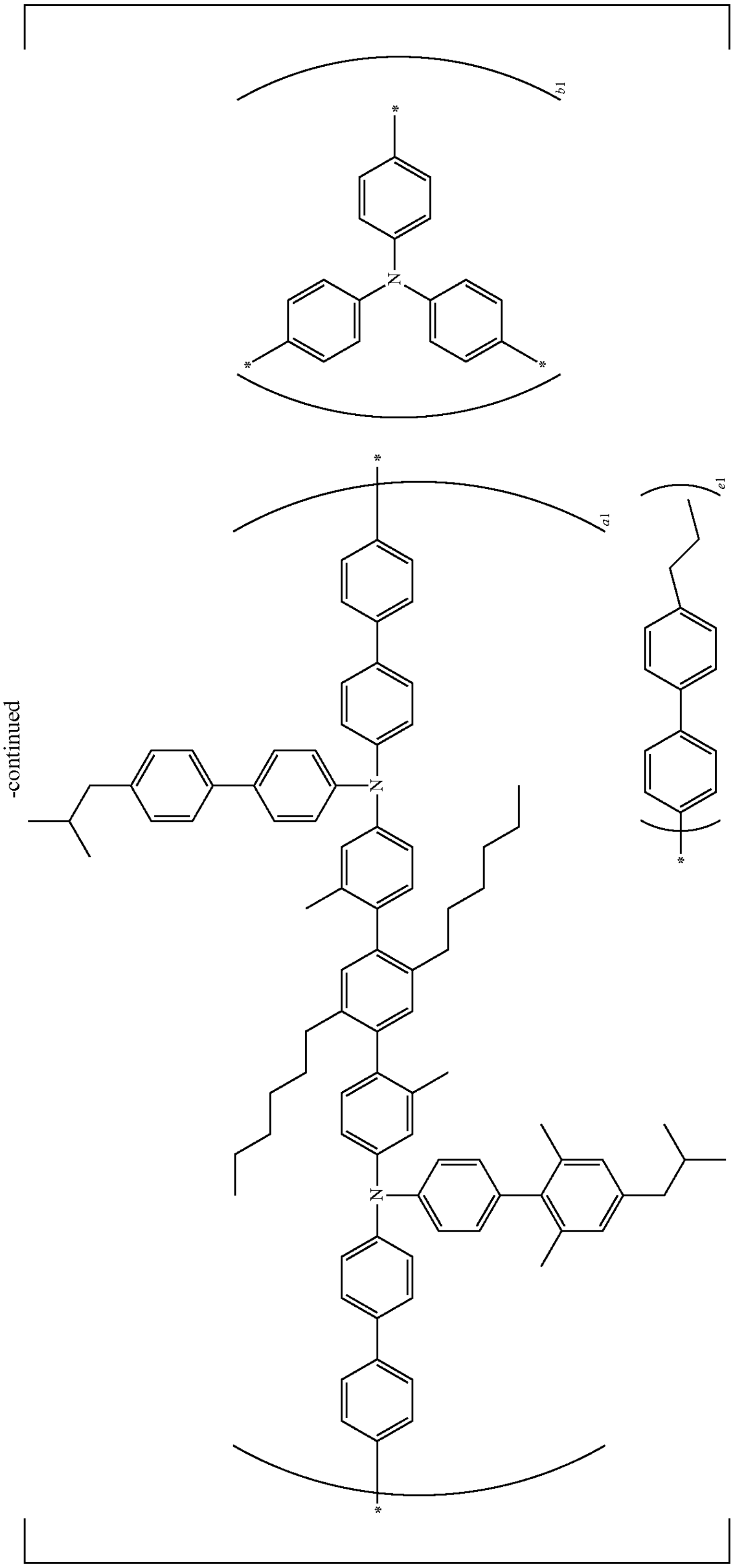

-continued
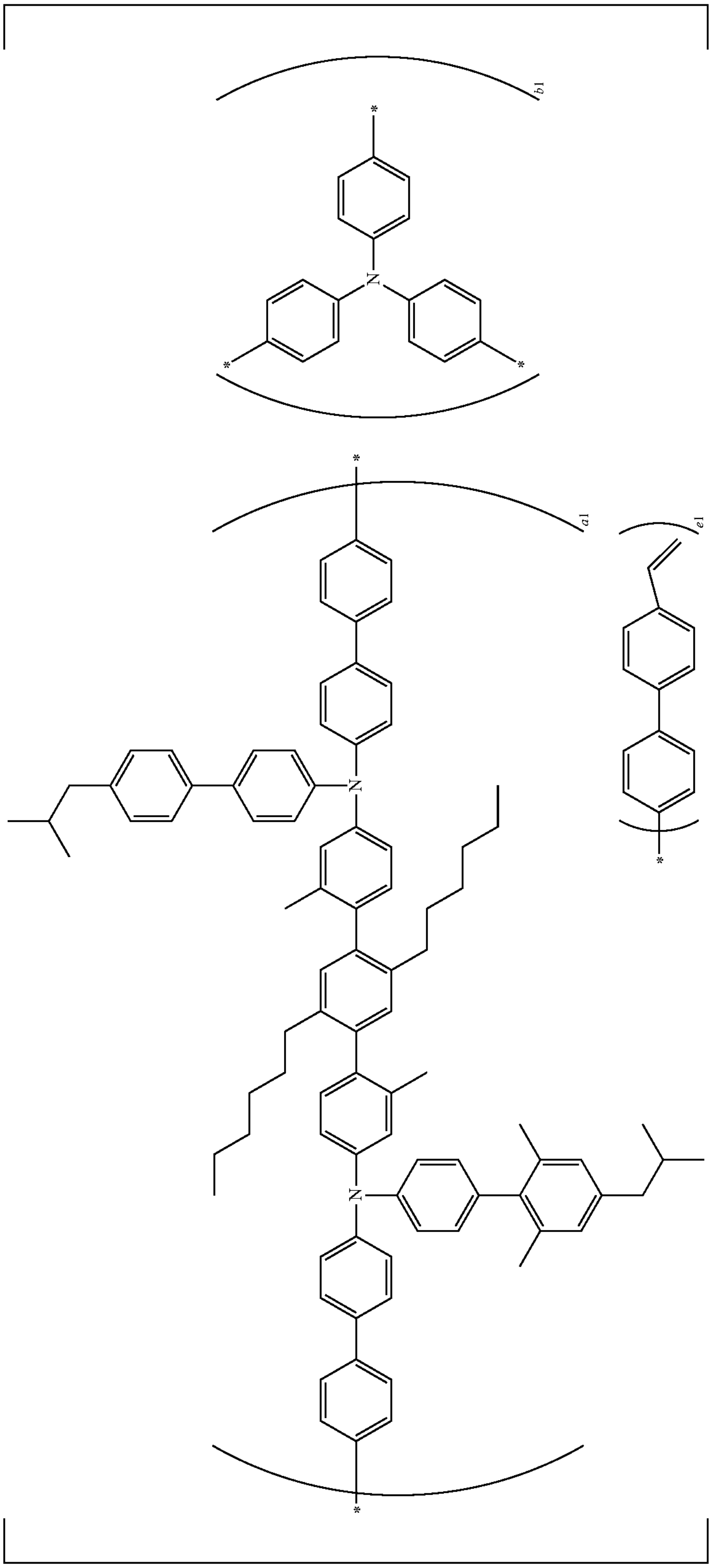

In the structures, al is a real number of $0<a1<1$, b1 is a real number of $0\leq b1<1$, e1 is a real number of $0<e1<1$, and $a1+b1+e1=1$.

Specifically, in the structures, al is a real number of $0<a1<1$, b1 is a real number of $0<b1<1$, e1 is a real number of $0<e1<1$, and $a1+b1+e1=1$.

More specifically, in the structures, al is a real number from 0.2 to 0.9, b1 is a real number from 0.1 to 0.5, e1 is a real number from 0.1 to 0.5, and $a1+b1+e1=1$.

More specifically, in the structures, al is a real number from 0.25 to 0.85, b1 is a real number from 0.1 to 0.4, e1 is a real number from 0.1 to 0.4, and $a1+b1+e1=1$.

In the structures, al, b1, and e1 are determined by the equivalent weight of the monomers added during the preparation of the polymer.

In an exemplary embodiment of the present specification, the polymer may be prepared by using a publicly-known polymerization technique. For example, preparation methods such as Suzuki, Yamamoto, Stille, a C—N coupling reaction using a metal catalyst, and an arylation reaction using a metal catalyst may be applied.

In an exemplary embodiment of the present specification, the polymer may be substituted with deuterium. In this case, deuterium may be substituted by applying a method using a precursor material. For example, deuterium may be substituted by treating a non-deuterated monomer and/or polymer with a deuterated solvent in the presence of a Lewis acid H/D exchange catalyst.

In an exemplary embodiment of the present specification, the molecular weight of the polymer may be controlled by adjusting the ratio of the used monomers. In addition, in some exemplary embodiment, the molecular weight of the polymer may be controlled by using a quenching reaction.

In an exemplary embodiment of the present specification, the polymer may be used as a hole transport material. For example, the polymer may be a polymer for transporting holes.

Further, the polymer according to an exemplary embodiment of the present specification can be applied to a hole transport layer of an organic light emitting device, and thus can improve the performance and service life characteristics of the device.

In an exemplary embodiment of the present specification, the polymer may be formed into a layer by a solution process. The term 'layer' is used interchangeably with the term 'membrane' or 'film', and refers to a coating which covers a desired region. This term is not limited by size. The region may be as large as the entire device, as small as a specific functional area such as an actual visual display, or as small as a single sub-pixel. Layers and films may be formed by any typical deposition technique including deposition, liquid deposition (continuous and discontinuous techniques), and thermal transfer. The continuous deposition technique includes spin coating, gravure coating, curtain coating, dip coating, slot-die coating, spray coating, and continuous nozzle coating, but is not limited thereto. The discontinuous deposition technique includes inkjet printing, gravure printing, and screen printing, but is not limited thereto.

In an exemplary embodiment of the present specification, the polymer has an intrinsic viscosity of less than 60 mL/g. This is especially useful for inkjet printing applications, but the lower viscosity may allow the inkjet printing to spray a thicker liquid. Specifically, the polymer has an intrinsic viscosity of less than 50 mL/g, more specifically less than 40 mL/g, and more specifically less than 30 mL/g.

In an exemplary embodiment of the present specification, the polymer has an intrinsic viscosity of 20 mL/g or more and less than 60 mL/g, specifically 20 mL/g to 50 mL/g, and more specifically 20 mL/g to 40 mL/g.

An exemplary embodiment of the present specification provides a coating composition including the above-described polymer.

In an exemplary embodiment of the present specification, the coating composition further includes a solvent. In an exemplary embodiment of the present specification, the coating composition includes the polymer and the solvent.

In an exemplary embodiment of the present specification, the coating composition may be in a liquid phase. The "liquid phase" means that the composition is in a liquid state at room temperature under atmospheric pressure.

In an exemplary embodiment of the present specification, it is preferred that the solvent does not dissolve a material applied to a lower layer.

In an exemplary embodiment of the present specification, when the coating composition is applied to an organic material layer of an organic light emitting device, a solvent that does not dissolve a material in a lower layer is used. For example, when the coating composition is applied to a hole transport layer, a solvent that does not dissolve the material in the lower layer (first electrode, hole injection layer, and the like) is used. Accordingly, there is an advantage in that the hole transport layer can be introduced by the solution process.

In an exemplary embodiment of the present specification, the coating composition has an improved resistance to solvent during heat treatment after coating.

For example, even though a coating composition is prepared by using a solvent that dissolves the polymer and a layer is manufactured by a solution process, the layer may have resistance to the same solvent after the heat treatment.

Therefore, when an organic material layer is formed by using the polymer and then subjected to a heat treatment process, a solution process can be performed when another organic material layer is applied.

In an exemplary embodiment of the present specification, examples of the solvent included in the coating composition include: a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; a ketone-based solvent such as acetone, methyl ethyl ketone, and cyclohexanone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol and a derivative thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; a benzoate-based solvent such as methyl benzoate, butyl benzoate, and 3-phenoxybenzoate; and a solvent such as tetralin, but the solvent can be used as long as the solvent can dissolve or disperse the polymer according to an exemplary embodiment of the present specification, and is not limited thereto.

In an exemplary embodiment of the present specification, the solvents may be used either alone or in a mixture of two or more solvents.

In an exemplary embodiment of the present specification, a boiling point of the solvent is preferably 40° C. to 350° C., and more preferably 80° C. to 330° C., but is not limited thereto.

In an exemplary embodiment of the present specification, a concentration of the polymer in the coating composition is preferably 0.1 wt/v % to 20 wt/v %, and more preferably 0.5 wt/v % to 10 wt/v %, but is not limited thereto.

An exemplary embodiment of the present specification provides an organic light emitting device including: a first electrode; a second electrode; and an organic material layer including one or more layers provided between the first electrode and the second electrode, in which one or more layers of the organic material layer include the polymer.

The organic material layer of the organic light emitting device of the present specification may also have a single-layered structure, but may have a multi-layered structure in which two or more organic material layers are stacked. For example, the organic light emitting device of the present disclosure may have a structure including a hole injection layer, a hole transport layer, a light emitting layer, an electron transport layer, an electron injection layer, a layer which simultaneously injects and transports holes, a layer which simultaneously injects and transports electrons, and the like as an organic material layer. However, the structure of the organic light emitting device is not limited thereto, and may include a fewer number of organic layers.

When the organic light emitting device includes a plurality of organic material layers, the organic material layers may be formed of the same material or different materials.

In an exemplary embodiment of the present specification, the organic light emitting device includes: a first electrode; a second electrode; and a light emitting layer provided between the first electrode and the second electrode, and includes an organic material layer having a single layer between the light emitting layer and the first electrode, in which the organic material layer includes the polymer.

In an exemplary embodiment of the present specification, the organic light emitting device includes: a first electrode; a second electrode; and a light emitting layer provided between the first electrode and the second electrode, and includes an organic material layer having multi-layers between the light emitting layer and the first electrode, in which one or more layers of the organic material layer include the polymer.

In an exemplary embodiment of the present specification, the organic material layer including the polymer is a hole injection layer, a hole transport layer, or a layer which simultaneously injects and transports holes.

In an exemplary embodiment of the present specification, the organic light emitting device includes: a first electrode; a second electrode; and a light emitting layer provided between the first electrode and the second electrode, and includes one or more layers of a hole injection layer, a hole transport layer or an electron blocking layer between the light emitting layer and the first electrode, in which one or more layers of the hole injection layer, the hole transport layer or the electron blocking layer include the polymer.

In an exemplary embodiment of the present specification, the organic light emitting device includes: a first electrode; a second electrode; and a light emitting layer provided between the first electrode and the second electrode, and includes the hole injection layer and the hole transport layer between the first electrode and the light emitting layer, and one or more layers of the hole injection layer or the hole transport layer include the polymer.

In an exemplary embodiment of the present specification, the organic light emitting device has a structure in which a first electrode; a hole injection layer; a hole transport layer; a light emitting layer; and a second electrode are sequentially provided, and one or more layers of the hole injection layer or the hole transport layer include the polymer.

In an exemplary embodiment of the present specification, the organic light emitting device has a structure in which a first electrode; a hole injection layer; a hole transport layer; a light emitting layer; and a second electrode are sequentially stacked, and the hole injection layer or the hole transport layer includes the polymer.

In an exemplary embodiment of the present specification, the organic light emitting device has a structure in which a first electrode; a hole injection layer; a hole transport layer; a light emitting layer; and a second electrode are sequentially stacked, and the hole transport layer includes the polymer.

In an exemplary embodiment of the present specification, an additional organic material layer may be further included between the light emitting layer and the second electrode.

In an exemplary embodiment of the present specification, an organic material layer having a single layer may be further included between the light emitting layer and the second electrode.

In an exemplary embodiment of the present specification, an organic material layer having multi-layers may be further included between the light emitting layer and the second electrode. For example, one or more layers of a hole blocking layer, an electron injection layer, an electron transport layer or a layer which simultaneously injects and transports electrons may be further included between the light emitting layer and the second electrode.

In an exemplary embodiment of the present specification, the organic light emitting device has a structure in which a first electrode; a hole injection layer; a hole transport layer; a light emitting layer; an electron injection and transport layer; and a second electrode are sequentially stacked, and one or more layers of the hole injection layer or the hole transport layer include the polymer.

In an exemplary embodiment of the present specification, the organic light emitting device has a structure in which a first electrode; a hole injection layer; a hole transport layer; a light emitting layer; an electron injection and transport layer; and a second electrode are sequentially stacked, and the hole injection layer or the hole transport layer includes the polymer.

In an exemplary embodiment of the present specification, the organic light emitting device has a structure in which a first electrode; a hole injection layer; a hole transport layer; a light emitting layer; an electron injection and transport layer; and a second electrode are sequentially stacked, and the hole transport layer includes the polymer.

For example, the structure of the organic light emitting device according to an exemplary embodiment of the present specification is exemplified in FIG. 1.

FIG. 1 exemplifies the structure of an organic light emitting device in which a substrate 1, an anode 2, a light emitting layer 3, and a cathode 4 are sequentially stacked.

FIG. 2 exemplifies the structure of an organic light emitting device in which a substrate 1, an anode 2, a hole injection layer 5, a hole transport layer 6, a light emitting layer 3, an electron injection and transport layer 7, and a cathode 4 are sequentially stacked.

FIGS. 1 and 2 exemplify an organic light emitting device, and the structure of the organic light emitting device of the present disclosure is not limited thereto. In an exemplary embodiment of the present specification, the first electrode is an anode, and the second electrode is a cathode. In another exemplary embodiment, the first electrode is a cathode, and the second electrode is an anode.

In still another exemplary embodiment, the organic light emitting device may be a normal type organic light emitting device in which an anode, an organic material layer having one or more layers, and a cathode are sequentially stacked on a substrate.

In yet another exemplary embodiment, the organic light emitting device may be an inverted type organic light emitting device in which a cathode, an organic material layer having one or more layers, and an anode are sequentially stacked on a substrate.

The organic light emitting device of the present disclosure may be stacked as a structure in the following examples.

(1) Anode/Hole transport layer/Light emitting layer/Cathode (2) Anode/Hole injection layer/Hole transport layer/Light emitting layer/Cathode (3) Anode/Hole injection layer/Hole buffer layer/Hole transport layer/Light emitting layer/Cathode (4) Anode/Hole transport layer/Light emitting layer/Electron transport layer/Cathode (5) Anode/Hole transport layer/Light emitting layer/Electron transport layer/Electron injection layer/Cathode (6) Anode/Hole injection layer/Hole transport layer/Light emitting layer/Electron transport layer/Cathode (7) Anode/Hole injection layer/Hole transport layer/Light emitting layer/Electron transport layer/Electron injection layer/Cathode (8) Anode/Hole injection layer/Hole buffer layer/Hole transport layer/Light emitting layer/Electron transport layer/Cathode (9) Anode/Hole injection layer/Hole buffer layer/Hole transport layer/Light emitting layer/Electron transport layer/Electron injection layer/Cathode

(10) Anode/Hole transport layer/Electron blocking layer/Light emitting layer/Electron transport layer/Cathode

(11) Anode/Hole transport layer/Electron blocking layer/Light emitting layer/Electron transport layer/Electron injection layer/Cathode

(12) Anode/Hole injection layer/Hole transport layer/Electron blocking layer/Light emitting layer/Electron transport layer/Cathode

(13) Anode/Hole injection layer/Hole transport layer/Electron blocking layer/Light emitting layer/Electron transport layer/Electron injection layer/Cathode

(14) Anode/Hole transport layer/Light emitting layer/Hole blocking layer/Electron transport layer/Cathode

(15) Anode/Hole transport layer/Light emitting layer/Hole blocking layer/Electron transport layer/Electron injection layer/Cathode

(16) Anode/Hole injection layer/Hole transport layer/Light emitting layer/Hole blocking layer/Electron transport layer/Cathode

(17) Anode/Hole injection layer/Hole transport layer/Light emitting layer/Hole blocking layer/Electron transport layer/Electron injection layer/Cathode

(18) Anode/Hole injection layer/Hole transport layer/Electron blocking layer/Light emitting layer/Hole blocking layer/Electron injection layer and transport layer/Cathode In the structures, the ‘Electron transport layer/Electron injection layer’ may be replaced with ‘Electron injection and transport layer’ or ‘Layer which simultaneously injects and transports electrons’.

In the structures, the ‘Hole injection layer/Hole transport layer’ may be replaced with the ‘hole injection and transport layer’ or the ‘layer which simultaneously injects and transports holes’.

The organic light emitting device of the present specification may be manufactured by the materials and methods known in the art, except that one or more layers of the organic material layer are manufactured so as to include the polymer. Specifically, for the organic light emitting device, one or more layers of the organic material layer may be formed by using a coating composition including the polymer.

For example, the organic light emitting device of the present specification may be manufactured by sequentially stacking an anode, an organic material layer, and a cathode on a substrate. In this case, the organic light emitting device may be manufactured by depositing a metal or a metal oxide having conductivity, or an alloy thereof on a substrate to form an anode, forming an organic material layer including a hole injection layer, a hole transport layer, a light emitting layer, and an electron injection and transport layer thereon, and then depositing a material, which may be used as a cathode, thereon, by using a physical vapor deposition (PVD) method such as sputtering or e-beam evaporation. In addition to the method described above, an organic light emitting device may be made by sequentially depositing a cathode material, an organic material layer, and an anode material on a substrate.

The present specification also provides a method for manufacturing an organic light emitting device formed by using the coating composition.

Specifically, in an exemplary embodiment of the present specification, the method includes: preparing a substrate; forming a first electrode on the substrate; forming an organic material layer having one or more layers on the first electrode; and forming a second electrode on the organic material layer, and one or more layers of the organic material layer are formed by using the coating composition.

In an exemplary embodiment of the present specification, the organic material layer formed by using the coating composition is formed by using spin coating.

In another exemplary embodiment, the organic material layer formed by using the coating composition is formed by a printing method.

In still another exemplary embodiment of the present specification, examples of the printing method include inkjet printing, nozzle printing, offset printing, transfer printing or screen printing, and the like, but are not limited thereto.

The coating composition according to an exemplary embodiment of the present specification is suitable for a solution process due to the structural characteristic thereof, so that the organic material layer may be formed by a printing method, and as a result, there is an economic effect in terms of time and costs when a device is manufactured.

In an exemplary embodiment of the present specification, the forming of the organic material layer formed by using the coating composition includes: coating the first electrode with the coating composition; and heat-treating or light-treating the coated coating composition.

In another exemplary embodiment, a heat treatment time in the heat-treating of the coating composition may be within 1 hour. The heat treatment time may be specifically within 30 minutes.

In an exemplary embodiment of the present specification, the atmosphere for heat-treating the organic layer formed by using the coating composition is preferably an inert gas atmosphere such as argon or nitrogen.

When the organic material layer formed by using the coating composition is formed by a method including the heat-treating or light-treating of the coated coating composition, resistance to a solvent is increased, so that a plurality of layers may be formed by repeatedly performing solution deposition and cross-linking methods, and stability is increased, so that the service life characteristic of the device may be increased.

In an exemplary embodiment of the present specification, as the anode material, materials having a high work function are usually preferred so as to facilitate the injection of holes into an organic material layer. Specific examples of the anode material which may be used in the present disclosure include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as Zno:Al or $SnO_2$:Sb; a conductive polymer such as poly(3-methylthiophene), poly[3,4-(ethylene-1,2-dioxy)thiophene] (PEDOT), polypyrrole, and polyaniline; and the like, but are not limited thereto.

In an exemplary embodiment of the present specification, as the cathode material, materials having a low work function are usually preferred so as to facilitate the injection of electrons into an organic material layer. Specific examples of the cathode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

In an exemplary embodiment of the present specification, the hole injection layer is a layer that injects holes from the electrode. It is preferred that the hole injection material used in the hole injection layer has the ability to transport holes, and thus has an excellent effect of injecting holes on the anode, the anode material, the light emitting layer and/or the light emitting material. In addition, the hole injection material is preferably a compound that prevents excitons generated in the light emitting layer from moving to the electron injection layer or the electron injection material and is excellent in the ability to form a thin film. In addition, the highest occupied molecular orbital (HOMO) of the hole injection material is preferably a value between the work function of the anode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based electrically conductive polymers, and the like, but are not limited thereto.

In an exemplary embodiment of the present specification, the hole transport layer is a layer that receives holes from the hole injection layer and transports the holes to the light emitting layer. A hole transport material used in the hole transport layer is suitably a material having high hole mobility which may accept holes from an anode or a hole injection layer and transfer the holes to a light emitting layer. In an exemplary embodiment of the present specification, the hole transport layer includes the polymer.

In an exemplary embodiment of the present specification, the light emitting layer includes an organic compound. The organic compound is a material which may receive holes and electrons from a hole transport layer and an electron transport layer, respectively, and combine the holes and the electrons to emit light in a visible ray region, and is preferably a material having good quantum efficiency to fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

In an exemplary embodiment of the present specification, the light emitting layer may include a host material and a dopant material. Examples of the host material include fused aromatic ring derivatives, or hetero ring-containing compounds, and the like. For example, examples of the fused aromatic ring derivatives include anthracene derivatives, pyrene derivatives, naphthalene derivatives, pentacene derivatives, phenanthrene compounds, fluoranthene compounds, and the like, and examples of the hetero ring-containing compounds include carbazole derivatives, dibenzofuran derivatives, ladder-type furan compounds, pyrimidine derivatives, and the like, but the examples thereof are not limited thereto. Examples of the dopant material include an aromatic amine derivative, a styrylamine compound, a boron complex, a fluoranthene compound, a metal complex, and the like. Specifically, the aromatic amine derivative is a fused aromatic ring derivative substituted with a substituted or unsubstituted arylamino group, and examples thereof include fluorene substituted with an arylamino group, benzofluorene, pyrene, anthracene, chrysene, periflanthene, and the like, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specifically, examples of the styrylamine compound include styrylamine, styryldiamine, styryltriamine, styryltetramine, and the like, but are not limited thereto. Further, examples of the metal complexes include an iridium complex, a platinum complex, and the like, but are not limited thereto.

In an exemplary embodiment of the present specification, the host material is an anthracene derivative, and the dopant material is a benzofluorene-based compound substituted with an arylamine group. Specifically, the host material is a deuterated anthracene derivative, and the dopant material is a bis(diarylamino)benzofluorene-based compound.

In an exemplary embodiment of the present specification, the light emitting layer includes a quantum dot. For example, the light emitting layer may include a matrix resin and a quantum dot, and as the types and contents of quantum dots, those known in the art may be used.

In an exemplary embodiment of the present specification, the electron transport layer is a layer that receives electrons from the electron injection layer and transports the electrons to the light emitting layer. An electron transport material used in the electron transport layer is suitably a material having high electron mobility which may proficiently accept electrons from a cathode and transfer the electrons to a light emitting layer. Specific examples thereof include: Al complexes of 8-hydroxyquinoline; complexes including $Alq_3$; organic radical compounds; hydroxyflavone-metal complexes, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

In an exemplary embodiment of the present specification, the electron injection layer is a layer which injects electrons from an electrode, and an electron injection material is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, bathocuproine (BCP), and the like, and derivatives thereof, metal complex compounds, nitrogen-containing 5-membered ring derivatives, and the like, but are not limited thereto.

In an exemplary embodiment of the present specification, examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

In an exemplary embodiment of the present specification, the hole blocking layer is a layer which blocks holes from reaching a cathode, and may be generally formed under the same conditions as those of the hole injection layer. Specifically, oxadiazole derivatives or triazole derivatives, phenanthroline derivatives, BCP, aluminum complexes, and the like may be used in the hole blocking layer, but are not limited thereto.

In an exemplary embodiment of the present specification, a layer adjacent to an organic material layer including the polymer represented by Chemical Formula 1; or the polymer including the unit represented by Chemical Formula 2 and the end group represented by Chemical Formula 5, for example, a bank layer includes a compound having fluorine as a substituent.

For example, when the polymer represented by Chemical Formula 1 is included in a hole transport layer, a bank layer adjacent to a hole transport layer (for example, one or more of a hole injection layer or a light emitting layer) includes fluorine.

When a layer adjacent to an organic material layer including the polymer represented by Chemical Formula 1, or the polymer including the unit represented by Chemical Formula 2 and the end group represented by Chemical Formula 5 includes fluorine, there is an effect capable of forming a uniform layer because the dipole moment is changed depending on the fluorine.

The organic light emitting device according to the present specification may be a top emission type, a bottom emission type, or a dual emission type according to the materials to be used.

EXAMPLES

Hereinafter, the present specification will be described in detail with reference to Examples for specifically describing the present specification. However, the Examples according to the present specification may be modified in various forms, and it is not interpreted that the scope of the present application is limited to the Examples described in detail below. The Examples of the present application are provided to explain the present specification more completely to a person with ordinary skill in the art.

SYNTHESIS EXAMPLES

Synthesis Example 1. Preparation of Polymer 1

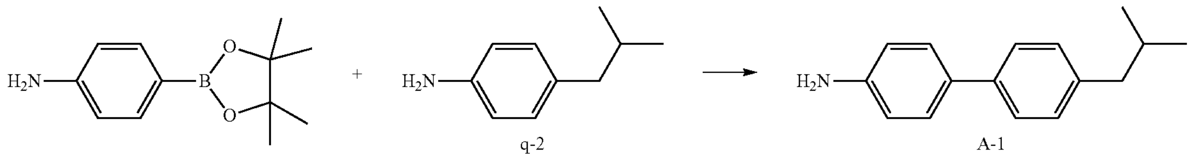

q-1 q-2 A-1

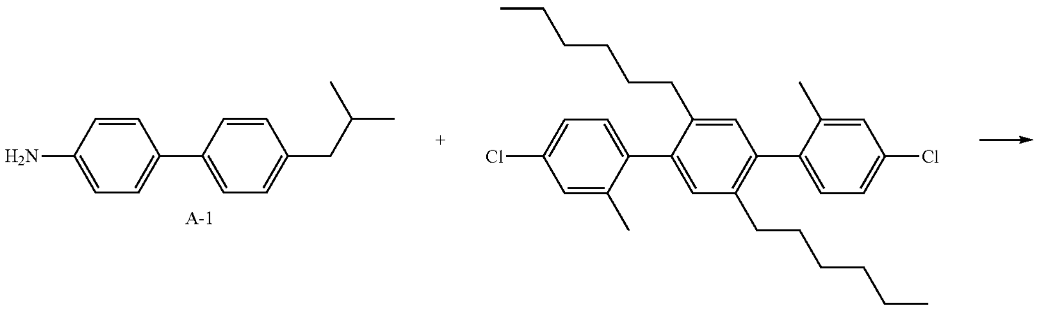

A-1 A-2

-continued
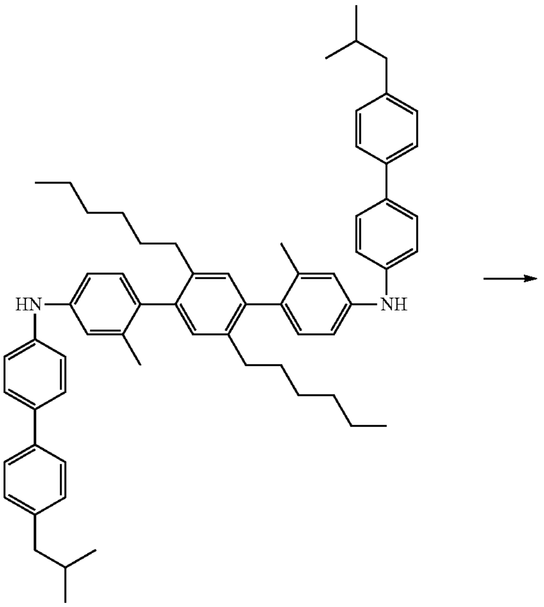
B-1
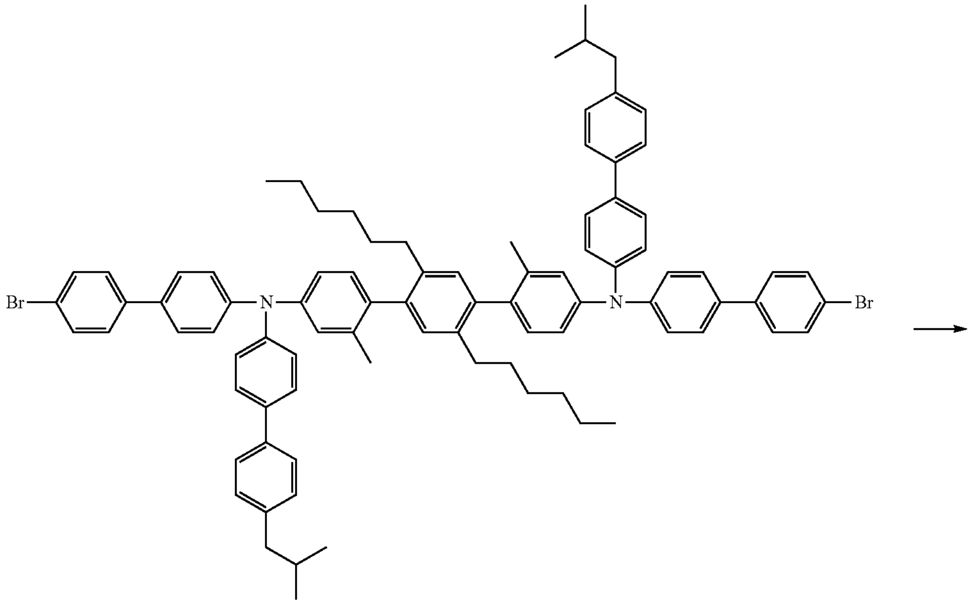
C-1

-continued

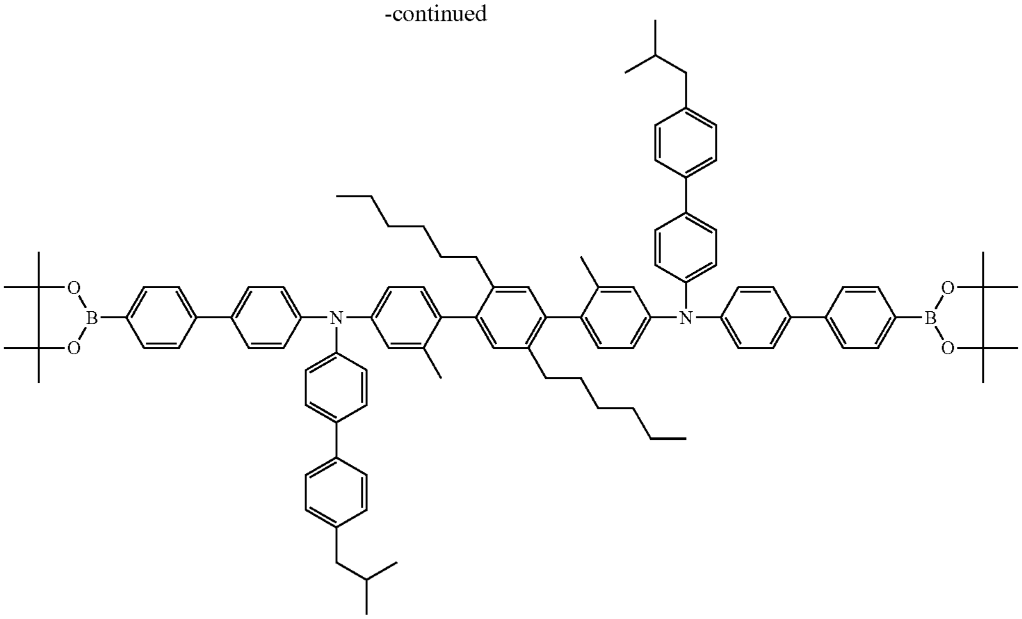

D-1

(1) Preparation of Compound A-1

After Compound q-1 (50.0 g, 1.00 eq), Compound q-2 (65.2 g, 1.35 eq), potassium carbonate ($K_2CO_3$) (78.7 g, 2.5 eq) and bis(tri-tert-butylphosphine) palladium (0) (1.74 g, 0.015 eq) were introduced into a round flask equipped with a condenser, tetrahydrofuran (THF) (500 mL) and distilled water (300 mL) were each injected into the flask, and the flask was warmed to 60° C., followed by stirring for 6 hours. After the reaction was terminated by injecting distilled water into the flask, the organic solvent was extracted and concentrated under reduced pressure to prepare Compound A-1 (50.1 g) in a liquid state.

(2) Preparation of Compound B-1

Compound A-2 (41.0 g, 1.00 eq) and Compound A-1 (50.0 g, 3.0 eq) previously prepared were dissolved in xylene (200 mL) in a round flask equipped with a condenser. When the solution was completely dissolved, sodium tert-butoxide (40.0 g, 5.00 eq) and bis(tri-tert-butylphosphine) palladium (0) (2.1 g, 0.05 eq) were added thereto, and the resulting mixture was refluxed at 120° C. for 3 hours. After the reaction was terminated by injecting distilled water to the flask, the organic solvent was extracted with ethyl acetate and distilled water, and precipitated with toluene and hexane to prepare Compound B-1 as a white solid.

(3) Preparation of Compound C-1

Compound B-1 (15.1 g, 1.00 eq) previously prepared, 4-bromo-4'-iodo-1,1'-biphenyl (13.16 g, 2.50 eq) and sodium tert-butoxide (7.0 g, 5.00 eq) were dissolved in toluene (200 mL) in a round flask equipped with a condenser. When the solution was completely dissolved, tris (dibenzylideneacetone) dipalladium (0) (0.67 g, 0.05 eq) and 1,1'-bis(diphenylphosphino) ferrocene (0.81 g, 0.10 eq) were introduced into the flask, and the resulting mixture was refluxed at 90° C. for 8 hours. After the reaction was terminated by injecting distilled water to the flask, the organic solvent was extracted with ethyl acetate and distilled water, and Compound C-1 with a purity of 99.7% was prepared by column chromatography.

(4) Preparation of Compound D-1

10.00 g (1.00 eq) of C-1 previously prepared, 14 g (2.00 eq) of bis(pinacolato)diboron, and 1.60 g (3.00 eq) of potassium tert-butoxide were dissolved in 200 mL of toluene in a round flask equipped with a condenser. When the solution was completely dissolved, 0.20 g (0.04 eq) of [1,1'-bis(diphenylphosphino) ferrocene]dichloropalladium (II) (Pd (dppf)) was introduced into the flask, and the resulting mixture was refluxed at 90° C. for 8 hours. After the reaction was terminated with DI water, an organic solvent was extracted with ethyl acetate and distilled water, and Compound D-1 with a purity of 99.3% was prepared by column chromatography.

(5) Preparation of Polymer 1
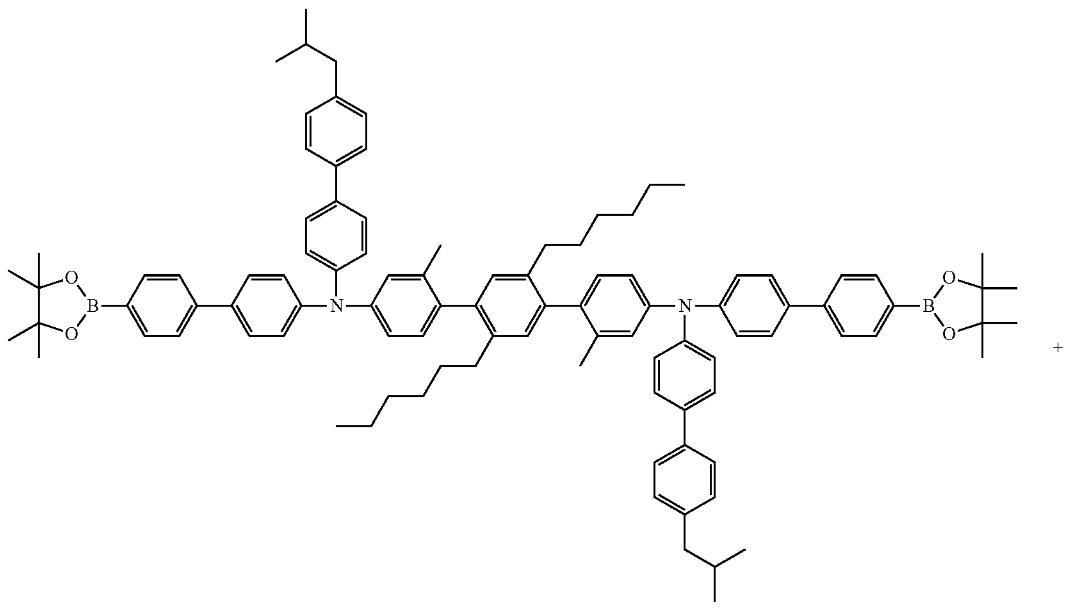
D-1
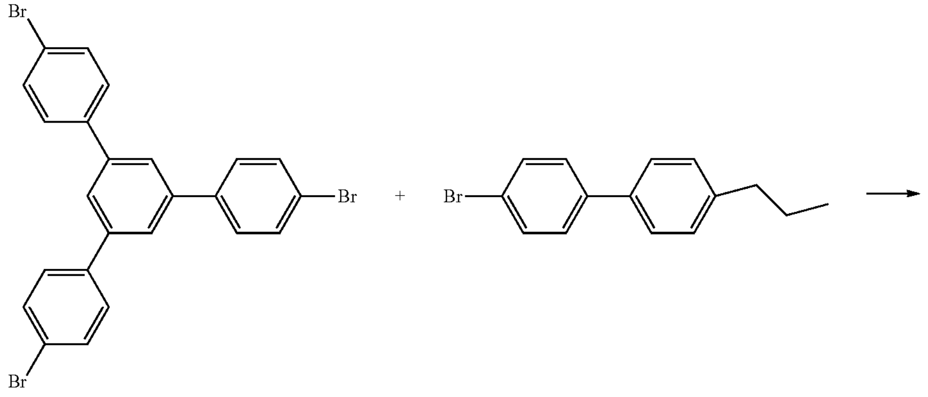
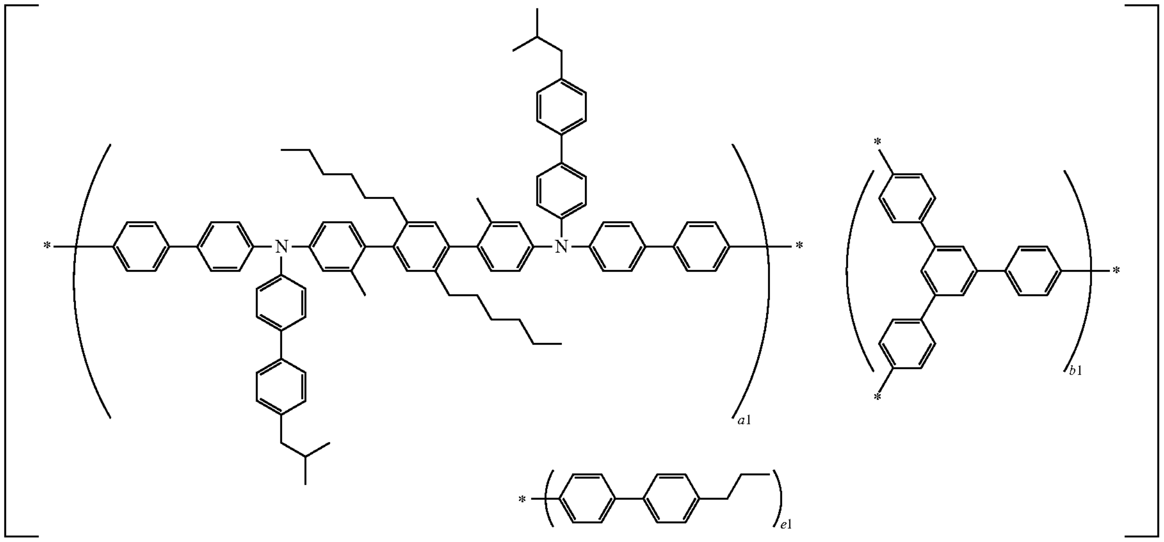
1

Compound D-1 (0.765 mmol), 4,4"-dibromo-5'-(4-bromophenyl)-1,1': 3',1"-terphenyl (0.158 mmol) and 4-bromo-4'-propyl-1,1'-biphenyl (0.369 mmol) were put into a round flask and dissolved in toluene (11 mL) to prepare a first solution.

Bis(1,5-cyclooctadiene) nickel (0) (2.42 mmol) was introduced into a 50 mL Schlenk tube. 2,2'-dipyridyl (2.42 mmol) and 1,5-cyclooctadiene (2.42 mmol) were put into a scintillation vial and then dissolved in N, N'-dimethylformamide (5.5 mL) and toluene (11 mL) to prepare a second solution.

The second solution was put into the Schlenk tube and the resulting solution was stirred at 50° C. for 30 minutes. The first solution was additionally added to the Schlenk tube, and the resulting solution was stirred at 50° C. for 3 hours. After the reaction was terminated by slowly adding HCl and methanol (methanol:HCl=95:5 (v:v)) dropwise thereto, the resulting solution was stirred for 45 minutes, and the resulting solid was filtered. The dried solid was dissolved in toluene (1% wt/v) and purified by being allowed to pass through a column containing silica gel and basic aluminum oxide (6 g each). Polymer 1 was prepared by triturating the obtained toluene solution with acetone.

Synthesis Example 2. Preparation of Polymer 2

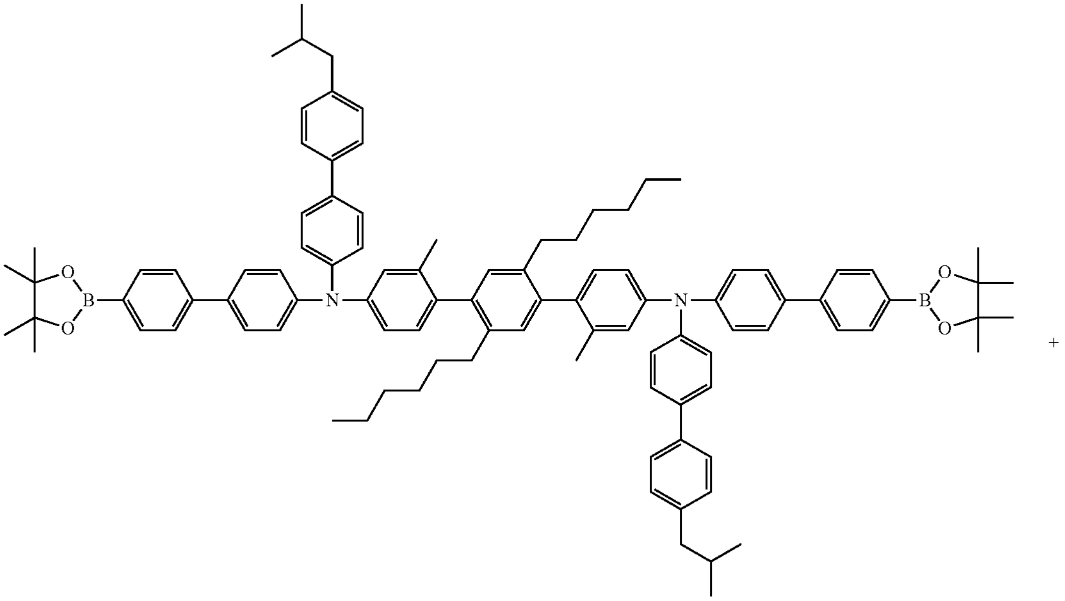

D-1

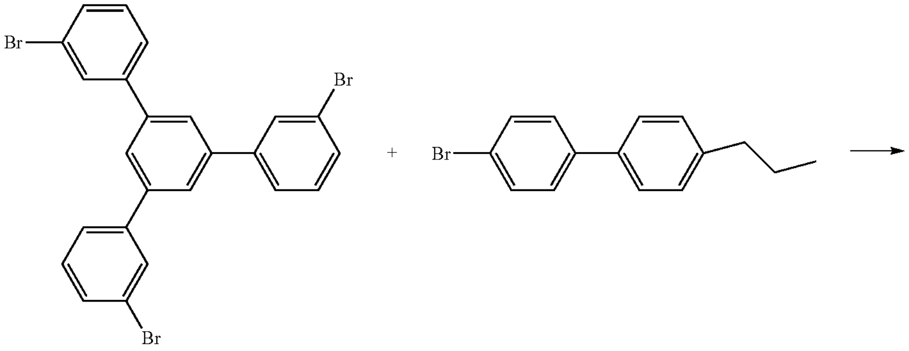

-continued
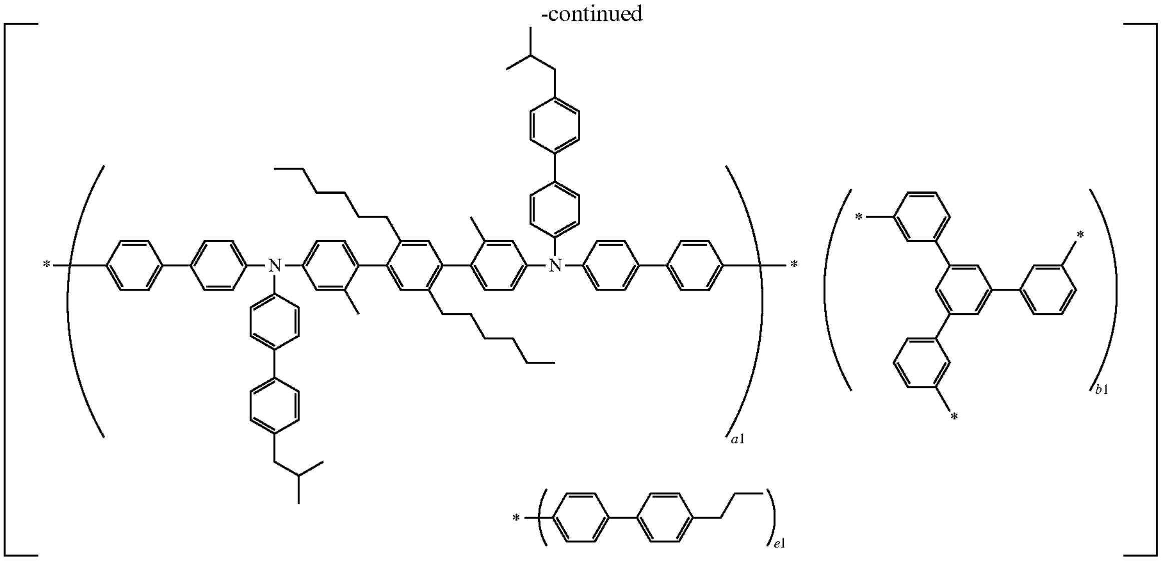
2
Polymer 2 was prepared in the same manner as in the preparation method in Synthesis Example 1, except that 3,3"-dibromo-5'-(3-bromophenyl)-1,1': 3',1"-terphenyl was used instead of 4,4"-dibromo-5'-(4-bromophenyl)-1,1': 3',1"-terphenyl in (5) of Synthesis Example 1.
Synthesis Example 3. Preparation of Polymer 3
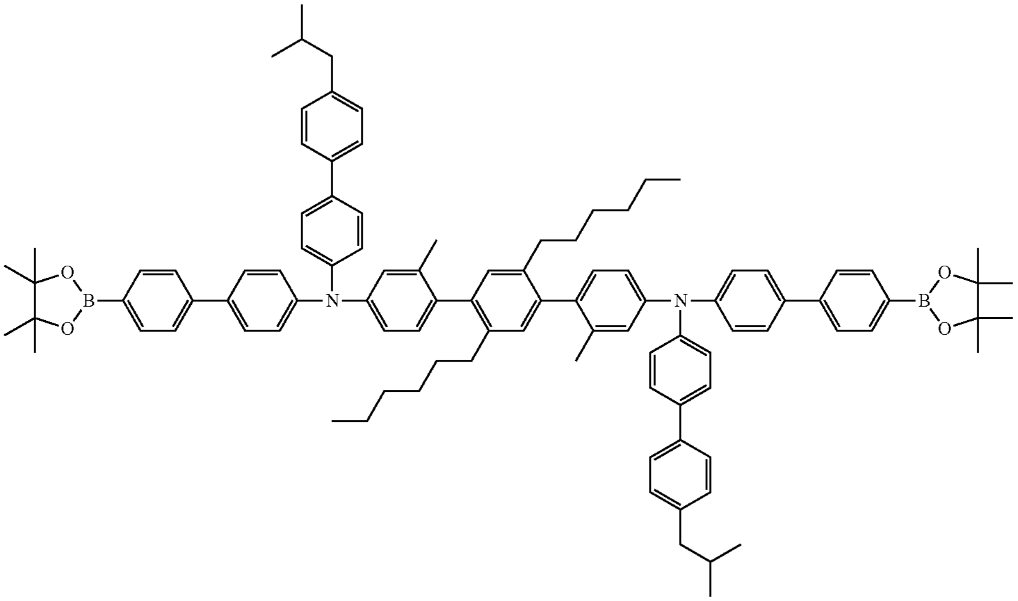
+
D-1
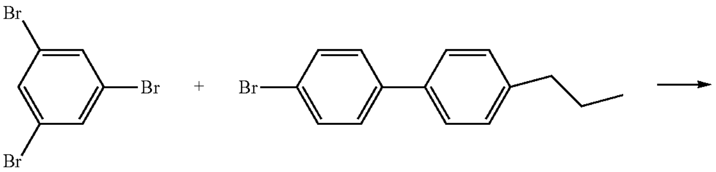

-continued
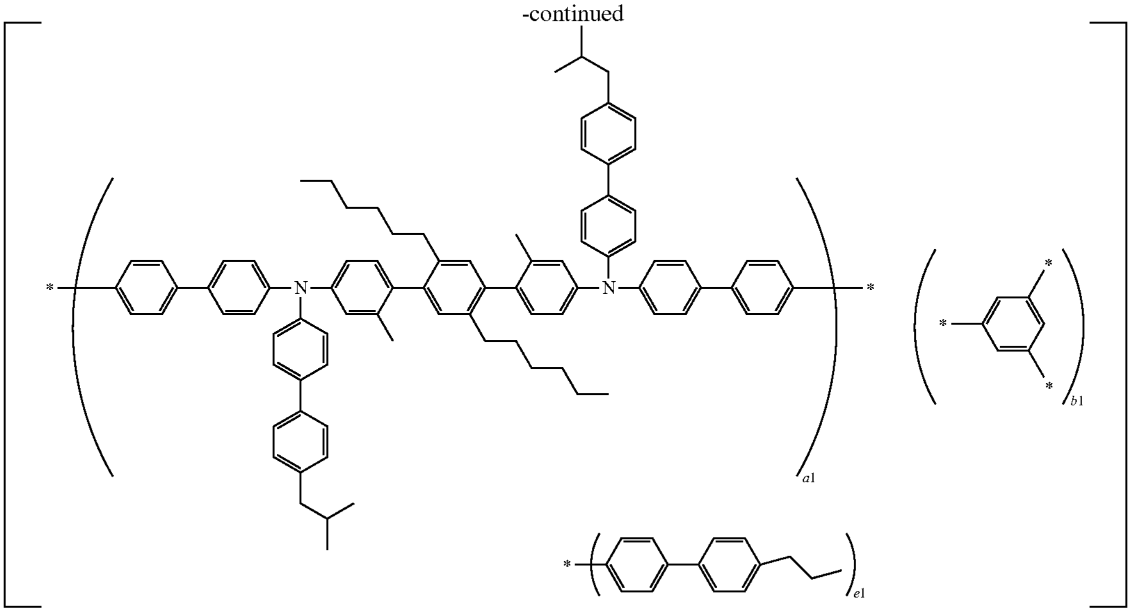
3
Polymer 3 was prepared in the same manner as in the preparation method in Synthesis Example 1, except that 1,3,5-tribromobenzene was used instead of 4,4"-dibromo-5'-(4-bromophenyl)-1,1': 3',1"-terphenyl in (5) of Synthesis Example 1.
Synthesis Example 4. Preparation of Polymer 4
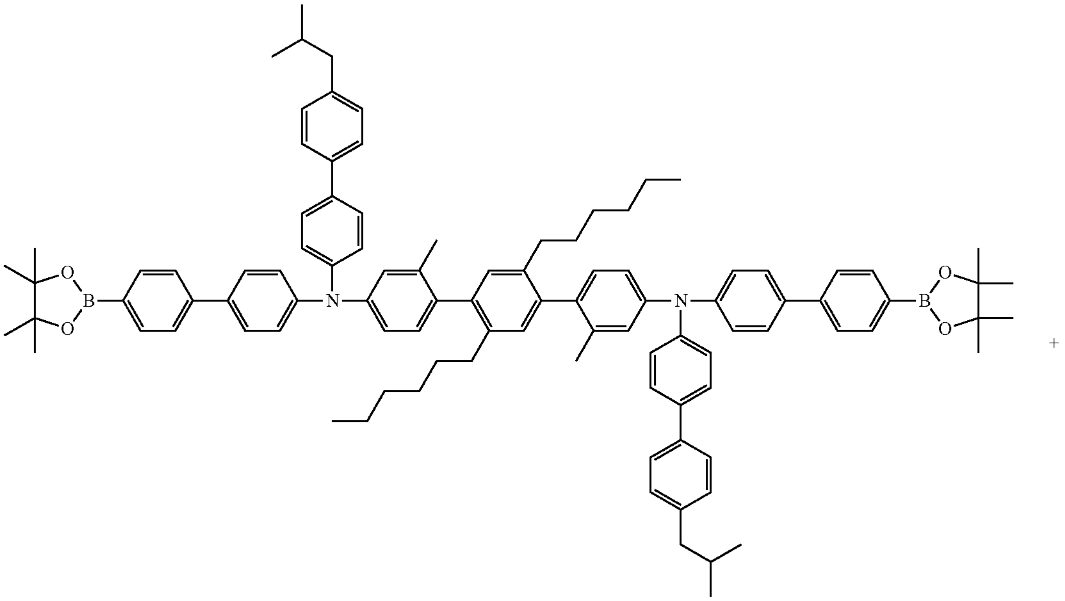
D-1

-continued
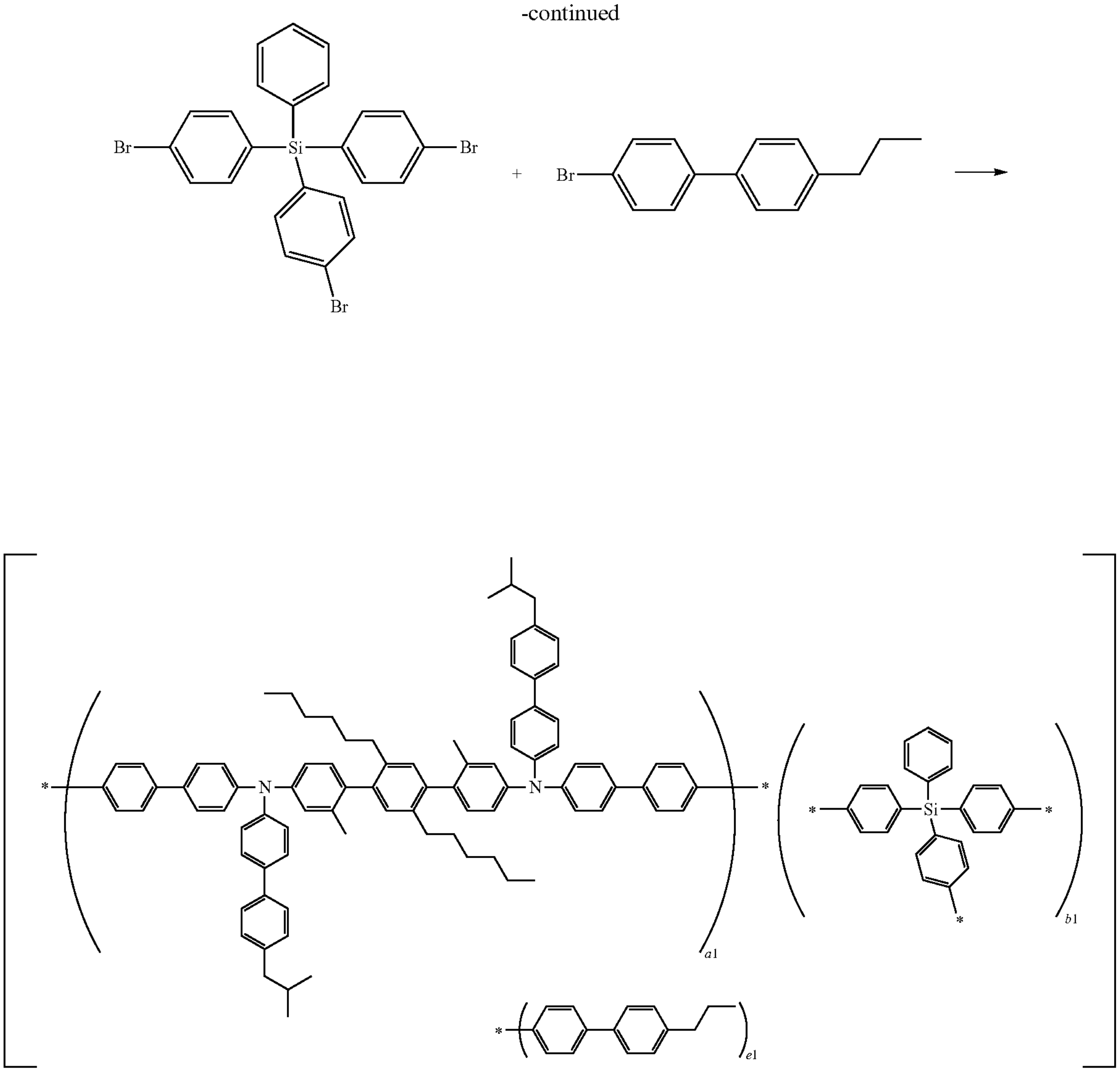
4
Polymer 4 was prepared in the same manner as in the preparation method in Synthesis Example 1, except that tris(4-bromophenyl) (phenyl) silane was used instead of 4,4"-dibromo-5'-(4-bromophenyl)-1,1': 3',1"-terphenyl in (5) of Synthesis Example 1.

Synthesis Example 5. Preparation of Polymer 5
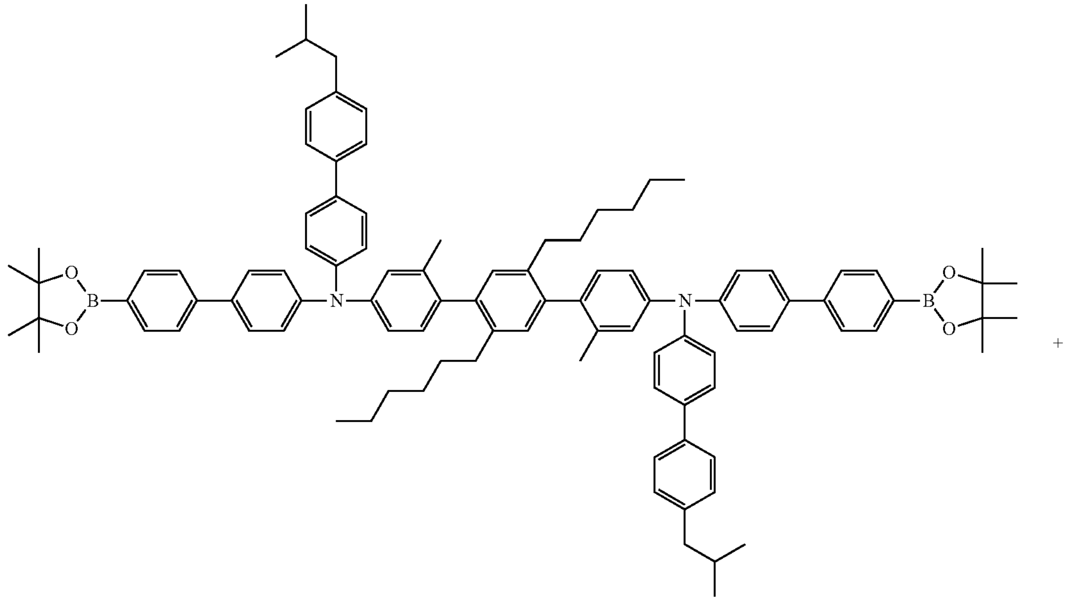
D-1
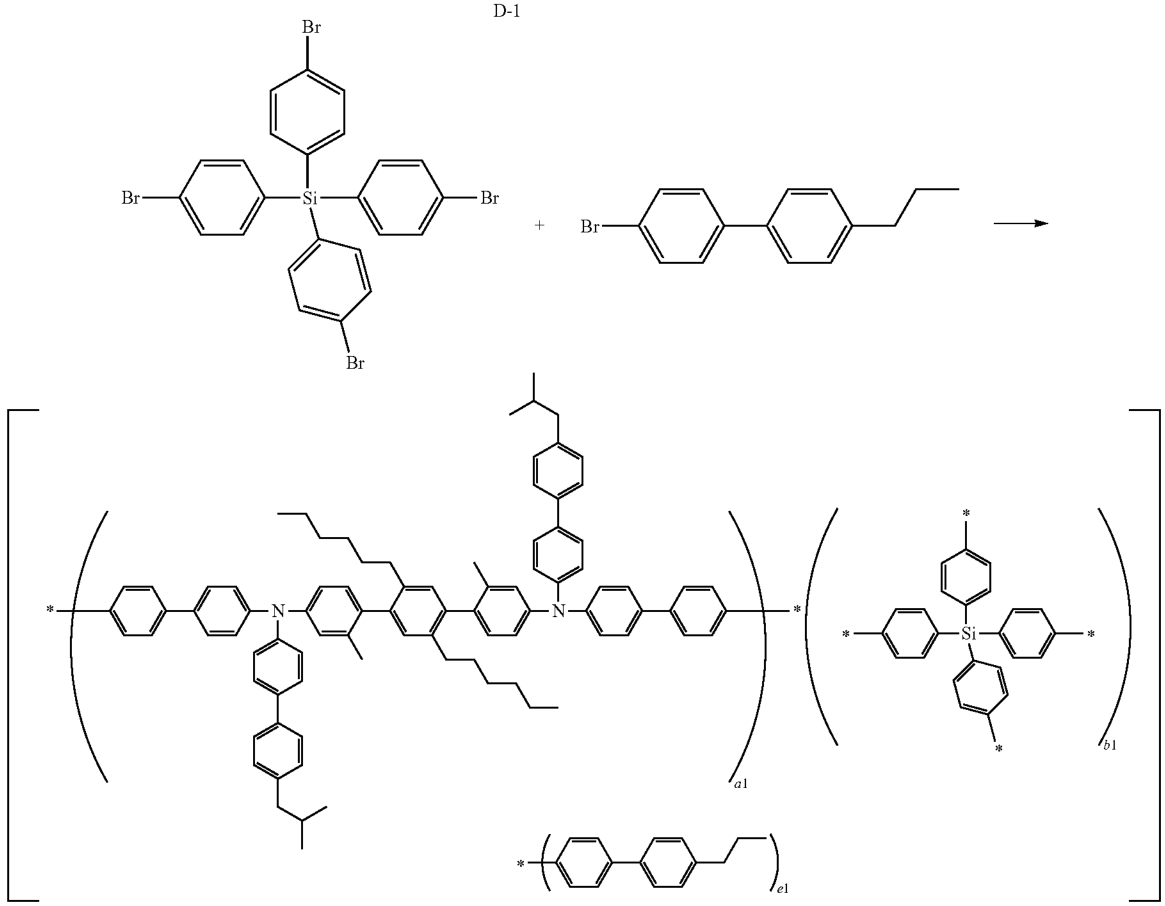
5
Polymer 5 was prepared in the same manner as in the preparation method in Synthesis Example 1, except that tetrakis(4-bromophenyl) silane was used instead of 4,4"-dibromo-5'-(4-bromophenyl)-1,1': 3',1"-terphenyl in (5) of Synthesis Example 1.

Synthesis Example 6. Preparation of Polymer 6
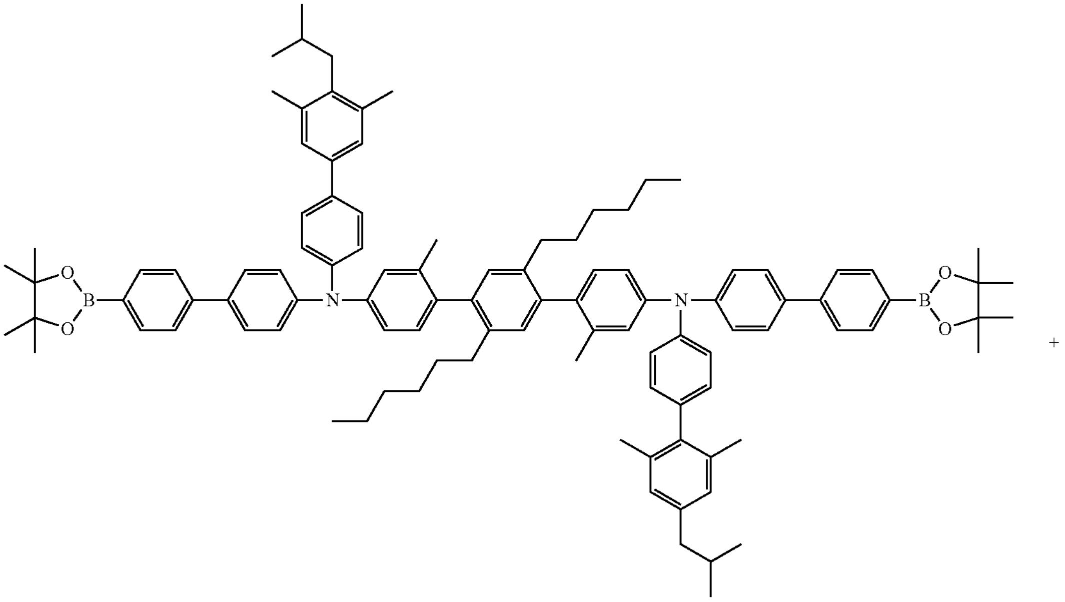
D-2
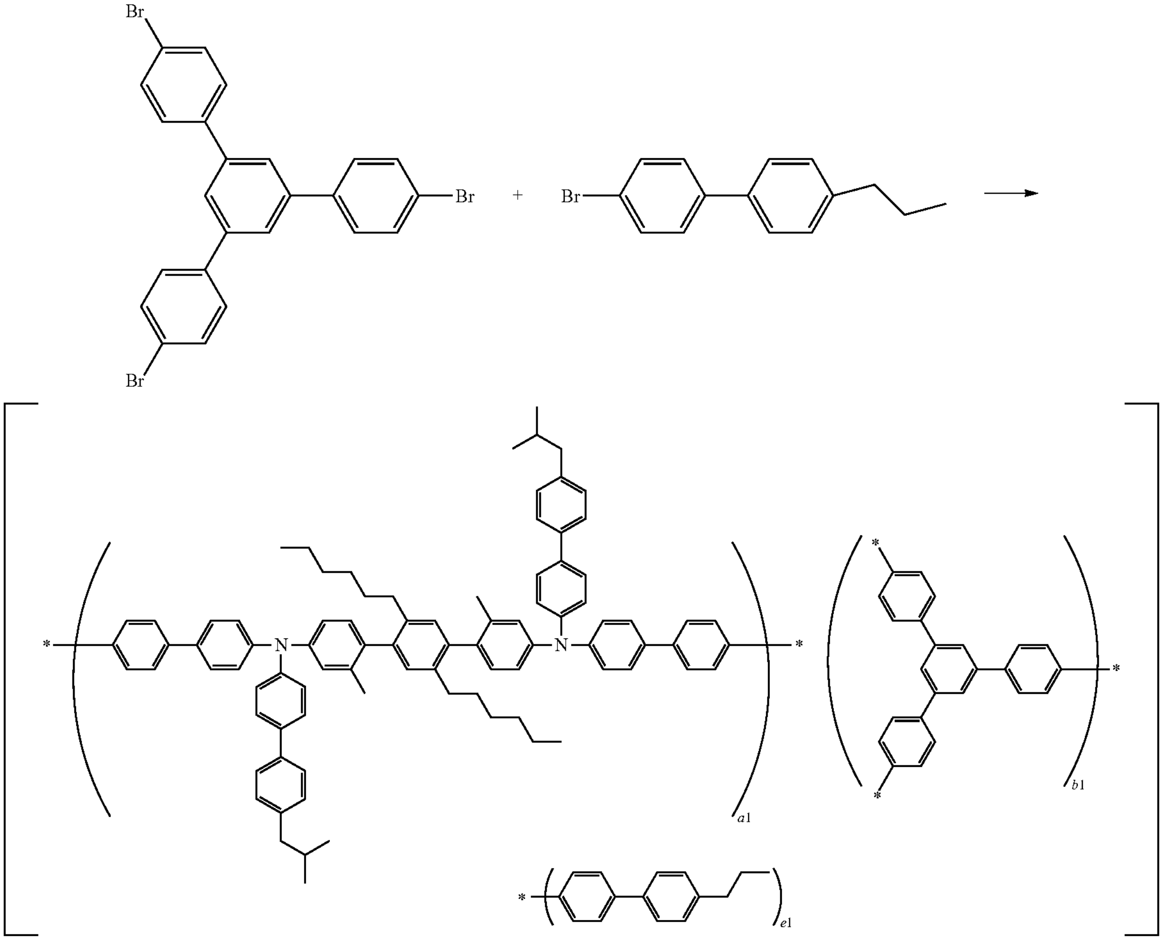
6

Polymer 6 was prepared in the same manner as in the preparation method in Synthesis Example 1, except that Compound D-2 was used instead of Compound D-1 in (5) of Synthesis Example 1.
Synthesis Example 7. Preparation of Polymer 7
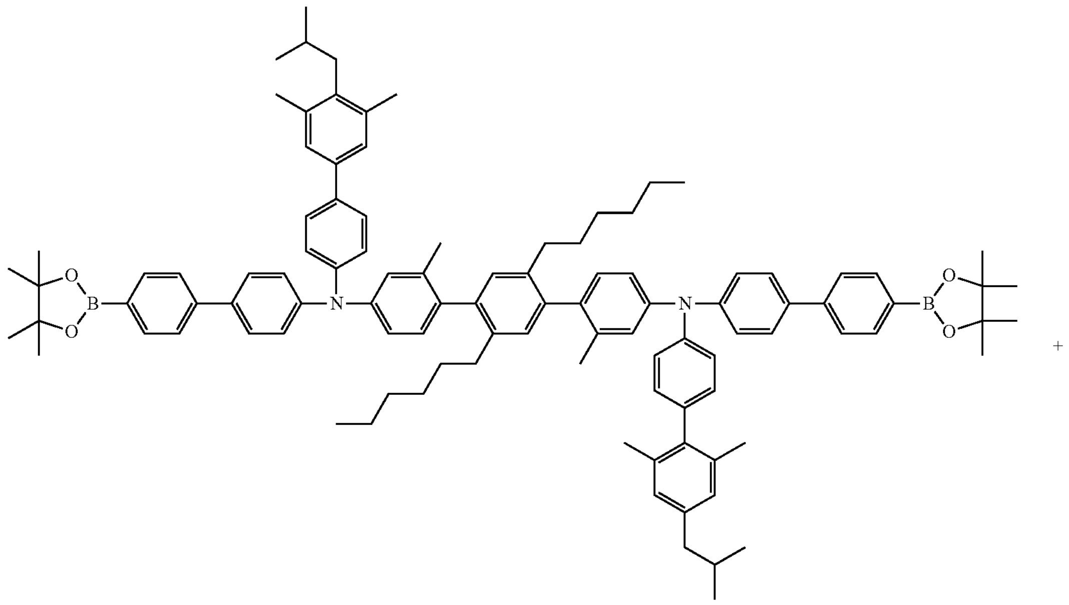
D-2
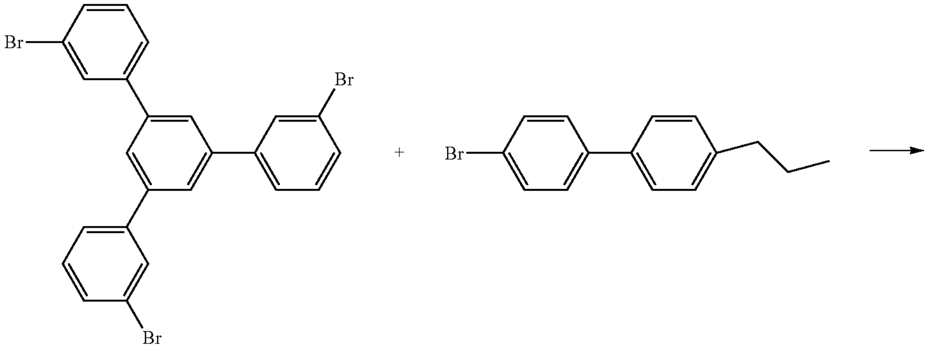

-continued
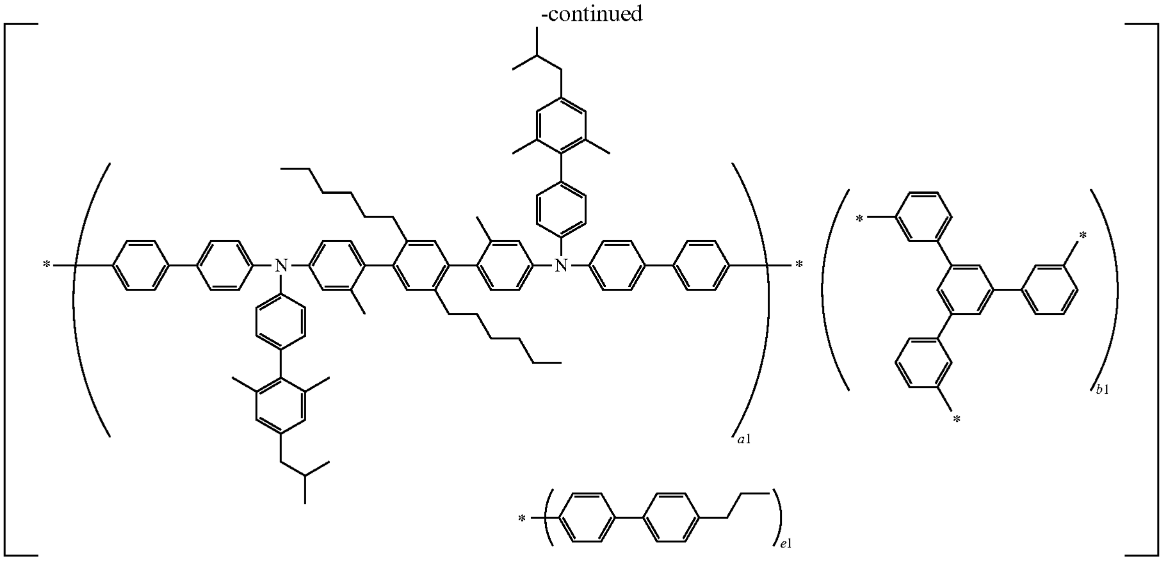
7
Polymer 7 was prepared in the same manner as in the preparation method in Synthesis Example 2, except that Compound D-2 was used instead of Compound D-1 in Synthesis Example 2.
Synthesis Example 8. Preparation of Polymer 8
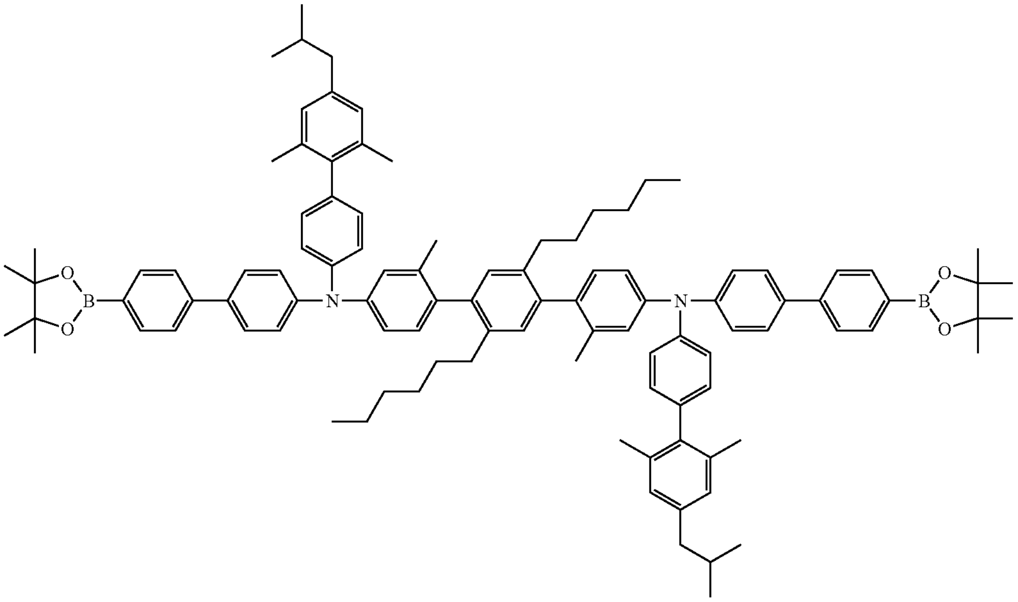
+
D-2
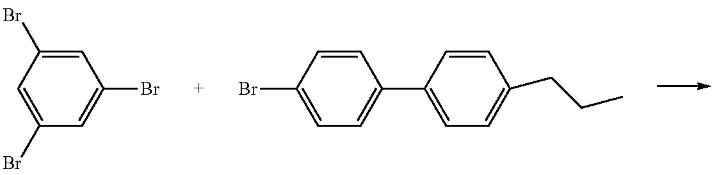

-continued
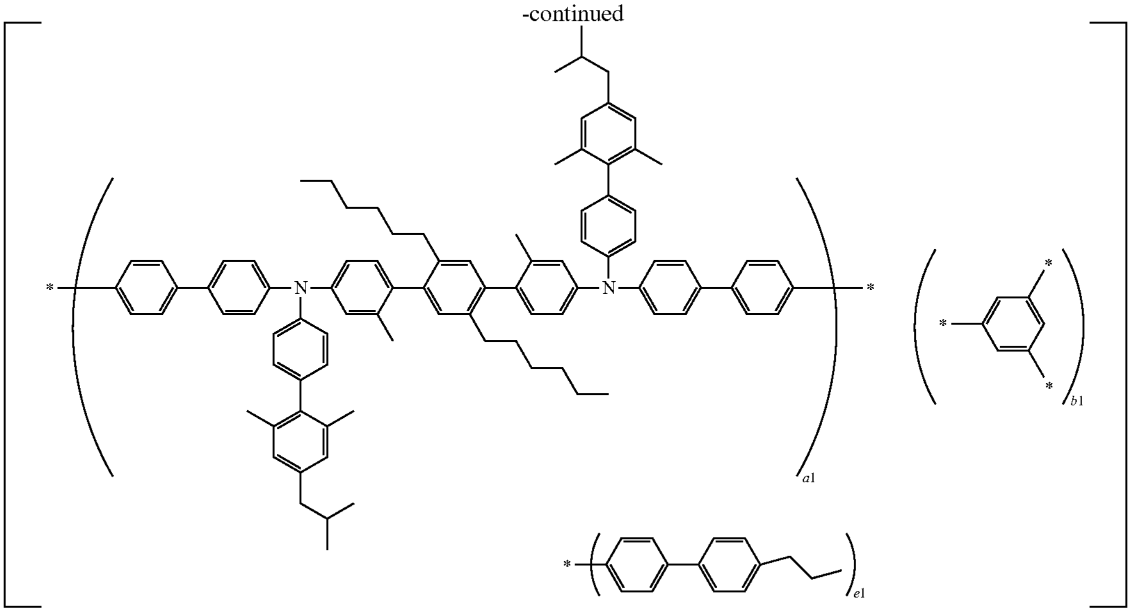
8
Polymer 8 was prepared in the same manner as in the preparation method in Synthesis Example 3, except that Compound D-2 was used instead of Compound D-1 in Synthesis Example 3.
Synthesis Example 9. Preparation of Polymer 9
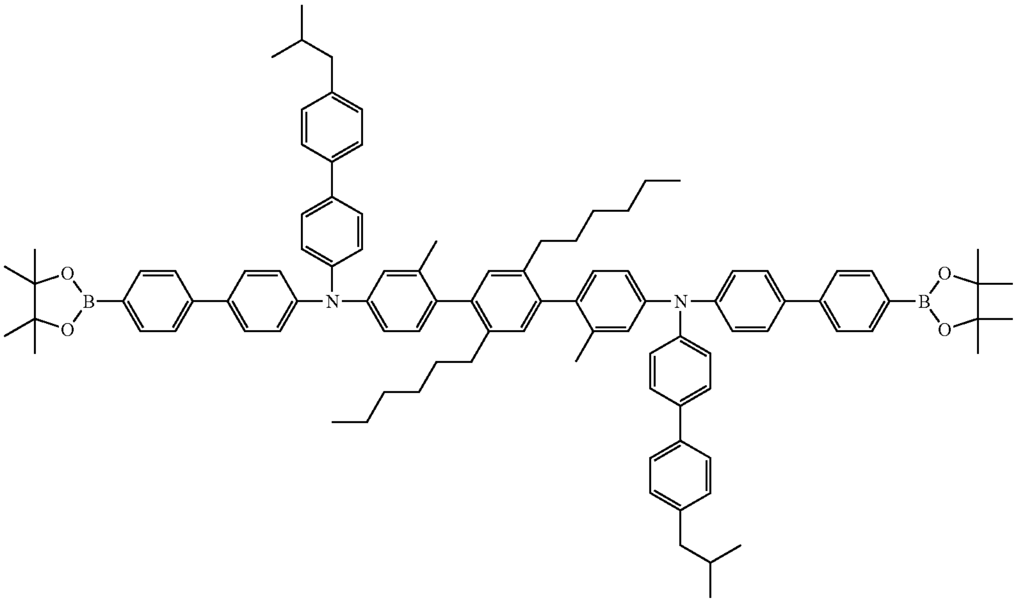
+
D-2

-continued
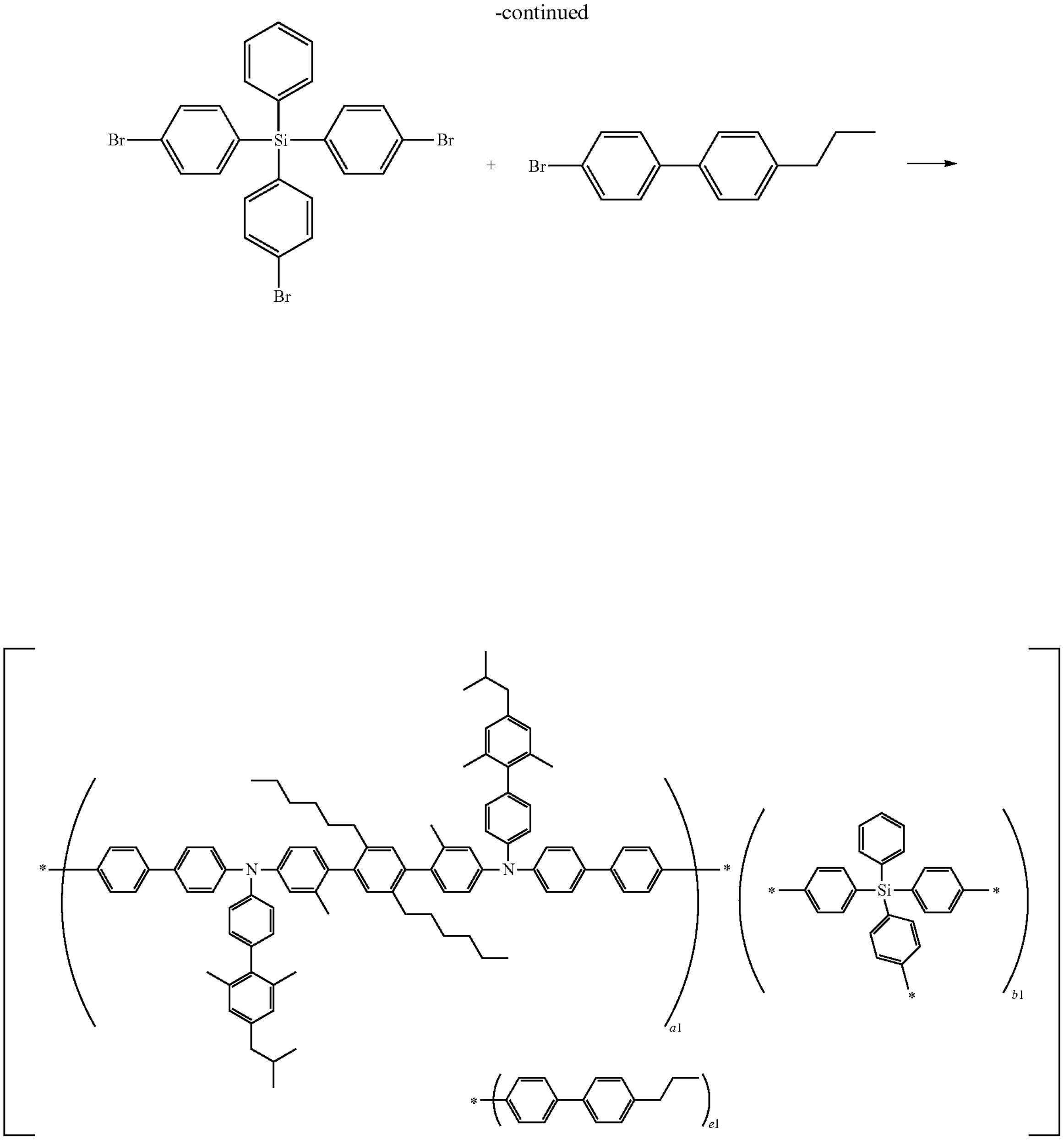
9
Polymer 9 was prepared in the same manner as in the preparation method in Synthesis Example 4, except that Compound D-2 was used instead of Compound D-1 in Synthesis Example 4.

Synthesis Example 10. Preparation of Polymer 10
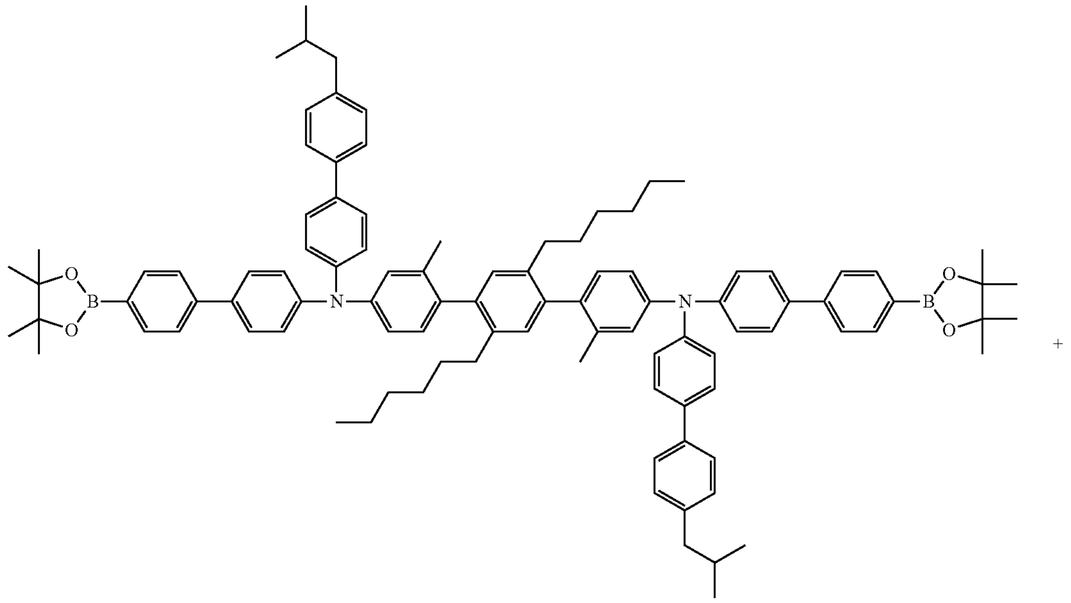
D-2
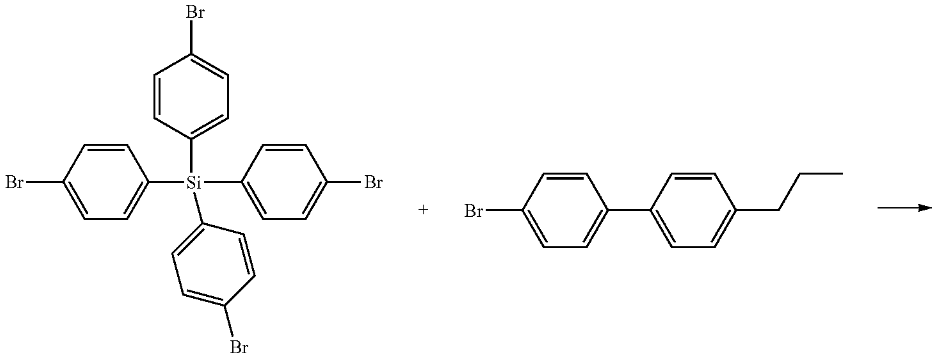
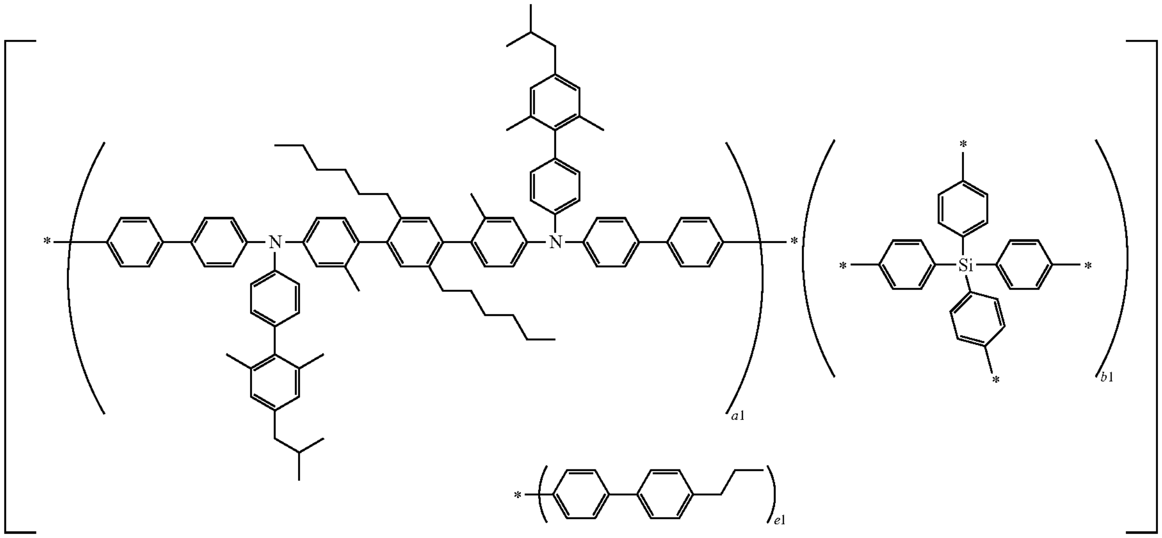
10

Polymer 10 was prepared in the same manner as in the preparation method in Synthesis Example 5, except that Compound D-2 was used instead of Compound D-1 in Synthesis Example 5.

<Experimental Example 1> Measurement of Molecular Weight

Experimental Example 1-1

The number average molecular weight (Mn), weight average molecular weight (Mw) and polydispersity index (PDI) of Polymer 1 prepared in Synthesis Example 1 were measured using GPC (manufactured by Agilent, PLgel HFIPGEL column).

The polydispersity index was calculated by the following Equation (1).

PDI=Weight average molecular weight (Mw)/Number average molecular weight (Mn)   Equation (1):

Experimental Examples 1-2 to 1-10

The number average molecular weight (Mn), weight average molecular weight (Mw) and polydispersity index (PDI) were measured in the same manner as in Experimental Example 1-1, except that the polymers in the following Table 1 were used instead of Polymer 1 in Experimental Example 1-1.

Comparative Example 1-1

The number average molecular weight (Mn), weight average molecular weight (Mw) and polydispersity index (PDI) were measured in the same manner as in Experimental Example 1-1, except that Polymer Q was used instead of Polymer 1 in Experimental Example 1-1.

The structure of Polymer Q used in Comparative Example 1-1 is as follows.

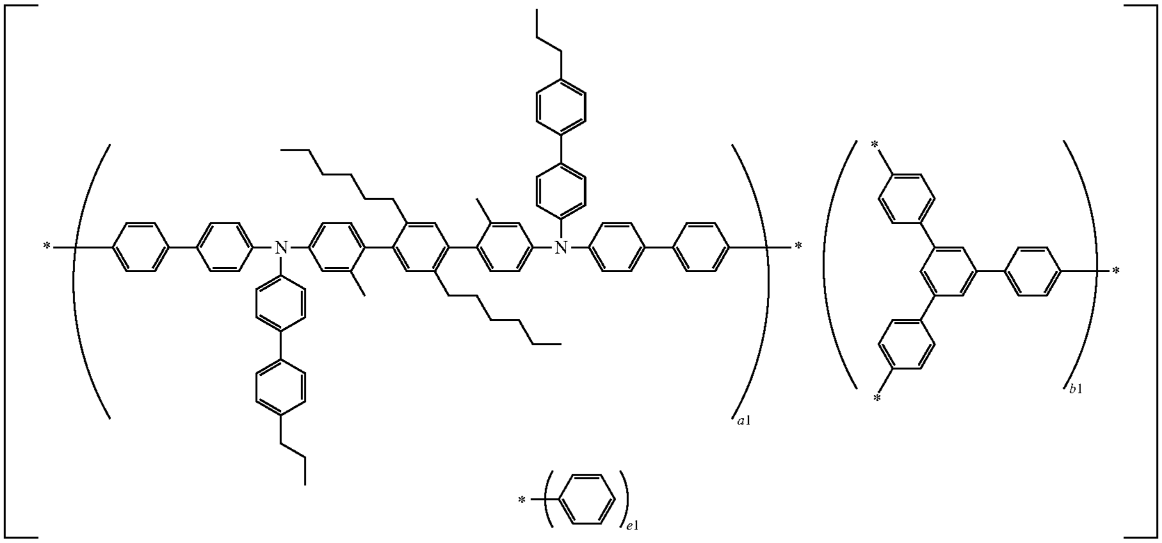

Q

The GPC results measured in Experimental Examples 1-1 to 1-10 and Comparative Example 1-1 are shown in the following Table 1.

TABLE 1

| | Polymer | a1:b1:e1 (molar ratio) | Mn | Mw | PDI |
|---|---|---|---|---|---|
| Experimental Example 1-1 | Polymer 1 | 52.8:18.4:28.8 | 32,000 | 100,000 | 3.13 |
| Experimental Example 1-2 | Polymer 2 | 55.3:19.1:25.6 | 35,000 | 98,000 | 2.80 |
| Experimental Example 1-3 | Polymer 3 | 54.1:18.8:27.1 | 39,000 | 111,000 | 2.85 |
| Experimental Example 1-4 | Polymer 4 | 52.3:18.4:29.3 | 38,000 | 124,000 | 3.26 |
| Experimental Example 1-5 | Polymer 5 | 57.0:17.6:25.4 | 39,000 | 105,000 | 2.69 |
| Experimental Example 1-6 | Polymer 6 | 53.3:18.3:28.4 | 30,000 | 110,000 | 3.67 |
| Experimental Example 1-7 | Polymer 7 | 53.1:17.8:29.1 | 32,000 | 114,000 | 3.56 |
| Experimental Example 1-8 | Polymer 8 | 52.9:16.9:30.2 | 29,000 | 104,000 | 3.59 |
| Experimental Example 1-9 | Polymer 9 | 55.4:18.1:26.5 | 28,000 | 105,000 | 3.75 |
| Experimental Example 1-10 | Polymer 10 | 53.3:20.1:26.6 | 22,000 | 131,000 | 5.95 |
| Comparative Example 1-1 | Polymer Q | 53.7:18.3:28.0 | 27,000 | 143,000 | 5.30 |

Experimental Example 2. Manufacture of Organic Light Emitting Device

Experimental Example 2-1

(1) Material

As a dopant, the bis(diarylamino)benzofluorene-based compound described in U.S. Pat. No. 8,465,848B2 was used.

As an HIL, the material described in U.S. Pat. No. 7,351,358B2 was used. Specifically, a hole injection material prepared from an aqueous dispersion of an electrically conductive polymer and a polymerizable fluorinated sulfonic acid was used.

As a host, the deuterated anthracene compound described in WO2011-028216A1 was used.

(2) Manufacture of Device

A glass substrate thinly coated with indium tin oxide (ITO) to have a thickness of 1,500 Å was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing with distilled water was completed, the substrate was ultrasonically washed with isopropyl alcohol and acetone solvents, and dried, and then the substrate was cleaned for 5 minutes, and then dried.

Immediately before the device was manufactured, the washed and patterned ITO was treated with UV ozone for 10 minutes. After ozone treatment, an aqueous dispersion of HIL was spin-coated on the ITO surface and the solvent was removed through heat treatment, thereby forming a hole injection layer having a thickness of about 40 nm. A toluene solution in which 1.5 wt % of Polymer 1 prepared in Synthesis Example 1 was dissolved was spin-coated on the hole injection layer formed above and the solvent was removed by heat treatment, thereby forming a hole transport layer having a thickness of about 100 nm. A methylbenzoate solution in which a host and a dopant (host:dopant=93:7 (wt %)) were dissolved at a concentration of 2.0 wt % was spin-coated on the hole transport layer, thereby forming a light emitting layer having a thickness of about 100 nm. Thereafter, the ITO was transported to a vacuum deposition apparatus, and then BCP was vacuum-deposited on the light emitting layer to have a thickness of 35 nm, thereby forming an electron injection and transport layer. LiF and aluminum were sequentially deposited on the electron injection and transport layer to have a thickness of 1 nm and 100 nm, respectively, thereby forming a cathode.

The deposition rates of lithium fluoride and aluminum of the cathode were maintained at 0.3 Å/see and 2 Å/see, respectively, during the aforementioned procedure, and the degree of vacuum during the deposition was maintained at $2\times10^{-7}$ torr to $5\times10^{-6}$ torr.

Experimental Examples 2-2 to 2-10

Organic light emitting devices were manufactured in the same manner as in Experimental Example 2-1, except that the polymers of the following Table 2 were used instead of Polymer 1 in Experimental Example 2-1.

Comparative Example 2-1

An organic light emitting device was manufactured in the same manner as in Experimental Example 2-1, except that the polymer of the following Table 2 were used instead of Polymer 1 in Experimental Example 2-1.

The results of measuring the performances of the organic light emitting devices manufactured in Experimental Examples 2-1 to 2-10 and Comparative Example 2-1 at a current density of 10 mA/cm$^2$ are shown in the following Table 2.

In the following Table 2, the external quantum efficiency was determined by (number of emitted photons)/(number of injected charge carriers), and the following color coordinates are x and y coordinates according to C.I.E chromaticity diagram (Commission Internationale de L'Eclairage, 1931), and CE/CIEy is a value obtained by dividing the light emitting efficiency (cd/A) by the color coordinate (y) value.

TABLE 2

| | Hole transport layer | Driving voltage (V) | Light emitting efficiency (cd/A) | Power efficiency (lm/W) | External quantum efficiency (QE) (%) | Luminance (cd/m$^2$) | Color coordinate (x) | Color coordinate (y) | CE/CIE*y* |
|---|---|---|---|---|---|---|---|---|---|
| Experimental Example 2-1 | Polymer 1 | 4.66 | 4.37 | 2.95 | 6.80 | 436.94 | 0.135 | 0.077 | 56.54 |
| Experimental Example 2-2 | Polymer 2 | 4.91 | 4.49 | 2.87 | 7.00 | 448.92 | 0.135 | 0.077 | 58.22 |
| Experimental Example 2-3 | Polymer 3 | 4.77 | 4.37 | 2.87 | 6.93 | 436.71 | 0.135 | 0.075 | 58.24 |
| Experimental Example 2-4 | Polymer 4 | 4.63 | 4.26 | 2.89 | 6.86 | 425.94 | 0.136 | 0.073 | 58.11 |
| Experimental Example 2-5 | Polymer 5 | 5.02 | 4.91 | 3.07 | 5.96 | 490.63 | 0.138 | 0.103 | 47.75 |
| Experimental Example 2-6 | Polymer 6 | 5.22 | 4.70 | 2.83 | 5.67 | 469.50 | 0.139 | 0.103 | 45.44 |
| Experimental Example 2-7 | Polymer 7 | 4.88 | 4.26 | 2.74 | 6.45 | 425.79 | 0.133 | 0.081 | 52.9 |
| Experimental Example 2-8 | Polymer 8 | 4.85 | 4.25 | 2.75 | 6.42 | 424.64 | 0.133 | 0.081 | 52.6 |
| Experimental Example 2-9 | Polymer 9 | 4.80 | 4.35 | 2.85 | 6.56 | 434.91 | 0.133 | 0.081 | 53.7 |
| Experimental Example 2-10 | Polymer 10 | 4.60 | 4.25 | 2.49 | 6.73 | 424.56 | 0.135 | 0.075 | 56.7 |
| Comparative Example 2-1 | Polymer Q | 7.81 | 1.21 | 0.49 | 1.41 | 121.05 | 0.150 | 0.107 | 11.31 |

As shown in Table 2, it could be confirmed that the organic light emitting devices (Experimental Examples 2-1 to 2-10) to which the polymer including a branched alkyl group according to the present specification was applied had low driving voltage and improved efficiency compared to the organic light emitting device (Comparative Example 2-1) to which the polymer including a straight-chained alkyl group was applied.

Experimental Example 3. Measurement of Service Life and Driving Stability

The organic light emitting devices manufactured in Experimental Example 2-1 and Comparative Example 2-1 were stored under 1000 nit and room temperature conditions, and the stability thereof was measured.

It was confirmed that when the time (T95) taken for the luminance to decrease by 95% from the initial luminance was compared, it took more than twice as long as that taken for the organic light emitting device manufactured in Comparative Example 2-1 for the organic light emitting device manufactured in Experimental Example 2-1. This means that it took longer for the luminance in Experimental Example 2-1 to be reduced than Comparative Example 2-1, and through this, it can be confirmed that the organic light emitting device manufactured in Experimental Example 2-1 has better long-term stability (service life) than the organic light emitting device of Comparative Example 2-1.

Furthermore, as a result of measuring the progressive driving voltage of the organic light emitting device manufactured in Experimental Example 2-1 and the organic light emitting device manufactured in Comparative Example 2-1, it could be confirmed that in the device of Comparative Example 2-1, the magnitude of the voltage injected to generate the same light as the initial light increased as time passed, whereas in the device of Experimental Example 2-1, a constant amount of light was implemented even though a low voltage was injected as in the beginning. Specifically, it could be confirmed that in the case of the device manufactured in Comparative Example 2-1, the same light as the initial light was generated only when a voltage of 0.2 V or more was injected as time passed, whereas in the case of the device manufactured in Experimental Example 2-1, the same light as the initial light was generated even though light of less than 0.1 V was injected at the same time as the time when 0.2 V or more was injected in Comparative Example 2-1. That is, it could be confirmed that the progressive driving voltage stability of the organic light emitting device manufactured in Experimental Example 2-1 was improved compared to the progressive driving voltage stability of the organic light emitting device manufactured in Comparative Example 2-1. In the case of the progressive driving voltage, the stability is improved as a uniform thin film is formed, and through the above experimental results, the polymer used in Experimental Example 2-1 has improved solubility compared to the polymer used in Comparative Example 2-1, so that a uniform thin film is formed, making it possible to predict that the progressive driving voltage exhibits stability.

Although the preferred exemplary embodiments (a hole transport layer) of the present invention have been described above, the present invention is not limited thereto, and various modifications can be made and carried out within the scope of the claims and the detailed description of the invention, and also fall within the scope of the invention.

The invention claimed is:

1. A polymer represented by the following-Chemical Formula 1:

$$E1\text{-}[A1]_a\text{-}[B1]_b\text{-}[C1]_c\text{-}E2$$ [Chemical Formula 1]

wherein, in Chemical Formula 1,

A1 is represented by Chemical Formula 2,

B1 is represented by Chemical Formula 3,

C1 is a substituted or unsubstituted arylene group; or a substituted or unsubstituted divalent heterocyclic group, and E1 and E2 are the same as or different from each other, and are each independently hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a crosslinkable group; or a combination thereof, a, b, and c are each a mole fraction, a is a real number of $0<a\leq 1$, b is a real number of $0\leq b<1$, c is a real number of $0\leq c<1$, $a+b+c=1$,

[Chemical Formula 2]

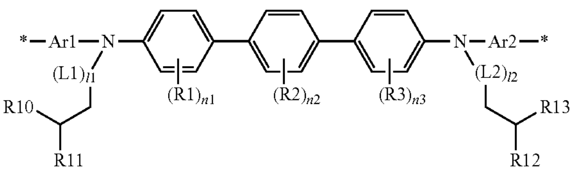

in Chemical Formula 2,

Ar1, Ar2, L1 and L2 are the same as or different from each other, and are each independently a substituted or unsubstituted arylene group, R1 to R3 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, R10 to R13 are the same as or different from each other, and are each independently a substituted or unsubstituted alkyl group, n1 to n3 are each independently an integer from 1 to 4, when n1 to n3 are each independently 2 or higher, each of R1 to R3 is the same as or different from each other, respectively, l1 and l2 are each independently an integer from 1 to 5, when l1 and l2 are each independently 2 or higher, each of L1 and L2 is the same as or different from each other, respectively,

* is an attachment point in the polymer, $$Z\text{-}[\text{-}Y\text{—}*]_m$$ [Chemical Formula 3]

in Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; deuterium; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

2. The polymer of claim 1, wherein E1 and E2 are the same as or different from each other, and are each independently a substituted or unsubstituted alkyl group; a substituted or unsubstituted aryl group; a cross-linkable group; or a combination thereof.

3. The polymer of claim 1, wherein E1 and E2 are the same as or different from each other, and are each independently a cross-linkable group; or any one of the following structures:

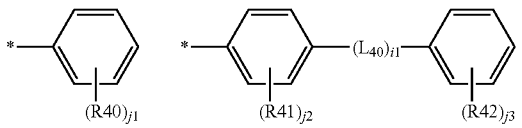

in the structures,

R40 to R42 are the same as or different from each other, and are each independently hydrogen; deuterium; a substituted or unsubstituted alkyl group; a substituted or unsubstituted aryl group; a substituted or unsubstituted heterocyclic group; or a cross-linkable group, L40 is a direct bond; a substituted or unsubstituted alkylene group; or a substituted or unsubstituted arylene group, i1 is an integer from 1 to 10, j1 and j3 are each independently an integer from 1 to 5, j2 is an integer from 1 to 4, when i1 is 2 or higher, each L40 is the same as or different from each other, when j1 to j3 are each independently 2 or higher, each of R40 to R42 is the same as or different from each other, respectively, and

* is an attachment point in the polymer.

4. The polymer of claim 1, wherein the polymer is any one of the following structures:

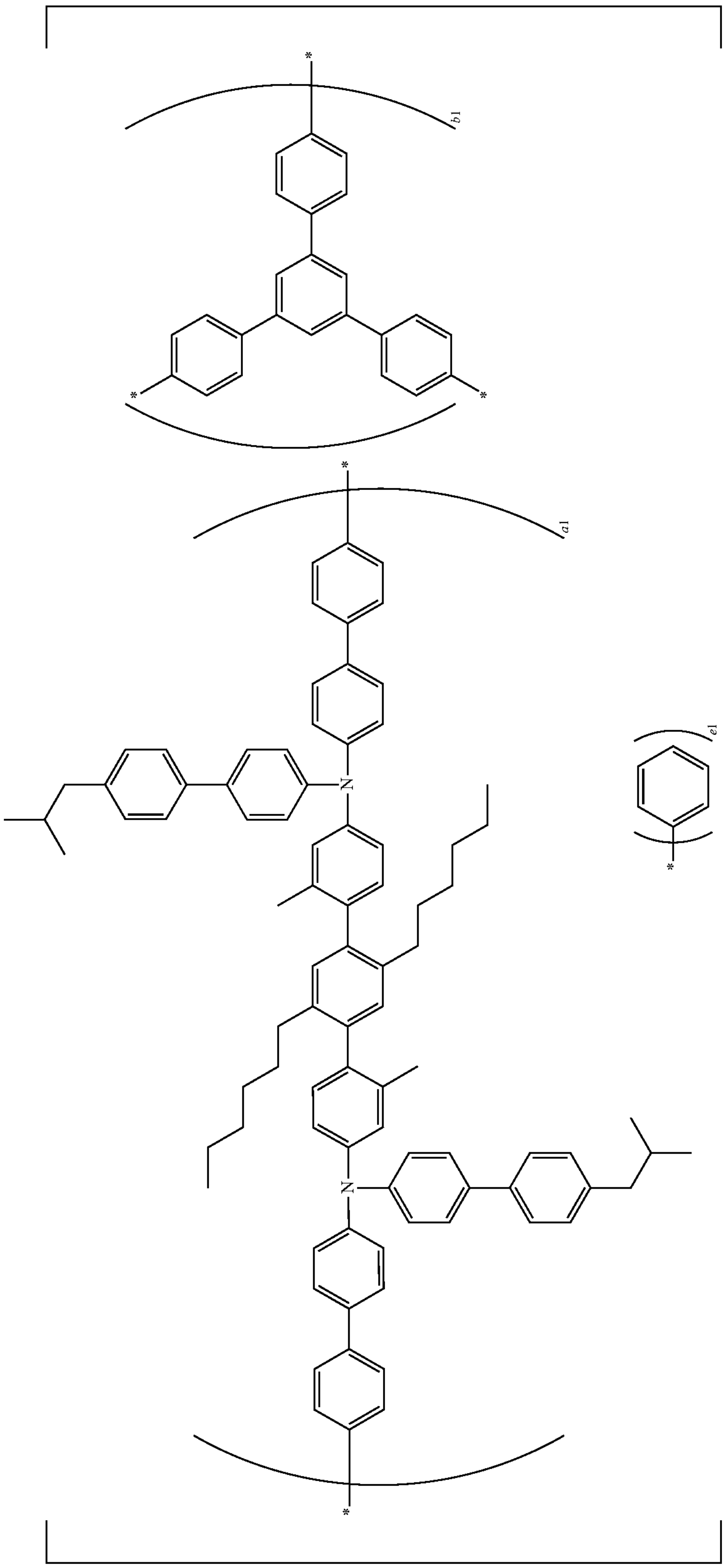

-continued
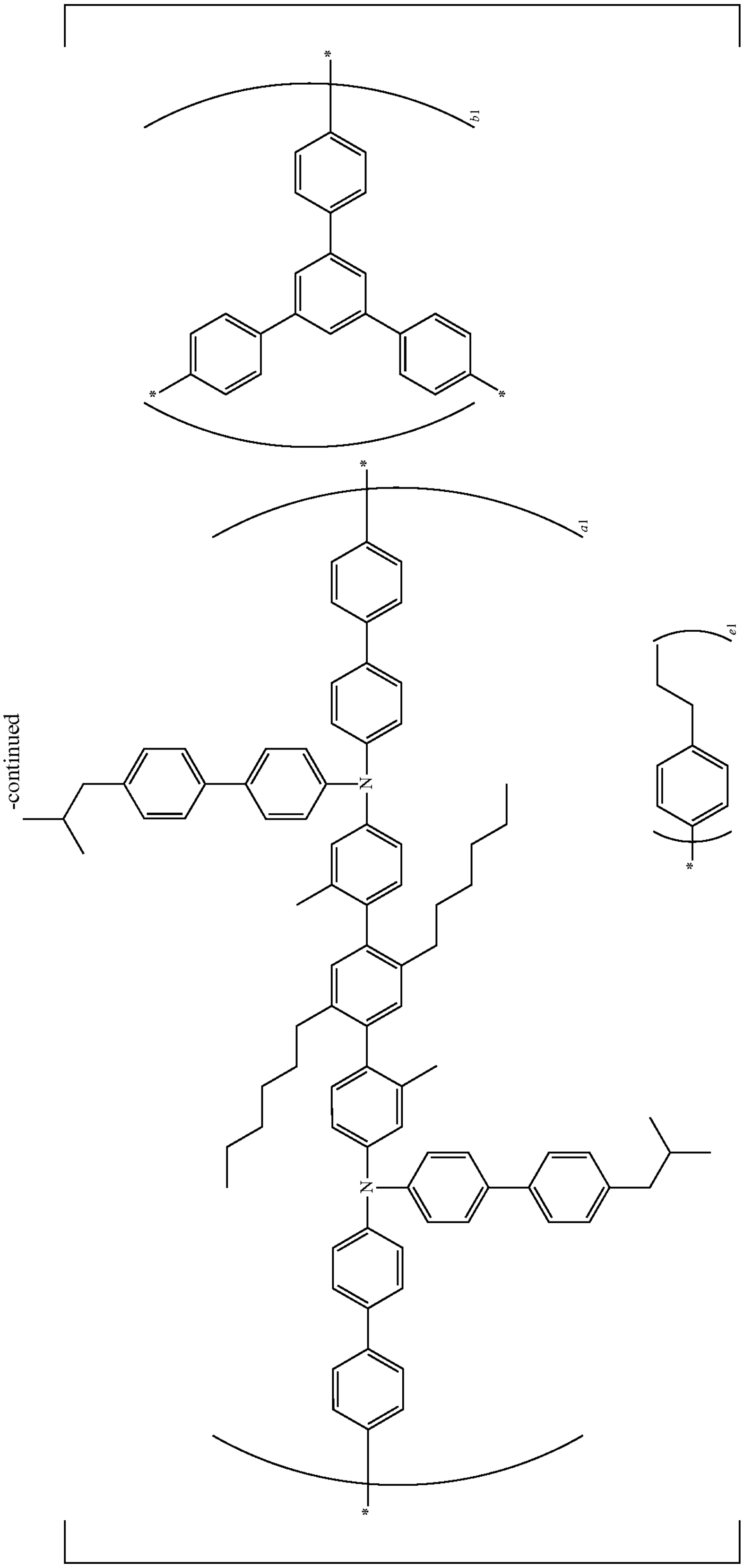

-continued
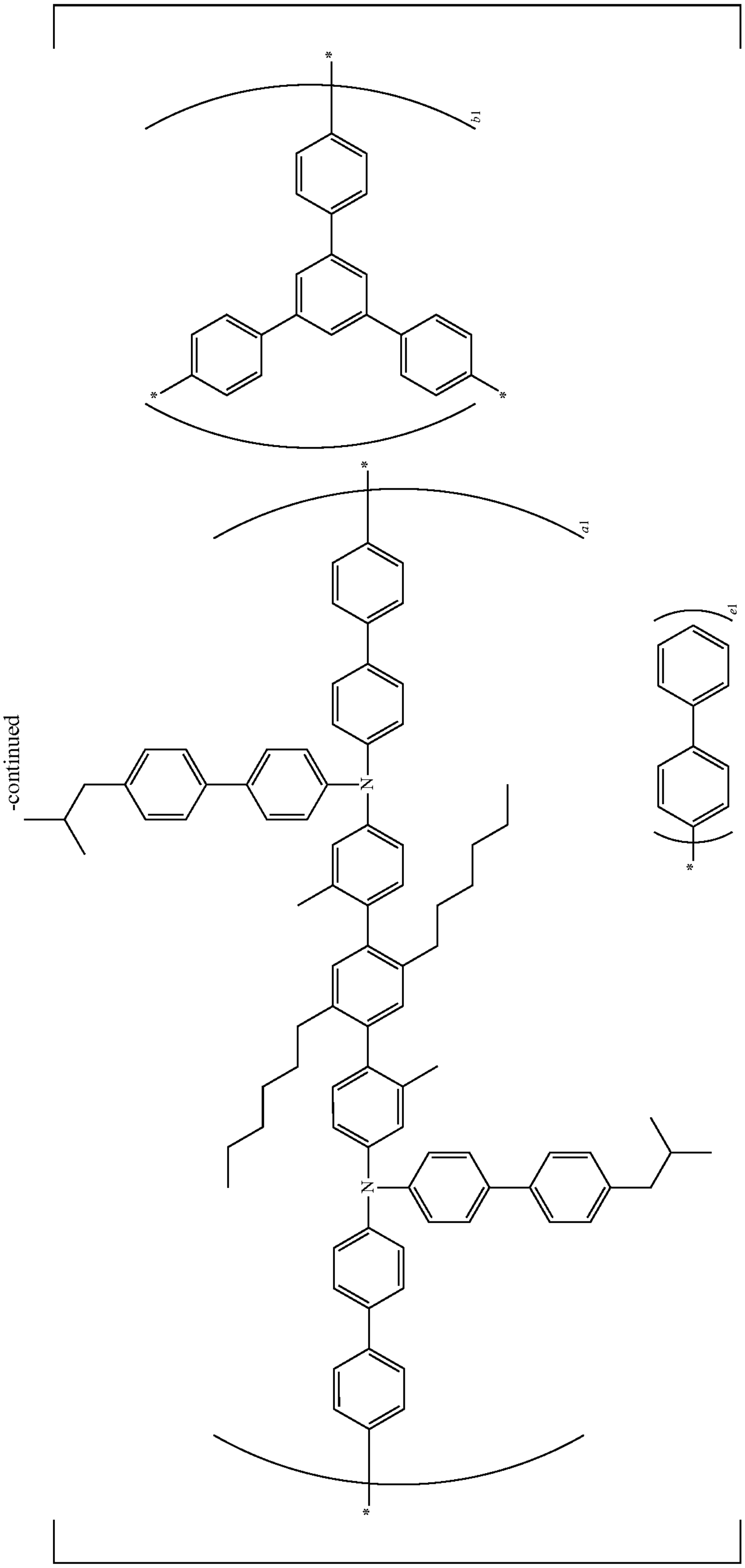

-continued
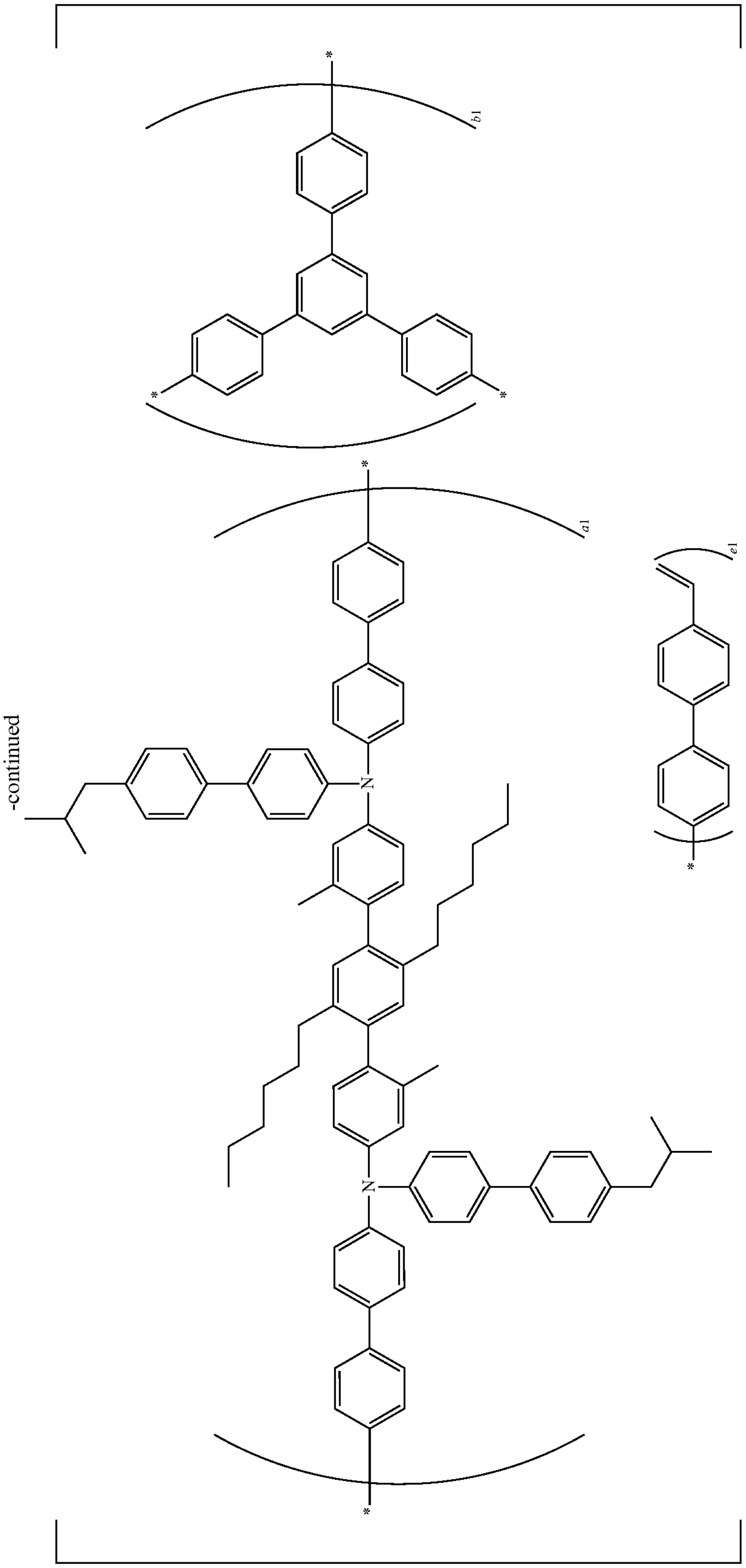

-continued
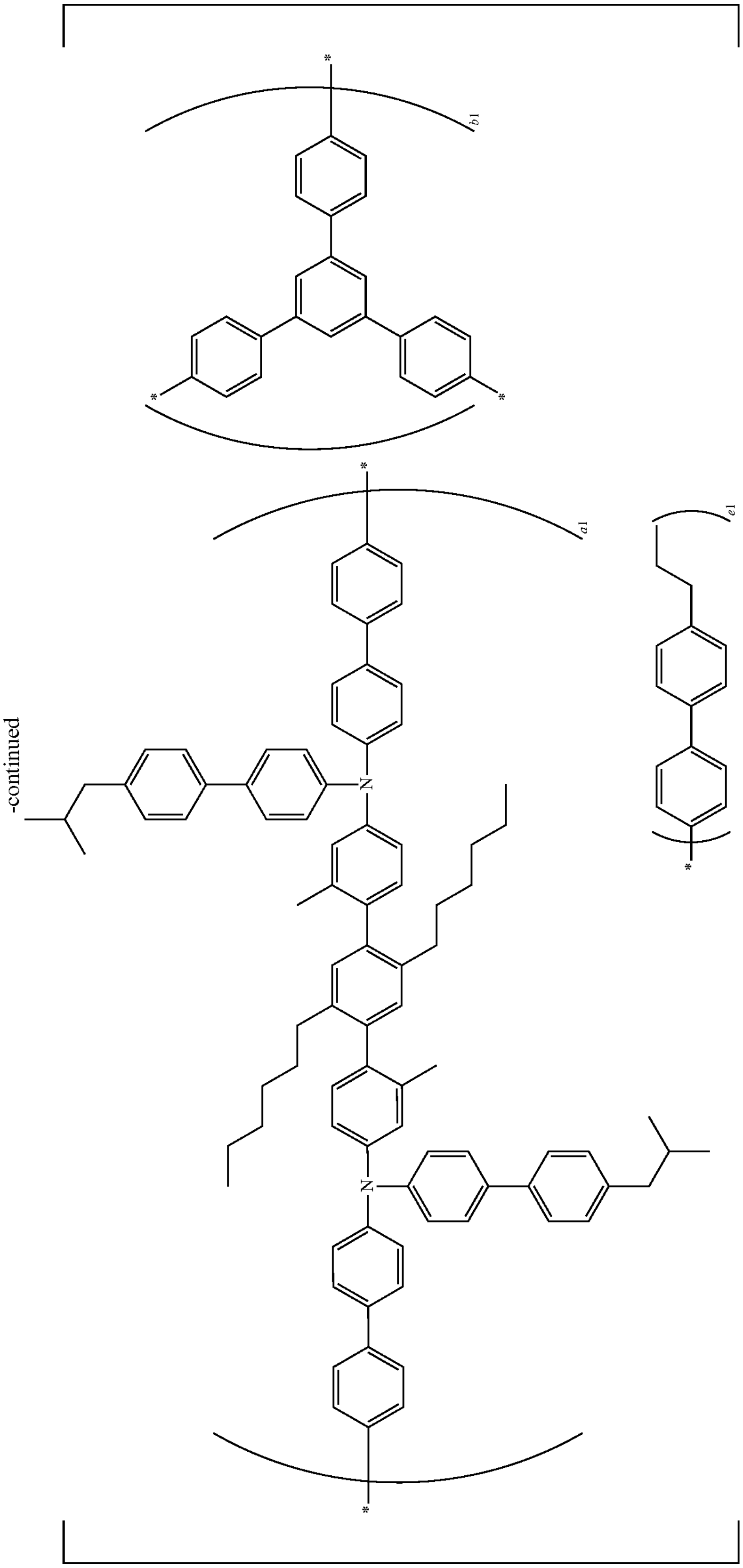

-continued
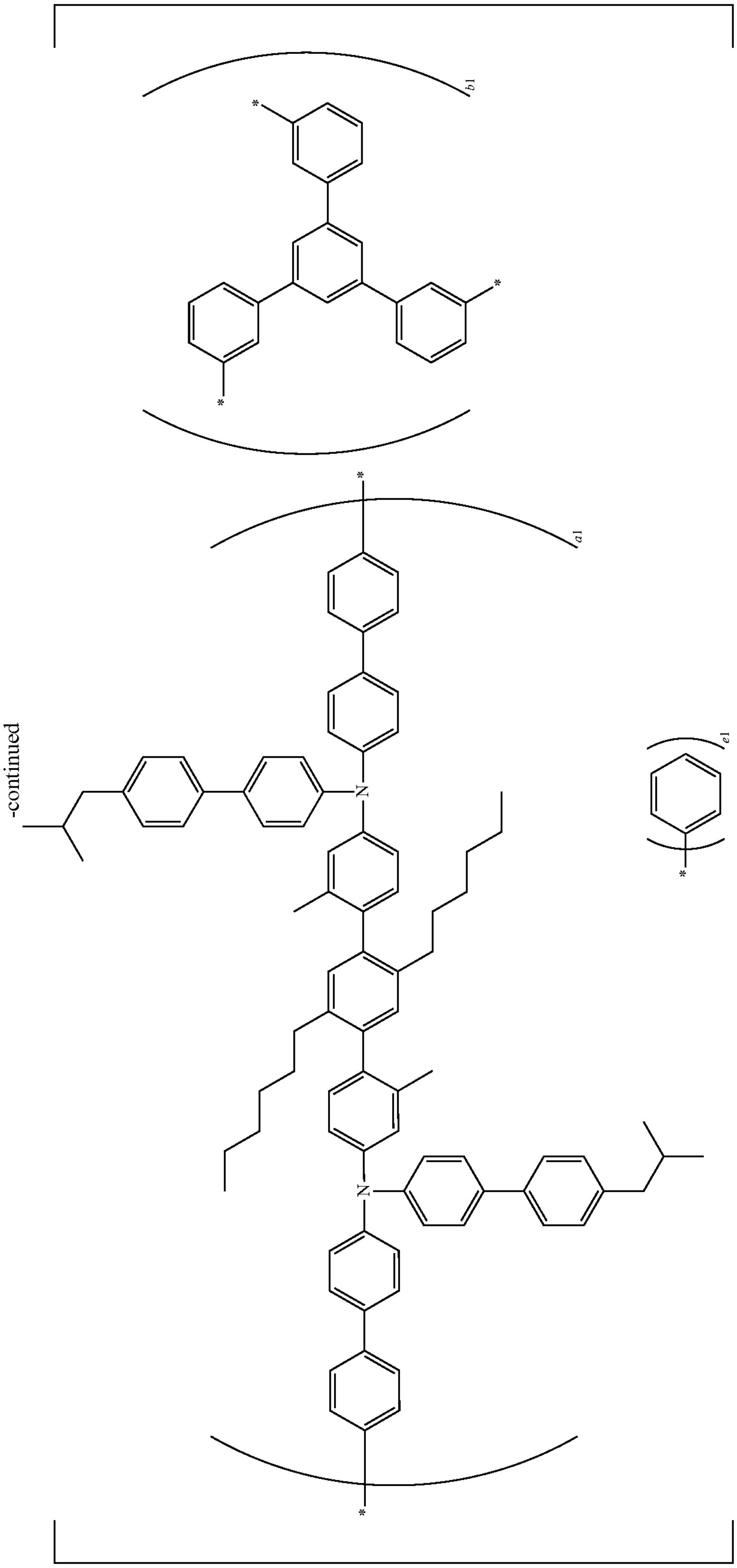

-continued
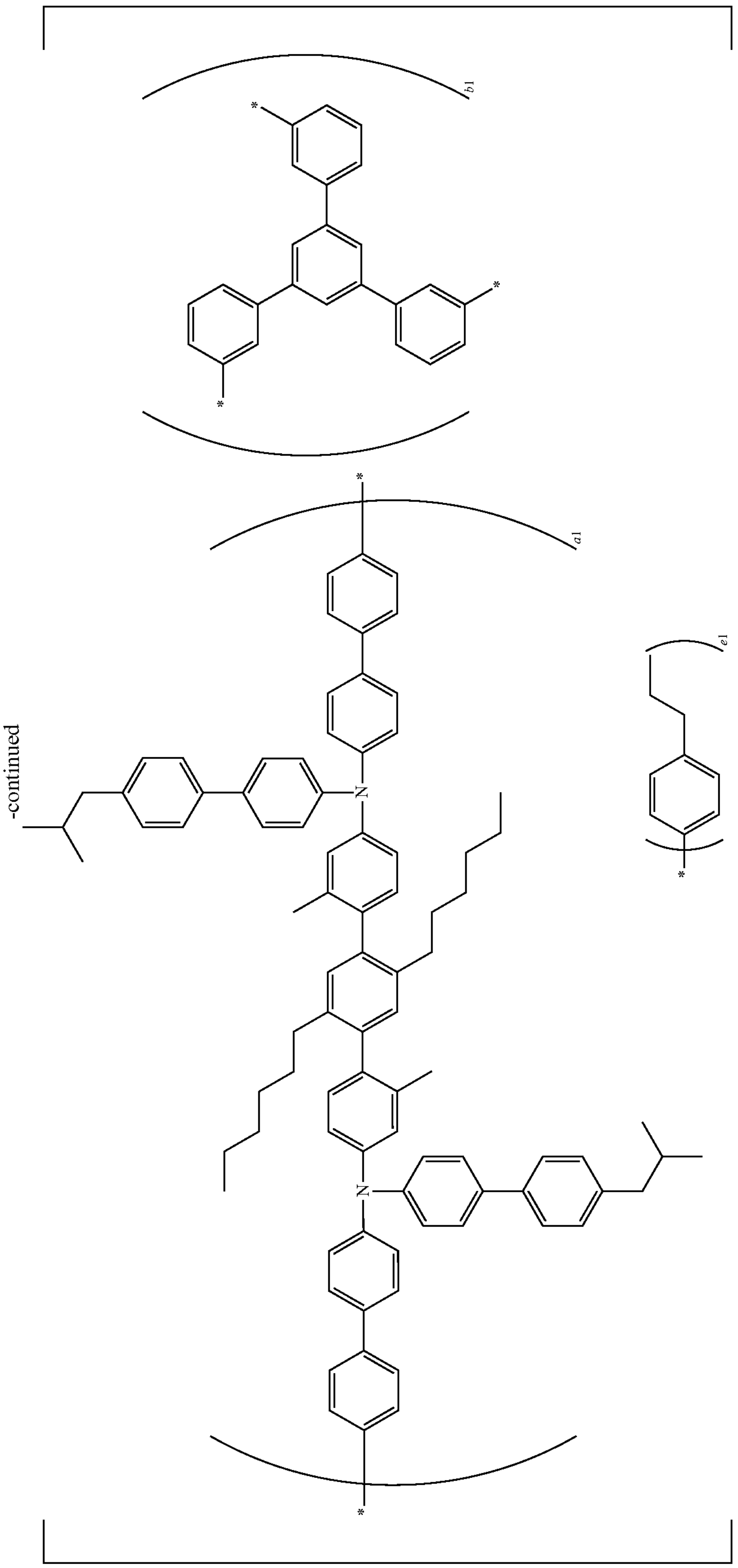

-continued
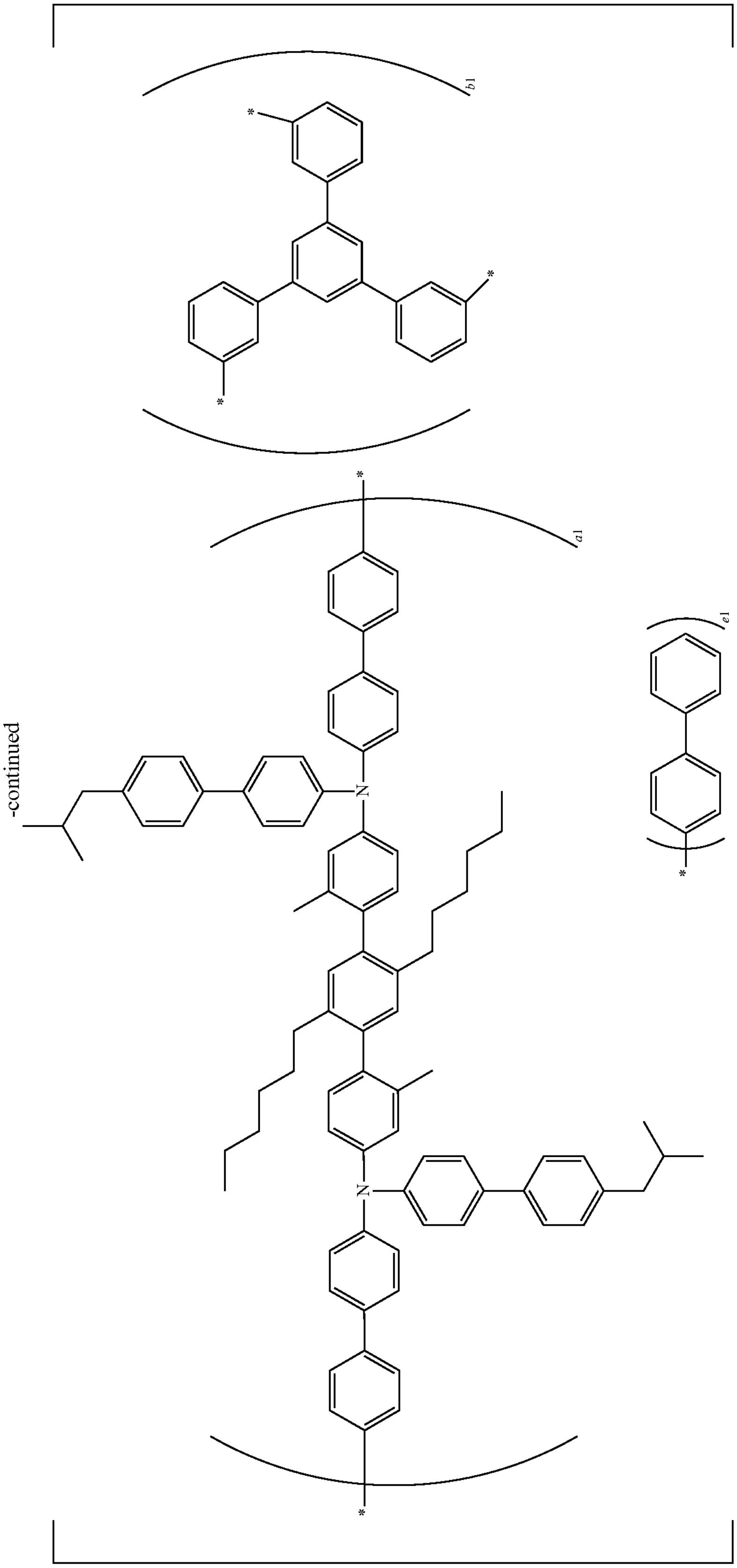

-continued
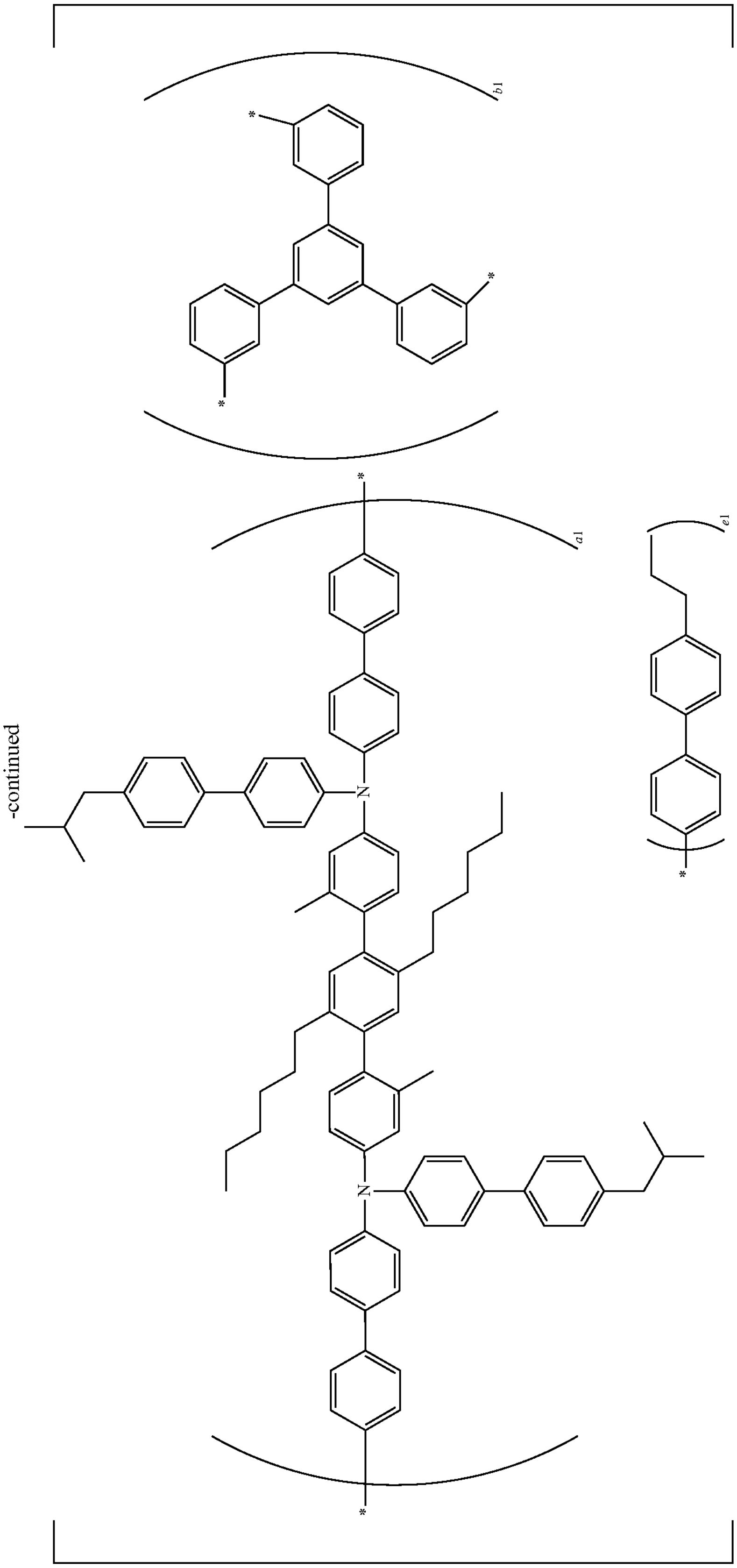

-continued
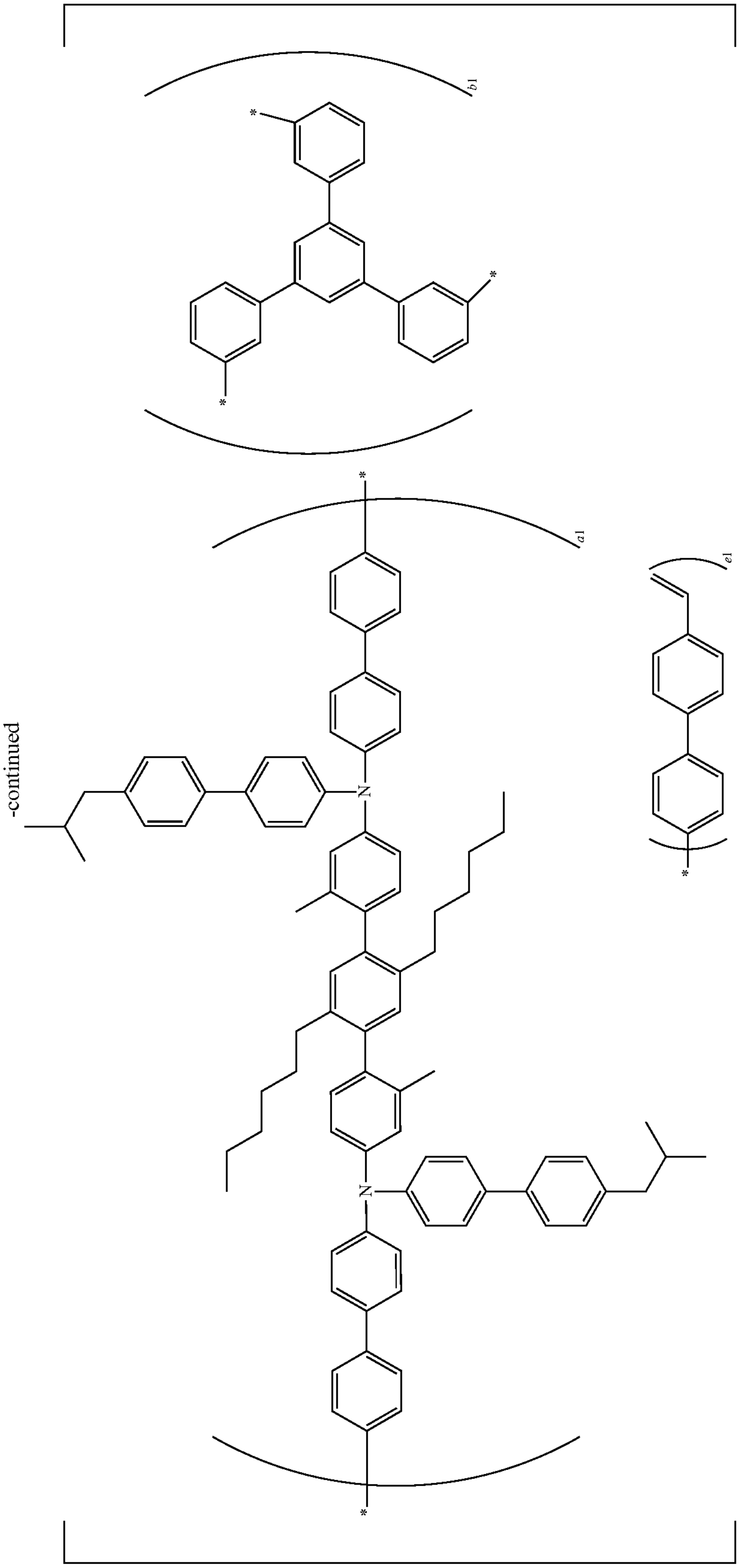

-continued
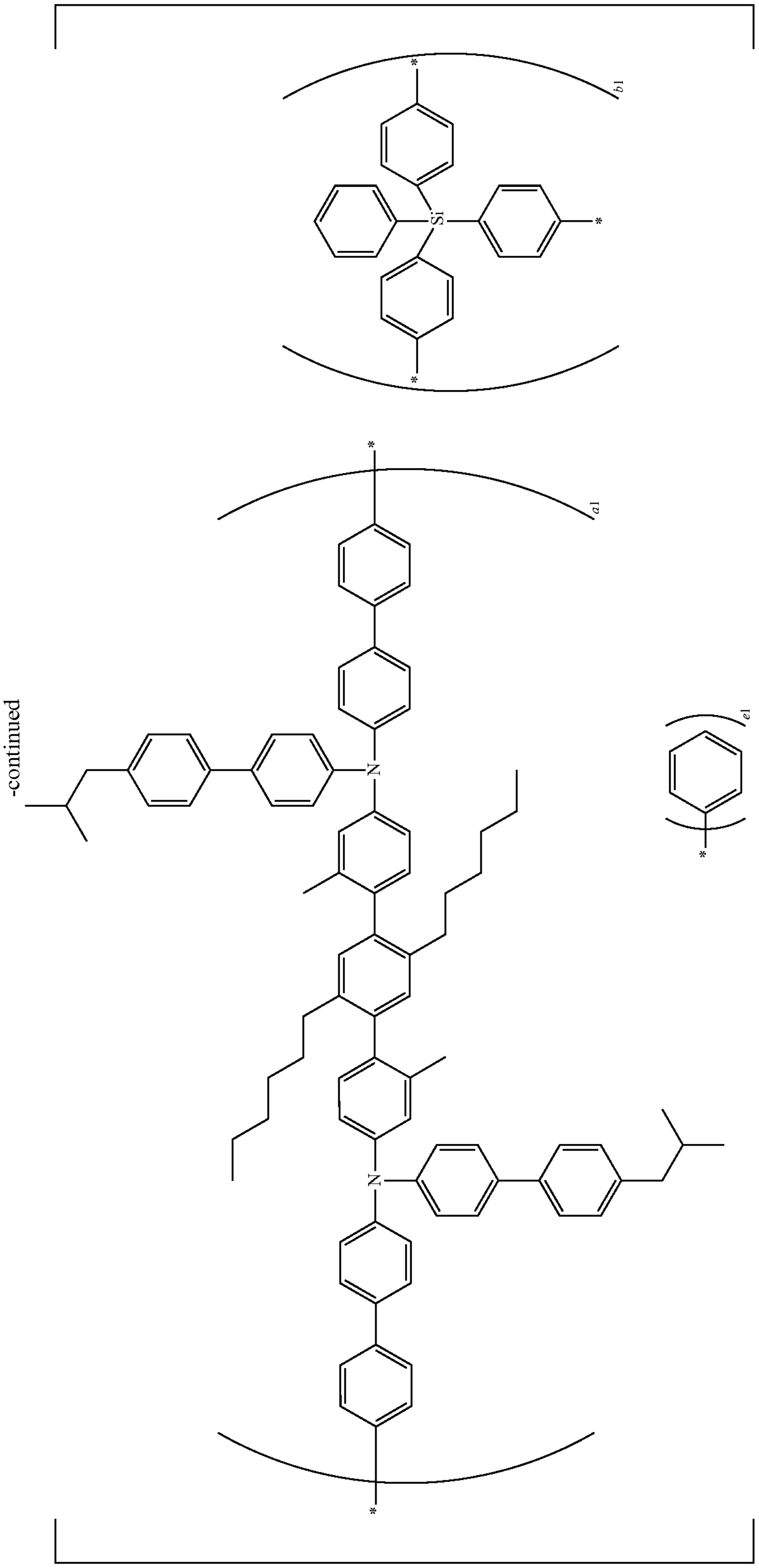

-continued
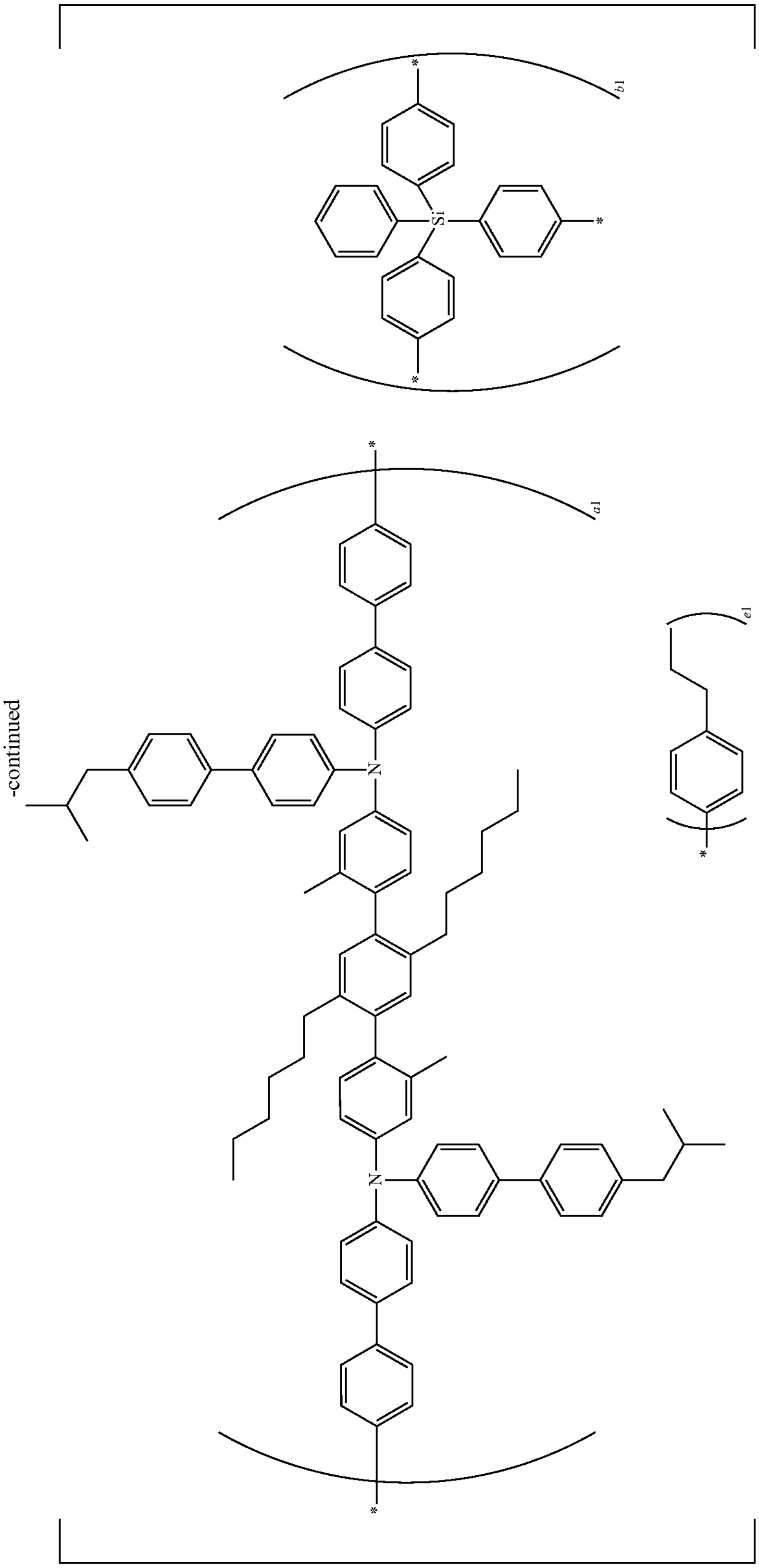

-continued
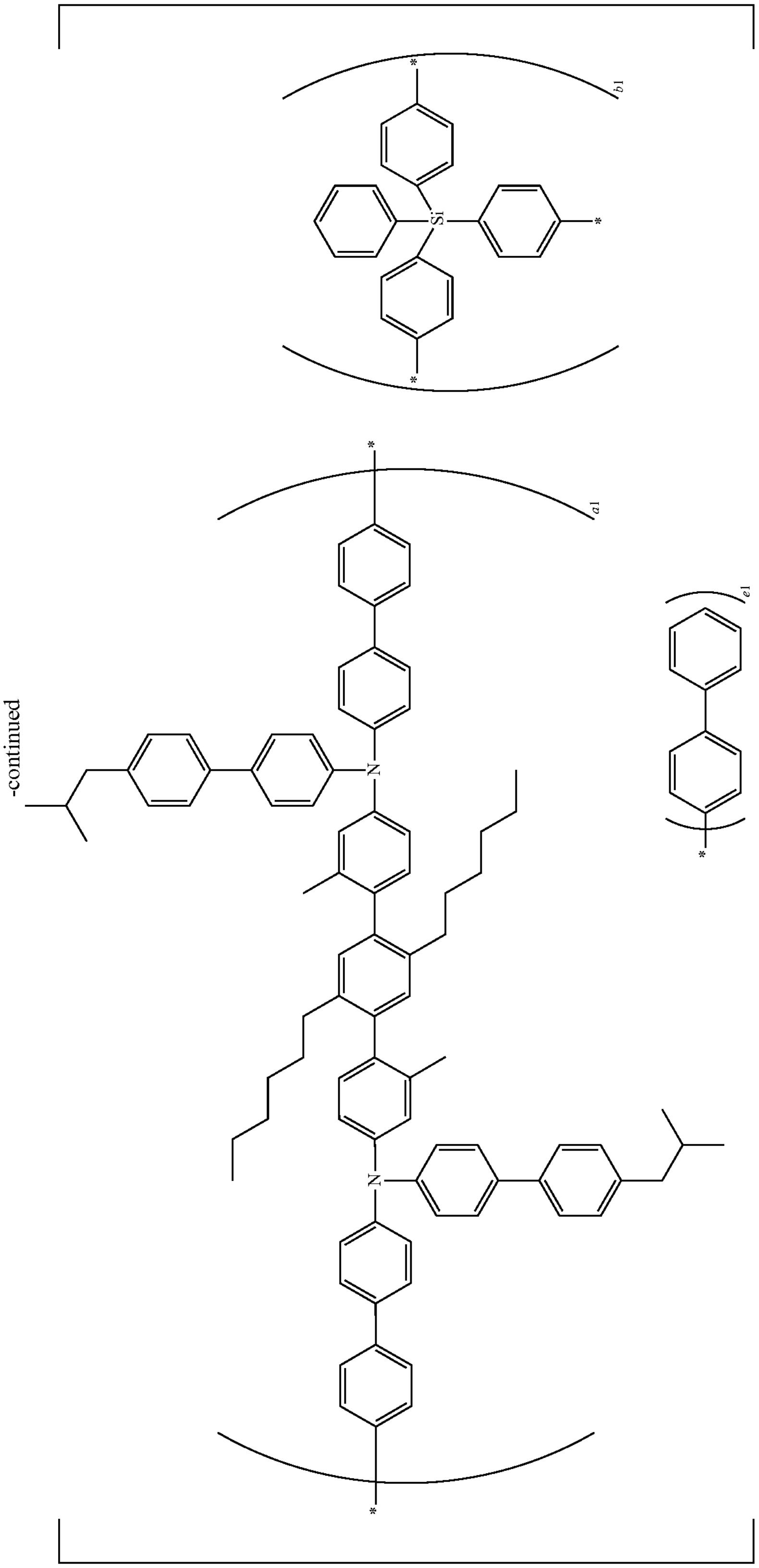

-continued
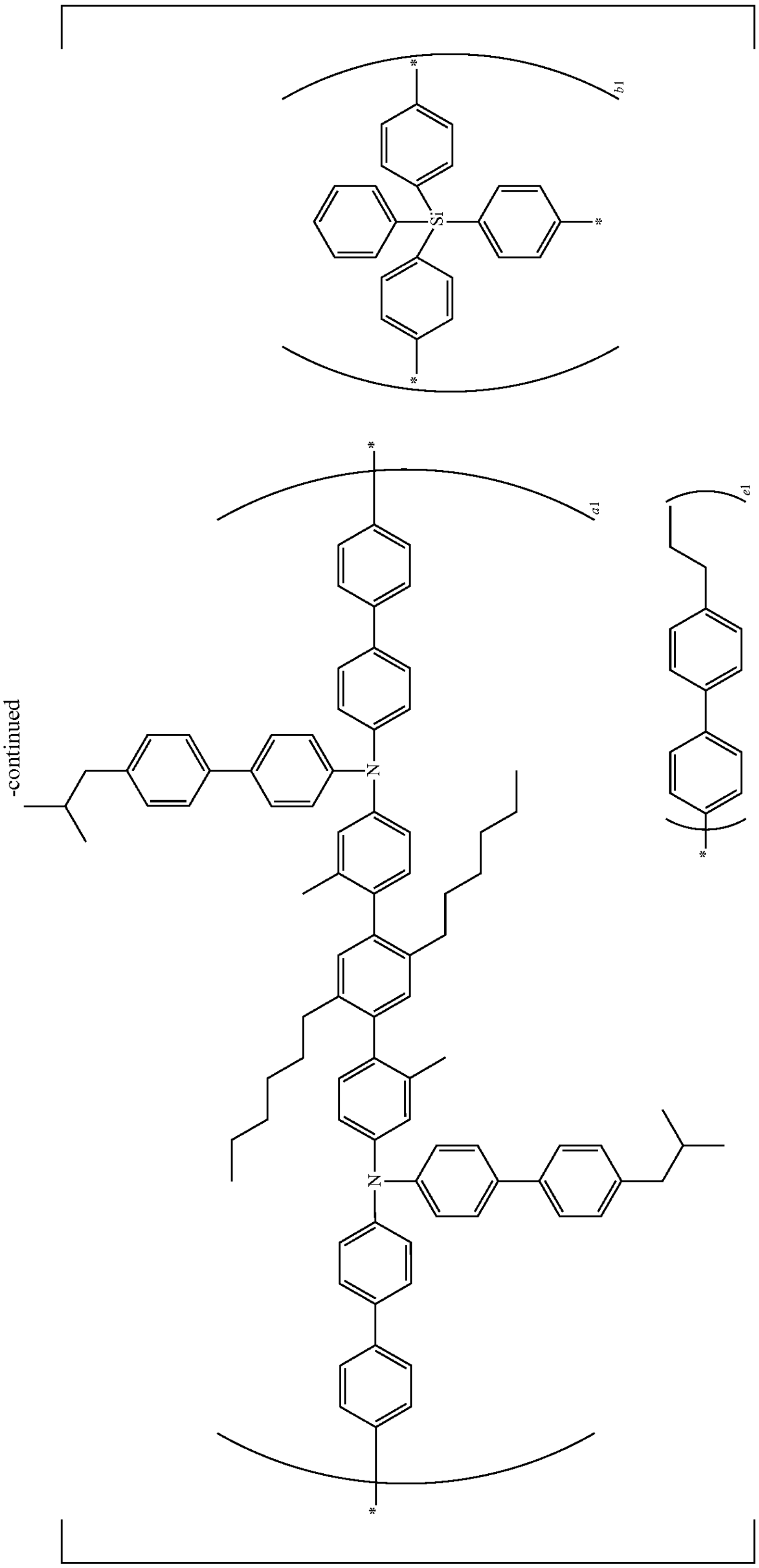

-continued
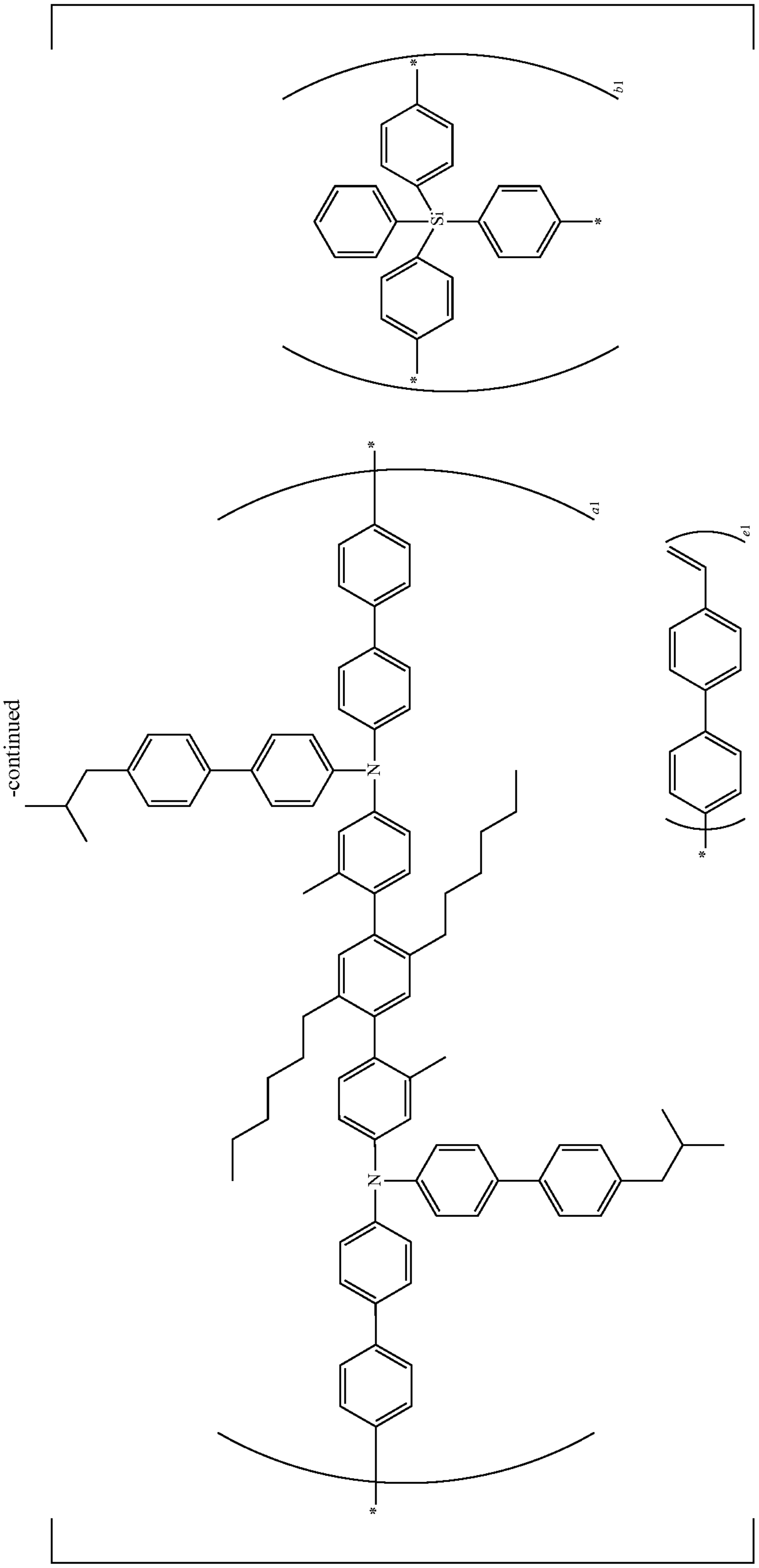

-continued
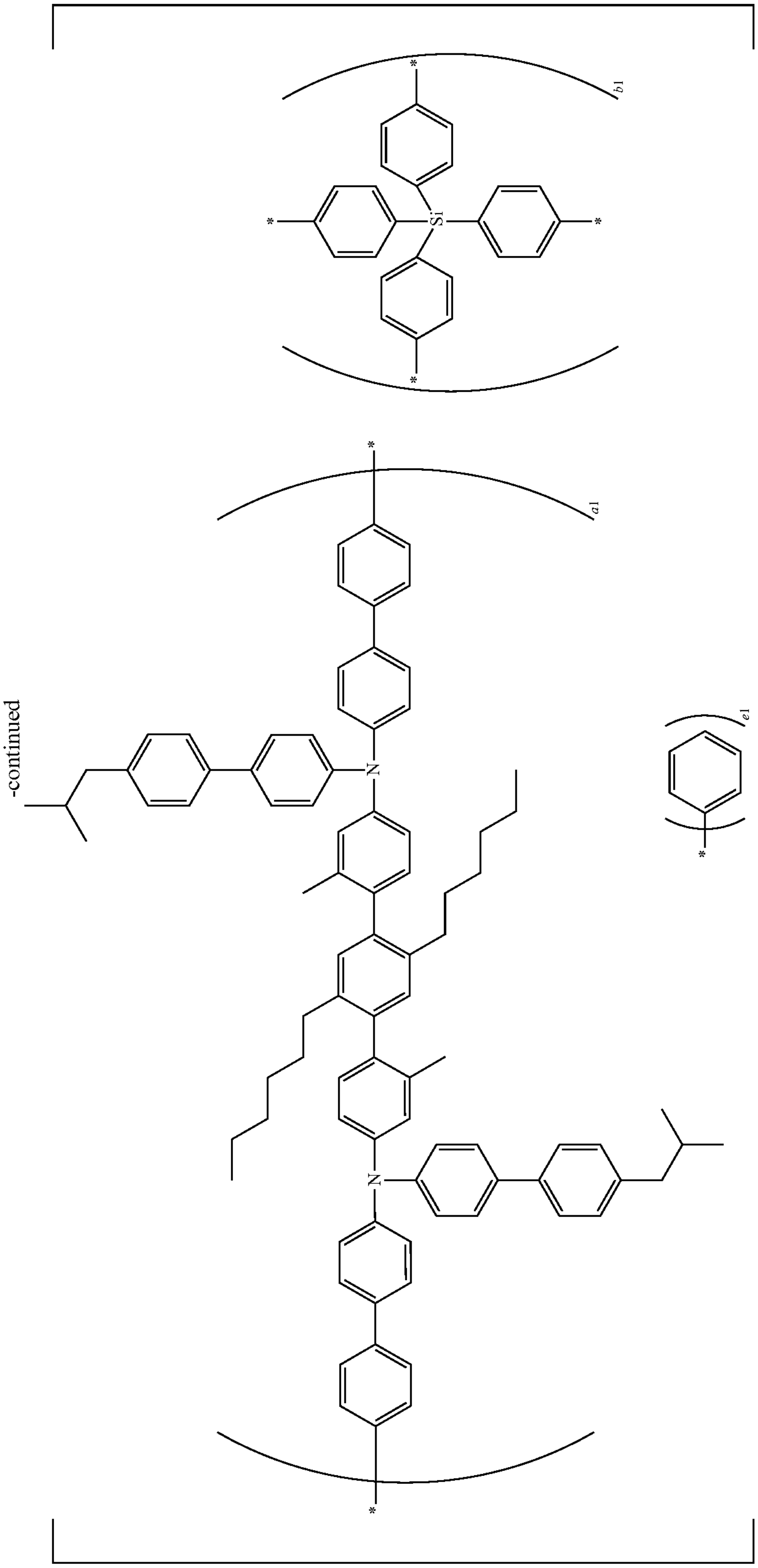

-continued
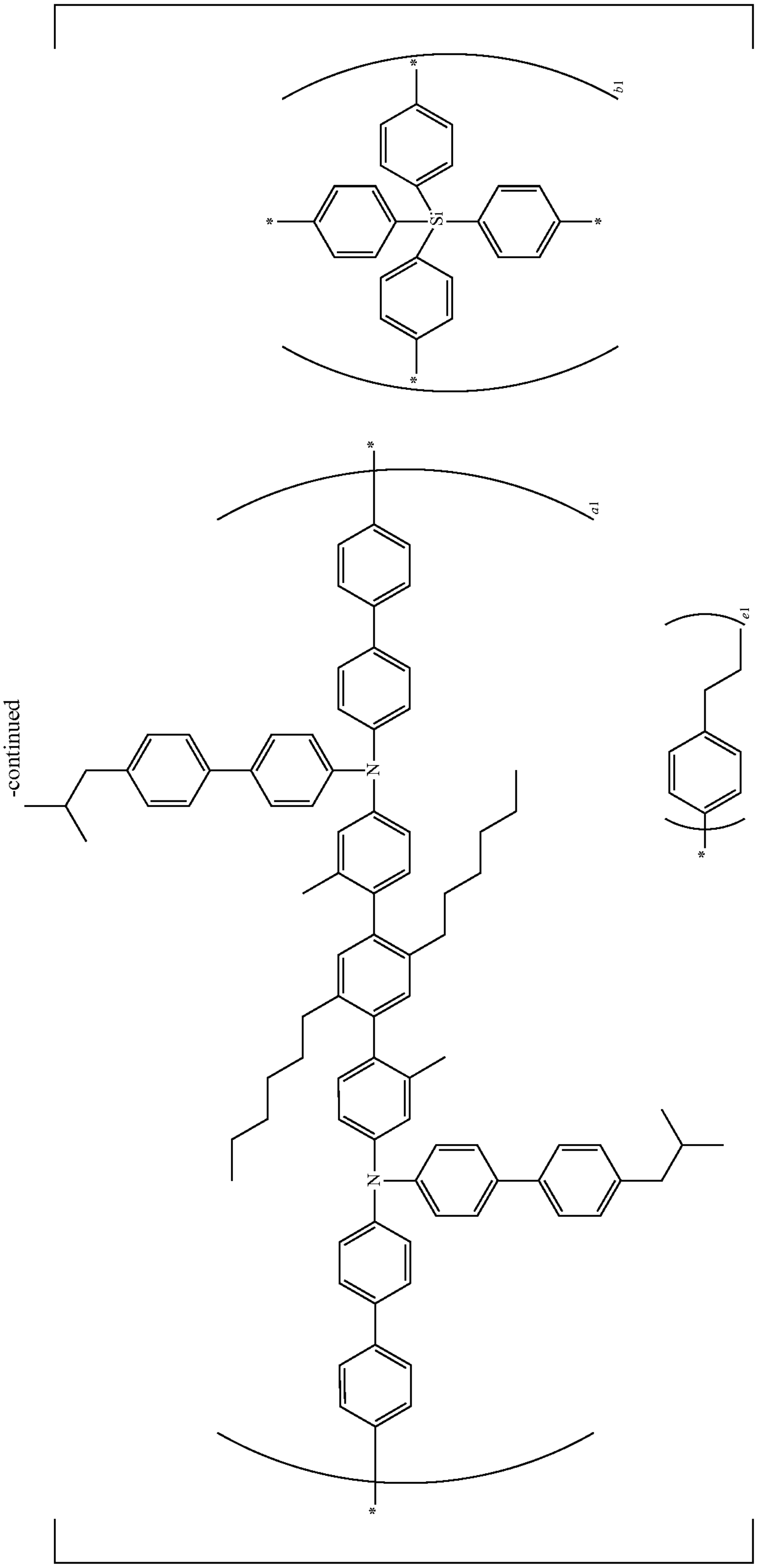

-continued
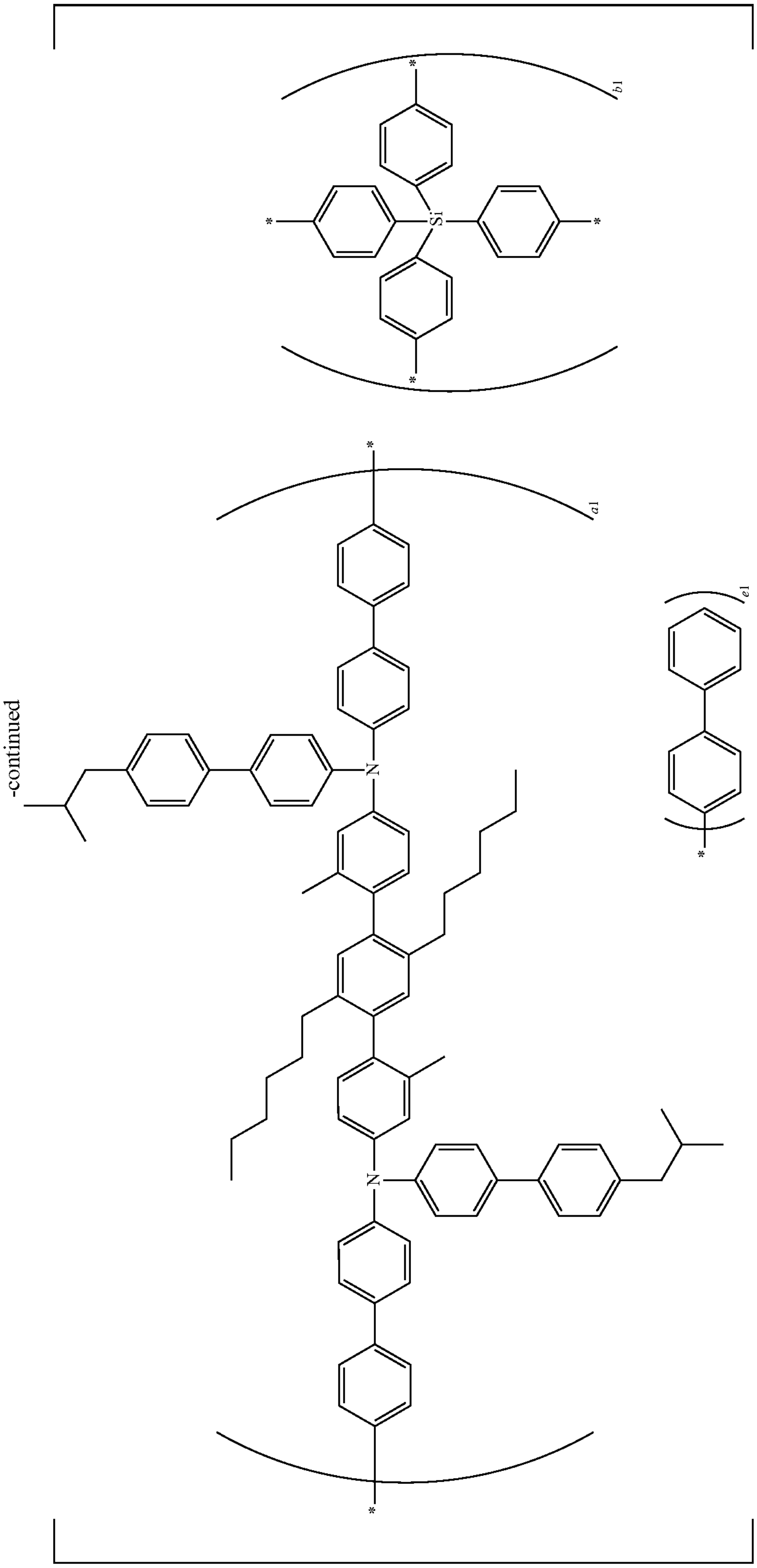

-continued
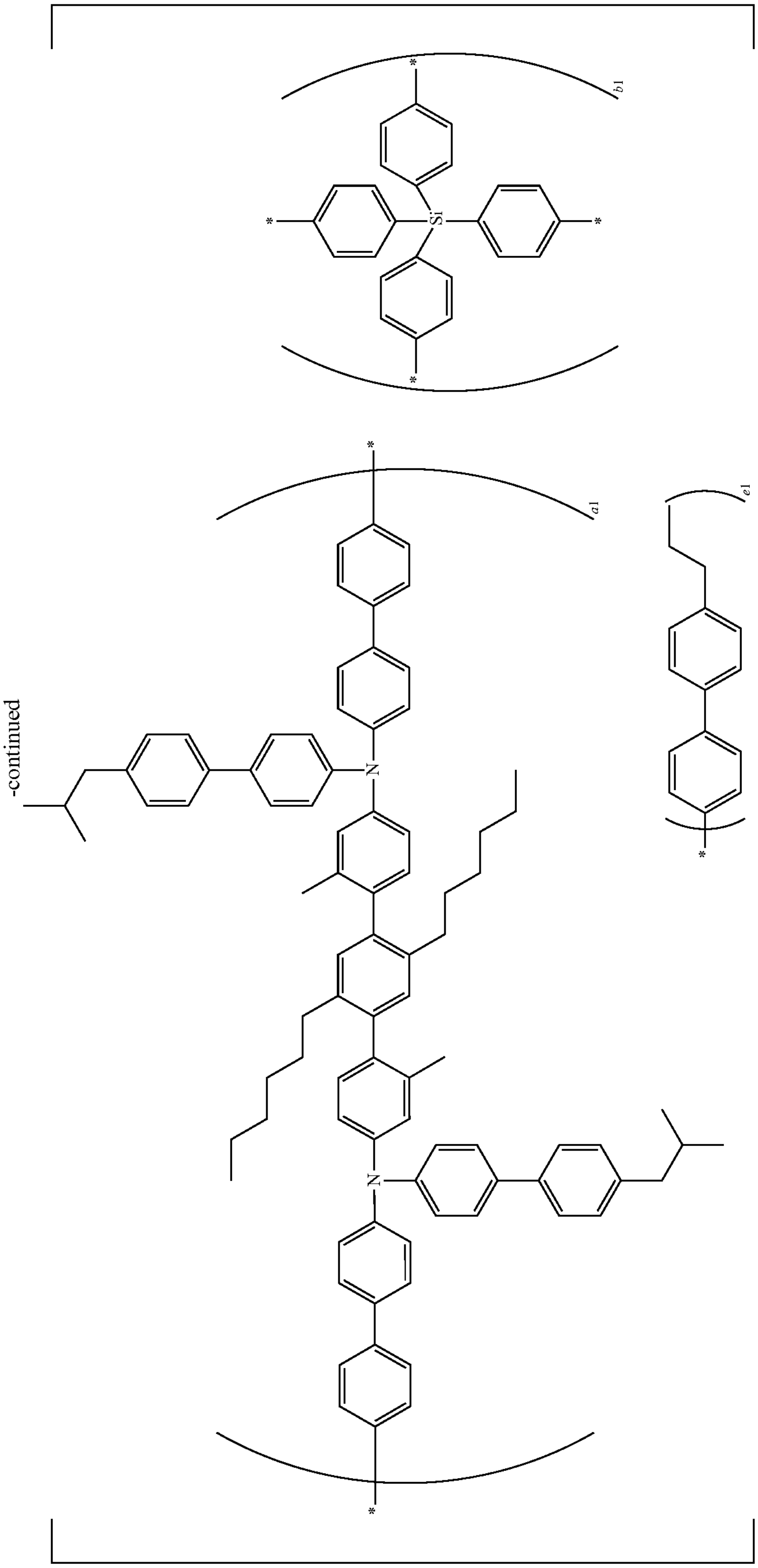

-continued
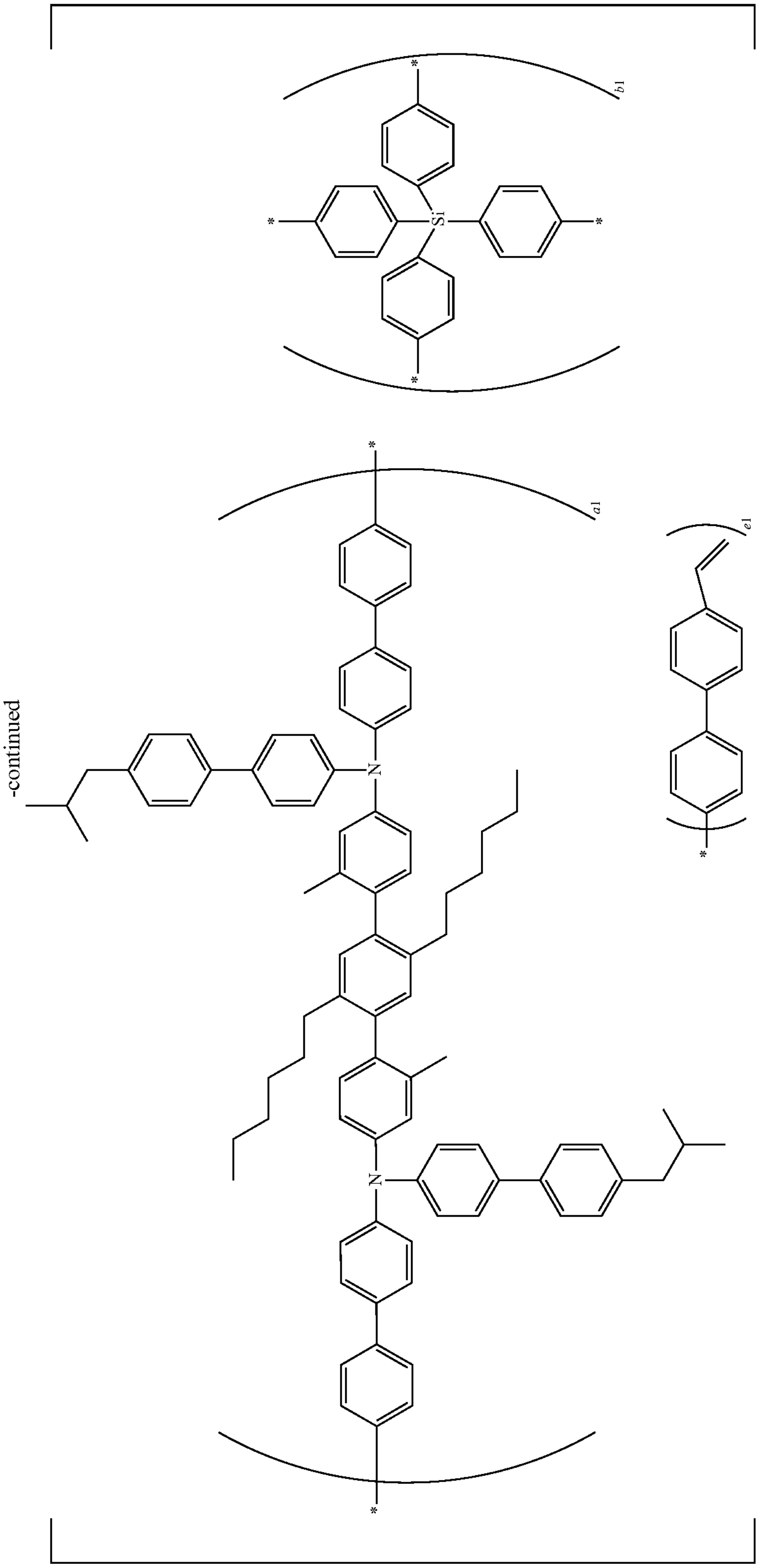

-continued
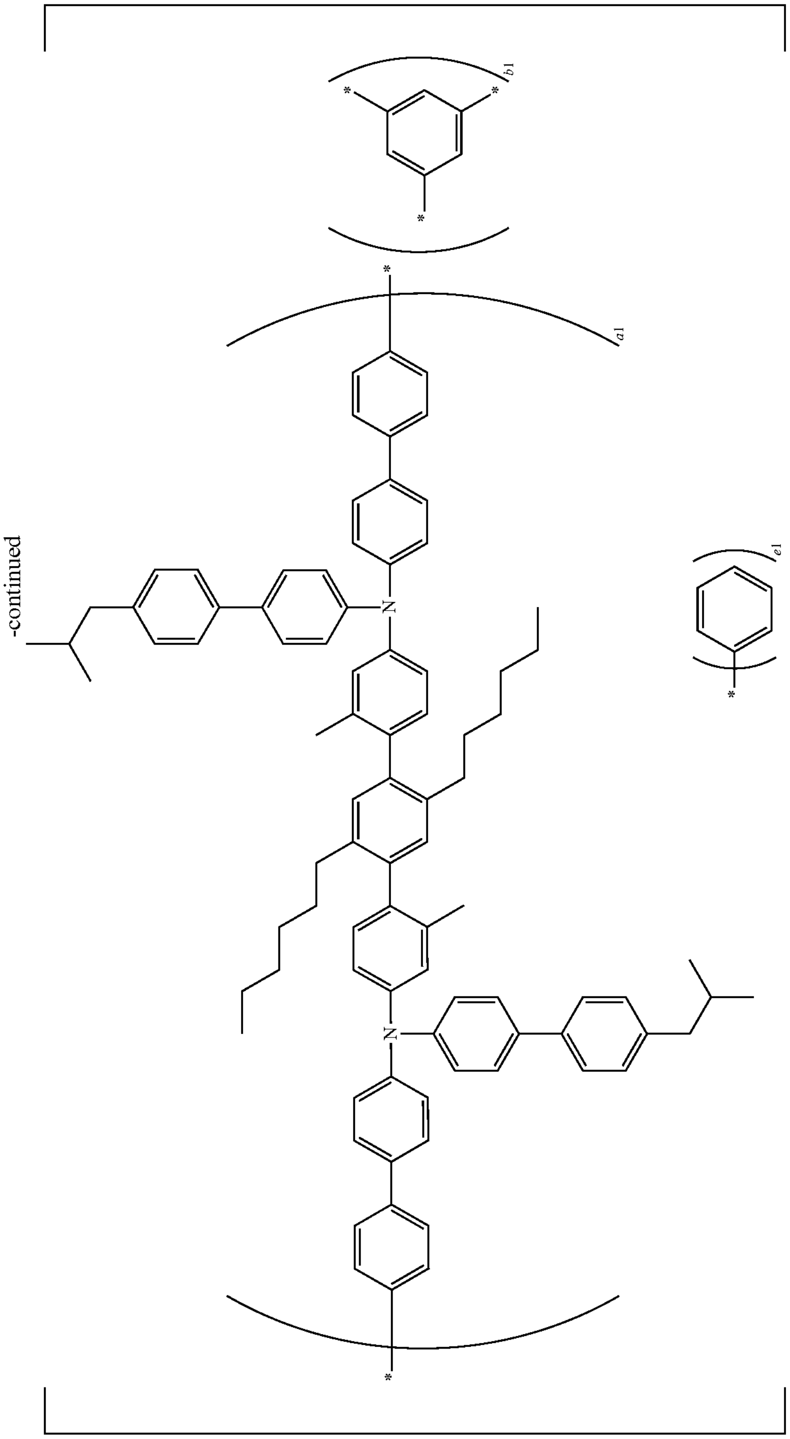

-continued
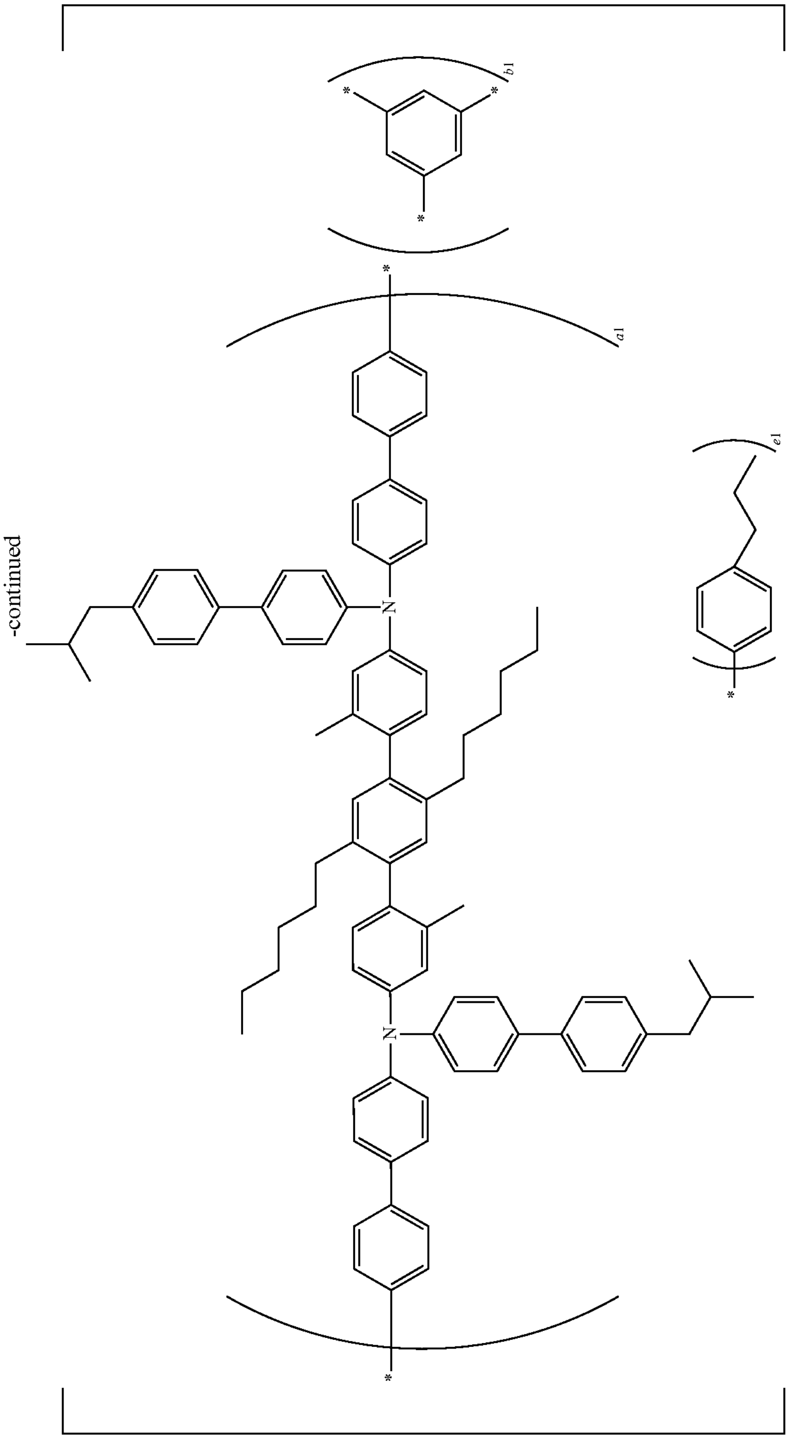

-continued
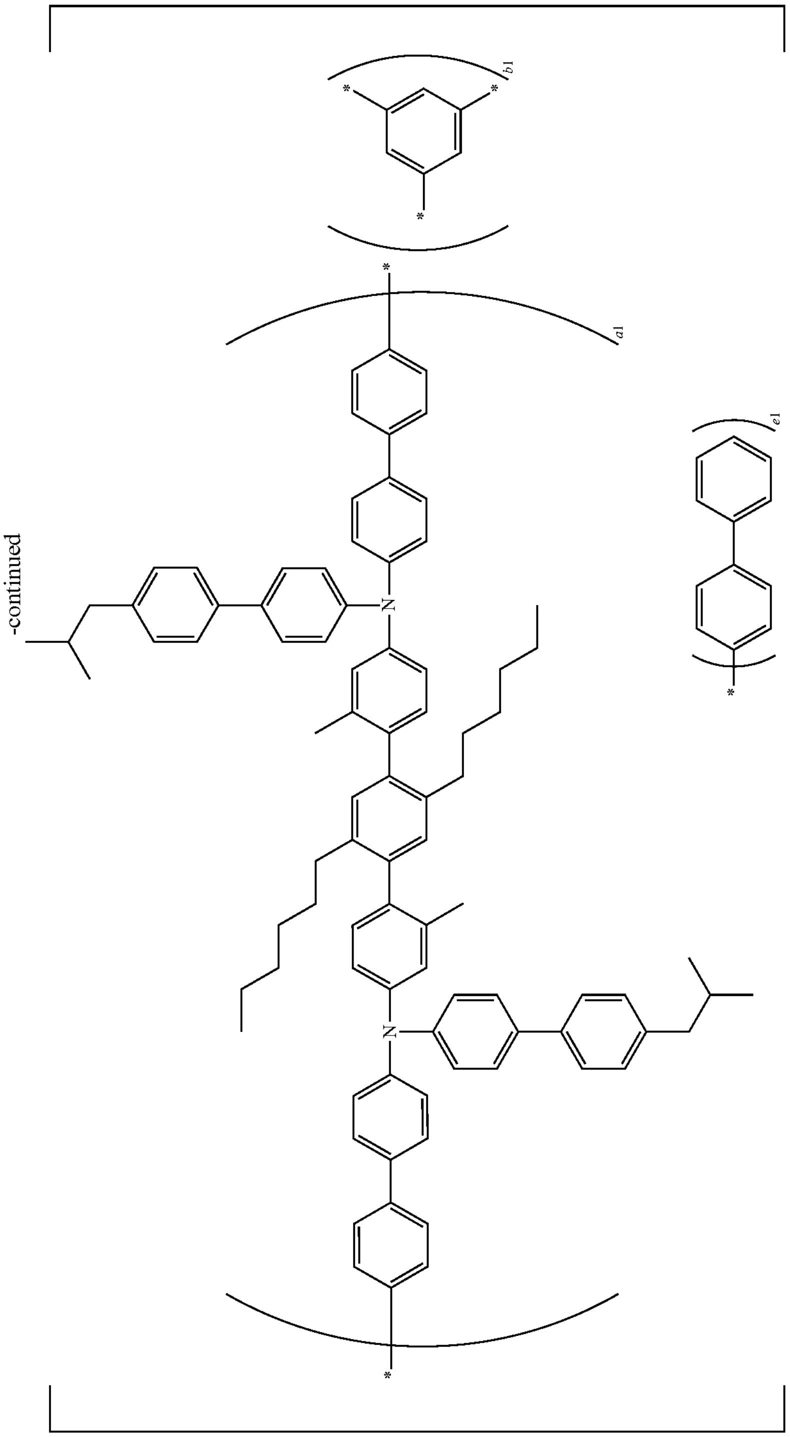

-continued
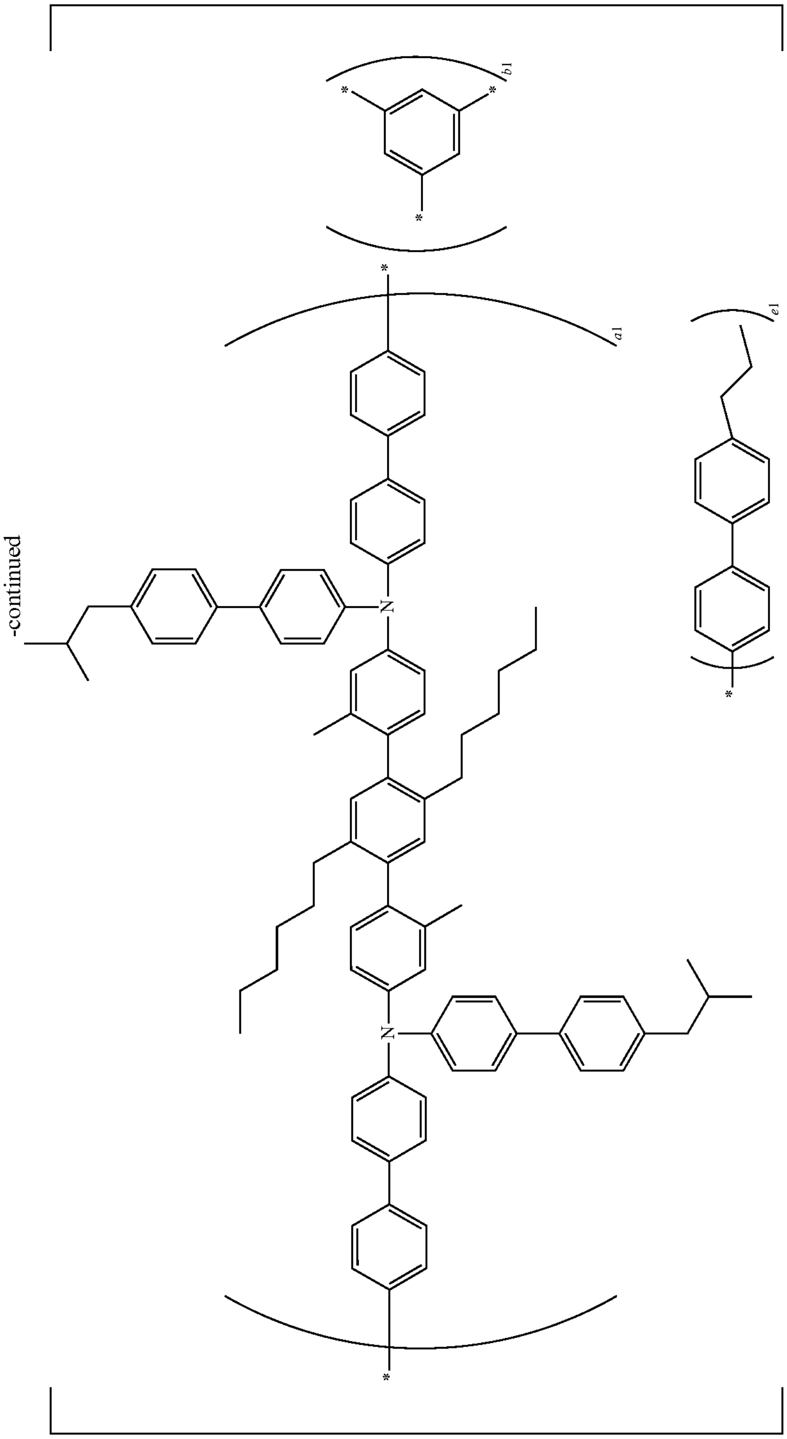

-continued
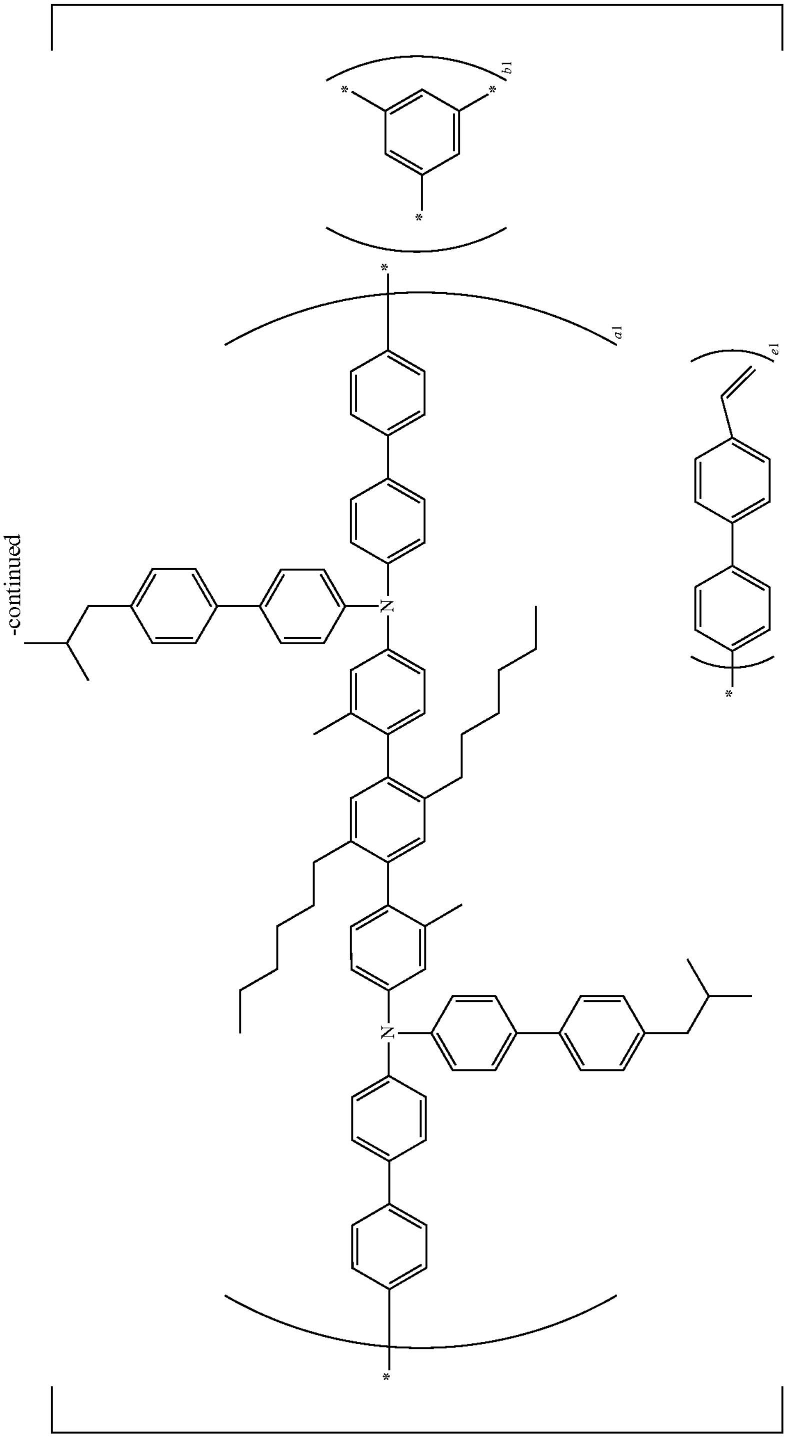

-continued
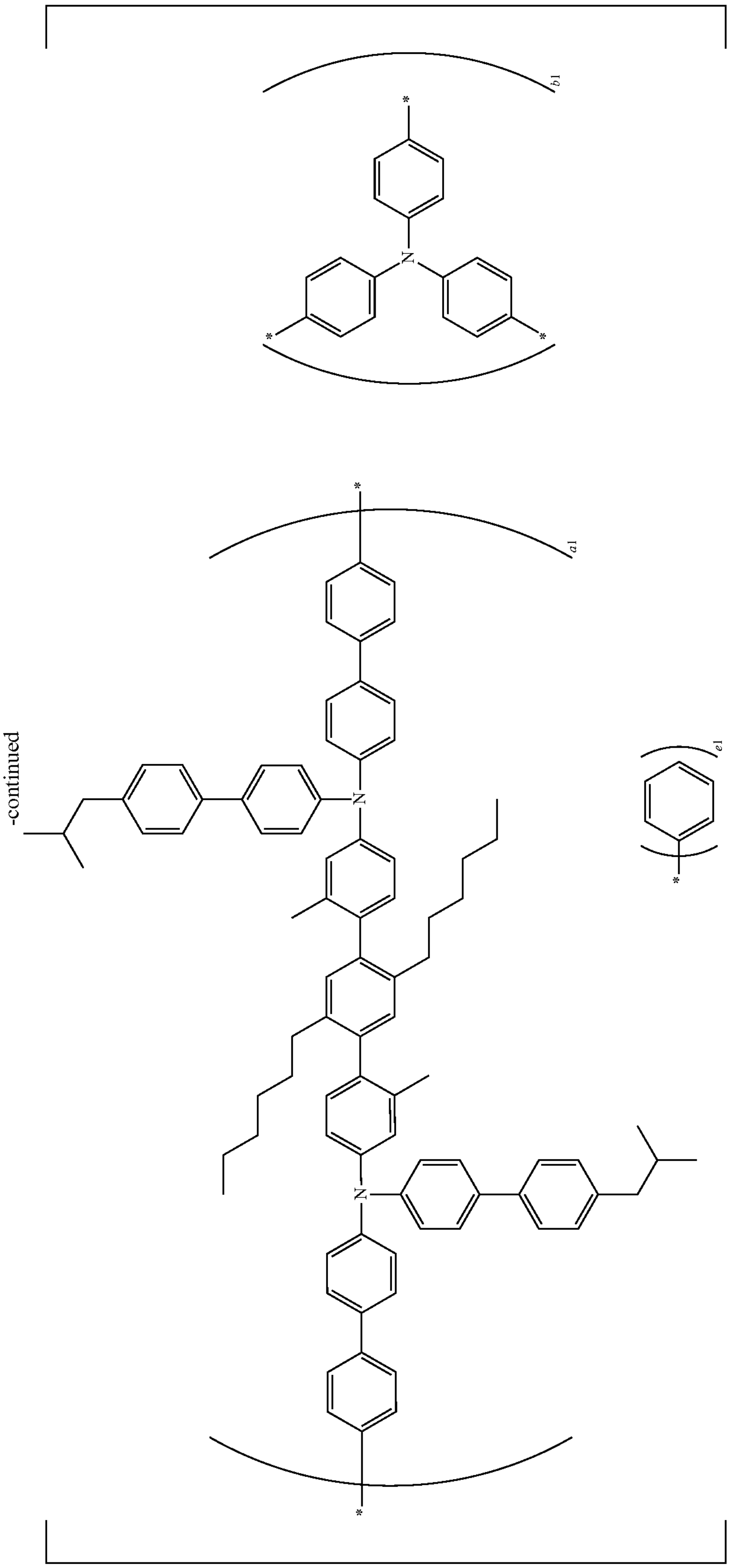

-continued
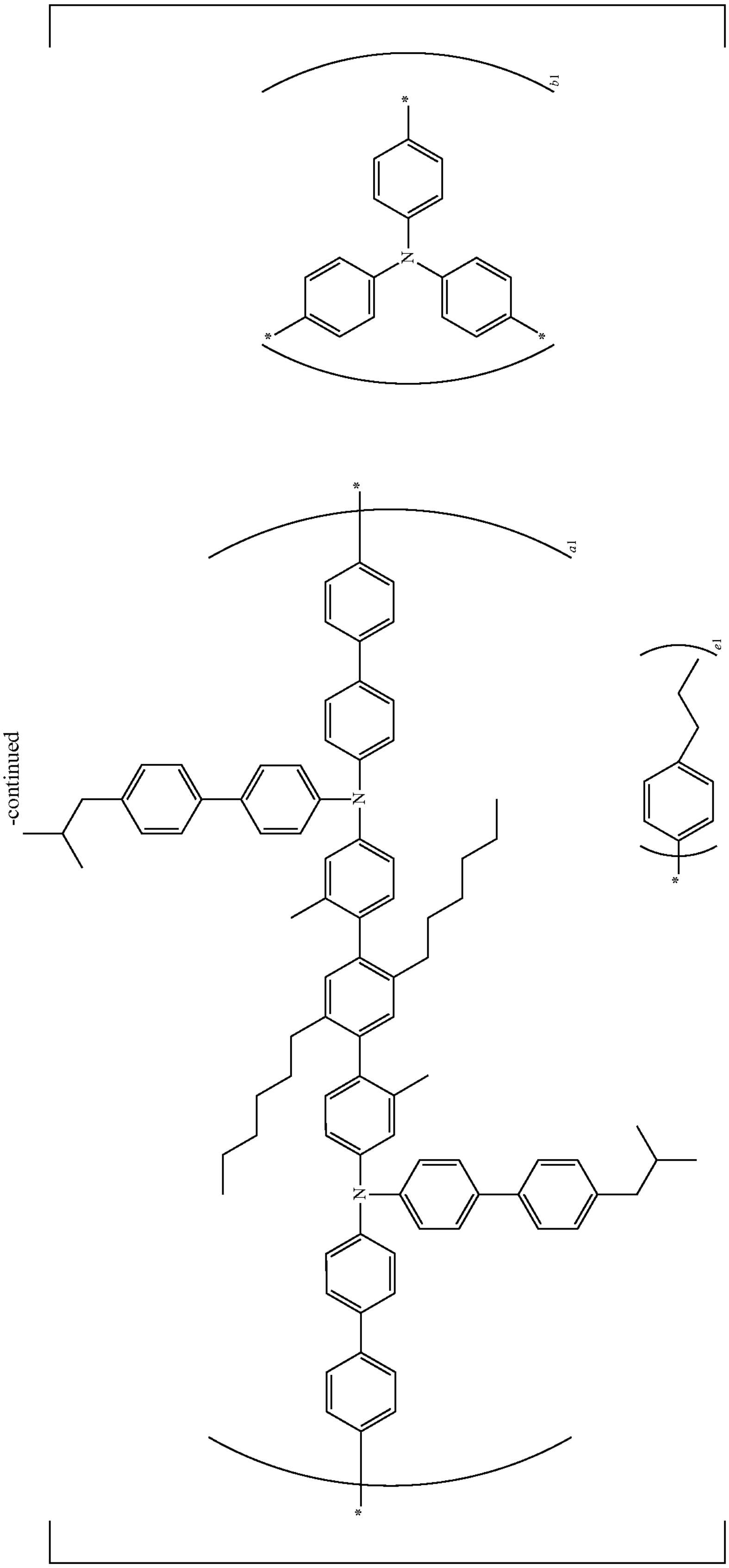

-continued
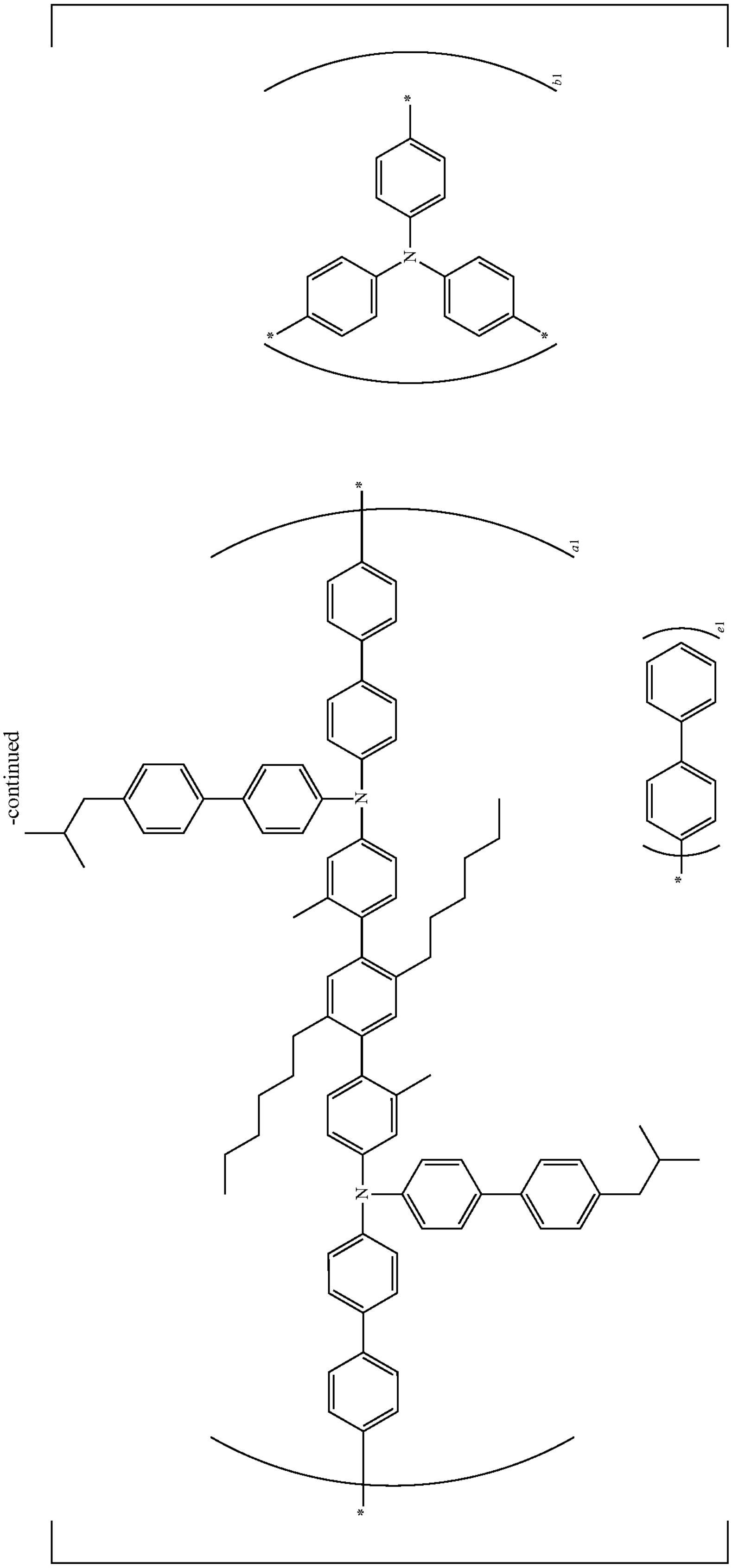

-continued
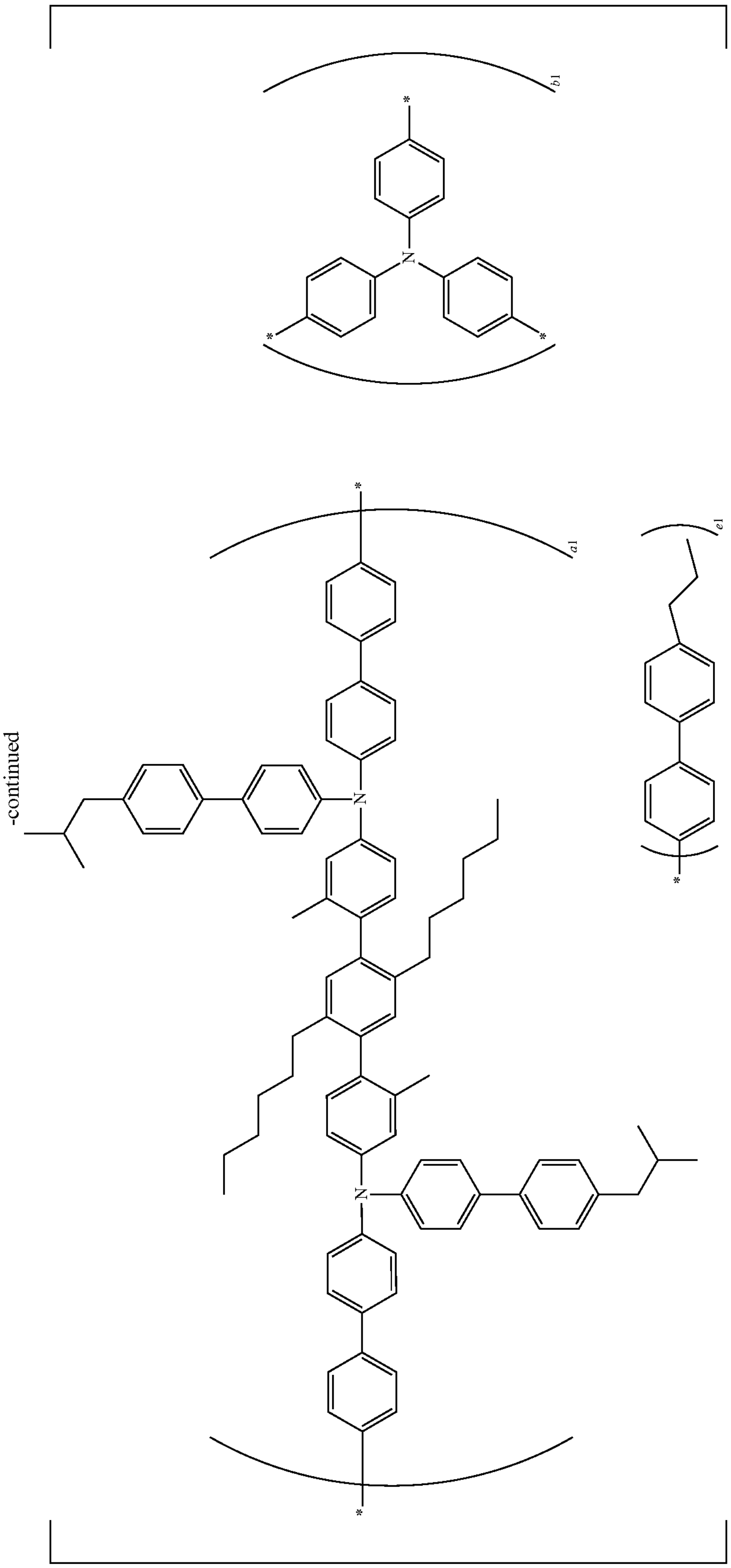

-continued
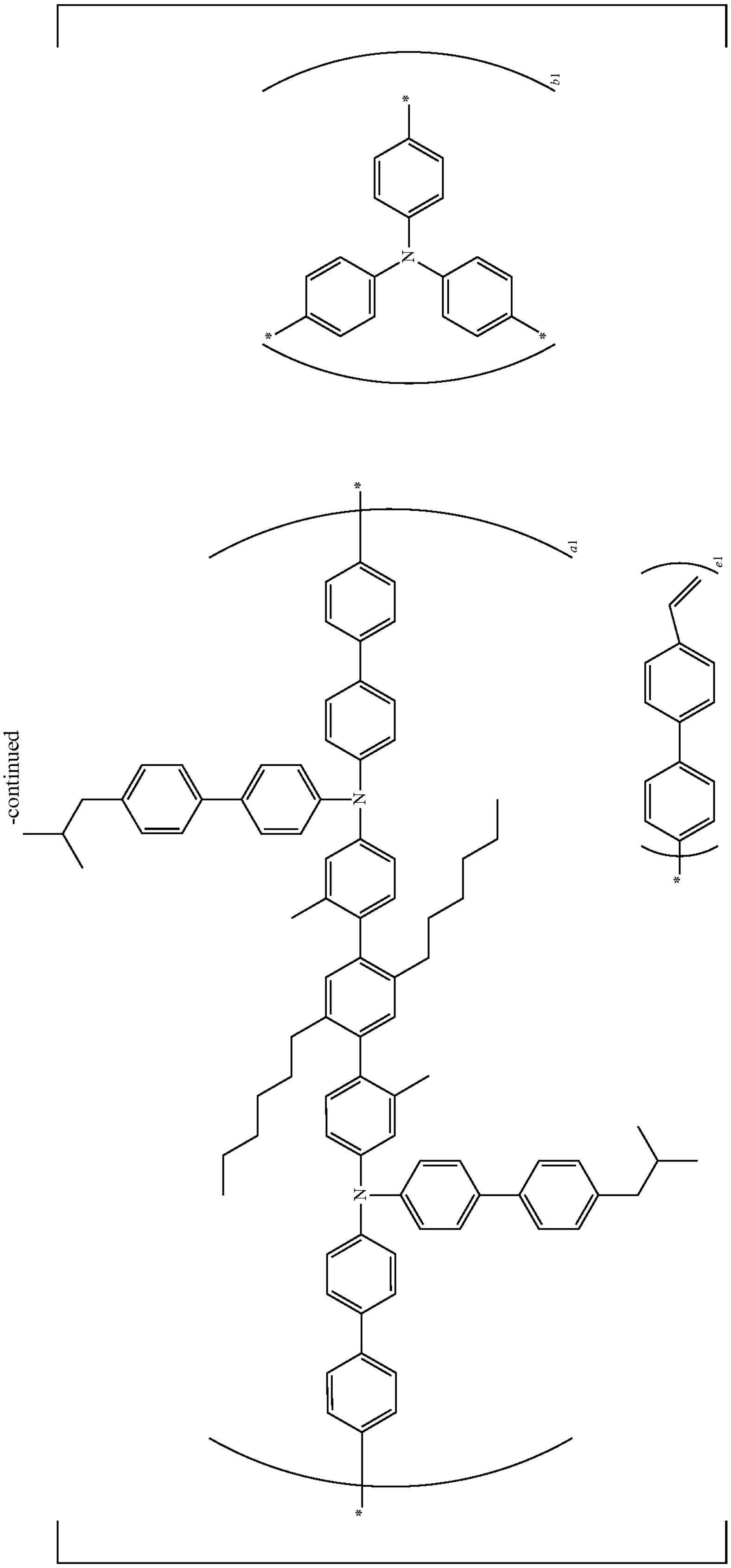

-continued
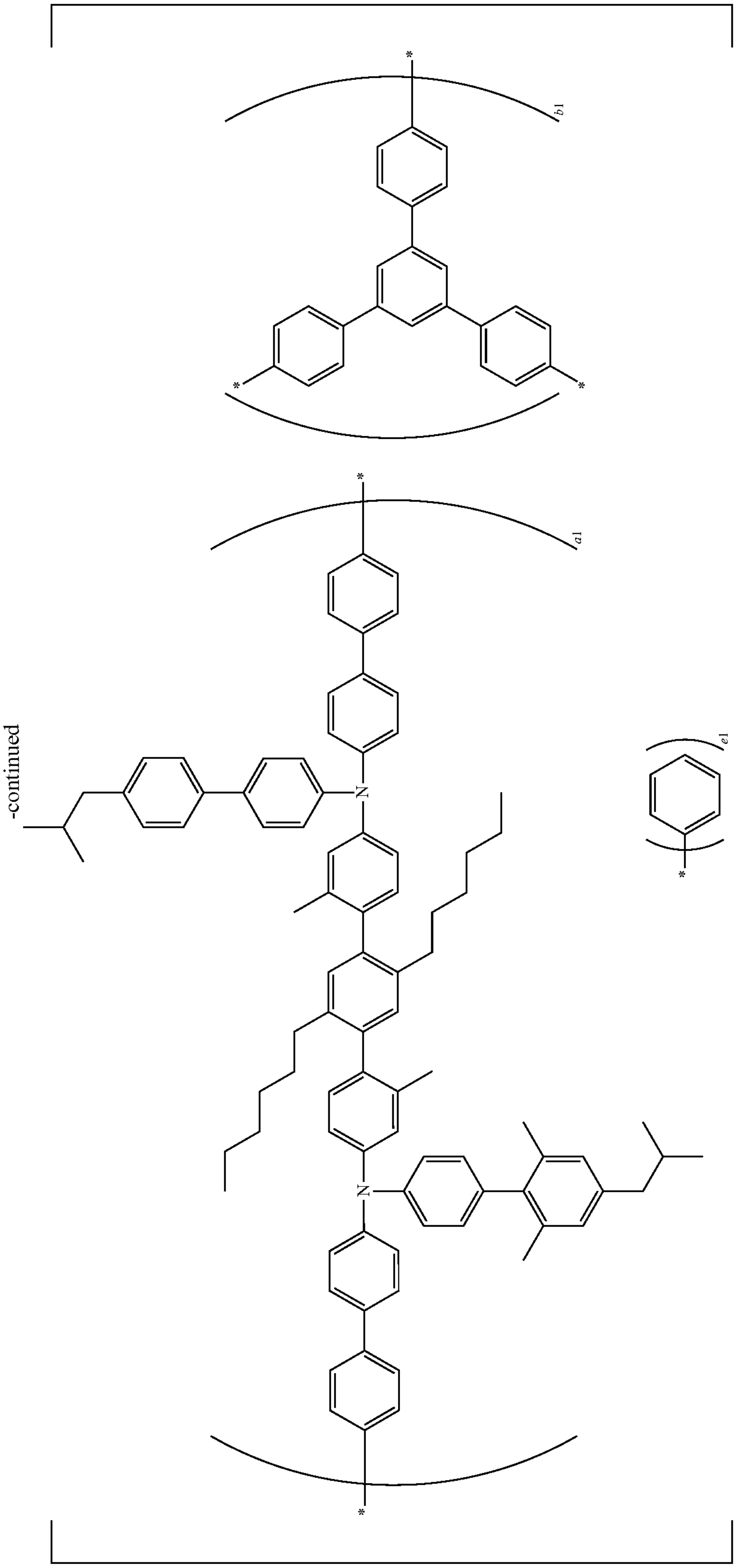

-continued
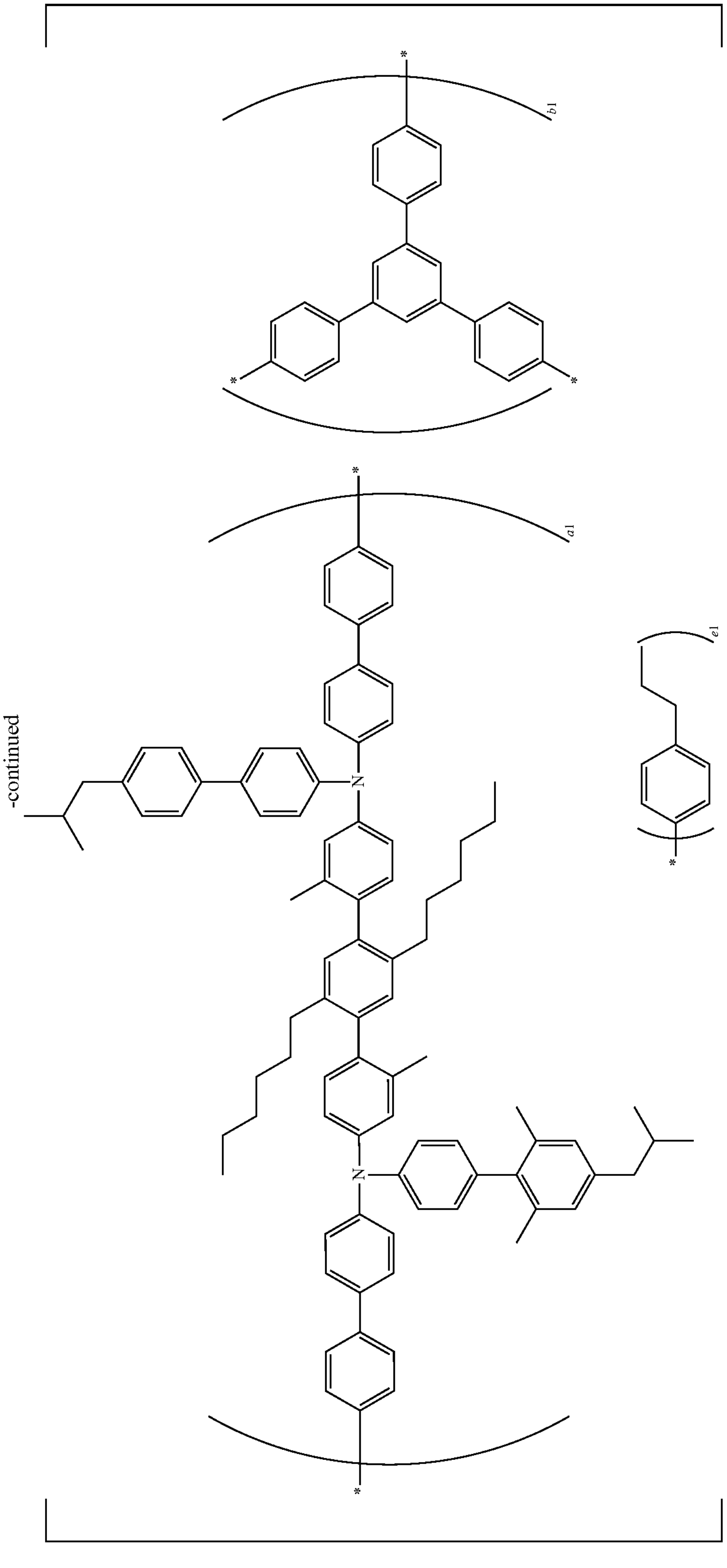

-continued
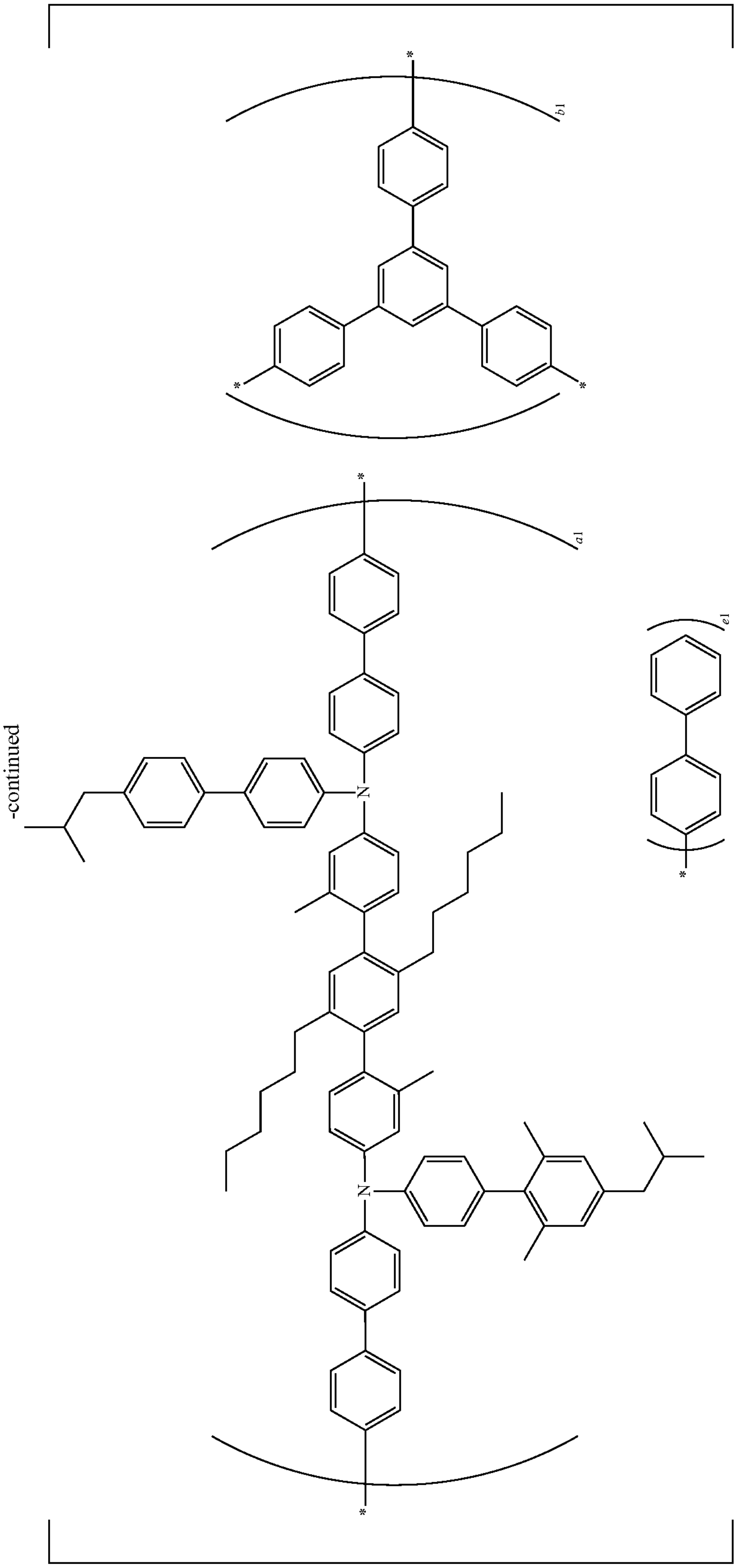

-continued
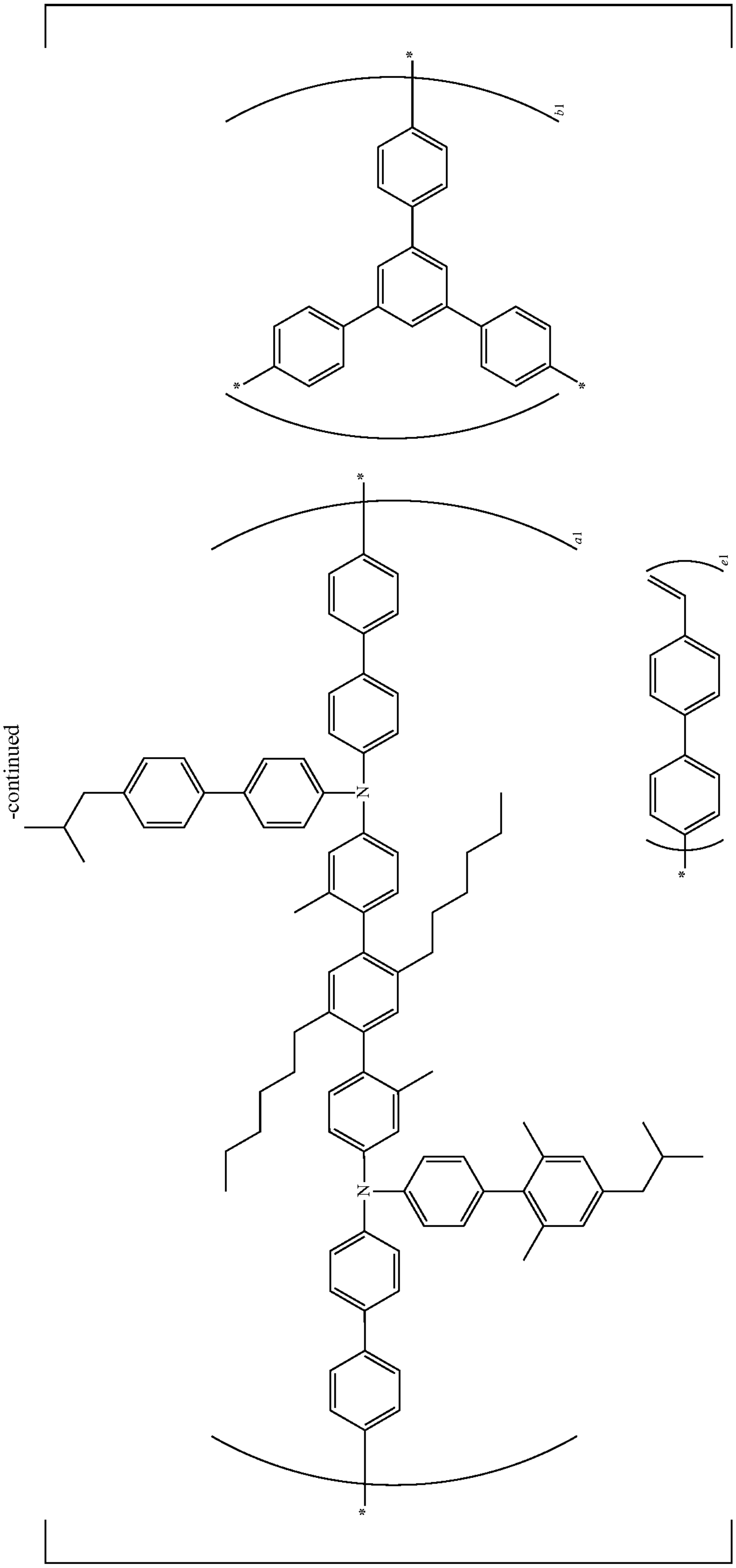

-continued
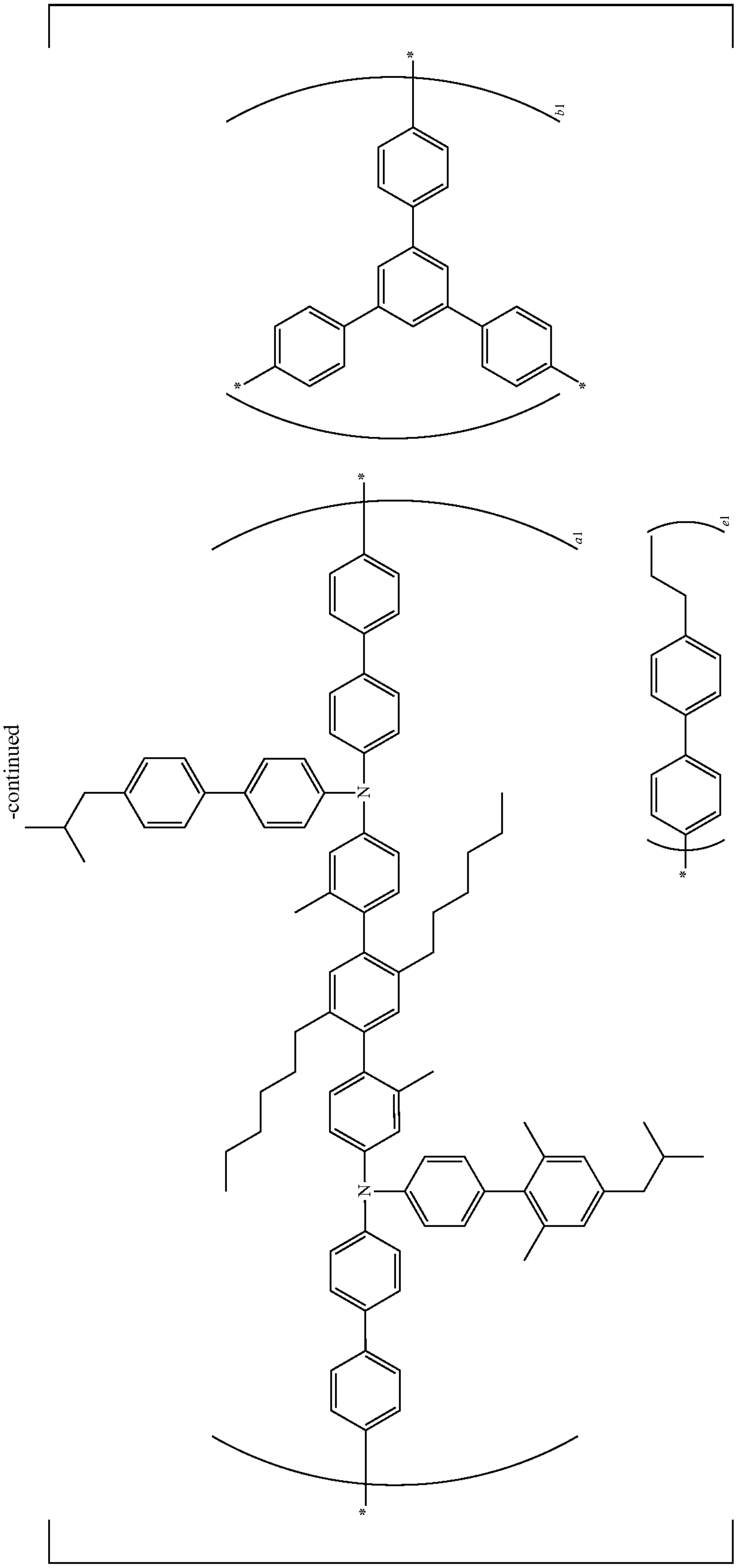

-continued
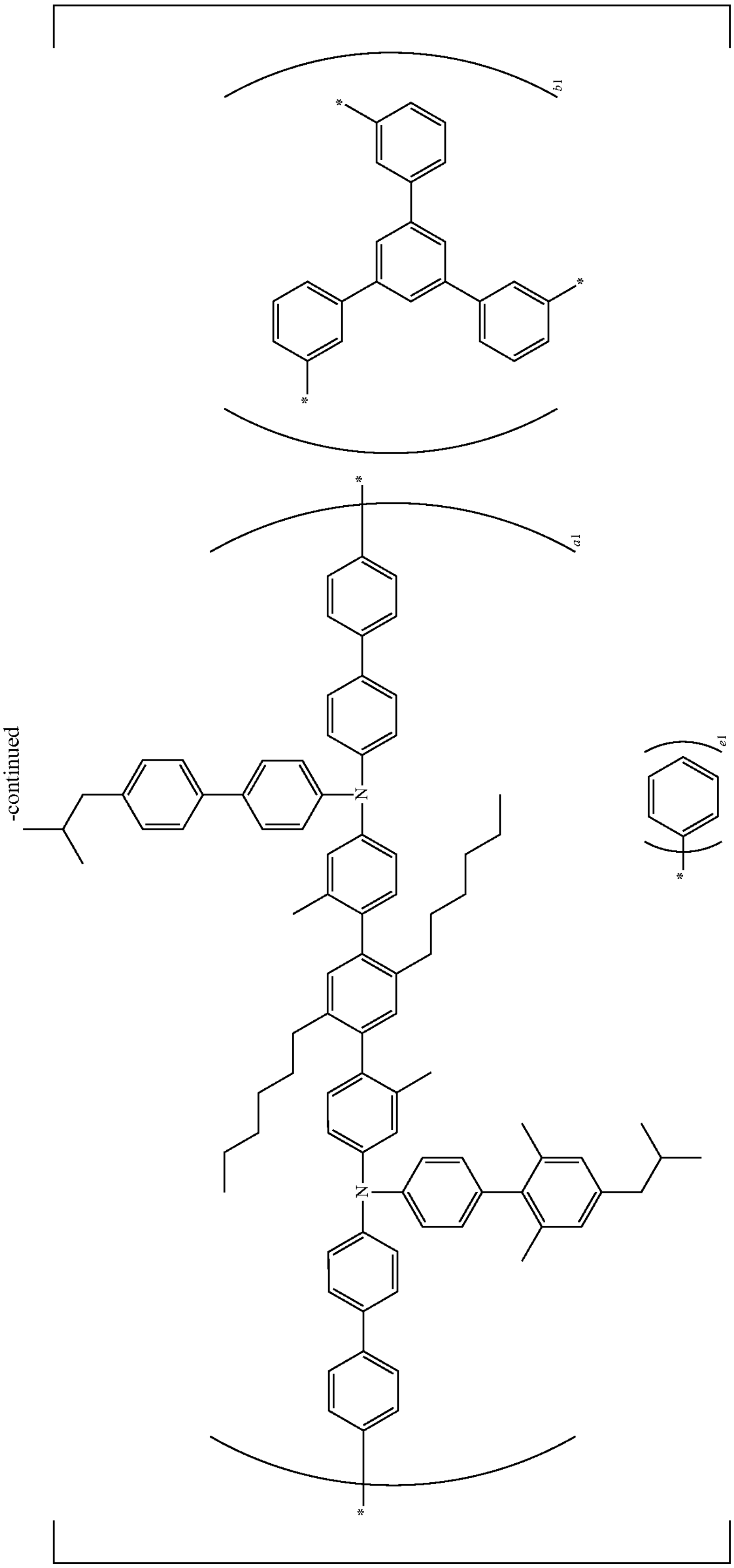

-continued
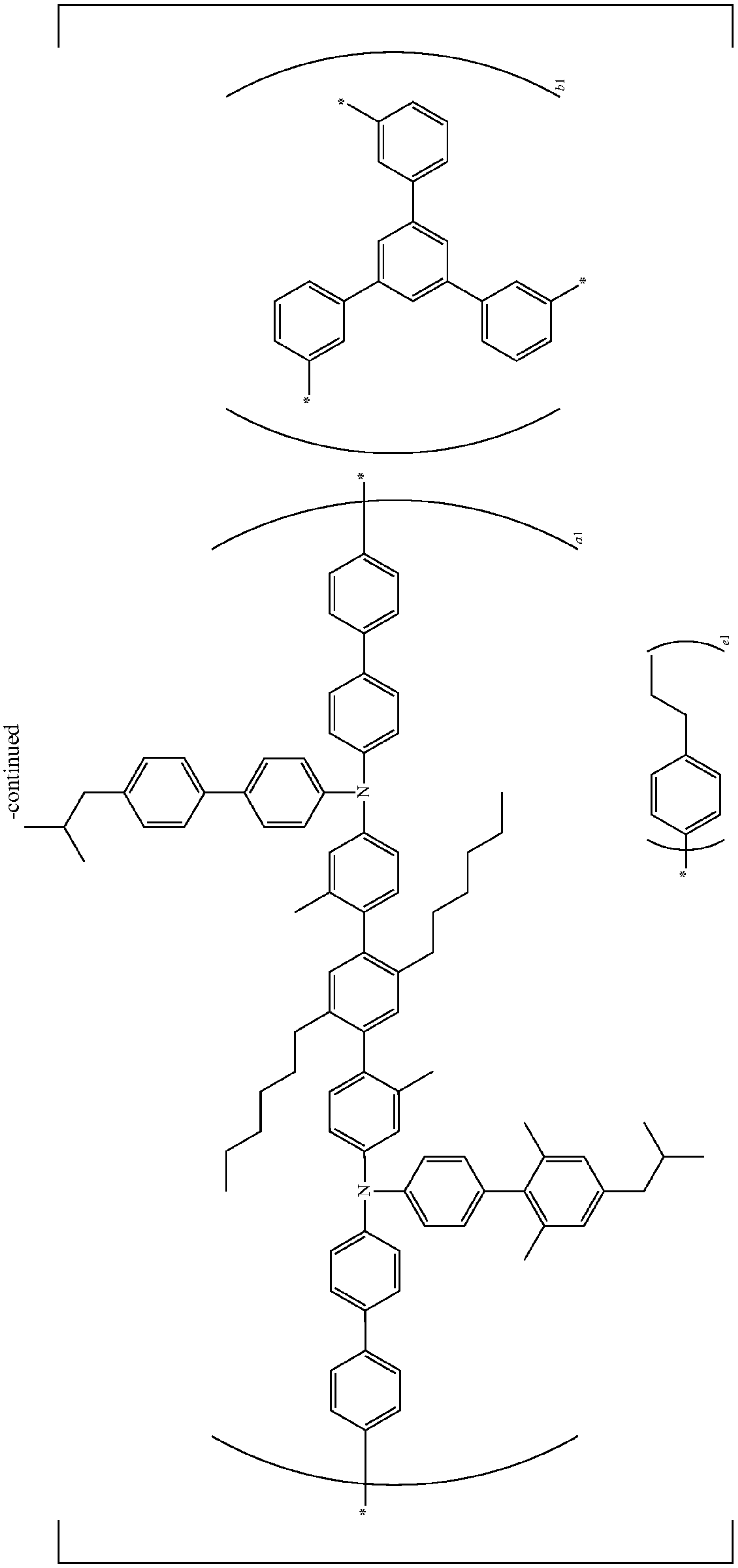

-continued
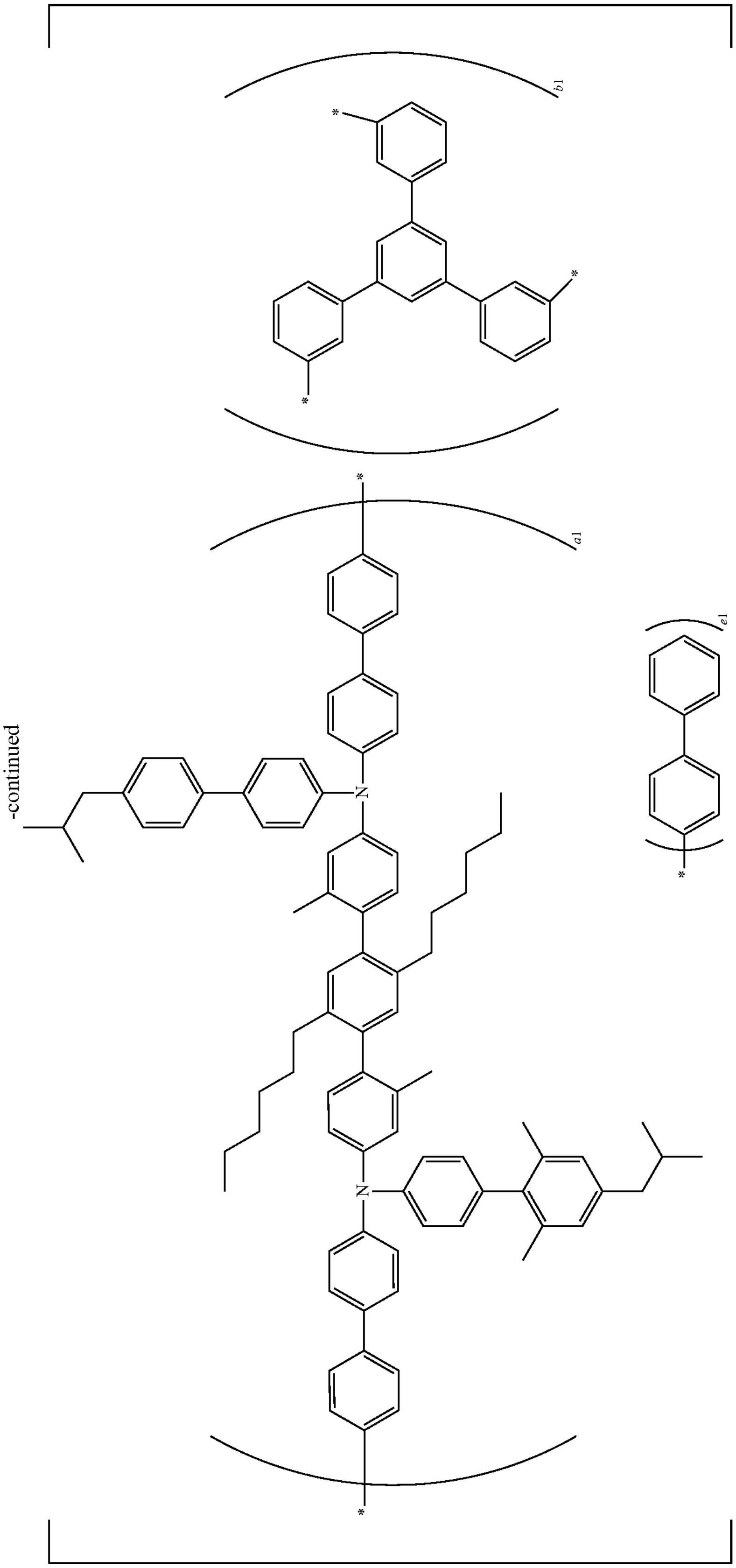

-continued
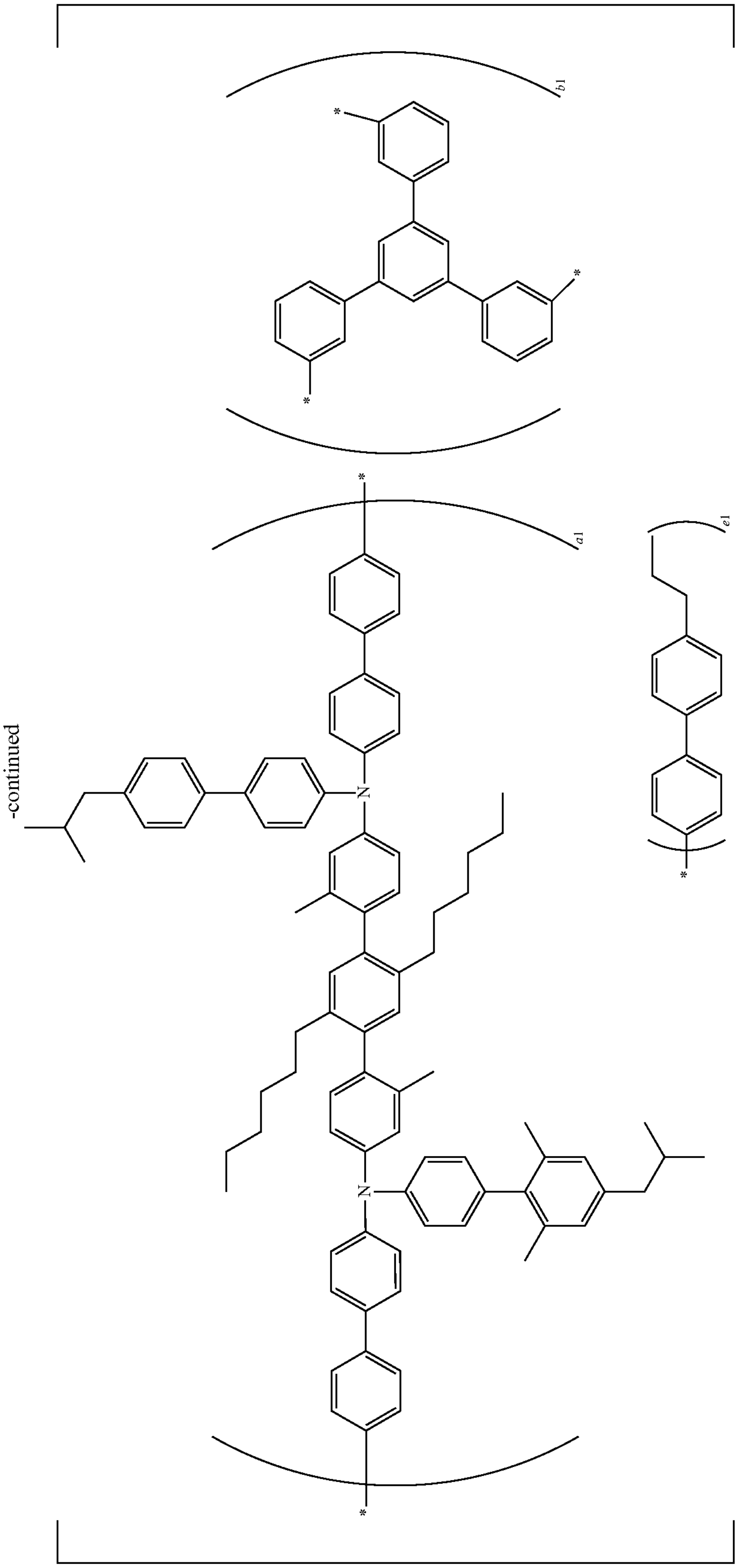

-continued
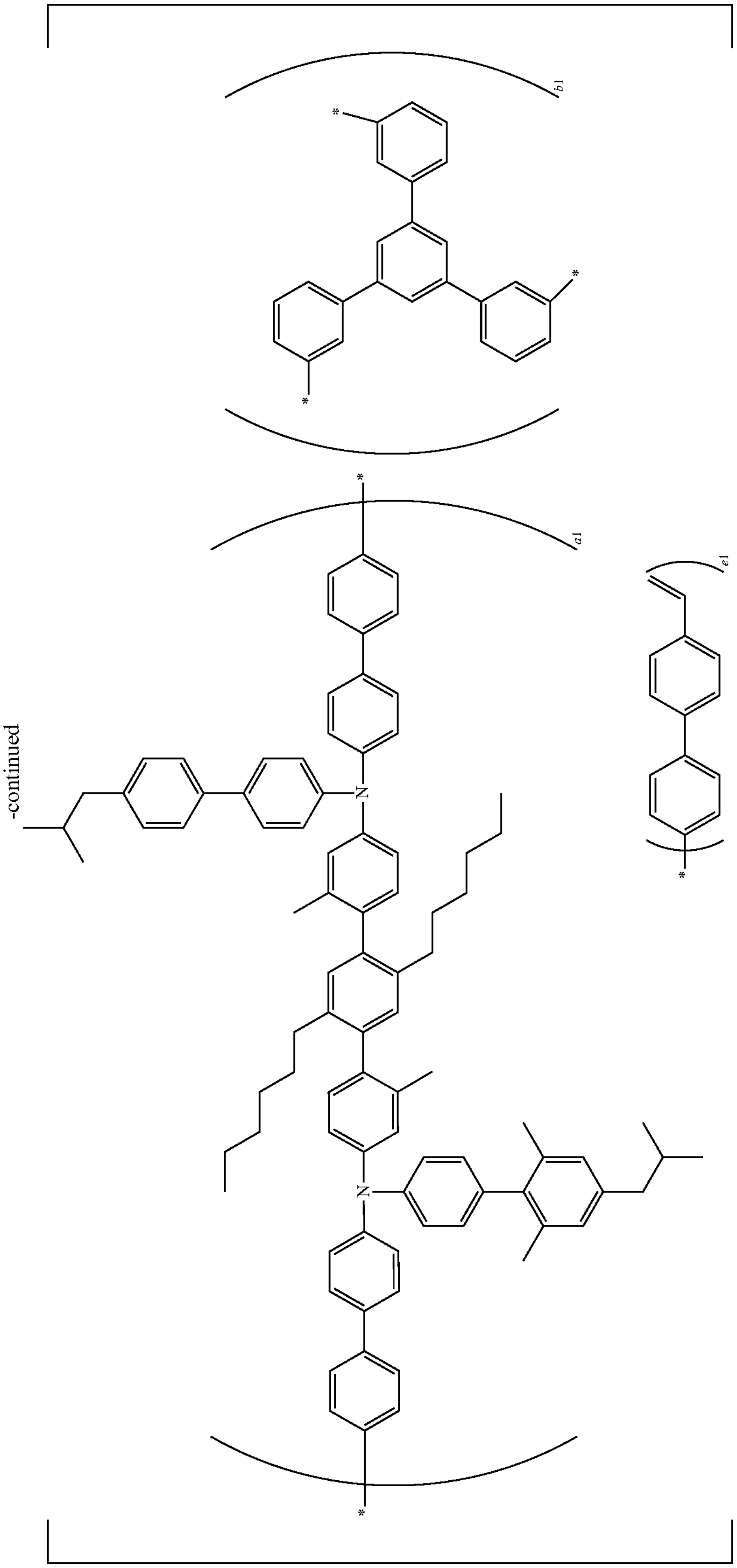

-continued
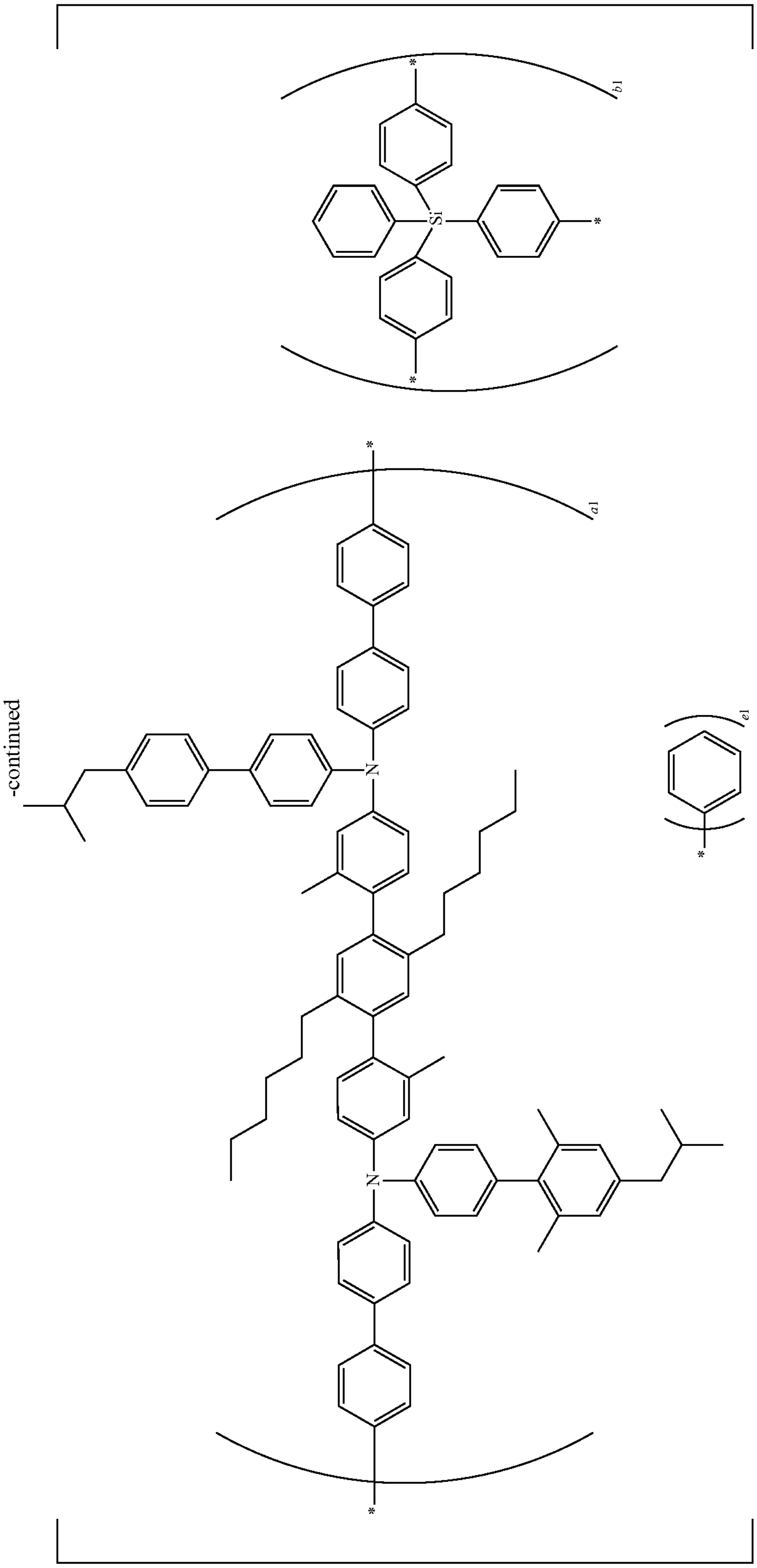

-continued
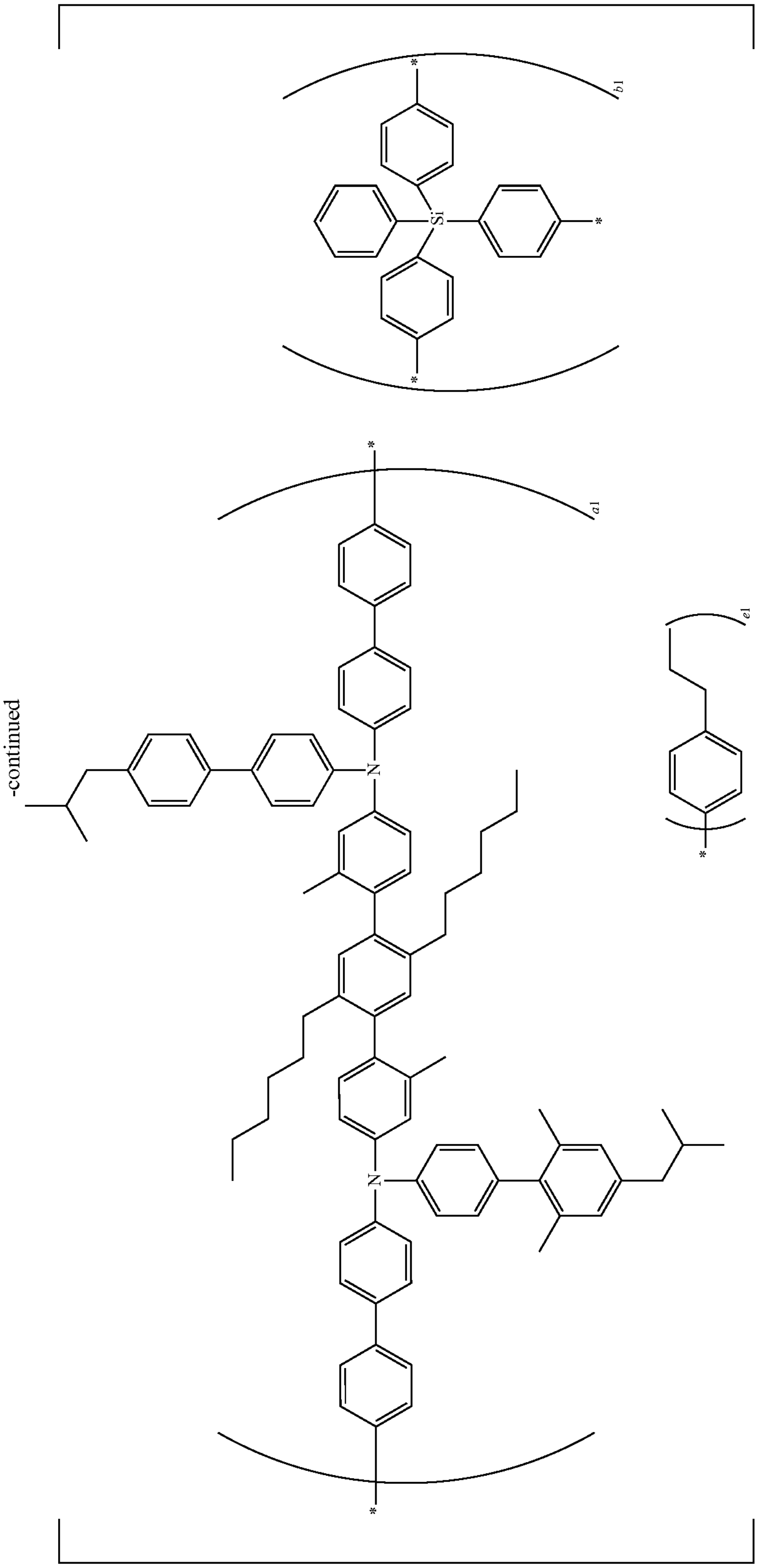

-continued
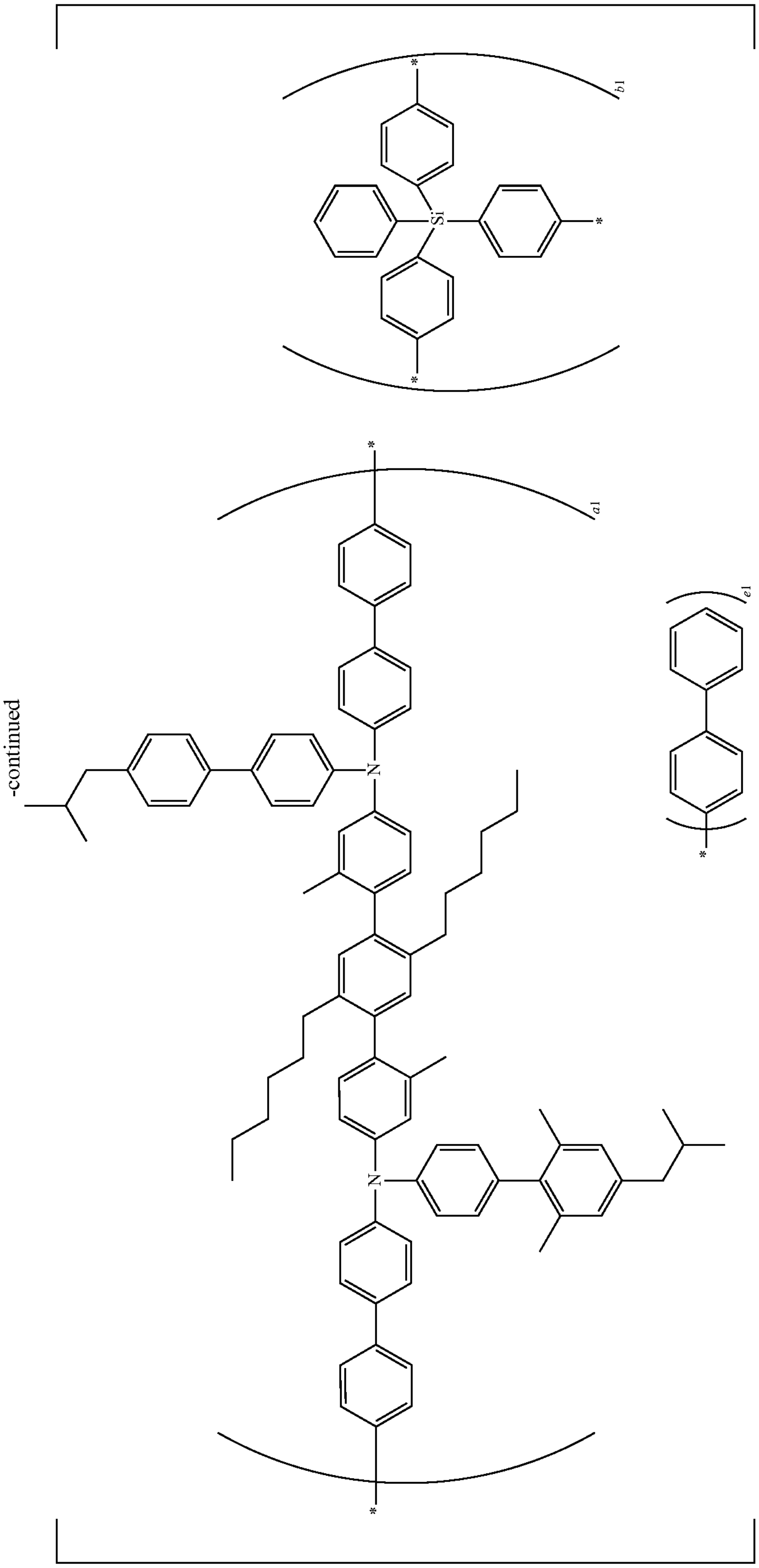

-continued
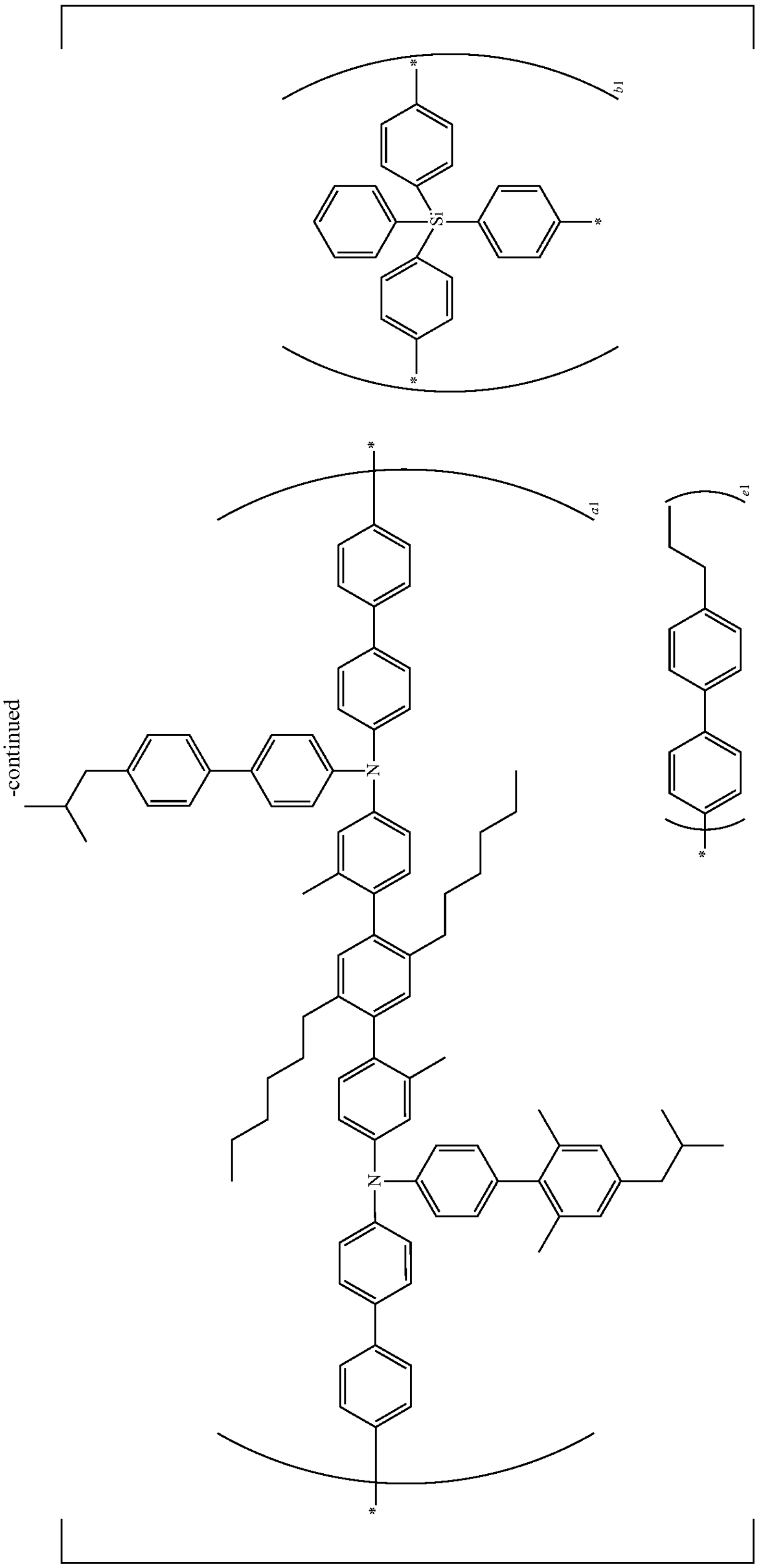

-continued
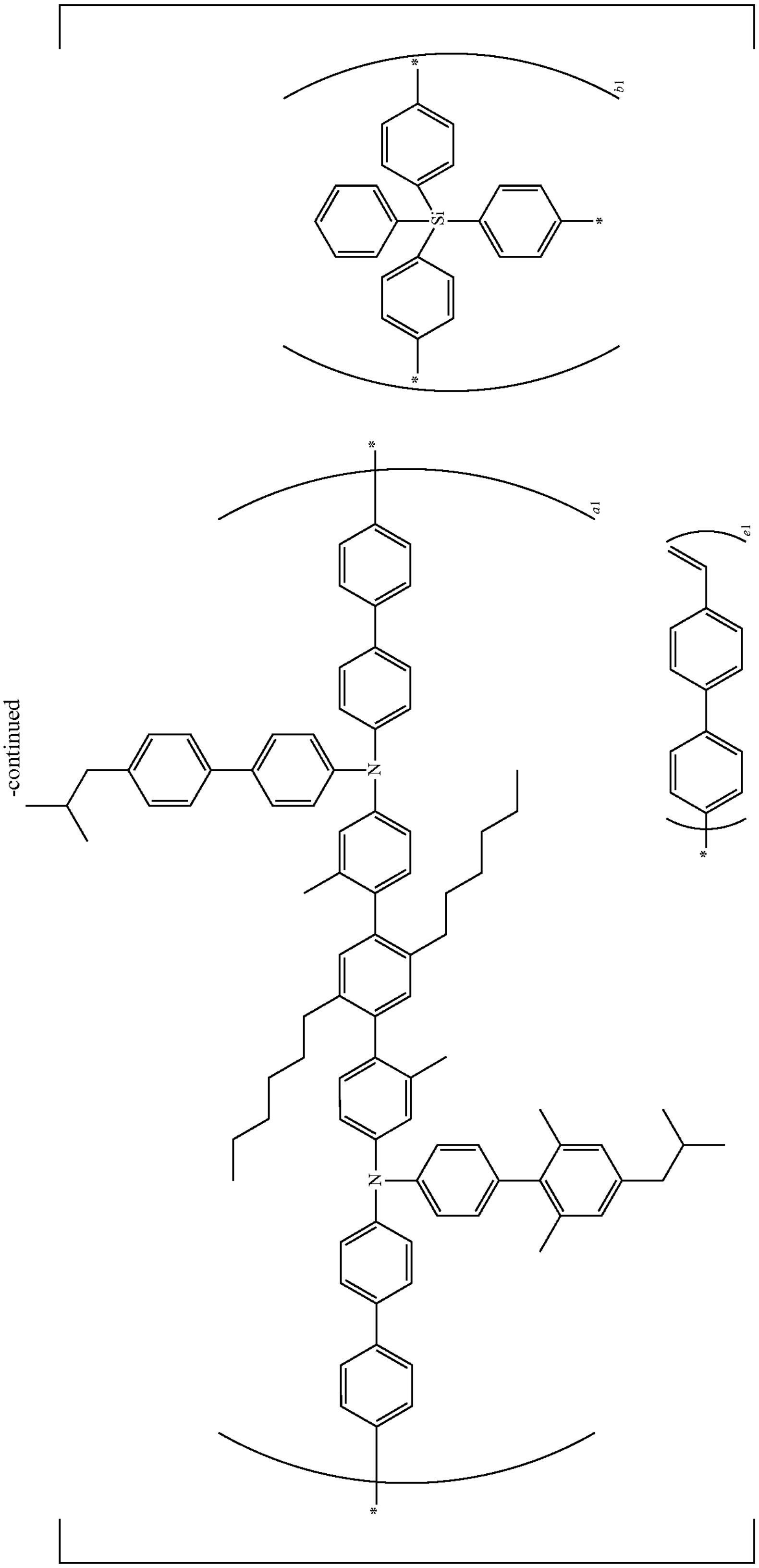

-continued
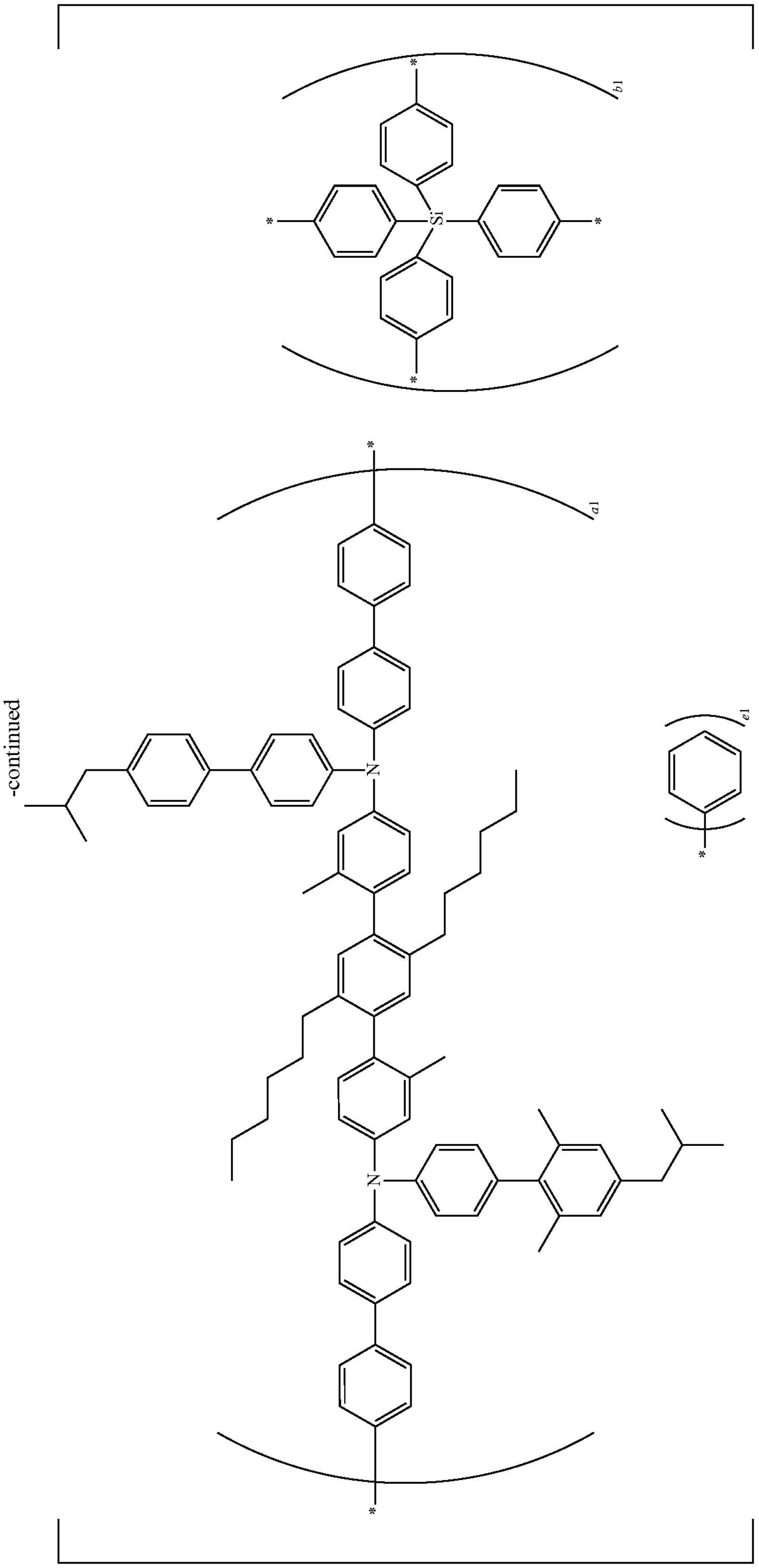

-continued
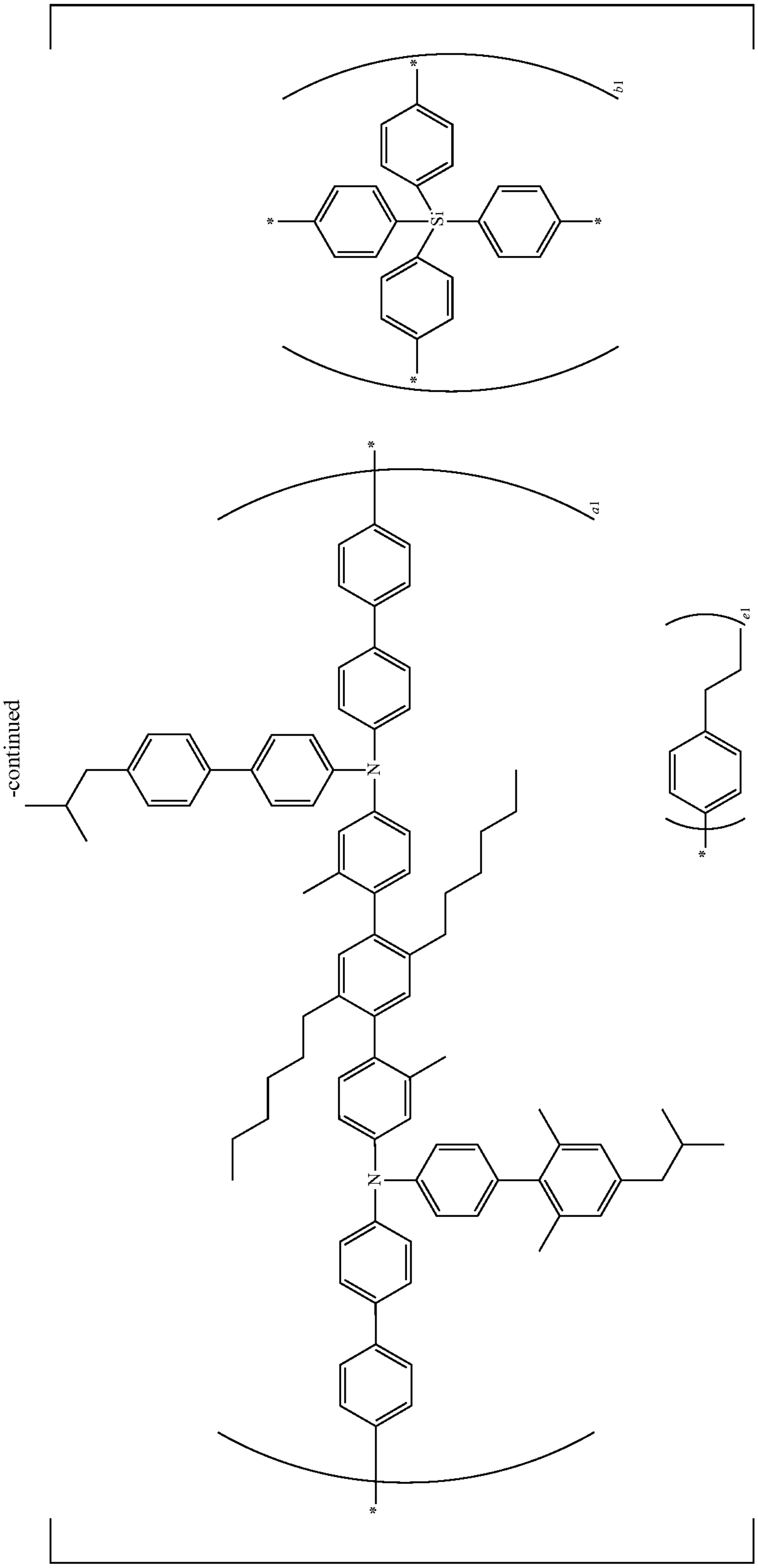

-continued
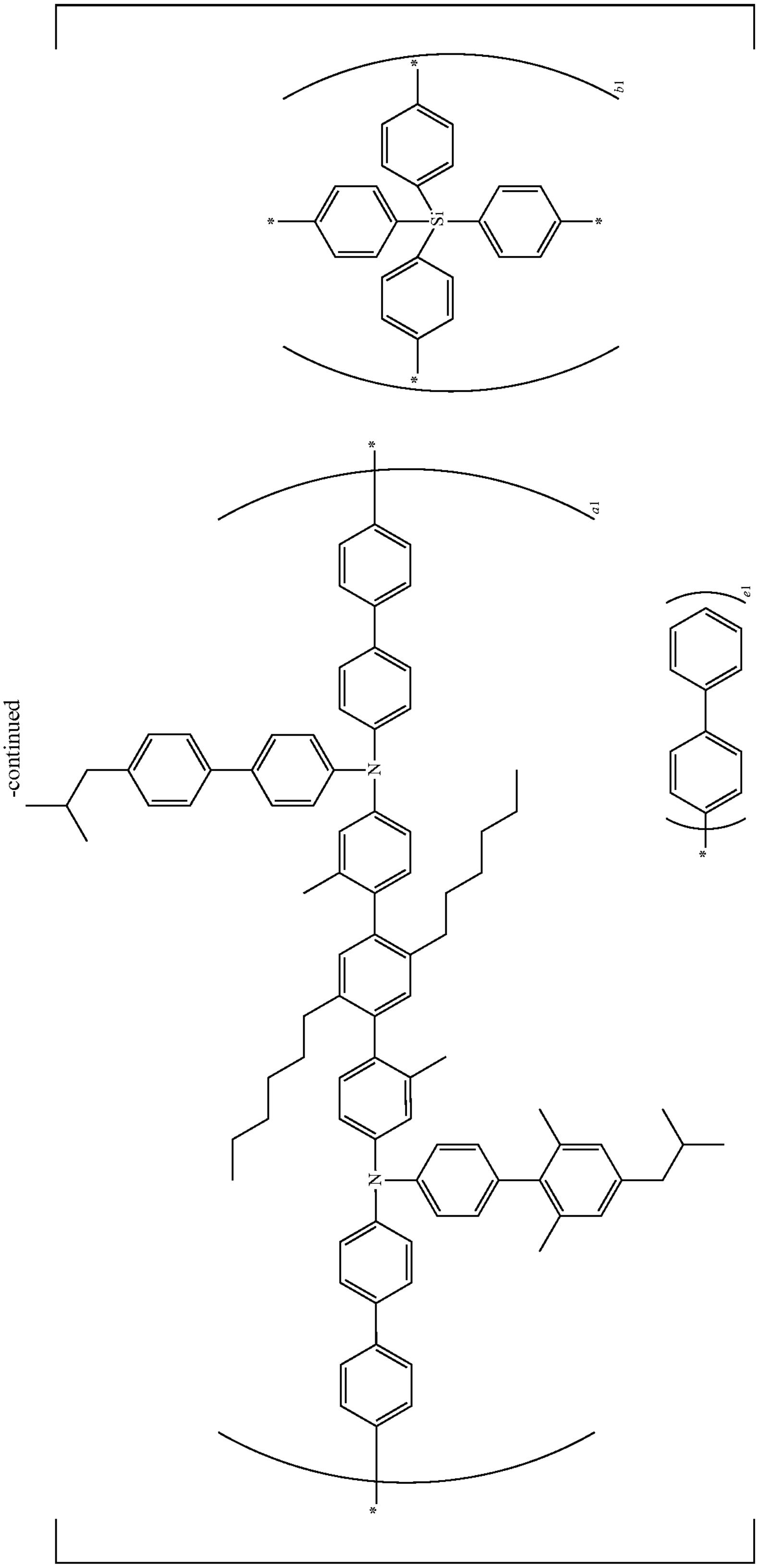

-continued
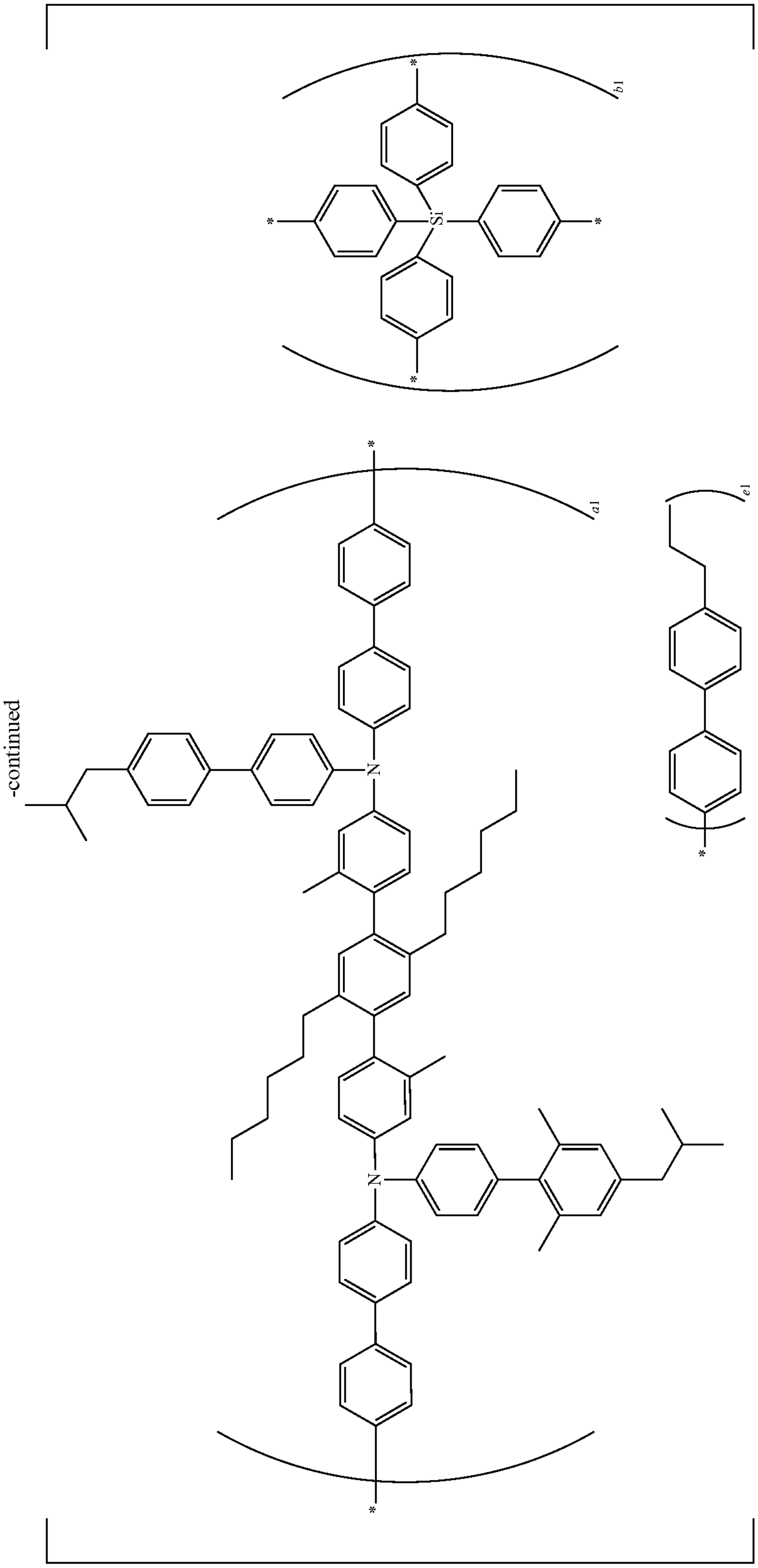

-continued
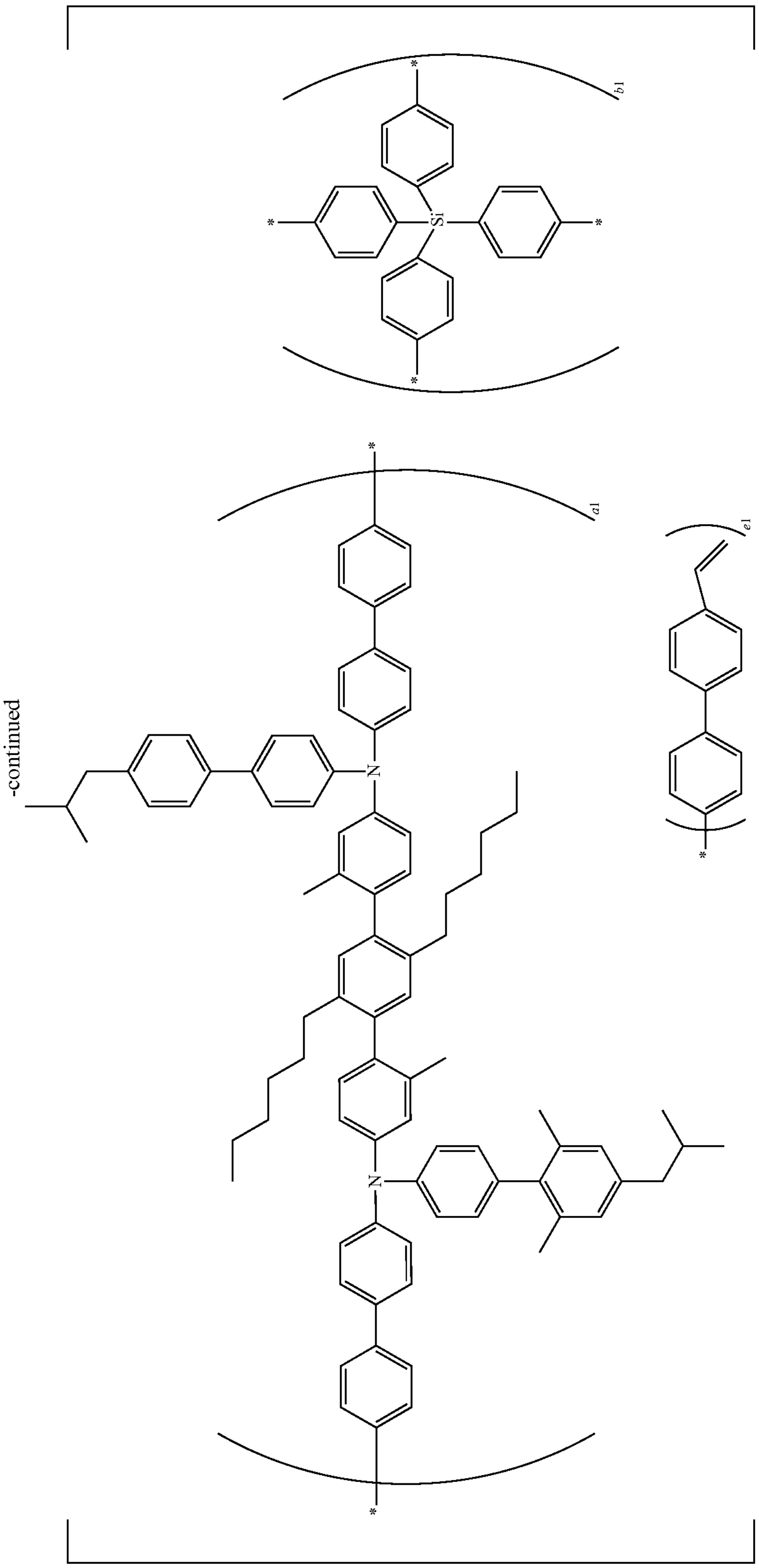

-continued
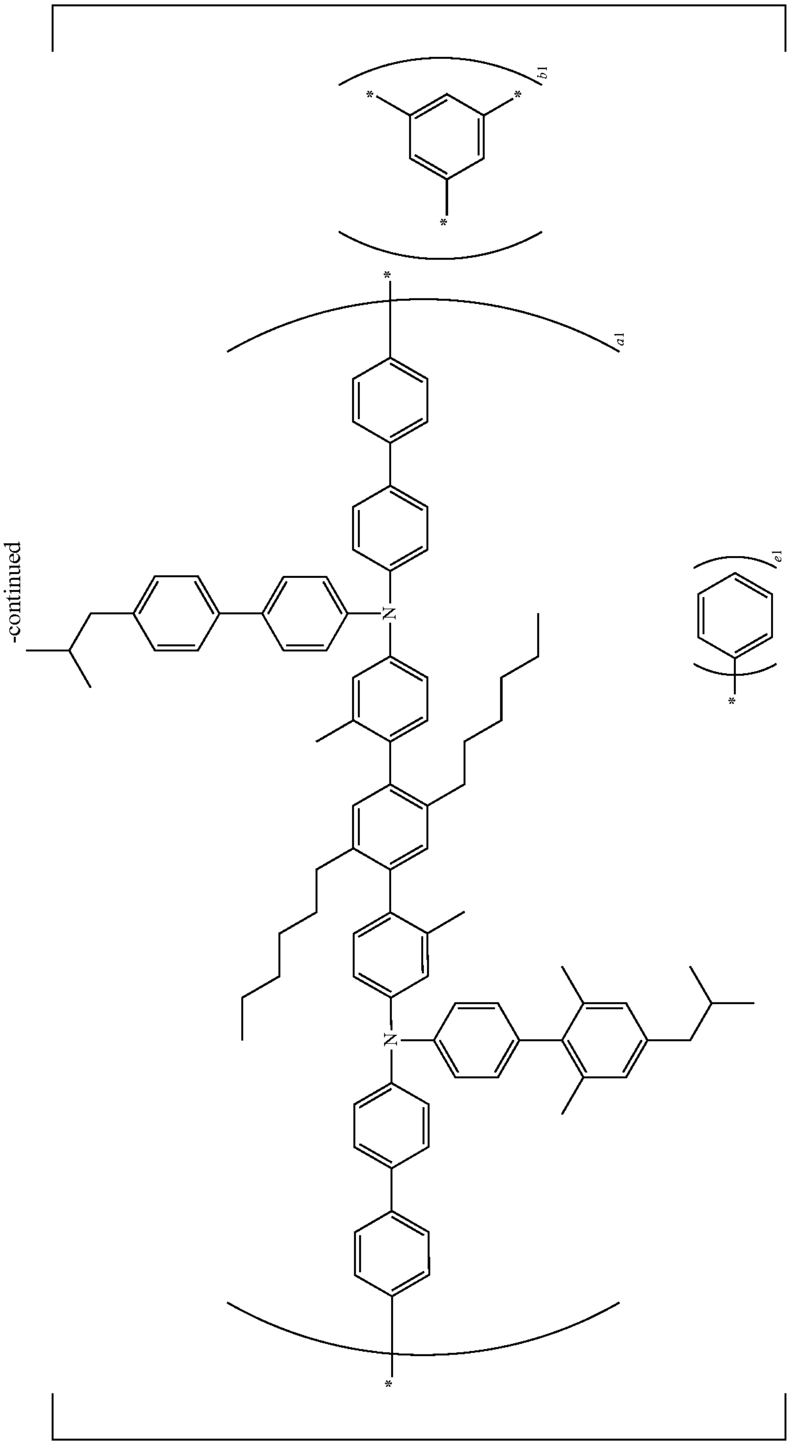

-continued
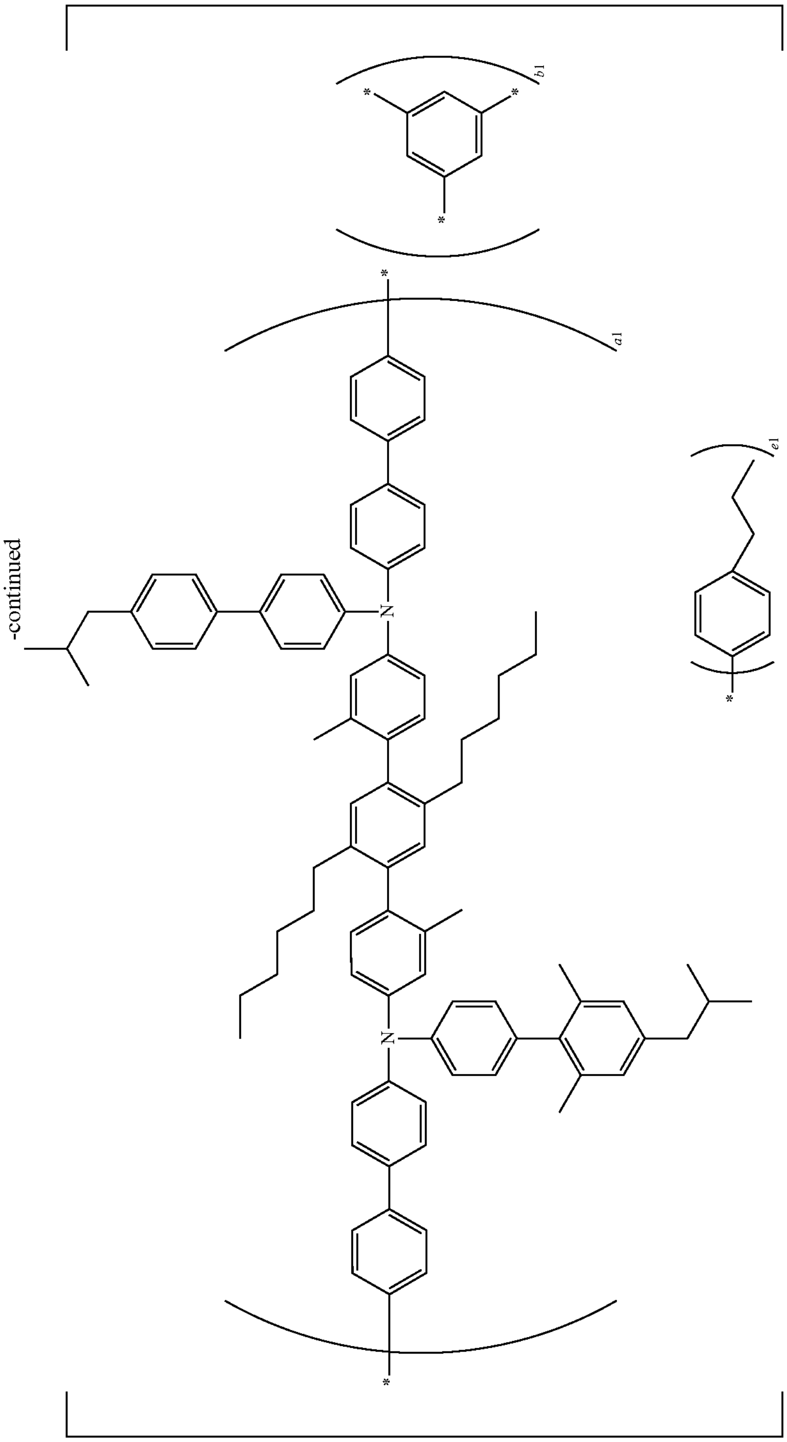

-continued
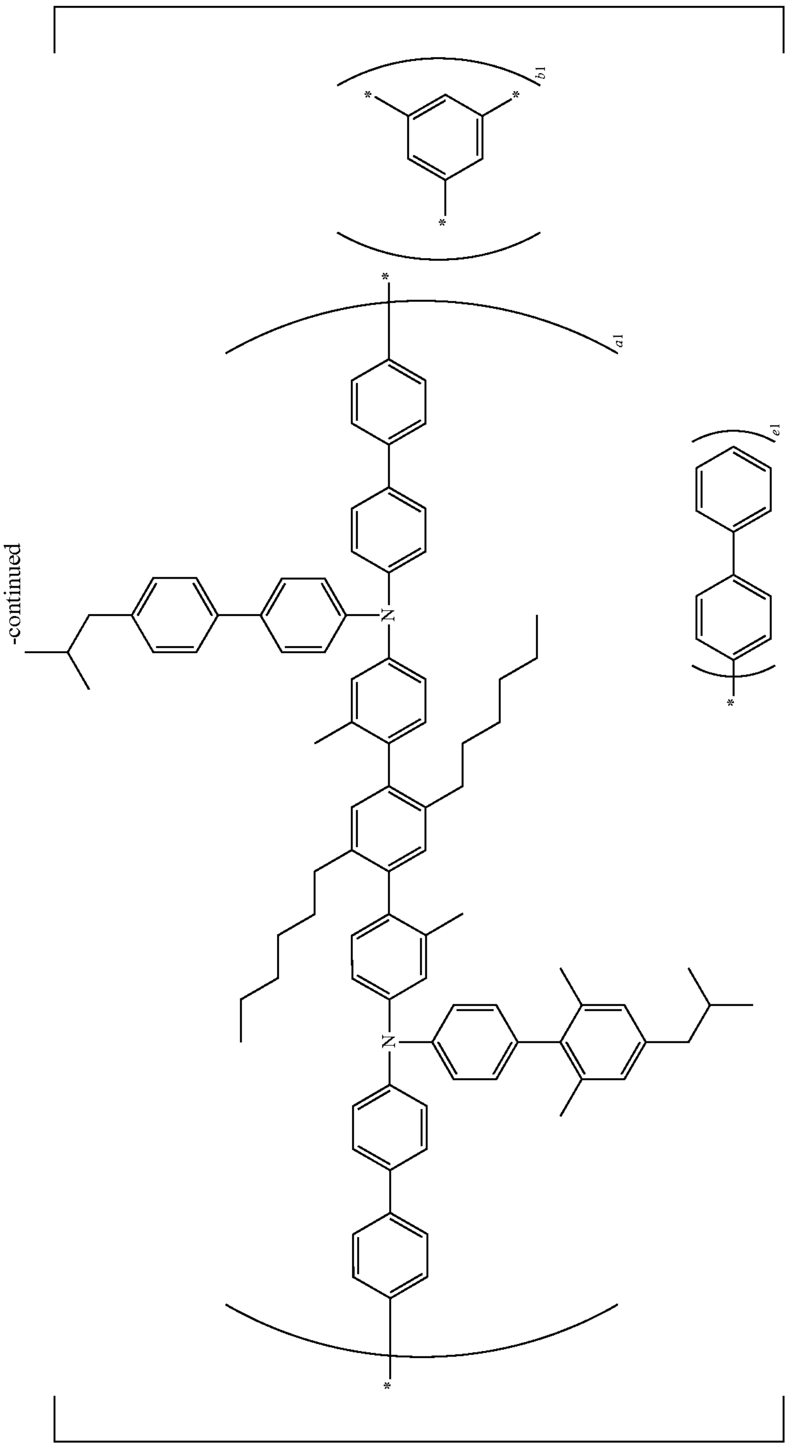

-continued
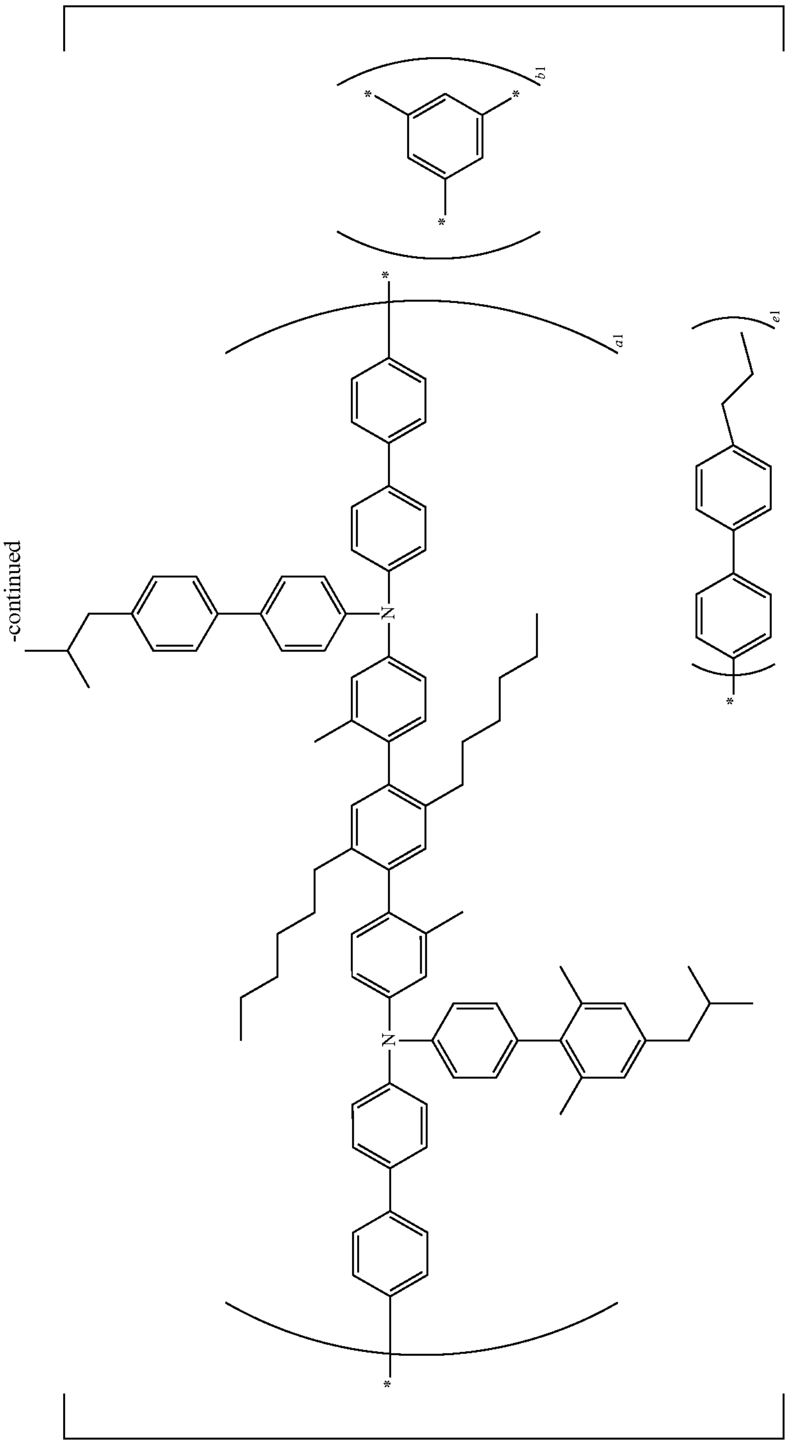

-continued
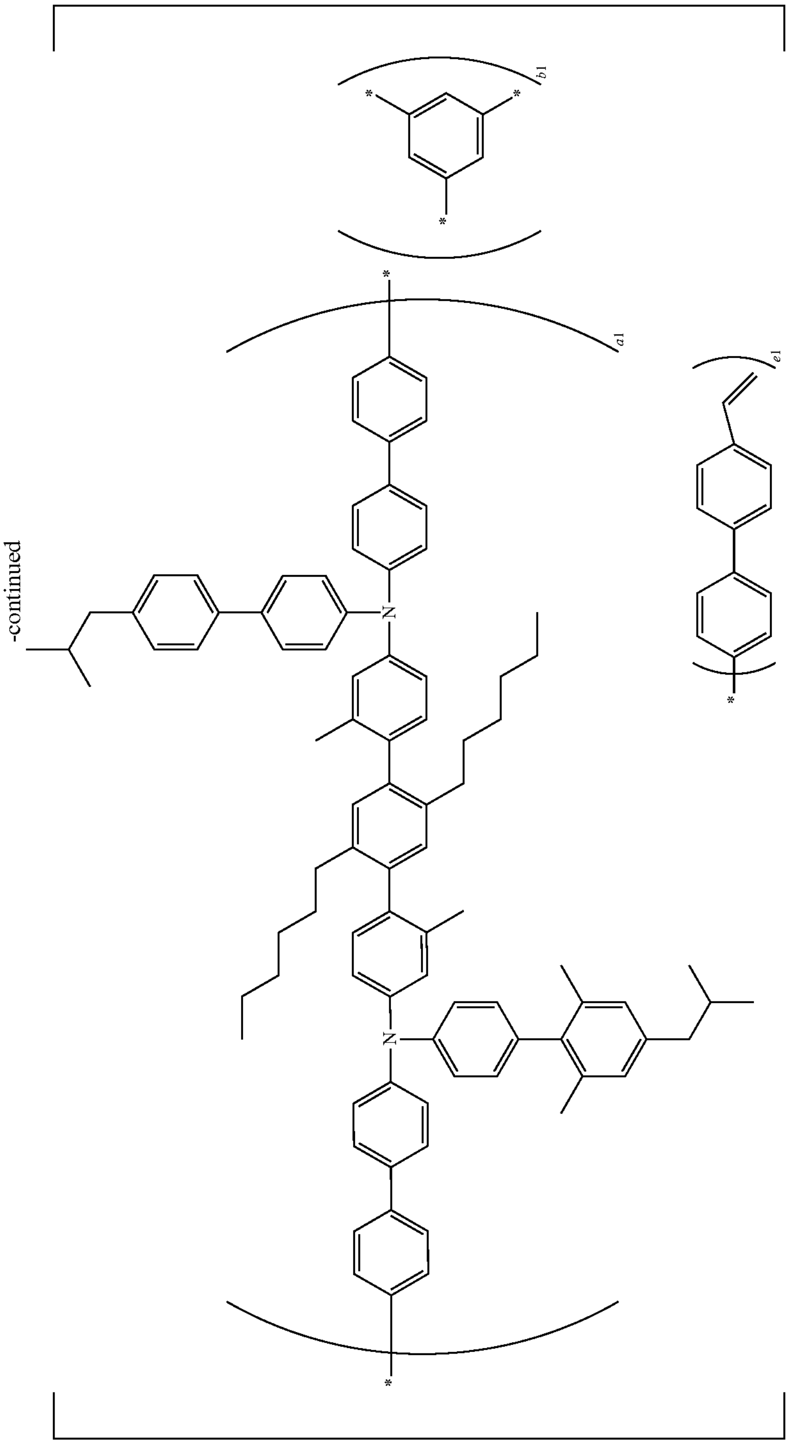

-continued
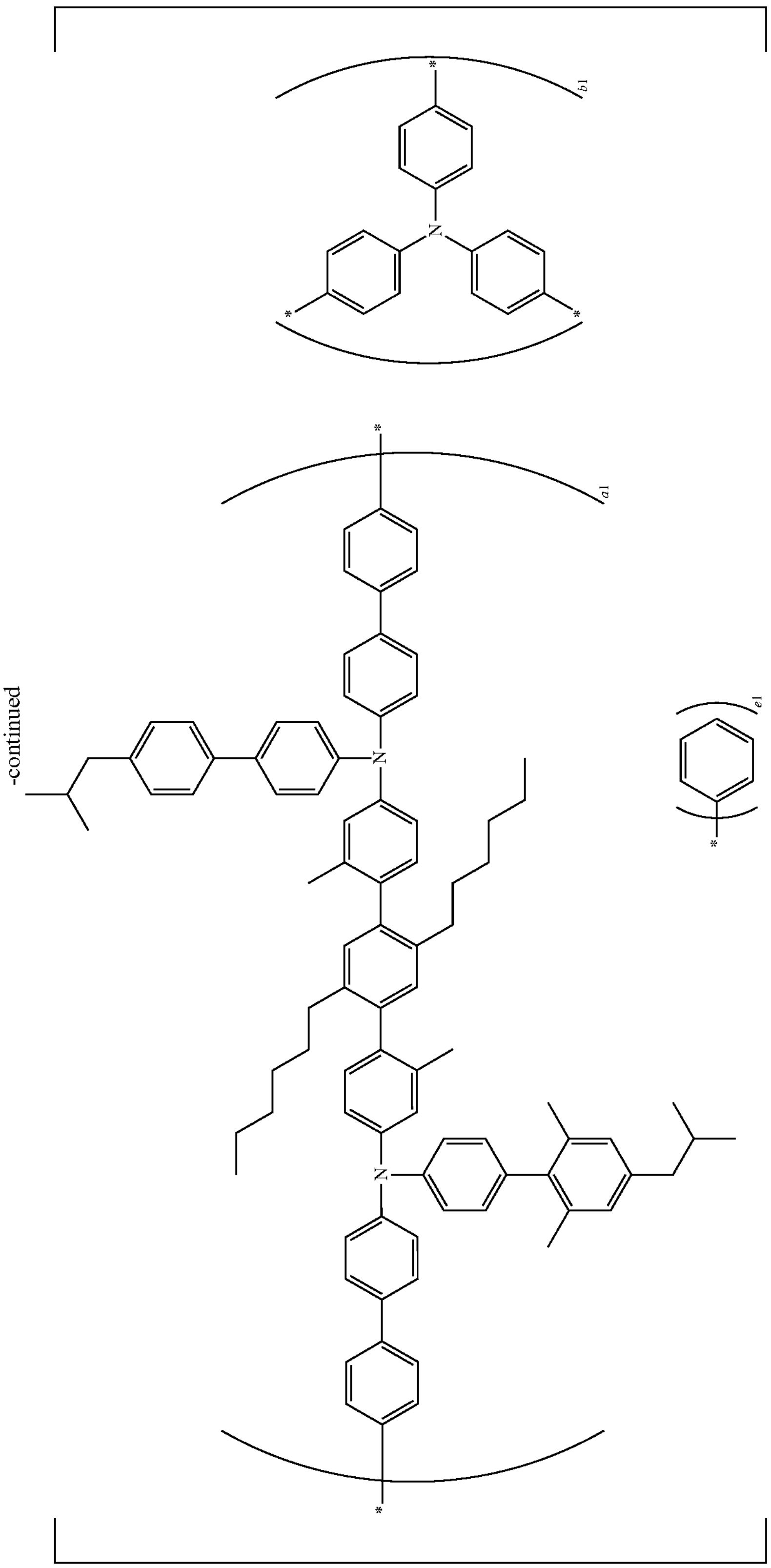

-continued
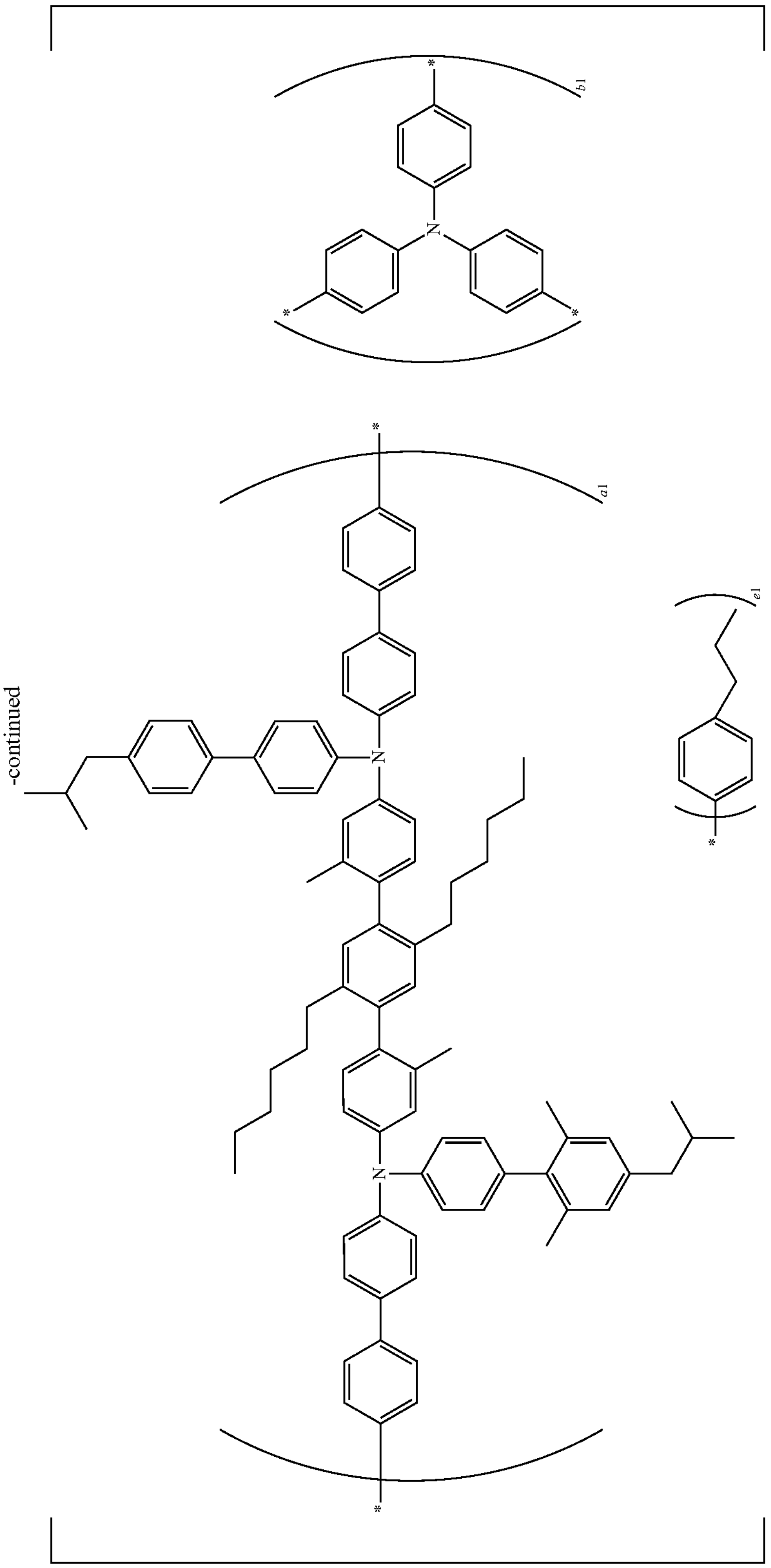

-continued
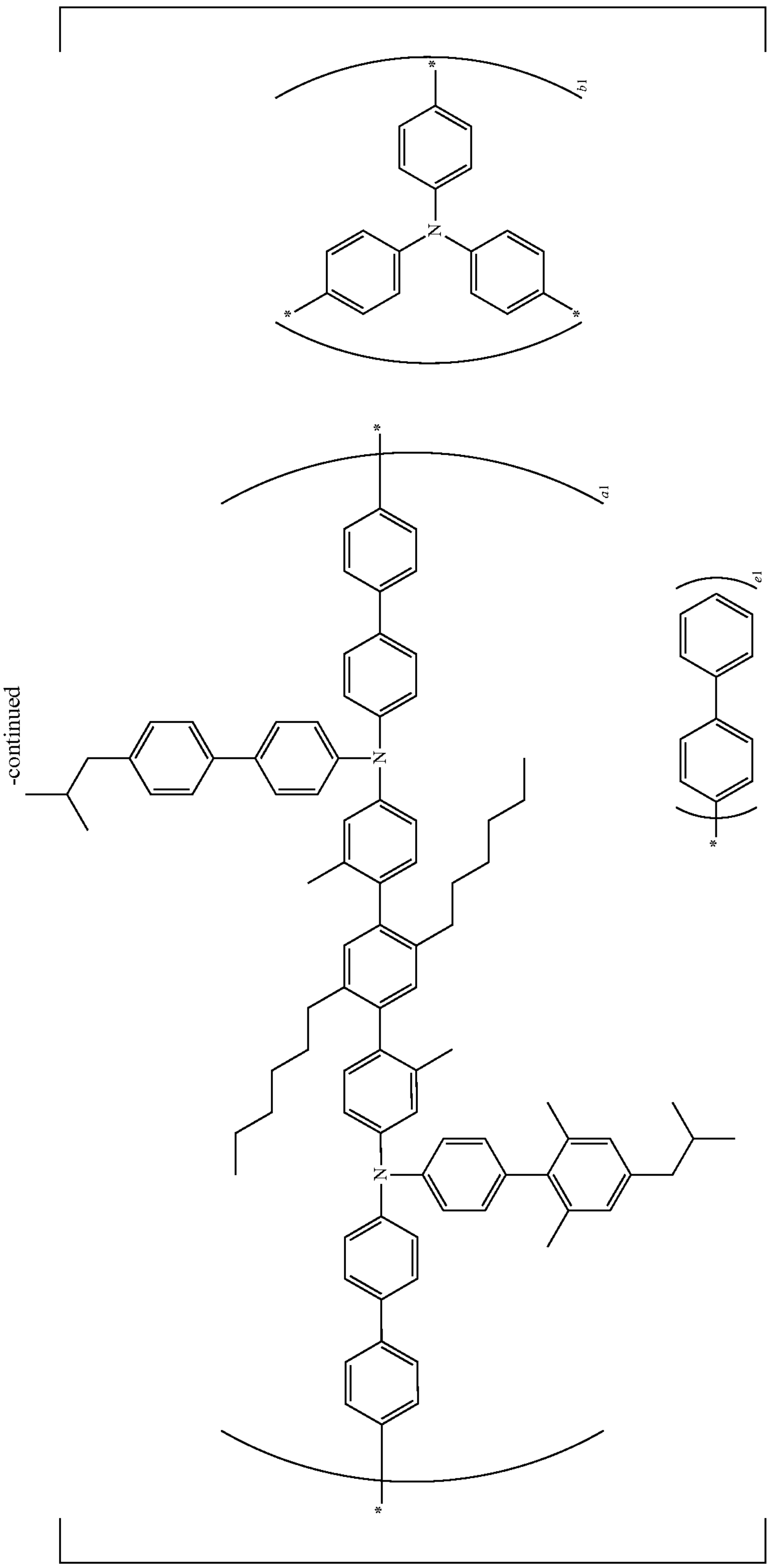

-continued
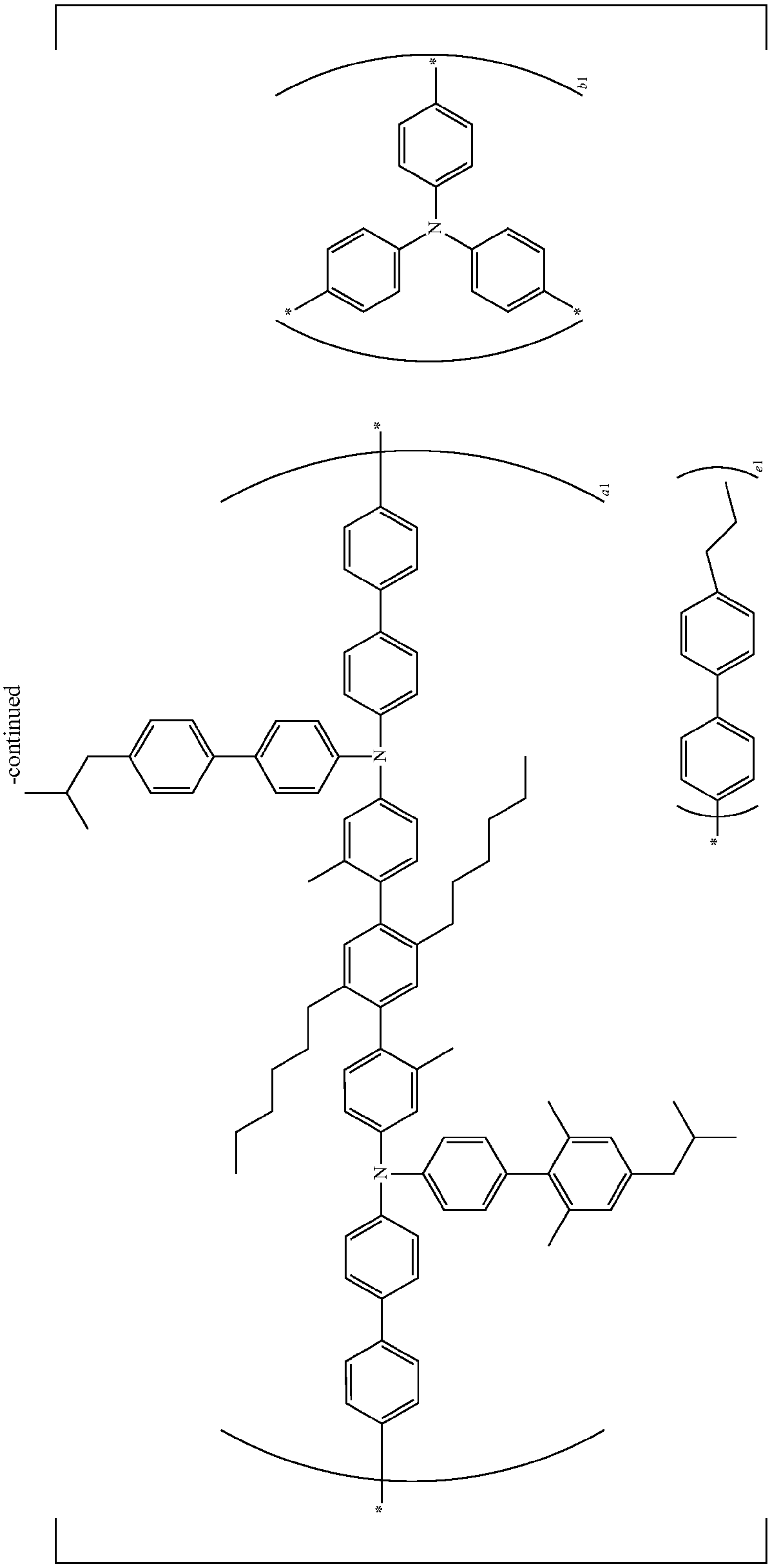

-continued
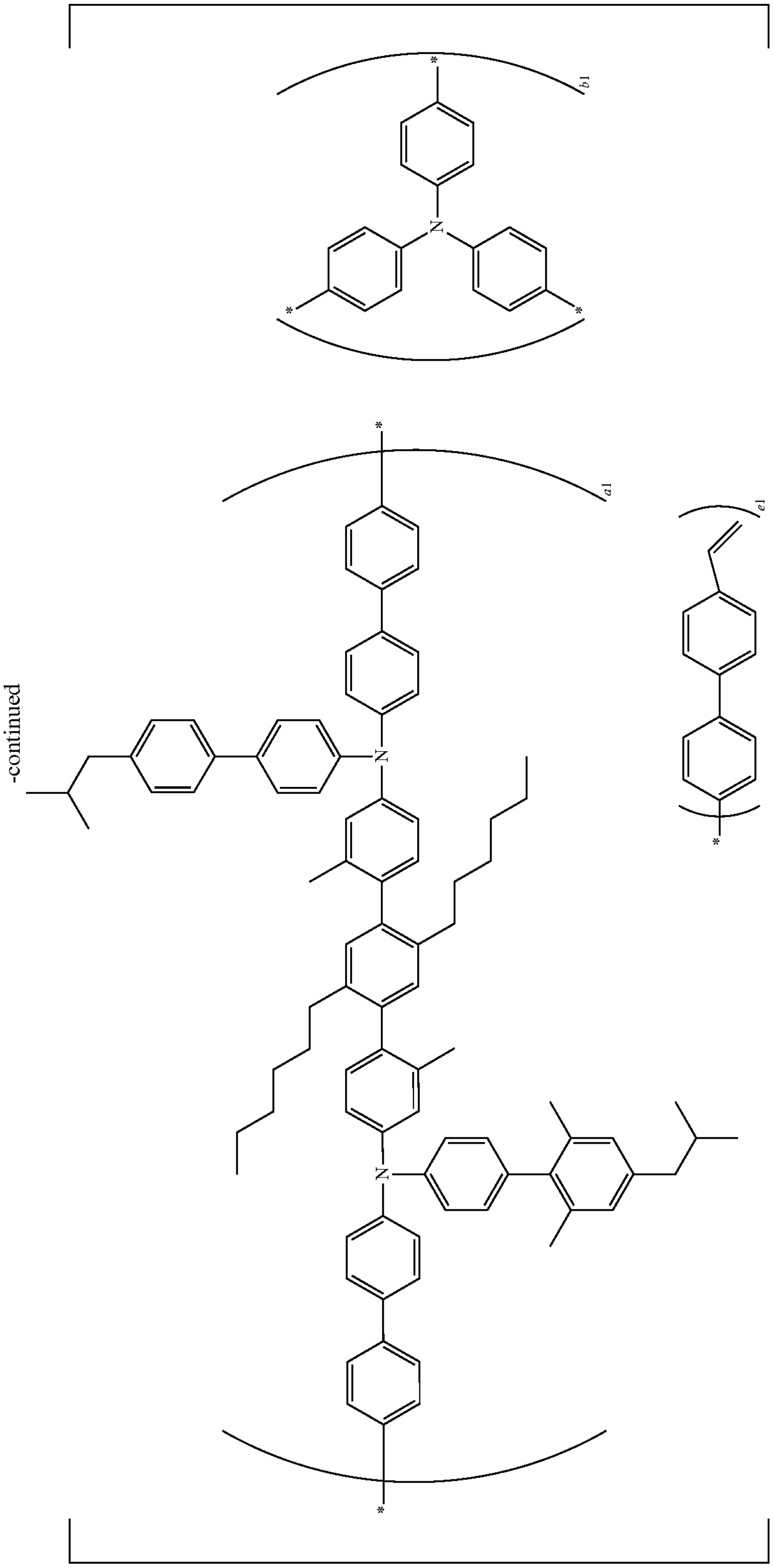

wherein, a1 is a real number of 0<a1<1, b1 is a real number of 0≤b1<1, e1 is a real number of 0<e1<1, and a1+b1+e1=1.
5. The polymer of claim 1, wherein the cross-linkable group is any one of the following structures:
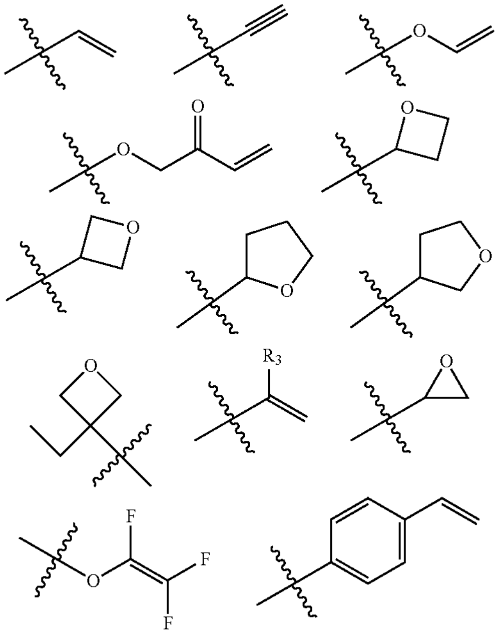
-continued
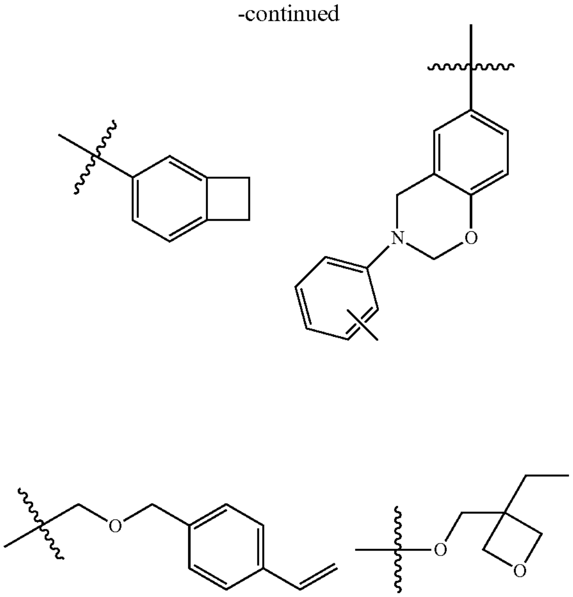
wherein,  means a moiety bonded to another substituent or a bonding portion.
6. The polymer of claim 1, wherein Al is represented by any one of the following structures:
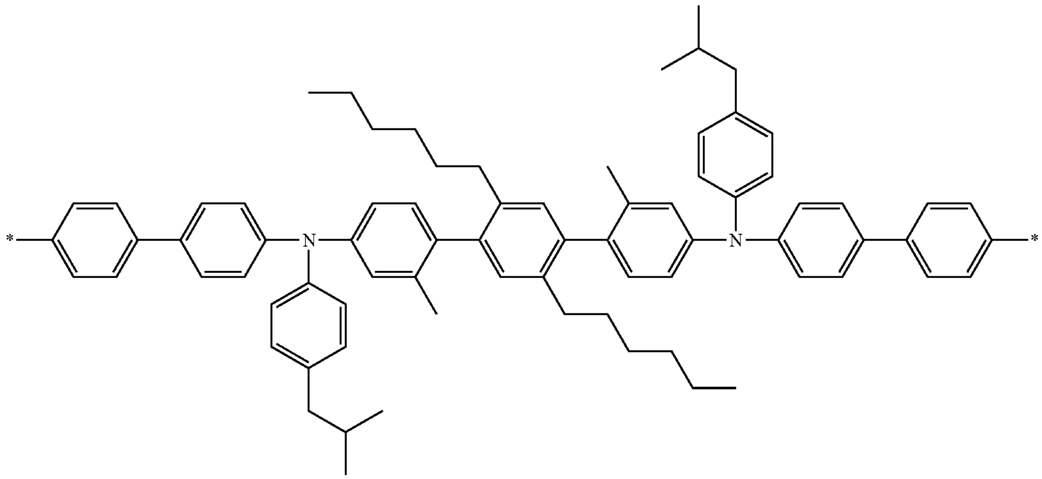

-continued
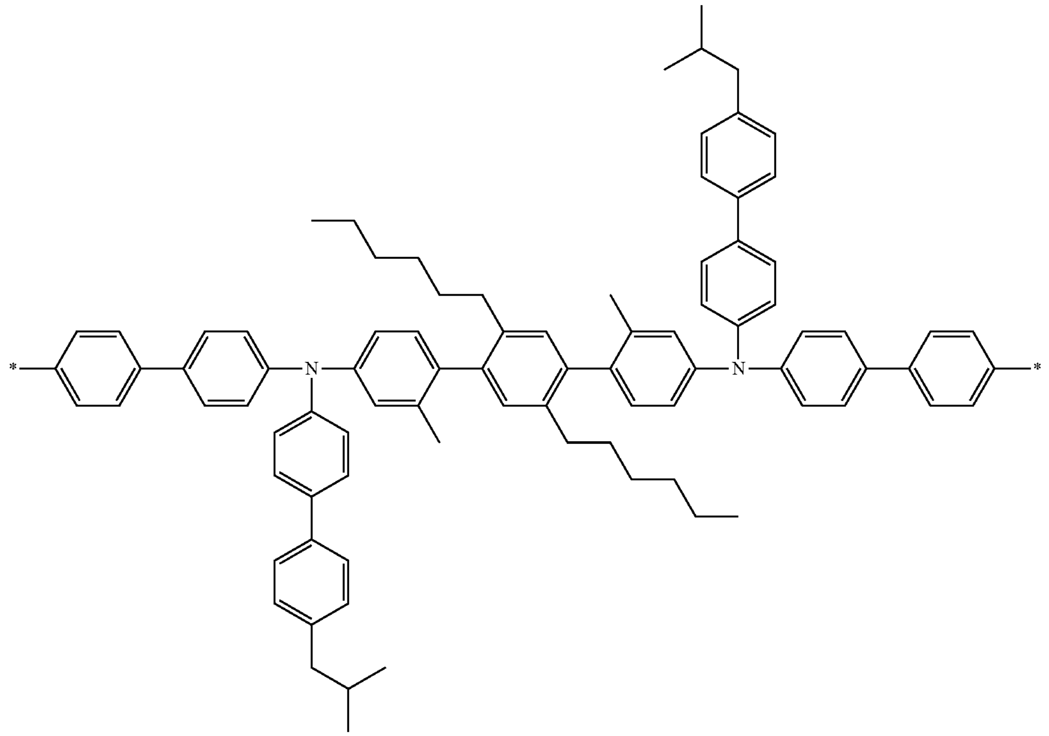
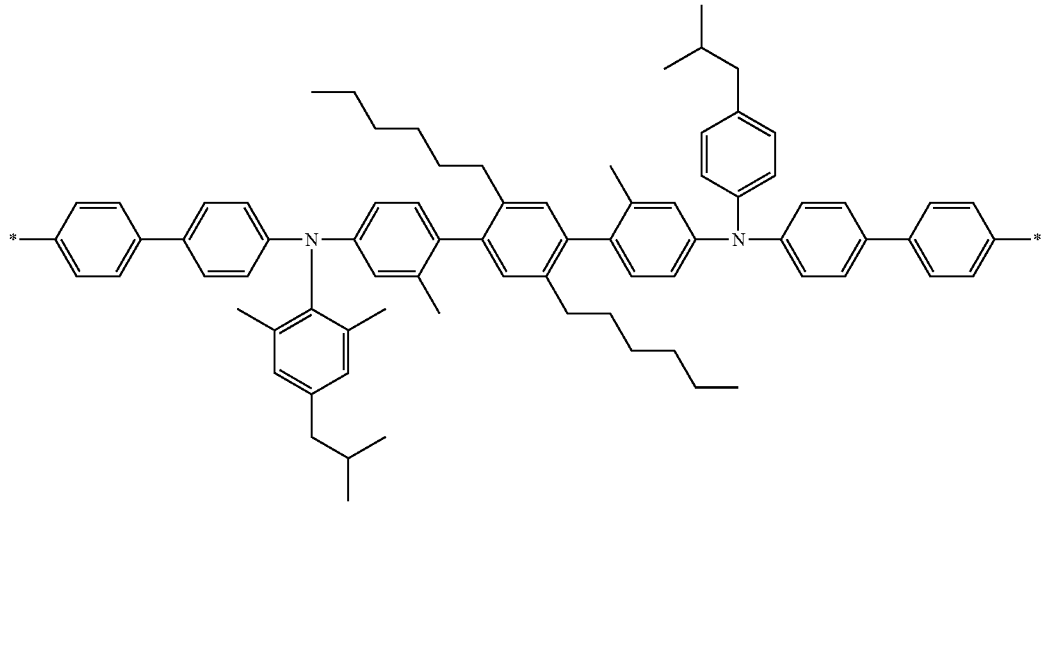

-continued
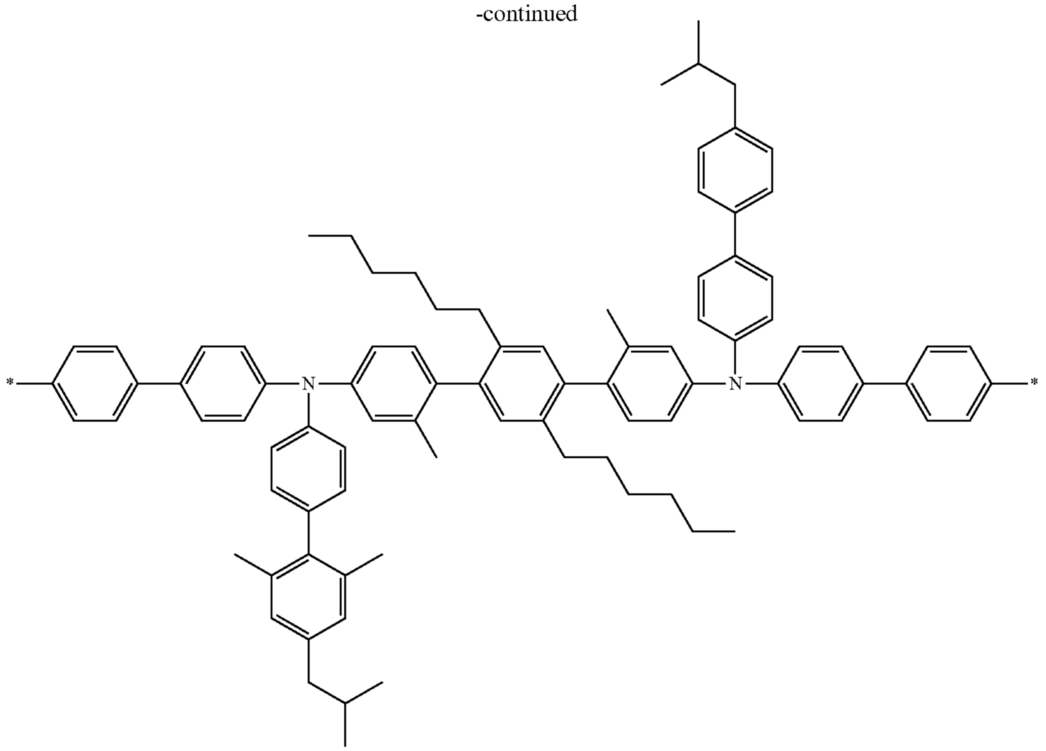
wherein, * is an attachment point in the polymer.
7. The polymer of claim 1, wherein B1 is represented by any one of the following structures:
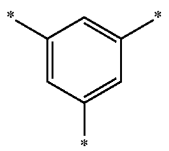
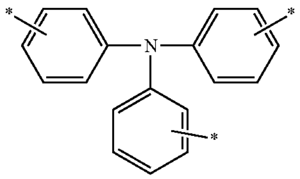
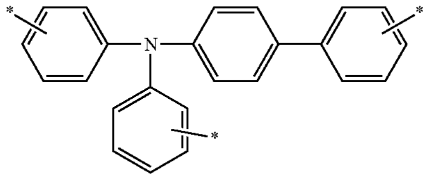
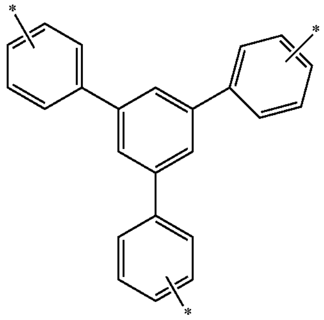
-continued
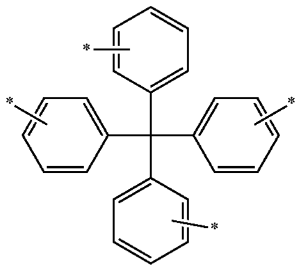
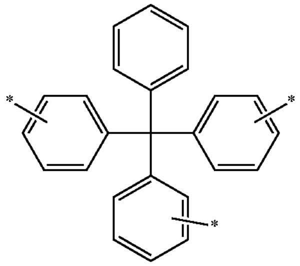
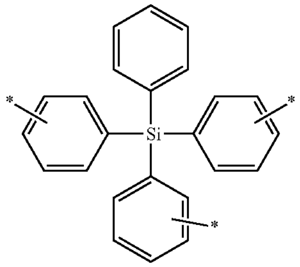

-continued

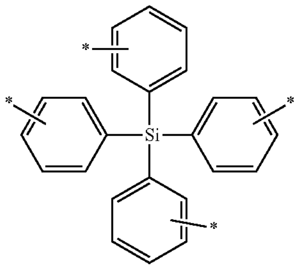

wherein, * is an attachment point in the polymer.

8. The polymer of claim 1, wherein C1 is represented by any one of the following structures:

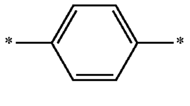

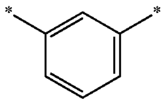

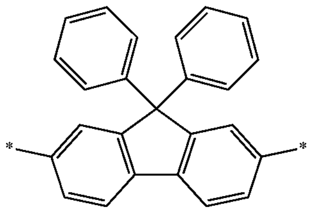

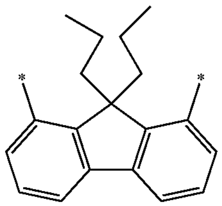

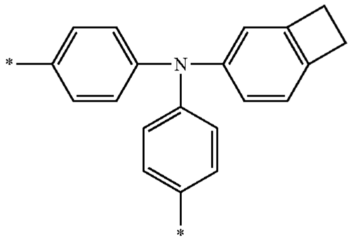

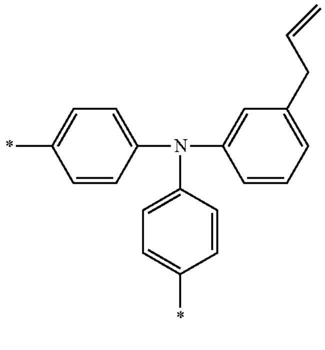

wherein, * is an attachment point in the polymer.

9. The polymer of claim 1, wherein E1 and E2 are the same as or different from each other, and are each independently represented by any one of the following structures:

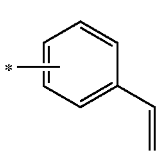

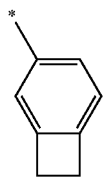

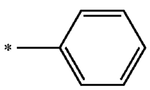

-continued

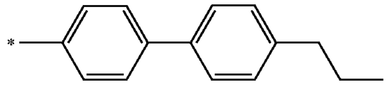

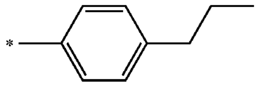

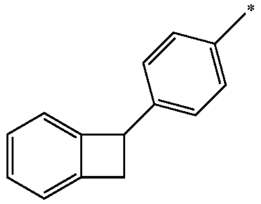

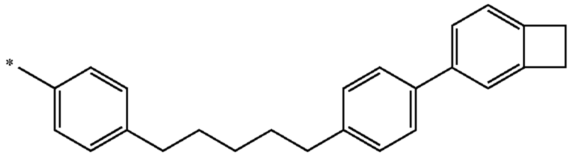

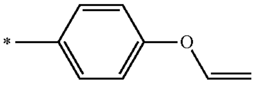

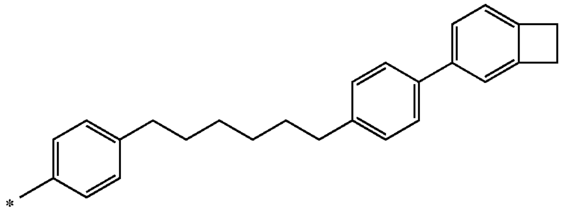

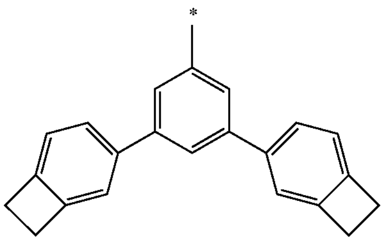

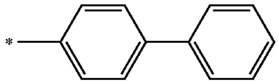

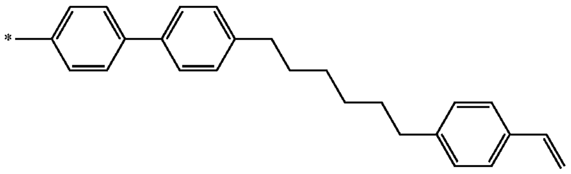

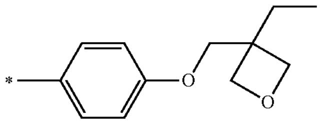

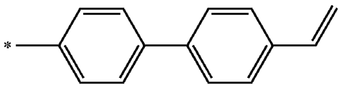

wherein, * is an attachment point in the polymer.

10. A polymer comprising: a unit represented by Chemical Formula 2; and an end group represented by Chemical Formula 5:

[Chemical Formula 2]

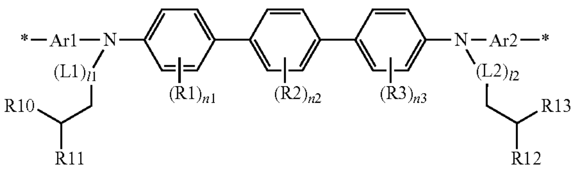

*-[E] [Chemical Formula 5]

wherein, in Chemical Formulae 2 and 5,

Ar1, Ar2, L1 and L2 are the same as or different from each other, and are each independently a substituted or unsubstituted arylene group, R1 to R3 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, R10 to R13 are the same as or different from each other, and are each independently a substituted or unsubstituted alkyl group, n1 to n3 are each independently an integer from 1 to 4, when n1 to n3 are each independently 2 or higher, each of R1 to R3 is the same as or different from each other, respectively, l1 and l2 are each independently an integer from 1 to 5, when l1 and l2 are each independently 2 or higher, each of L1 and L2 is the same as or different from each other, respectively, E is hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, and

* is an attachment point in the polymer.

11. The polymer of claim 10, further comprising a unit represented by Chemical Formula 4:

*—[C1]-* [Chemical Formula 4]

wherein, in Chemical Formula 4,

C1 is a substituted or unsubstituted arylene group; or a substituted or unsubstituted divalent heterocyclic group, and

* is an attachment point in the polymer.

12. The polymer of claim 10, wherein E is a cross-linkable group; or any one of the following structures:

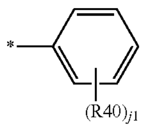

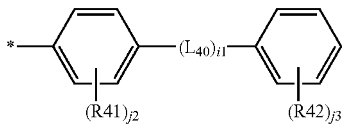

in the structures,

R40 to R42 are the same as or different from each other, and are each independently hydrogen; deuterium; a substituted or unsubstituted alkyl group; a substituted or unsubstituted aryl group; a substituted or unsubstituted heterocyclic group; or a cross-linkable group, L40 is a direct bond; a substituted or unsubstituted alkylene group; or a substituted or unsubstituted arylene group, i1 is an integer from 1 to 10, j1 and j3 are each independently an integer from 1 to 5, j2 is an integer from 1 to 4, when i1 is 2 or higher, each L40 is the same as or different from each other, when j1 to j3 are each independently 2 or higher, each of R40 to R42 is the same as or different from each other, respectively, and

* is an attachment point in the polymer.

13. The polymer of claim 10, wherein the unit represented by Chemical Formula 2 is represented by Chemical Formula 2-1:

[Chemical Formula 2-1]

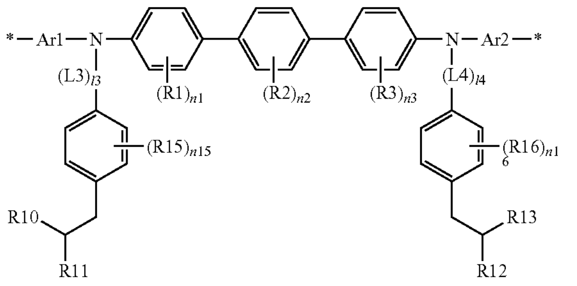

in Chemical Formula 2-1,

R1 to R3, R10 to R13, Ar1, Ar2, and n1 to n3 are the same as those defined in Chemical Formula 2, L3 and L4 are the same as or different from each other, and are each independently a direct bond; or a substituted or unsubstituted arylene group, R15 and R16 are the same as or different from each other, and are each independently hydrogen; deuterium; a halogen group; a substituted or unsubstituted alkyl group; a substituted or unsubstituted silyl group; a substituted or unsubstituted aryl group; a substituted or unsubstituted heterocyclic group; a substituted or unsubstituted arylamine group; or a substituted or unsubstituted siloxane group, n15 and n16 are each independently an integer from 1 to 4, when n15 and n16 are each independently 2 or higher, each of R15 and R16 is the same as or different from each other, respectively, l3 and l4 are each independently an integer from 1 to 4, when l3 and l4 are each independently 2 or higher, each of L13 and L14 is the same as or different from each other, respectively, and

* is an attachment point in the polymer.

14. The polymer of claim 10, further comprising a unit represented by Chemical Formula 3:

$Z{-}[-Y{-}*]_m$ [Chemical Formula 3]

wherein, in Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; deuterium; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

15. The polymer of claim 14, wherein the unit represented by Chemical Formula 3 is represented by any one of Chemical Formulae 3-1 to 3-4:

[Chemical Formula 3-1]

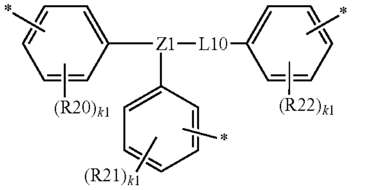

[Chemical Formula 3-2]

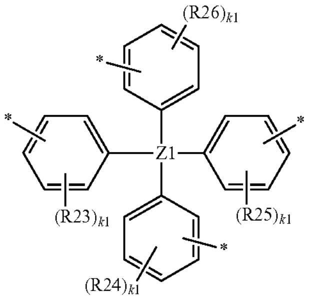

[Chemical Formula 3-3]

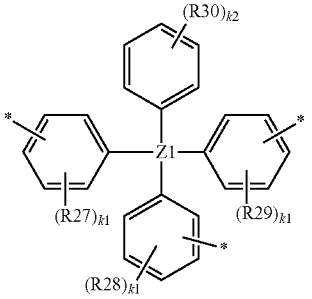

-continued

[Chemical Formula 3-4]

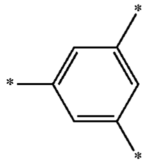

in Chemical Formulae 3-1 to 3-4,

Z1 is CRa; SiRa; N; or a substituted or unsubstituted trivalent aryl group,

Z2 and Z3 are the same as or different from each other, and are each independently C; Si; or a substituted or unsubstituted tetravalent aryl group, L10 is a direct bond; or a substituted or unsubstituted arylene group, Ra is hydrogen; deuterium; a substituted or unsubstituted alkyl group; or a substituted or unsubstituted aryl group, R20 to R30 are the same as or different from each other, and are each independently hydrogen; deuterium; a halogen group; a cyano group; an alkoxy group; an aryloxy group; a fluoroalkoxy group; a siloxane group; a substituted or unsubstituted amine group; a substituted or unsubstituted alkyl group; a substituted or unsubstituted aryl group; a substituted or unsubstituted heterocyclic group; or a cross-linkable group, or adjacent groups are bonded to each other to form a ring, each k1 is independently an integer from 1 to 4, k2 is an integer from 1 to 5, when k1 is each independently 2 or higher, each of R20 to R29 is the same as or different from each other, respectively, when k2 is 2 or higher, each R30 is the same as or different from each other, and

* is an attachment point in the polymer.

16. An organic light emitting device comprising:

a first electrode;

a second electrode; and an organic material layer having one or more layers provided between the first electrode and the second electrode, wherein the one or more layers comprise the polymer of claim 4.

17. The organic light emitting device of claim 16, wherein the one or more layers comprising the polymer is a hole injection layer, a hole transport layer, or a layer which simultaneously injects and transports holes.

* * * * *